United States Patent
Misaki

(10) Patent No.: US 10,663,823 B2
(45) Date of Patent: May 26, 2020

(54) TFT SUBSTRATE, SCANNING ANTENNA PROVIDED WITH TFT SUBSTRATE, AND METHOD FOR PRODUCING TFT SUBSTRATE

(71) Applicant: SHARP KABUSHIKI KAISHA, Sakai, Osaka (JP)

(72) Inventor: Katsunori Misaki, Yonago (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/307,924

(22) PCT Filed: Jun. 5, 2017

(86) PCT No.: PCT/JP2017/020824
§ 371 (c)(1),
(2) Date: Dec. 6, 2018

(87) PCT Pub. No.: WO2017/213084
PCT Pub. Date: Dec. 14, 2017

(65) Prior Publication Data
US 2019/0265527 A1   Aug. 29, 2019

(30) Foreign Application Priority Data

Jun. 9, 2016 (JP) .................. 2016-115575

(51) Int. Cl.
*G02F 1/136* (2006.01)
*G02F 1/1368* (2006.01)
(Continued)

(52) U.S. Cl.
CPC .............. *G02F 1/1368* (2013.01); *G02F 1/13* (2013.01); *H01L 27/124* (2013.01);
(Continued)

(58) Field of Classification Search
None
See application file for complete search history.

(56) References Cited

U.S. PATENT DOCUMENTS 7,466,269 B2   12/2008   Haziza
7,847,894 B2   12/2010   Rho
(Continued)

FOREIGN PATENT DOCUMENTS

JP   2002-217640 A   8/2002
JP   2007-116573 A   5/2007
(Continued)

OTHER PUBLICATIONS

R. A. Stevenson et al., "Rethinking Wireless Communications: Advanced Antenna Design using LCD Technology", SID 2015 Digest, pp. 827-830.
(Continued)

*Primary Examiner* — James A Dudek
(74) *Attorney, Agent, or Firm* — ScienBiziP, P.C.

(57) ABSTRACT

Provided is a TFT substrate including a dielectric substrate and a plurality of antenna unit regions arranged on the dielectric substrate. The TFT substrate further includes a transmission and/or reception region including the plurality of antenna unit regions, and a non-transmission and/or reception region positioned in a region other than the transmission and/or reception region. Each of the plurality of antenna unit regions is provided with a TFT that is supported by the dielectric substrate and that includes a gate electrode, a semiconductor layer, a gate insulating layer formed between the gate electrode and the semiconductor layer, and a source electrode and a drain electrode-electrically connected to the semiconductor layer; and a patch electrode electrically connected to the drain electrode of the
(Continued)

TFT. The patch electrode is formed from the same conductive film as the gate electrode.

20 Claims, 64 Drawing Sheets

(51) Int. Cl.
  *H01L 29/786* (2006.01)
  *H01Q 3/34* (2006.01)
  *H01Q 3/44* (2006.01)
  *H01Q 13/22* (2006.01)
  *H01L 27/12* (2006.01)
  *G02F 1/13* (2006.01)
(52) U.S. Cl.
  CPC ........ *H01L 27/1225* (2013.01); *H01L 29/786* (2013.01); *H01Q 3/34* (2013.01); *H01Q 3/44* (2013.01); *H01Q 13/22* (2013.01)

(56) References Cited

U.S. PATENT DOCUMENTS

| | | |
|---|---|---|
| 2012/0092577 A1 | 4/2012 | Shi et al. |
| 2012/0138922 A1 | 6/2012 | Yamazaki et al. |
| 2012/0194399 A1 | 8/2012 | Bily et al. |
| 2013/0320334 A1 | 12/2013 | Yamazaki et al. |
| 2014/0286076 A1 | 9/2014 | Aoki et al. |
| 2016/0261042 A1* | 9/2016 | Sazegar .................. H01Q 3/36 |
| 2016/0261043 A1* | 9/2016 | Sazegar ............. H01Q 21/0012 |
| 2017/0256865 A1* | 9/2017 | Sikes ........................ H01Q 1/38 |
| 2017/0338569 A1* | 11/2017 | Hower ................... H01Q 1/288 |
| 2018/0358690 A1* | 12/2018 | Linn ....................... H01Q 1/364 |

FOREIGN PATENT DOCUMENTS

| | | |
|---|---|---|
| JP | 2007-295044 A | 11/2007 |
| JP | 2009-538565 A | 11/2009 |
| JP | 2012-134475 A | 7/2012 |
| JP | 2013-539949 A | 10/2013 |
| JP | 2014-007399 A | 1/2014 |
| JP | 2014-209727 A | 11/2014 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |

OTHER PUBLICATIONS

M. Ando et al., "A Radial Line Slot Antenna for 12GHz Satellite TV Reception", IEEE Transactions on Antennas and Propagation, vol. AP-33, No. 12, pp. 1347-1353 (1985).

M. Wittek et al., "Liquid Crystals for Smart Antennas and Other Microwave Applications", SID 2015 Digestpp. 824-826.

Kuki, "New Functional Element Using Liquid Crystal" Polymer, vol. 55, August issue, pp. 599-602 (2006) (A concise explanation of the relevance can be found in paragraph [0064] of the specification of the subject application).

Co-pending letter regarding a related co-pending U.S. Appl. No. 15/542,488, filed Jul. 10, 2017.

* cited by examiner

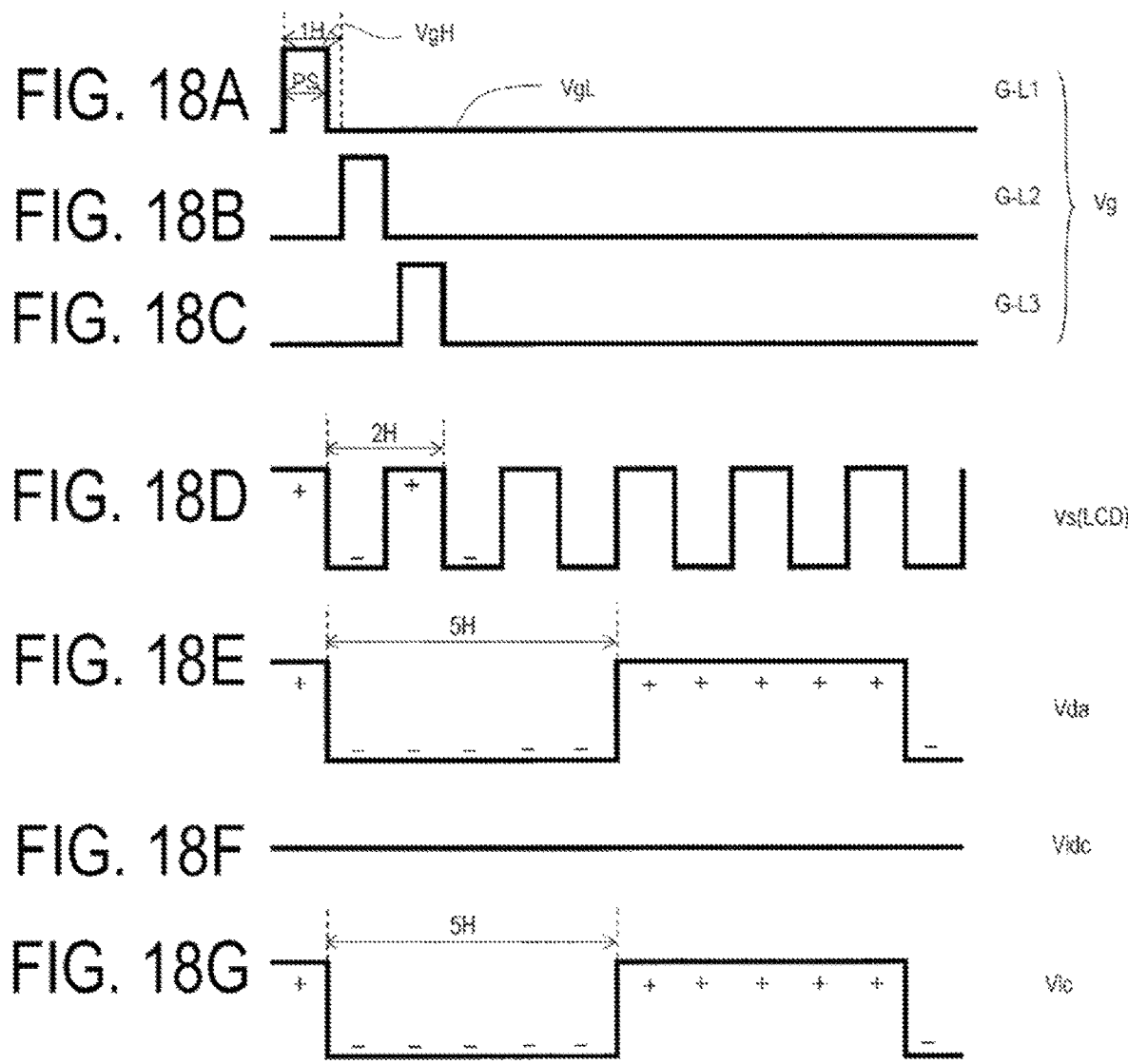

FIG. 20E ─────────────────── Vlc(OFF)

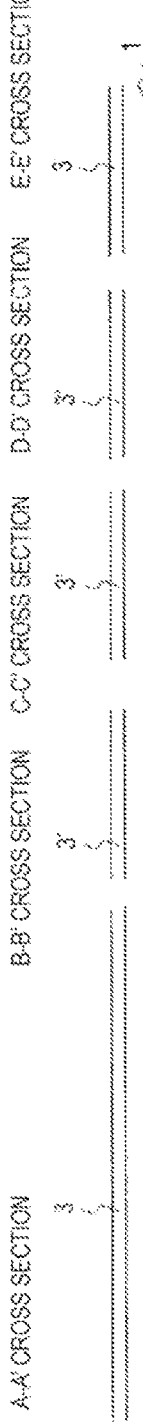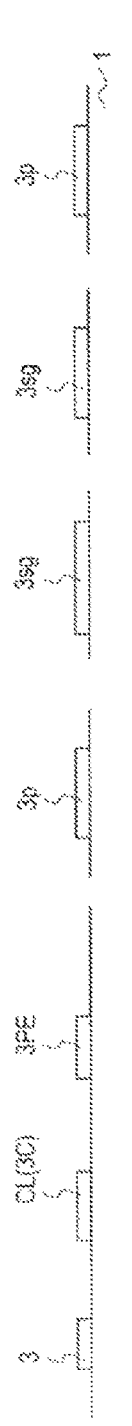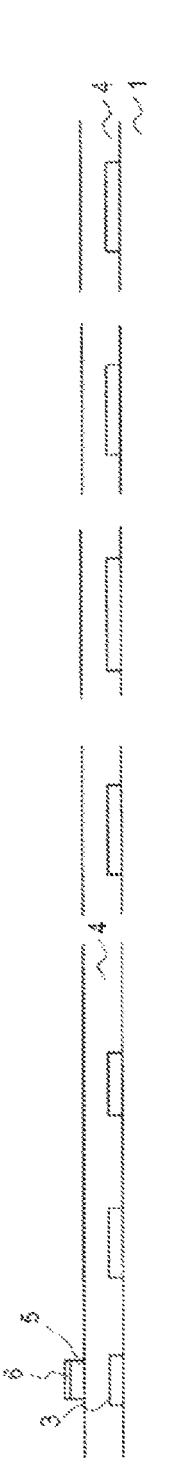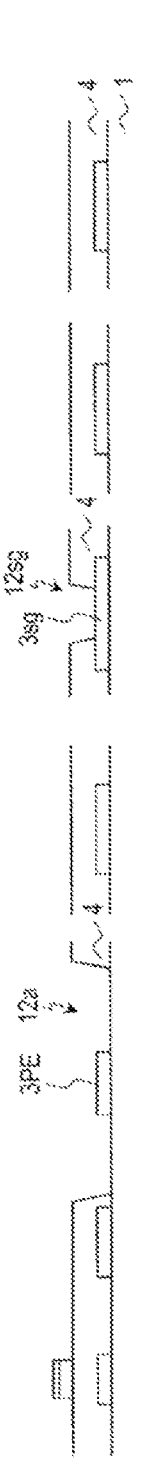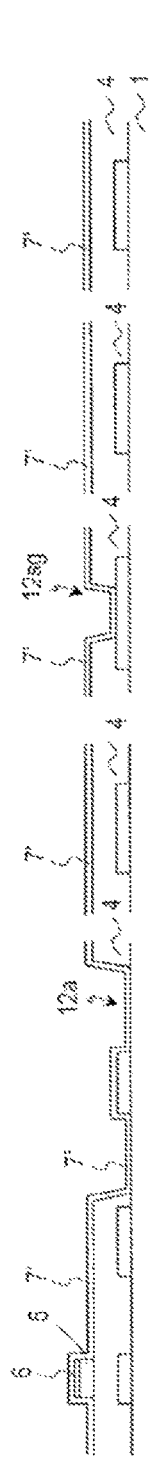
FIG. 24AA
FIG. 24AB
FIG. 24AC
FIG. 24AD
FIG. 24AE
FIG. 24AF

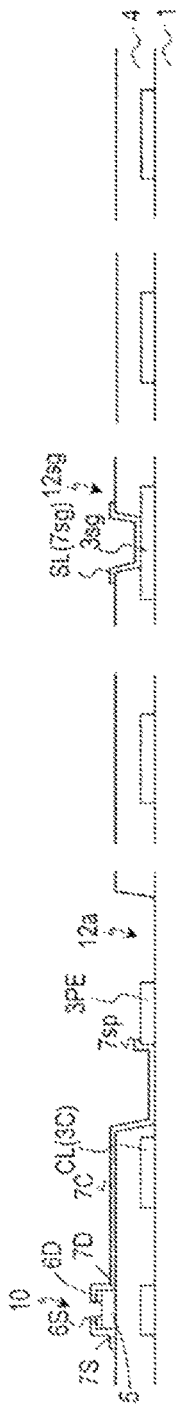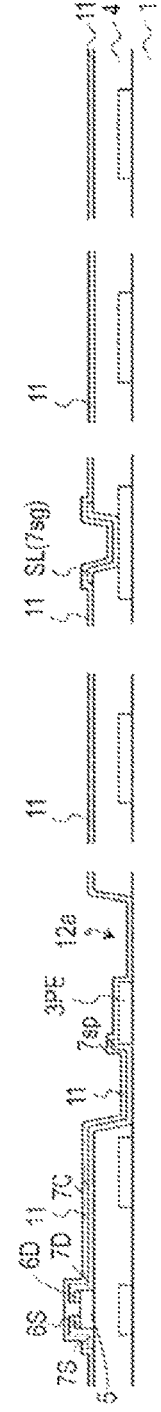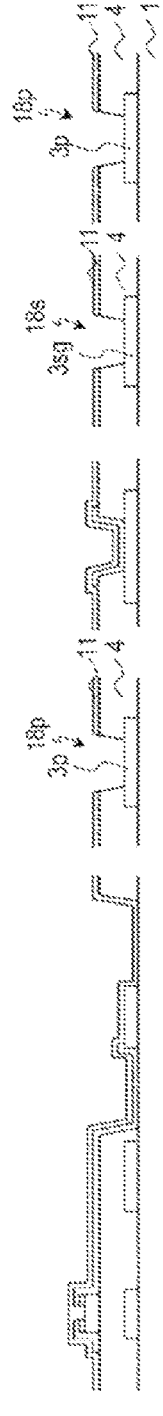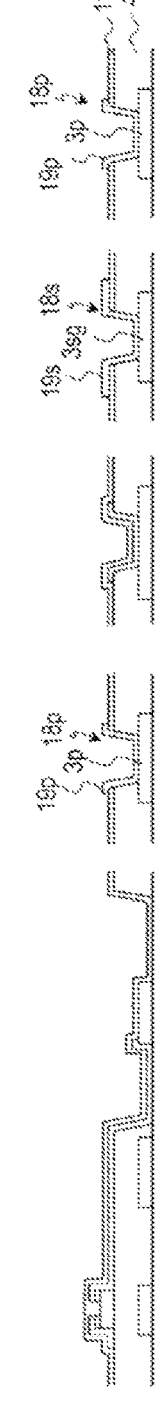
FIG. 24BG
FIG. 24BH
FIG. 24BI
FIG. 24BJ
FIG. 24BK

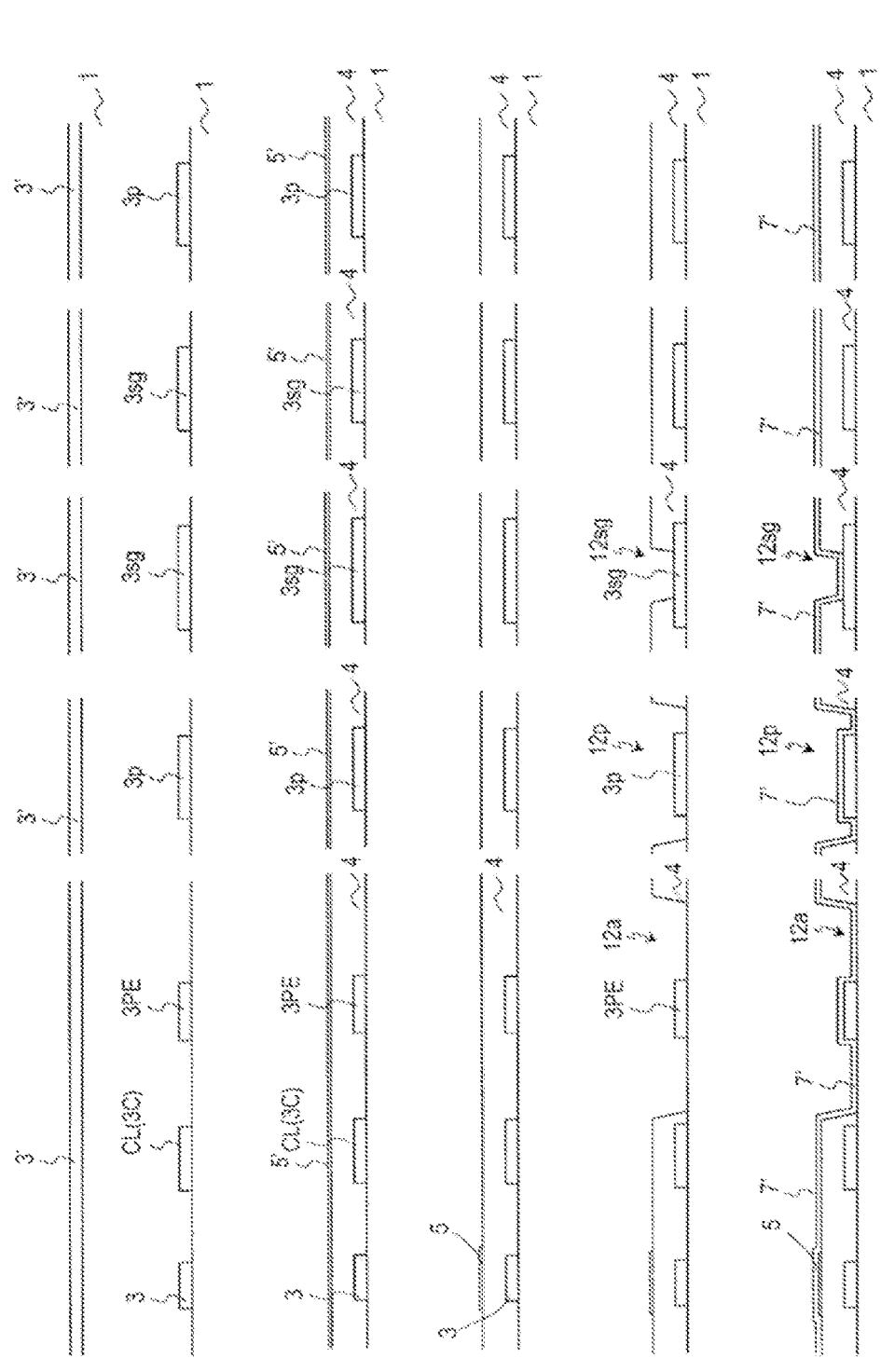

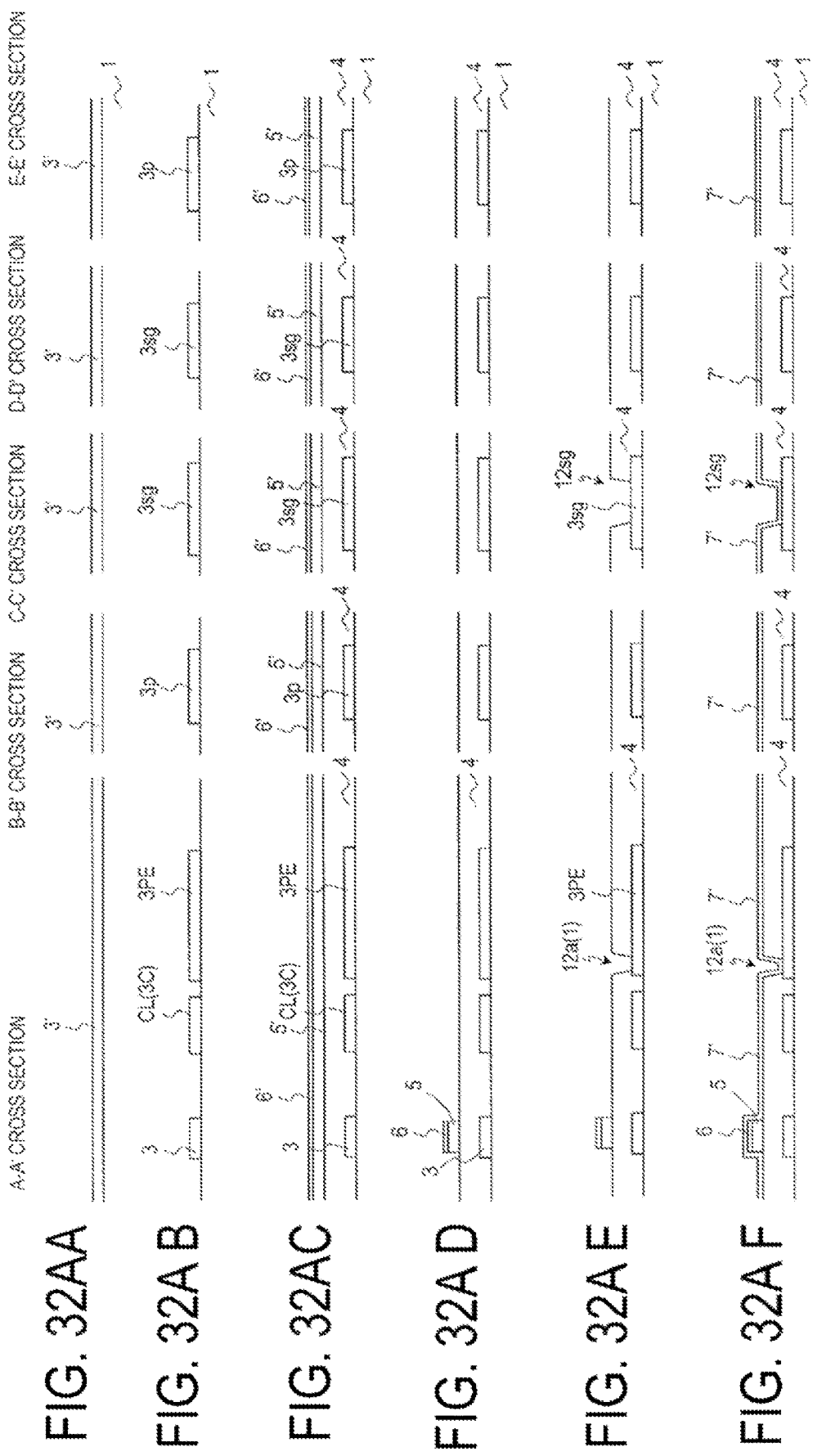

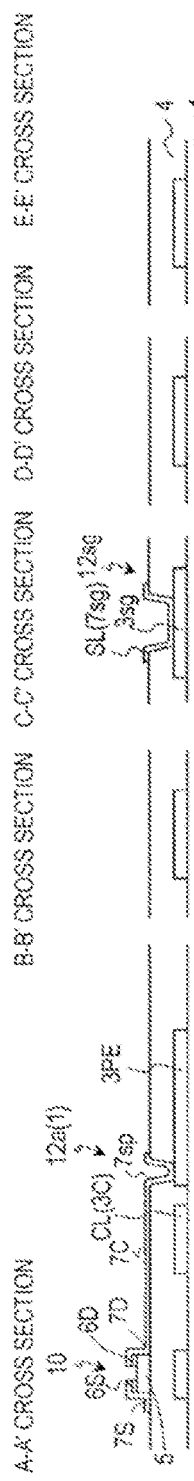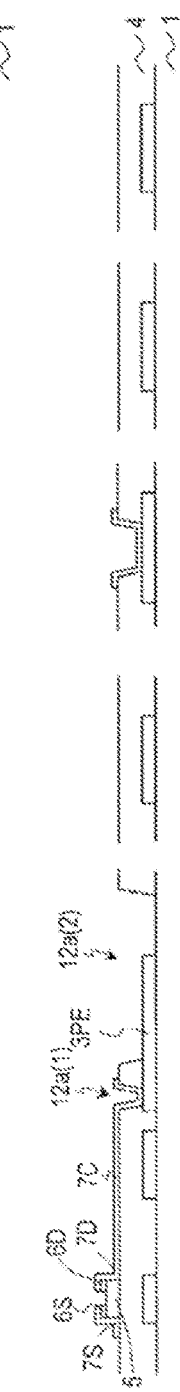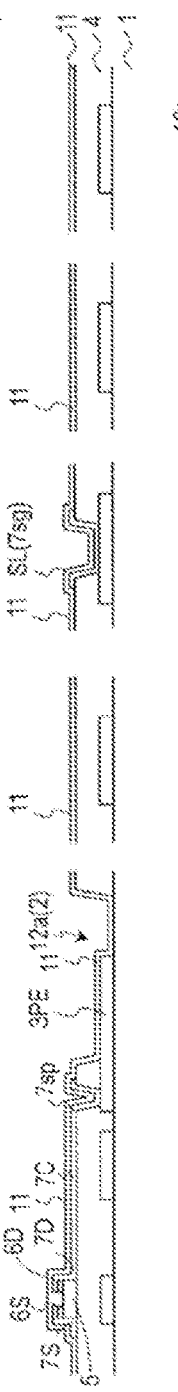
FIG. 32BG
FIG. 32BH
FIG. 32BI
FIG. 32BJ
FIG. 32BK
FIG. 32BL

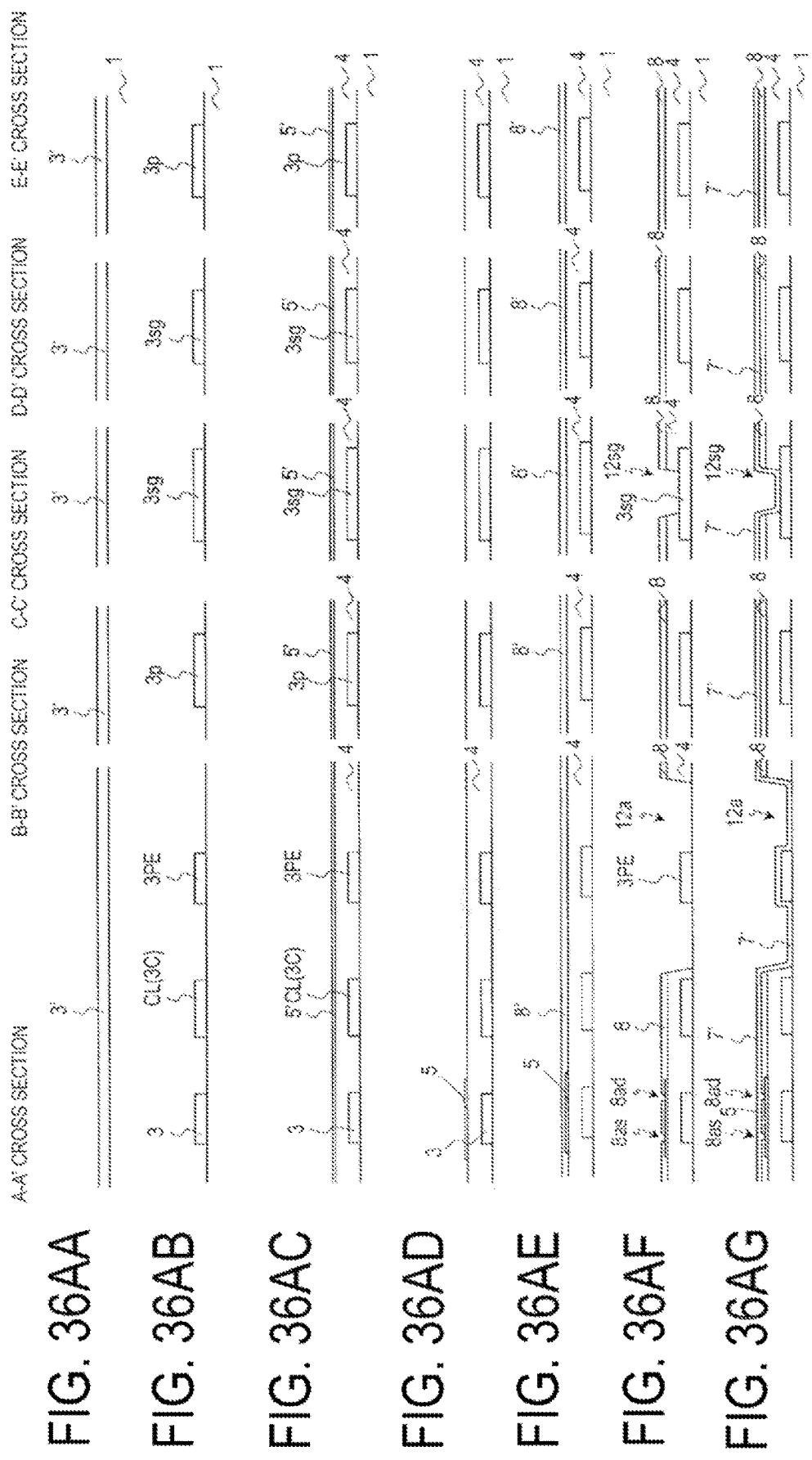

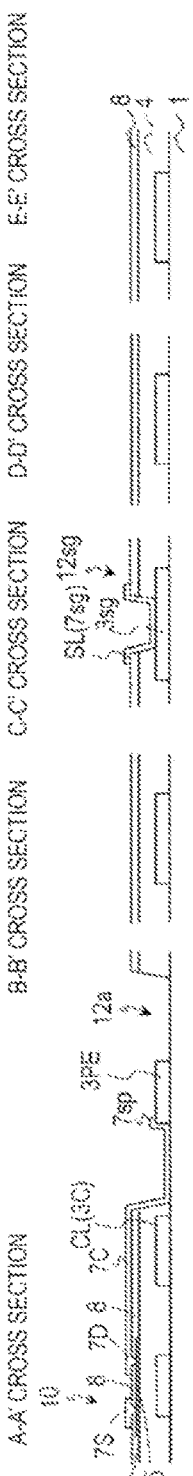
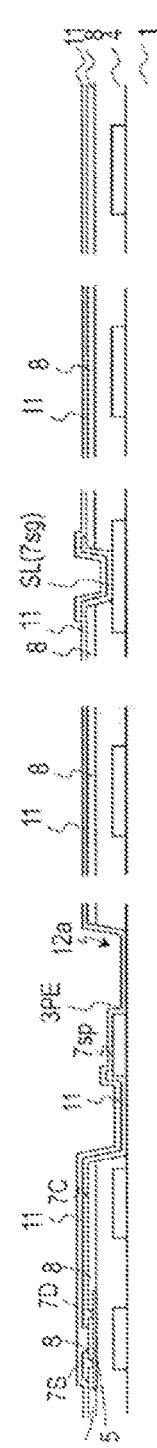
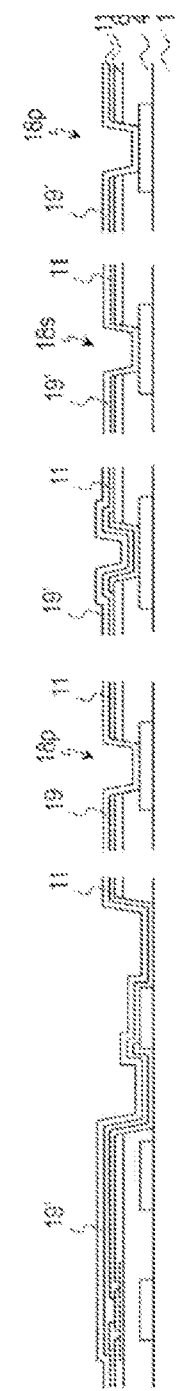
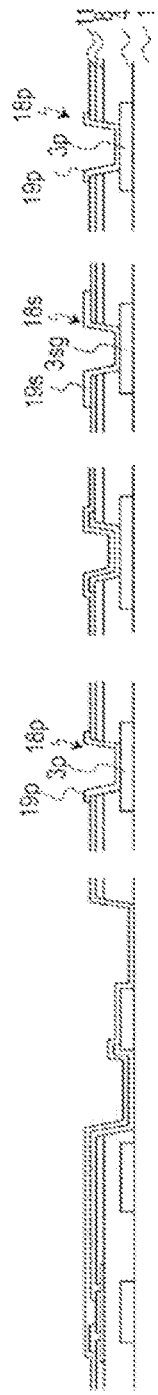
FIG. 36BH
FIG. 36BI
FIG. 36BJ
FIG. 36BK
FIG. 36BL

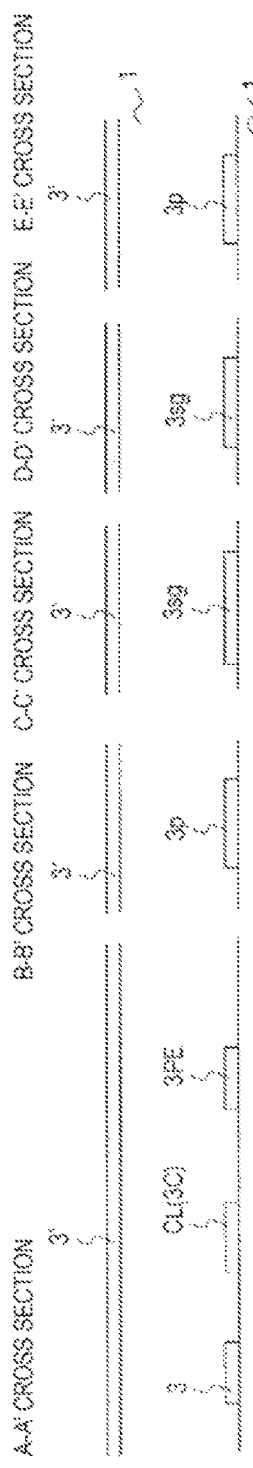
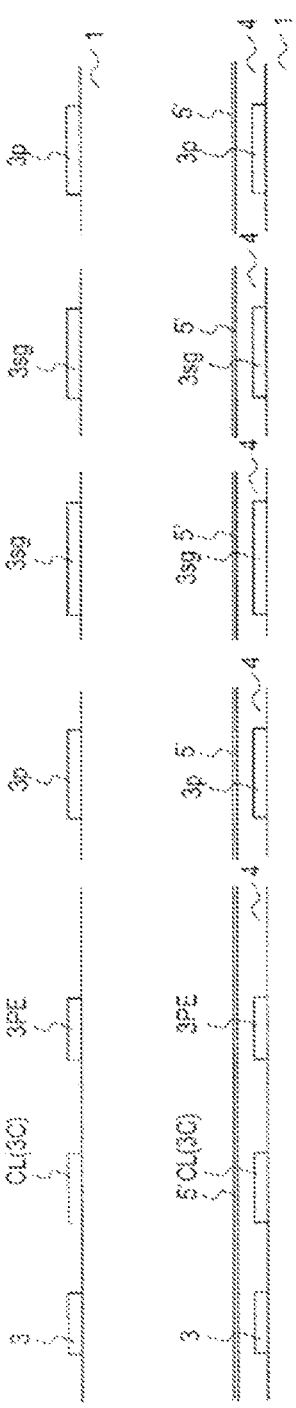
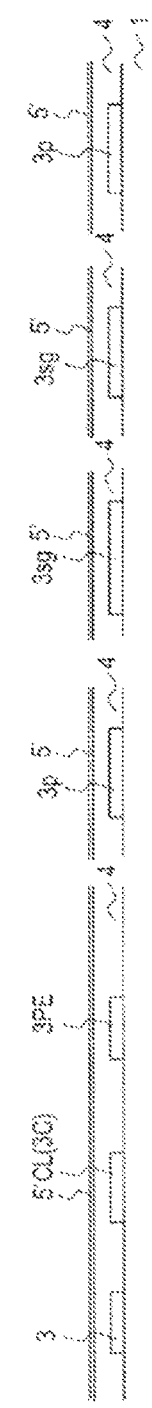
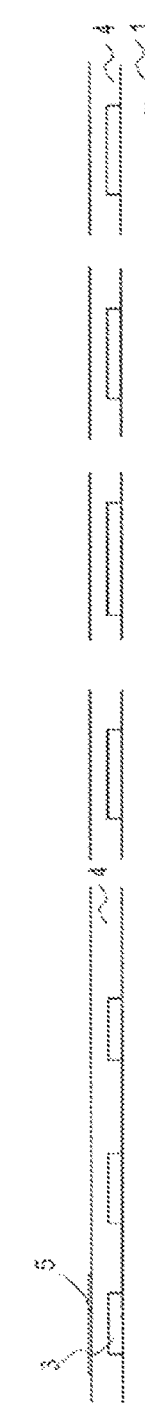
FIG. 40AA
FIG. 40AB
FIG. 40AC
FIG. 40AD
FIG. 40AE
FIG. 40AF
FIG. 40AG

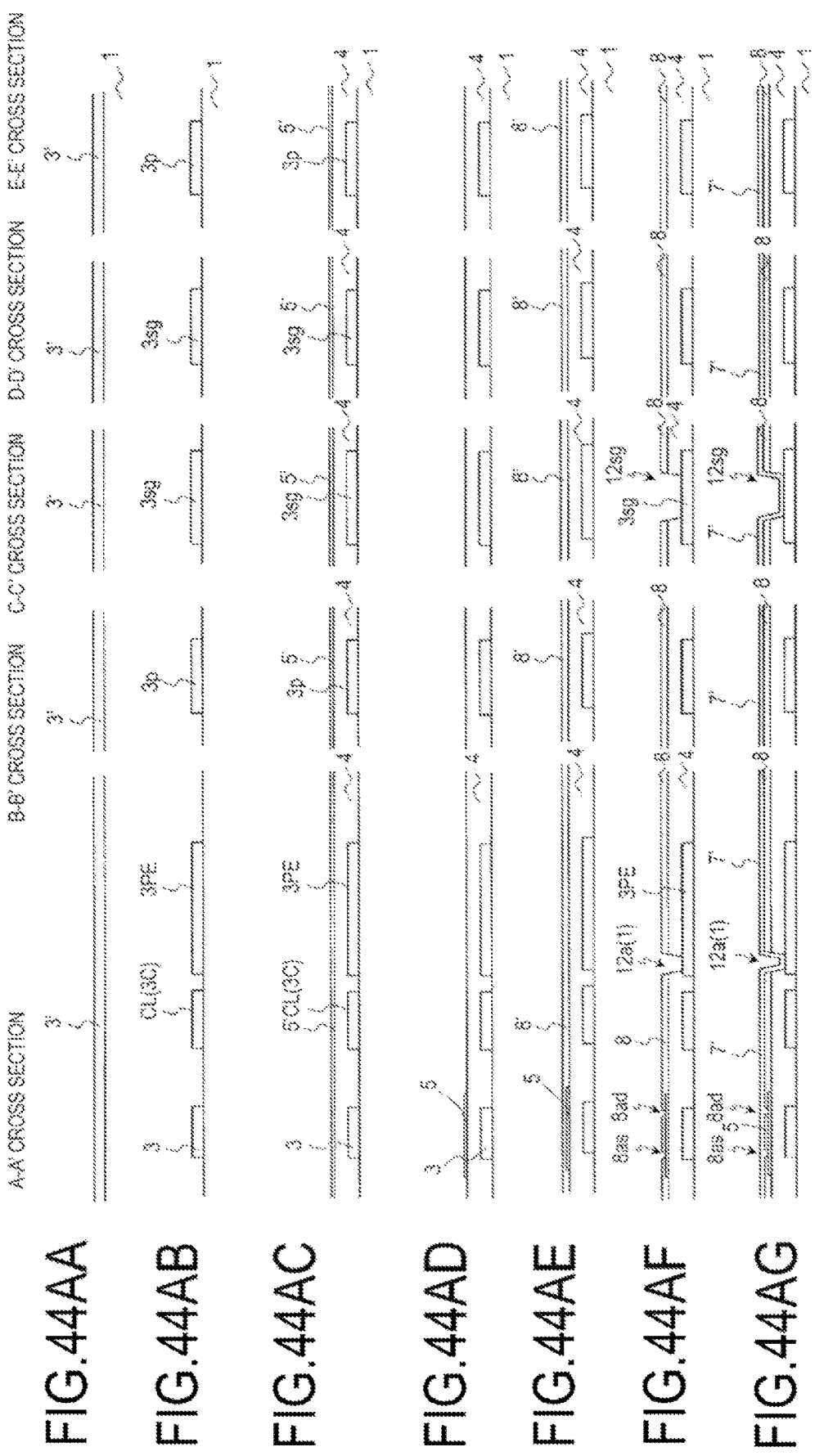

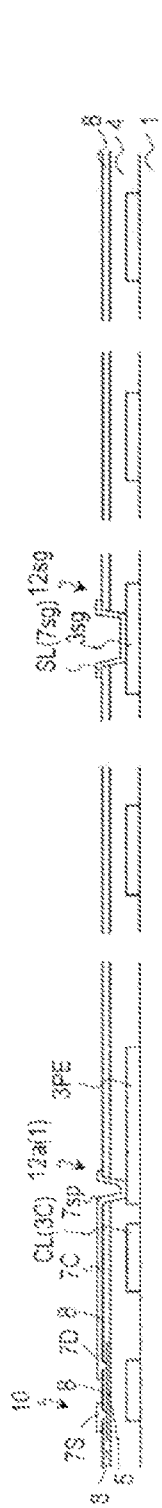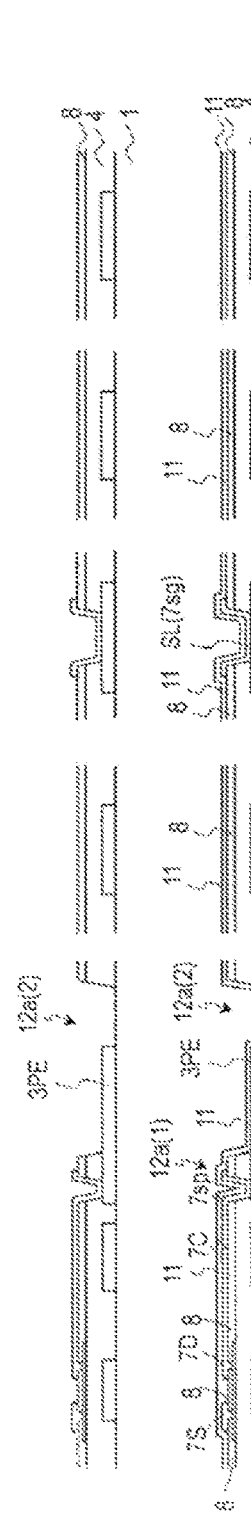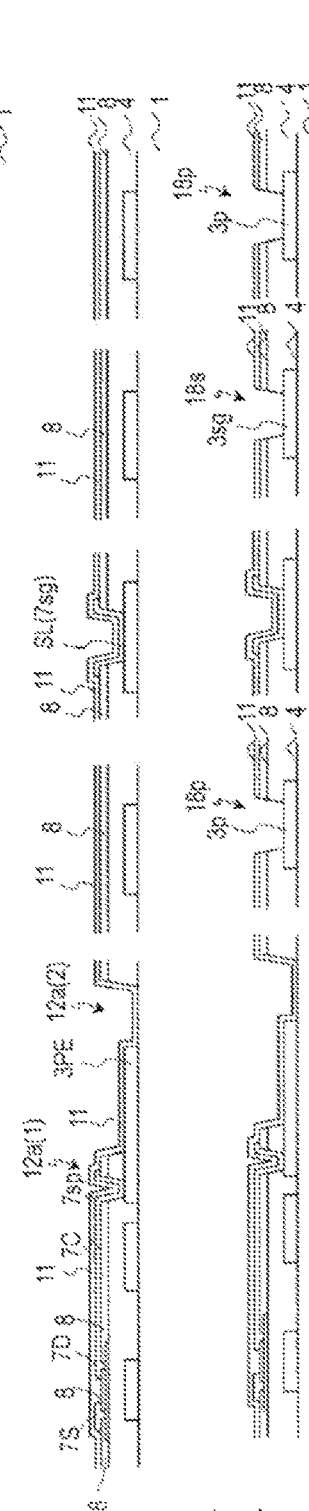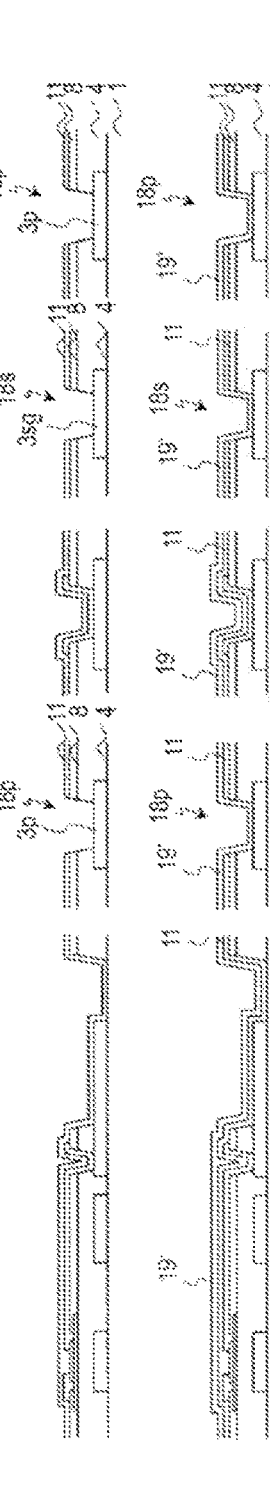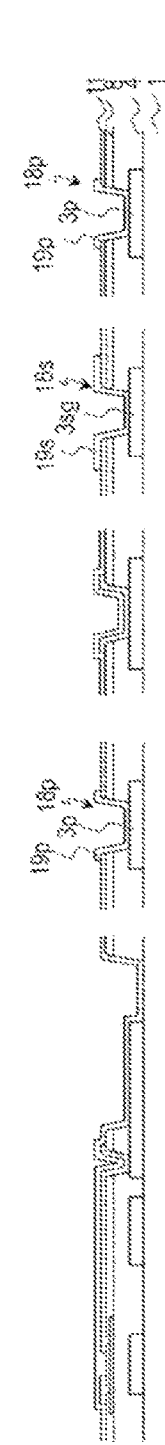
FIG. 44BH
FIG. 44BI
FIG. 44BJ
FIG. 44BK
FIG. 44BL
FIG. 44BM

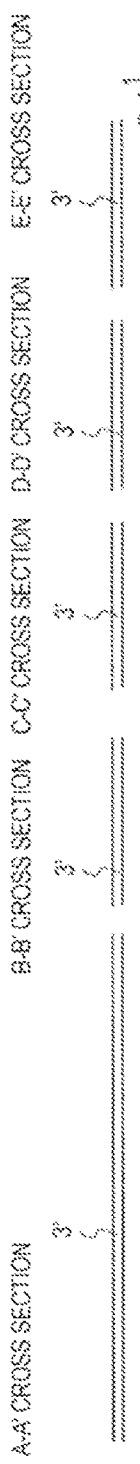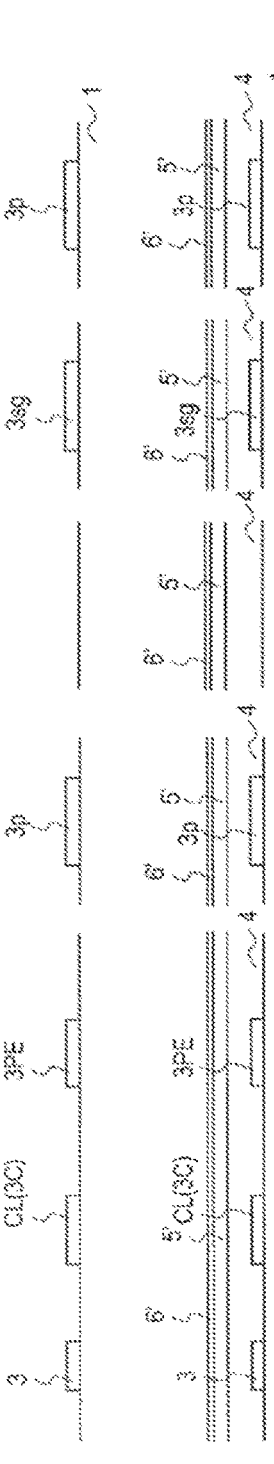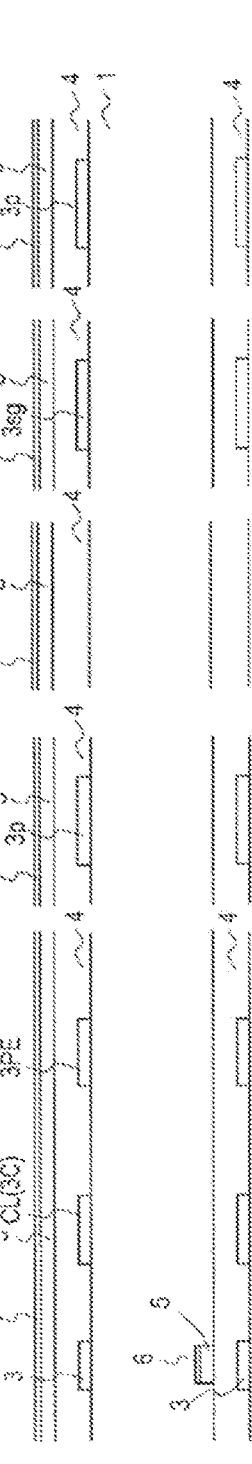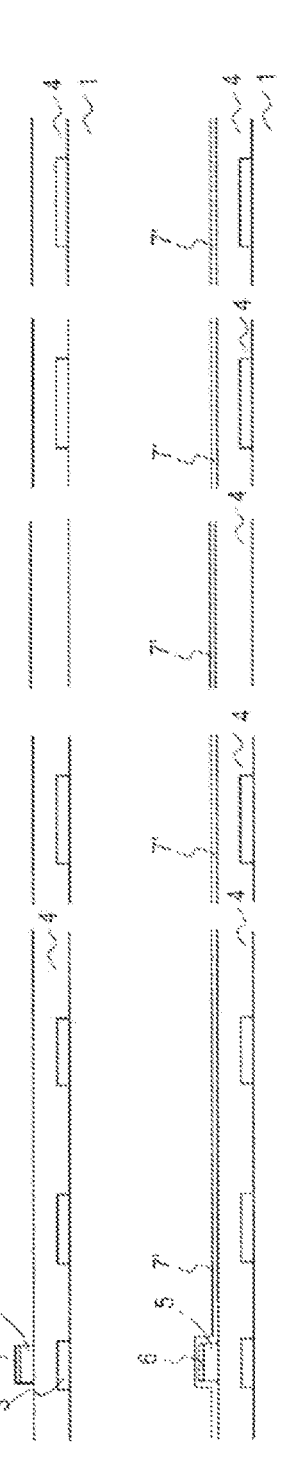

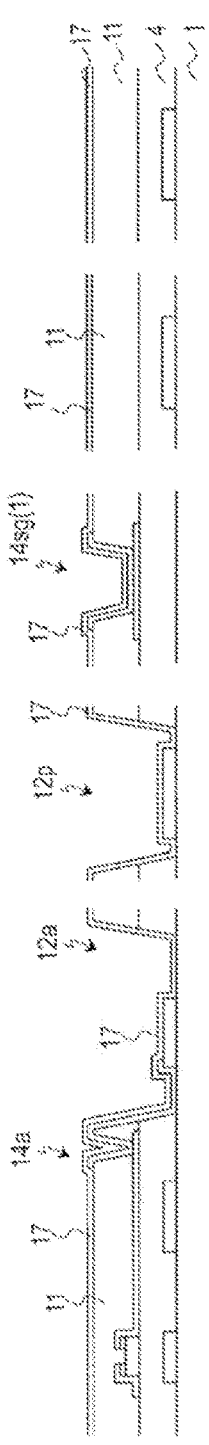
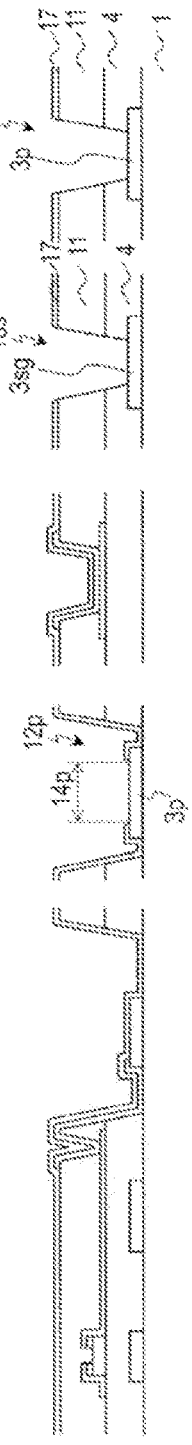
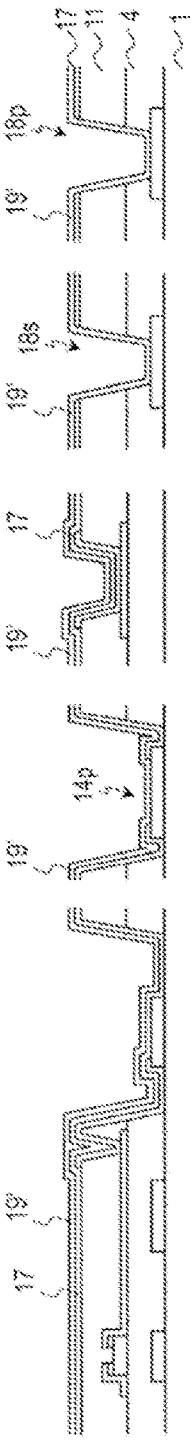
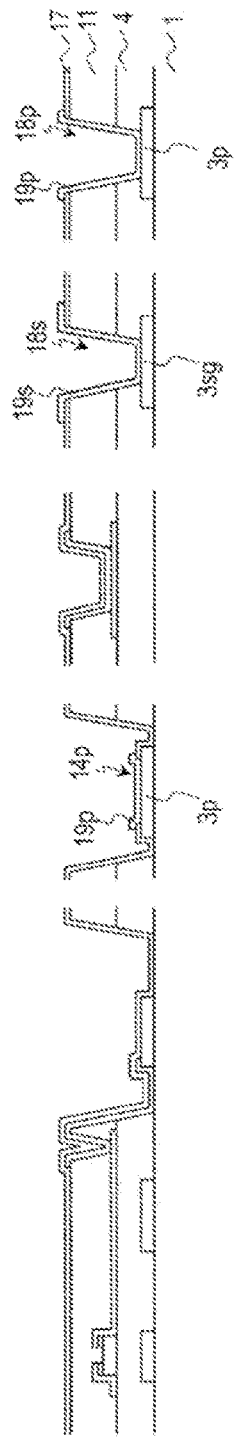
FIG. 48CK
FIG. 48CL
FIG. 48CM
FIG. 48CN

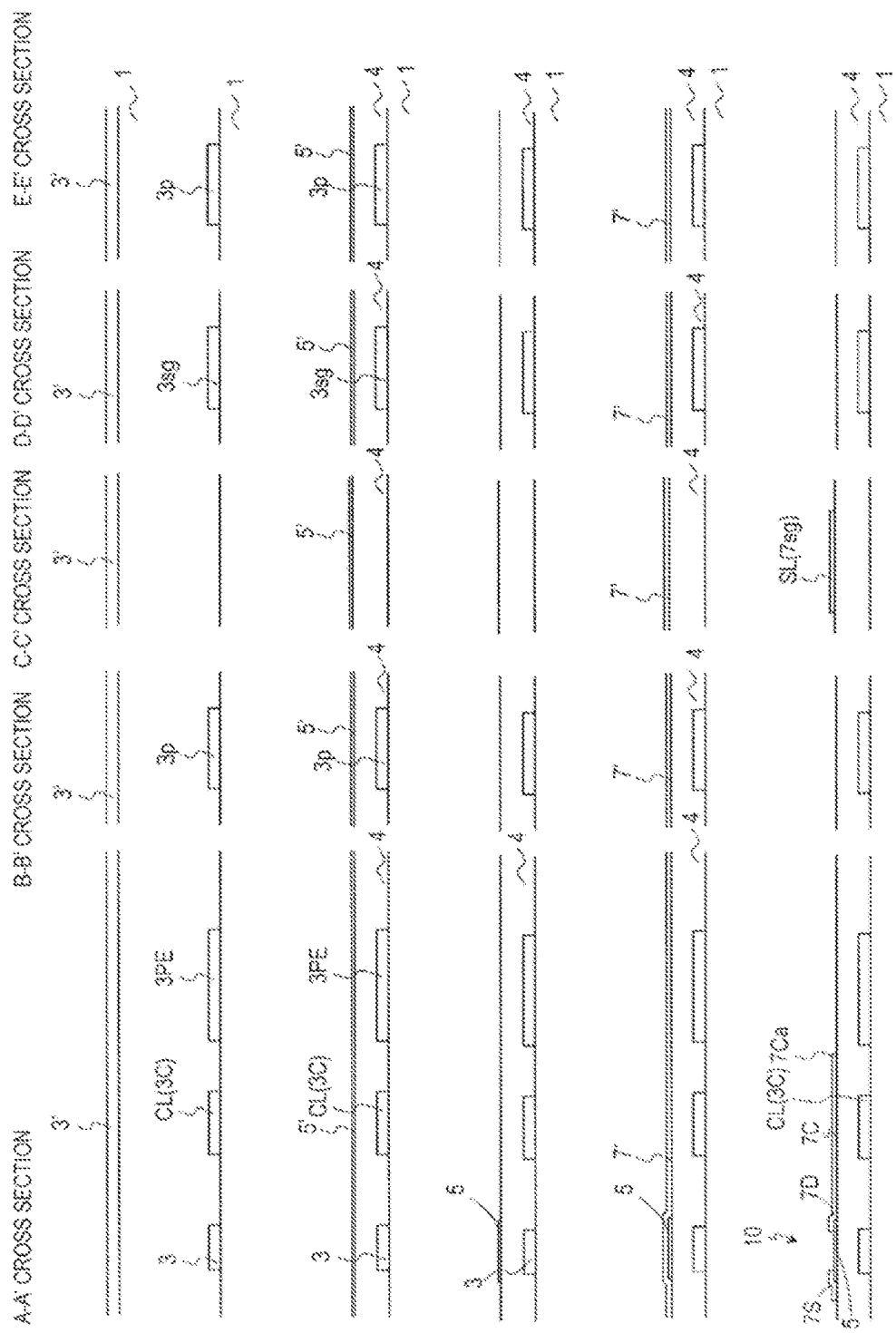

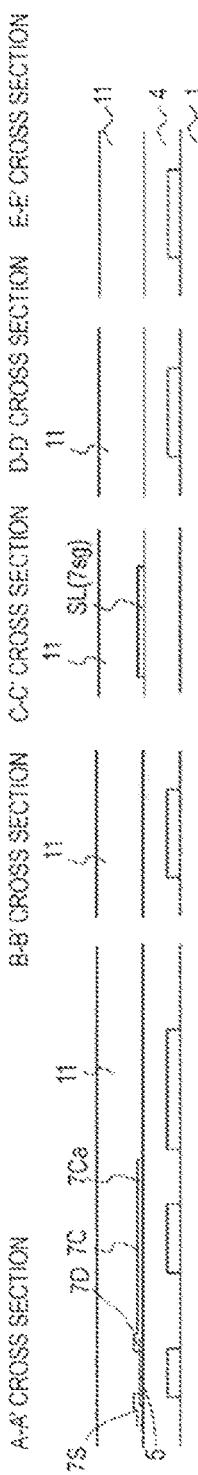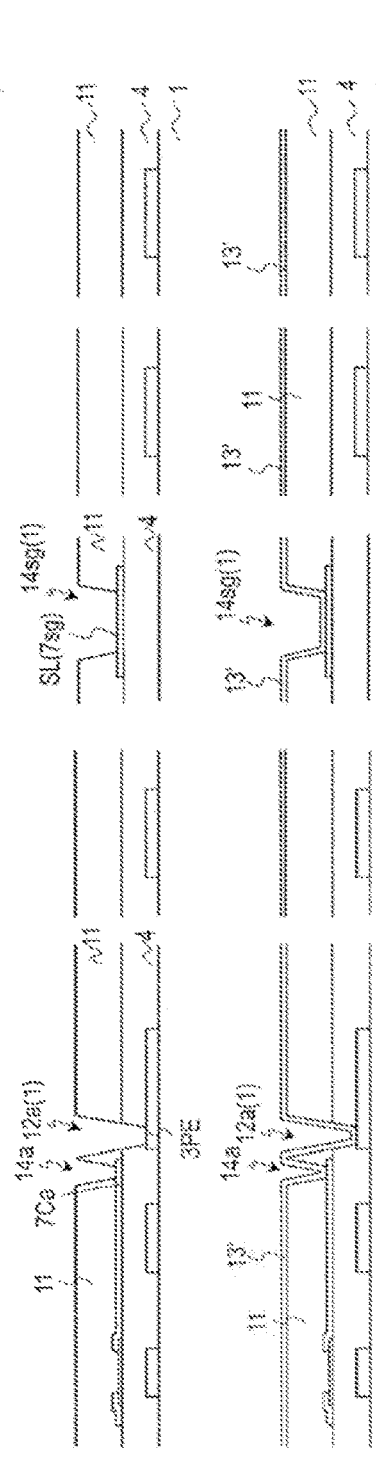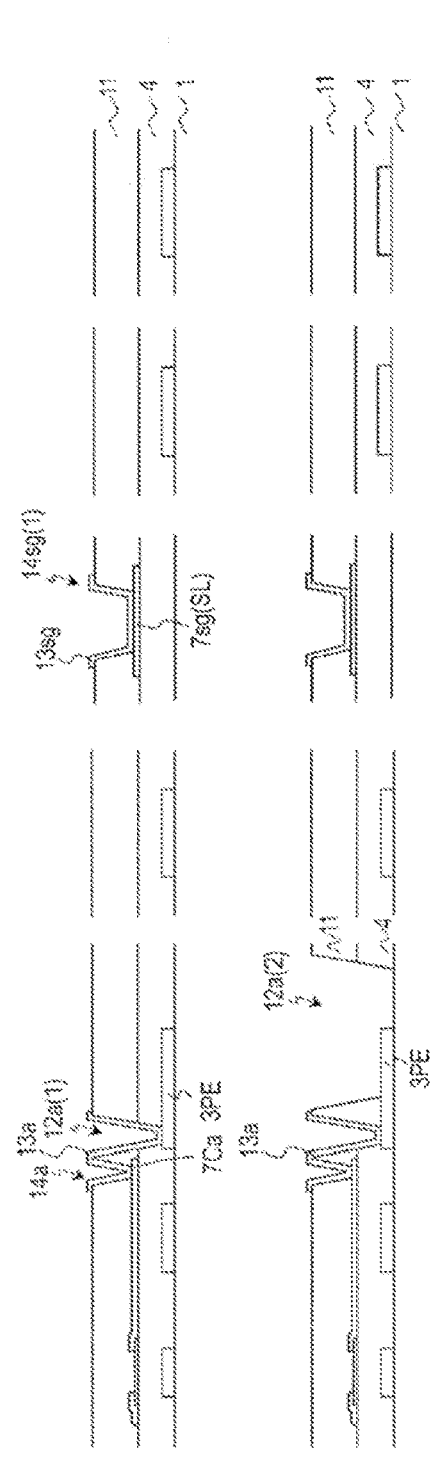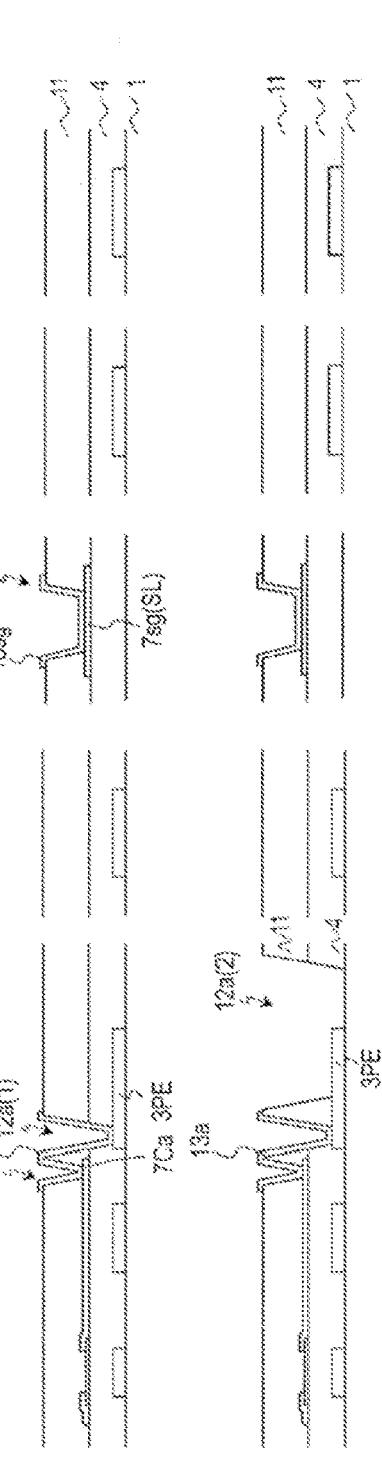
FIG. 52BG
FIG. 52BH
FIG. 52BI
FIG. 52BJ
FIG. 52BK

TFT SUBSTRATE, SCANNING ANTENNA PROVIDED WITH TFT SUBSTRATE, AND METHOD FOR PRODUCING TFT SUBSTRATE

TECHNICAL FIELD

The disclosure relates to a scanning antenna, and particularly to a scanning antenna (also referred to as a "liquid crystal array antenna") provided with an antenna unit (also referred to as an "element antenna") having a liquid crystal capacitance, a TFT substrate used in such a scanning antenna, and a method for manufacturing such a TFT substrate.

BACKGROUND ART

An antenna for mobile communication or satellite broadcasting requires a function to change a beam direction (referred to as "beam scanning" or "beam steering"). As the antenna having such a function (hereinafter referred to as a "scanned antenna"), a phased array antenna including antenna units is known. However, an existing phased array antenna is expensive and thus, has an obstacle for popularization as a consumer product. Particularly, as the number of antenna units increases, the cost rises considerably.

Therefore, a scanning antenna utilizing high dielectric anisotropy (birefringence) of a liquid crystal material (including nematic liquid crystal and polymer dispersed liquid crystal) has been proposed (PTL 1 to PTL 4 and NPL 1). Since a dielectric constant of a liquid crystal material has frequency dispersion, a dielectric constant in a frequency band for microwaves (may also be referred to as a "dielectric constant for microwaves") is particularly denoted herein by a "dielectric constant M ($\varepsilon$m)".

PTL 3 and NPL 1 each describe an inexpensive scanning antenna that can be obtained by utilizing liquid crystal display device (hereinafter referred to as "LCD") technology.

CITATION LIST

Patent Literature

PTL 1: JP 2007-116573 A
PTL 2: JP 2007-295044 A
PTL 3: JP 2009-538565 A
PTL 4: JP 2013-539949 A

Non Patent Literature

NPL 1: R. A. Stevenson et al., "Rethinking Wireless Communications: Advanced Antenna Design using LCD Technology", SID 2015 DIGEST, pp. 827-830.
NPL 2: M. ANDO et al., "A Radial Line Slot Antenna for 12 GHz Satellite TV Reception", IEEE Transactions of Antennas and Propagation, Vol. AP-33, No. 12, pp. 1347-1353 (1985).

SUMMARY

Technical Problem

As described above, although the idea of realizing an inexpensive scanning antenna by applying the LCD technology is known, there is no document specifically describing a structure, a manufacturing method, and a driving method of a scanning antenna utilizing the LCD technology.

Accordingly, an object of the disclosure is to provide a scanning antenna which can be mass-manufactured by utilizing the existing manufacturing techniques of LCDs, a TFT substrate used in such a scanning antenna, and a method for manufacturing such a TFT substrate.

Solution to Problem

A TFT substrate according to an embodiment of the disclosure includes a dielectric substrate, a plurality of antenna unit regions arranged on the dielectric substrate, a transmission and/or reception region provided with the plurality of antenna unit regions, and a non-transmission and/or reception region positioned in a region other than the transmission and/or reception region. The plurality of antenna unit regions are each provided with a TFT that is supported by the dielectric substrate and that includes a gate electrode, a semiconductor layer, a gate insulating layer formed between the gate electrode and the semiconductor layer, and a source electrode and a drain electrode electrically connected to the semiconductor layer; and a patch electrode electrically connected to the drain electrode of the TFT. The patch electrode is formed from the same conductive film as the gate electrode.

In an embodiment, the gate electrode and the patch electrode each have a thickness from 0.3 to 3 µm, inclusive.

In an embodiment, the source electrode and the drain electrode are disposed on the gate insulating layer.

In an embodiment, the plurality of antenna unit regions each include a patch electrode connection section extending from the drain electrode over the patch electrode, the gate insulating layer includes a first opening exposing the patch electrode, the patch electrode is on an inner side of the first opening when viewed from a normal direction of the dielectric substrate, and the patch electrode connection section is in contact with the patch electrode inside the first opening.

In an embodiment, the plurality of antenna unit regions each include a patch electrode connection section extending from the drain electrode over the patch electrode, the gate insulating layer includes a first opening that extends over the patch electrode and exposes a part of the patch electrode, and the patch electrode connection section is disposed inside the first opening.

In an embodiment, the gate insulating layer further includes a second opening exposing another part of the patch electrode.

In an embodiment, the TFT substrate further includes a transfer terminal section disposed in the non-transmission and/or reception region. The transfer terminal section includes a gate connection section formed from the same conductive film as the gate electrode, the gate insulating layer that extends over the gate connection section and includes a third opening exposing a part of the gate connection section, and a first conductive connection section disposed on the gate insulating layer and inside the third opening.

In an embodiment, the TFT substrate further includes a first insulating layer that covers the TFT, and a transfer terminal section disposed in the non-transmission and/or reception region. The transfer terminal section includes a gate connection section formed from the same conductive film as the gate electrode, a third opening of the gate insulating layer exposing the gate connection section, the first insulating layer that extends over the gate connection section, is in contact with the gate connection section inside the third opening, and includes a fourth opening exposing a part of the gate connection section, and a first conductive connection section disposed on the first insulating layer and inside the fourth opening.

In an embodiment, the TFT substrate further includes a first insulating layer that covers the TFT, and a first conductive connection section formed on the first insulating layer. The gate insulating layer and the first insulating layer include a first contact hole exposing the patch electrode, the patch electrode is on an inner side of the first contact hole when viewed from the normal direction of the dielectric substrate, the first insulating layer includes a first opening exposing a part of the drain electrode or a part of a section extending from the drain electrode, and the first conductive connection section is disposed inside the first opening and is in contact with the patch electrode inside the first contact hole.

In an embodiment, the TFT substrate further includes a first insulating layer that covers the TFT, and a first conductive connection section formed on the first insulating layer. The gate insulating layer and the first insulating layer include a first contact hole extending over the patch electrode and exposing a part of the patch electrode, the first insulating layer includes a first opening extending over the drain electrode or over a section extending from the drain electrode, and exposing the drain electrode or a part of a section extending from the drain electrode, and the first conductive connection section is disposed inside the first opening and inside the first contact hole.

In an embodiment, the gate insulating layer and the first insulating layer further include a second contact hole exposing another part of the patch electrode.

In an embodiment, the TFT substrate further includes a transfer terminal section disposed in the non-transmission and/or reception region. The transfer terminal section includes a gate connection section formed from the same conductive film as the gate electrode, the gate insulating layer and the first insulating layer that include a third contact hole extending over the gate connection section and exposing a part of the gate connection section, and a second conductive connection section disposed on the first insulating layer and inside the third contact hole.

In an embodiment, the TFT substrate further includes a second insulating layer formed on the first insulating layer, and a transfer terminal section disposed in the non-transmission and/or reception region. The transfer terminal section includes a gate connection section formed from the same conductive film as the gate electrode, a third contact hole formed in the gate insulating layer and the first insulating layer and exposing the gate connection section, the second insulating layer that extends on the gate connection section, is in contact with the gate connection section inside the third contact hole, and includes a second opening exposing a part of the gate connection section, and a second conductive connection section disposed on the second insulating layer and inside the second opening.

A scanning antenna according to an embodiment of the disclosure includes any one of the TFT substrates described above, a slot substrate disposed facing the TFT substrate, a liquid crystal layer provided between the TFT substrate and the slot substrate, and a reflecting conductive plate disposed facing a surface of the slot substrate on a side opposite the liquid crystal layer via a dielectric layer. The slot substrate includes another dielectric substrate, and a slot electrode formed on a surface of the other dielectric substrate on the liquid crystal layer side. The slot electrode includes a plurality of slots. The plurality of slots are disposed correspondingly with the patch electrodes of the plurality of antenna unit regions of the TFT substrate.

A method for manufacturing a TFT substrate according to an embodiment of the disclosure is a method for manufacturing a TFT substrate including a transmission and/or reception region including a plurality of antenna unit regions, and a non-transmission and/or reception region positioned in a region other than the transmission and/or reception region, each of the plurality of antenna unit regions being provided with a TFT and a patch electrode. The manufacturing method includes the steps of (a) forming a gate conductive film on a dielectric substrate, and forming a plurality of gate bus lines, a gate electrode of the TFT, and the patch electrode by patterning the gate conductive film, (b) forming a gate insulating layer that covers the plurality of gate bus lines, the gate electrode, and the patch electrode, (c) forming a semiconductor layer of the TFT on the gate insulating layer, and (d) forming a first opening in the gate insulating layer, exposing at least a part of the patch electrode.

In an embodiment, the manufacturing method further includes a step of (e) forming a source conductive film on the semiconductor layer, on the gate insulating layer, and inside the first opening, and forming a plurality of source bus lines, a source electrode and a drain electrode connected to the semiconductor layer, and a first section that extends from the drain electrode and is in contact with the patch electrode inside the first opening, after the steps (c) and (d) described above.

In an embodiment, the TFT substrate further includes a transfer terminal section in the non-transmission and/or reception region, the step (a) includes a step of forming a gate connection section in the non-transmission and/or reception region by patterning the gate conductive film, the step (b) includes a step of forming the gate insulating layer that covers the plurality of gate bus lines, the gate electrode, the patch electrode, and the gate connection section, and the manufacturing method further includes a step of forming a second opening in the gate insulating layer, exposing a part of the gate connection section.

In an embodiment, the TFT substrate further includes a transfer terminal section in the non-transmission and/or reception region, the step (a) includes a step of forming a gate connection section in the non-transmission and/or reception region by patterning the gate conductive film, the step (b) includes a step of forming the gate insulating layer that covers the plurality of gate bus lines, the gate electrode, the patch electrode, and the gate connection section, the step (d) includes a step of forming a second opening in the gate insulating layer, exposing the gate connection section, and the manufacturing method further includes a step of forming a first insulating layer on the gate insulating layer and inside the second opening, and forming a third opening in the first insulating layer, exposing a part of the gate connection section, after the step (d).

In an embodiment, the manufacturing method further includes the steps of (e) forming a source conductive film on the semiconductor layer and the gate insulating layer, and forming a plurality of source bus lines, a source electrode and a drain electrode connected to the semiconductor layer, and a second section extending from the drain electrode by patterning the source conductive film, and (f) forming a first insulating layer that covers the TFT, after the step (c) and before the step (d). The step (d) further includes a step of etching the gate insulating layer and the first insulating layer at once, thereby forming a first contact hole in the gate insulating layer and the first insulating layer, exposing at least a part of the patch electrode, and forming a second opening in the first insulating layer, exposing a part of the drain electrode or a part of the second section.

In an embodiment, the manufacturing method further includes the step of forming a connection section conductive film on the first insulating layer, inside the first contact hole, and inside the second opening, and forming a conductive connection section that is in contact with the patch electrode inside the first contact hole and in contact with a part of the drain electrode or a part of the second section inside the second opening, by patterning the connection section conductive film, after the step (d).

In an embodiment, the TFT substrate further includes a transfer terminal section in the non-transmission and/or reception region, the step (a) includes a step of forming a gate connection section in the non-transmission and/or reception region by patterning the gate conductive film, the step (b) includes a step of forming the gate insulating layer that covers the plurality of gate bus lines, the gate electrode, the patch electrode, and the gate connection section, the step (f) includes a step of forming the first insulating layer that covers the TFT and the gate connection section, and the manufacturing method further includes a step of forming a second contact hole in the gate insulating layer and the first insulating layer, exposing a part of the gate connection section.

In an embodiment, the TFT substrate further includes a transfer terminal section in the non-transmission and/or reception region, the step (a) includes a step of forming a gate connection section in the non-transmission and/or reception region by patterning the gate conductive film, the step (b) includes a step of forming the gate insulating layer that covers the plurality of gate bus lines, the gate electrode, the patch electrode, and the gate connection section, the step (f) includes a step of forming a first insulating layer that covers the TFT and the gate connection section, the step (d) includes a step of forming a second contact hole in the gate insulating layer and the first insulating layer, exposing the gate connection section, and the manufacturing method further includes a step of forming a second insulating layer on the first insulating layer and inside the second contact hole, and forming a third opening in the second insulating layer, exposing a part of the gate connection section, after the step (d).

Advantageous Effects of Disclosure

According to an embodiment of the disclosure, there are provided a scanning antenna which can be mass-manufactured by utilizing the existing manufacturing techniques of LCDs, a TFT substrate used in such a scanning antenna, and a method for manufacturing such a TFT substrate.

BRIEF DESCRIPTION OF DRAWINGS

FIG. 18A to FIG. 18C, and FIG. 18E to FIG. 18G are each a view illustrating an example of a waveform of each signal used for driving the scanning antenna according to an embodiment, and FIG. 18D is a view illustrating a waveform of a display signal of an LCD panel in which dot inversion driving is performed.

FIG. 20A to FIG. 20E are each a view illustrating yet another example of a waveform of each signal used for driving the scanning antenna according to an embodiment.

FIG. 24AA to FIG. 24AF are each a process cross-sectional view illustrating an example of a manufacturing method of the TFT substrate 105.

FIG. 24BG to FIG. 24BK are each a process cross-sectional view illustrating an example of a manufacturing method of the TFT substrate 105.

FIG. 28AA to FIG. 28AF are each a process cross-sectional view illustrating an example of a manufacturing method of the TFT substrate 105*a*.

FIG. 32AA to FIG. 32AF are each a process cross-sectional view illustrating an example of a manufacturing method of the TFT substrate 105*b*.

FIG. 32BG to FIG. 32BL are each a process cross-sectional view illustrating an example of a manufacturing method of the TFT substrate 105*b*.

FIG. 36AA to FIG. 36AG are each a process cross-sectional view illustrating an example of a manufacturing method of the TFT substrate 106.

FIG. 36BH to FIG. 36BL are each a process cross-sectional view illustrating an example of a manufacturing method of the TFT substrate 106.

FIG. 40AA to FIG. 40AG are each a schematic cross-sectional view of an example of a manufacturing method of the TFT substrate 106*a*.

FIG. 44AA to FIG. 44AG are each a process cross-sectional view illustrating an example of a manufacturing method of the TFT substrate 106*b*.

FIG. 44BH to 44BM are each a process cross-sectional view illustrating an example of a manufacturing method of the TFT substrate 106*b*.

FIG. 48AA to FIG. 48AF are each a process cross-sectional view illustrating an example of a manufacturing method of the TFT substrate 107.

FIG. 48CK to FIG. 48CN are each a process cross-sectional view illustrating an example of a manufacturing method of the TFT substrate 107.

FIG. 52AA to FIG. 52AF are each a process cross-sectional view illustrating an example of a manufacturing method of the TFT substrate 107*a*.

FIG. 52BG to FIG. 52BK are each a process cross-sectional view illustrating an example of a manufacturing method of the TFT substrate 107*a*.

DESCRIPTION OF EMBODIMENTS

Hereinafter, a scanning antenna and a manufacturing method of the same according to an embodiment of the disclosure will be described with reference to the drawings. In the following description, first, a structure of a known TFT-type LCD (hereinafter referred to as a "TFT-LCD") and a manufacturing method of the TFT-LCD will be described. However, the description of matters well-known within the technical field of LCDs may be omitted. As for basic TFT-LCD technology, refer to, for example, Liquid Crystals, Applications and Uses, Vol. 1-3 (Editor: Birenda Bahadur, Publisher: World Scientific Pub Co Inc), or the like. The entire contents of the disclosures of the above documents are incorporated herein by reference.

The structure and operation of a typical transmissive TFT-LCD (hereinafter simply referred to as an "LCD") 900 will be described with reference to FIG. 53A and FIG. 53B. Here, the LCD 900 having a vertical electric field mode (for example, a Twisted Nematic (TN) mode or a vertical alignment mode) in which a voltage is applied in a thickness direction of a liquid crystal layer will be described as an example. A frame frequency (typically twice a polarity inversion frequency) of a voltage applied to liquid crystal capacitance of the LCD is 240 Hz even at quad speed driving, and a dielectric constant c of the liquid crystal layer serving as a dielectric layer of the liquid crystal capacitance of the LCD is different from the dielectric constant M (CM) for microwaves (for example, satellite broadcasting, a Ku band (from 12 to 18 GHz), a K band (from 18 to 26 GHz), and a Ka band (from 26 to 40 GHz)).

Figure 53A:
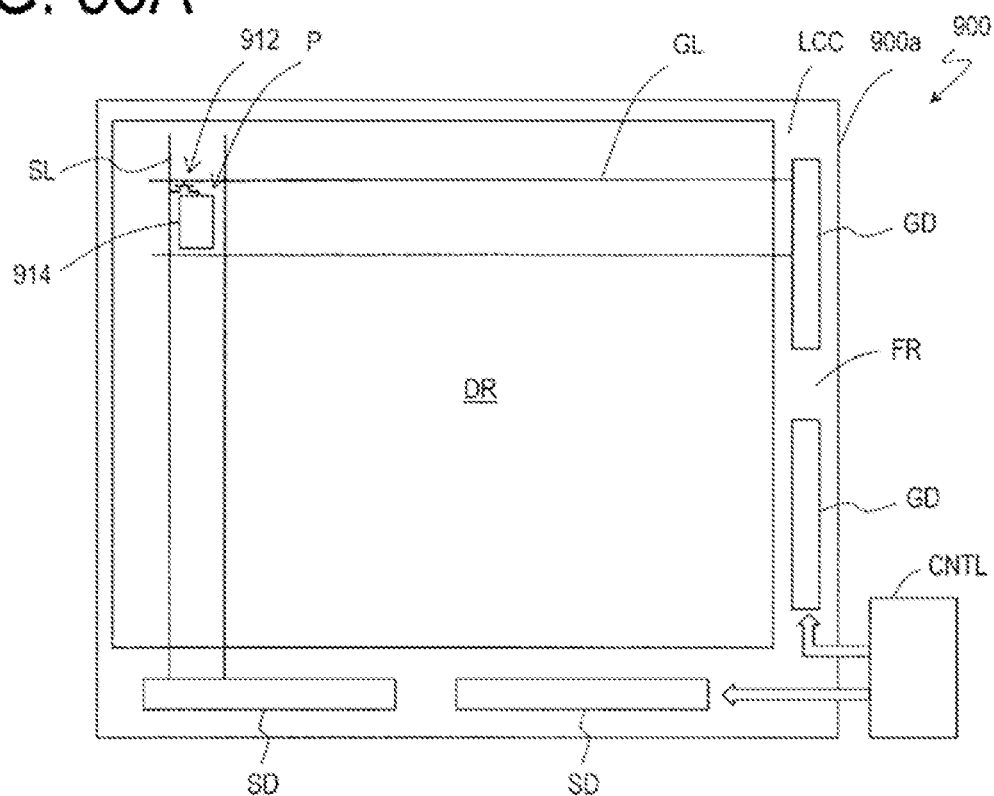
FIG. 53A is a schematic view illustrating a structure of an existing LCD 900.

As is schematically illustrated in FIG. 53A, the transmissive LCD 900 includes a liquid crystal display panel 900a, a control circuit CNTL, a backlight (not illustrated), a power supply circuit (not illustrated), and the like. The liquid crystal display panel 900a includes a liquid crystal display cell LCC and a driving circuit including a gate driver GD and a source driver SD. The driving circuit may be, for example, mounted on a TFT substrate 910 of the liquid crystal display cell LCC, or all or a part of the driving circuit may be integrated (monolithic integration) with the TFT substrate 910.

Figure 53B:
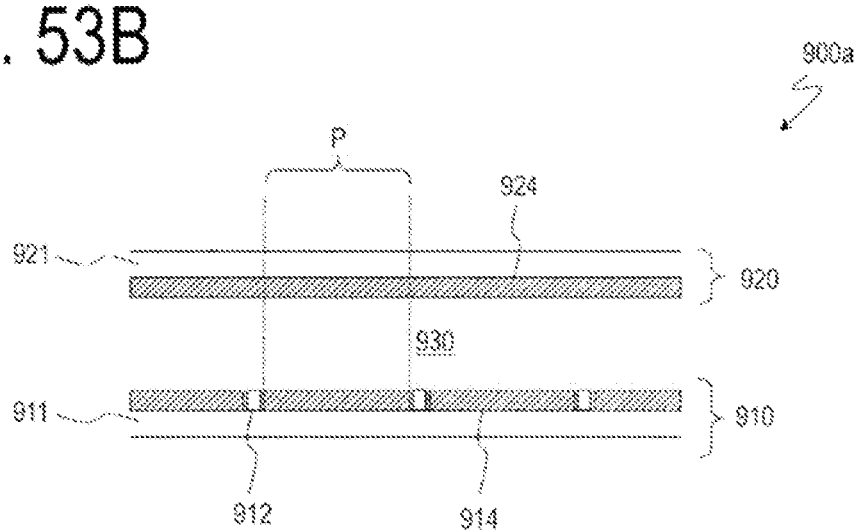
FIG. 53B is a schematic cross-sectional view of an LCD panel 900*a*.

FIG. 53B illustrates a schematic cross-sectional view of the liquid crystal display panel (hereinafter referred to as an "LCD panel") 900a included in the LCD 900. The LCD panel 900a includes the TFT substrate 910, a counter substrate 920, and a liquid crystal layer 930 provided between the TFT substrate 910 and the counter substrate 920. The TFT substrate 910 and the counter substrate 920 include transparent substrates 911 and 921 such as glass substrates, respectively. In addition to glass substrates, plastic substrates may also be used as the transparent substrates 911 and 921. The plastic substrates are formed of, for example, a transparent resin (for example, polyester) and glass fiber (for example, nonwoven fabric).

A display region DR of the LCD panel 900a includes pixels P arranged in a matrix shape. A frame region FR not contributing to display is formed around the display region DR. A liquid crystal material is sealed in the display region DR by a sealing portion (not illustrated) formed to surround the display region DR. The sealing portion is formed by curing a sealing member including, for example, an ultraviolet curable resin and a spacer (for example, resin beads or silica beads), and bonds and fixes the TFT substrate 910 and the counter substrate 920 to each other. The spacer in the sealing member controls a gap between the TFT substrate 910 and the counter substrate 920, that is, a thickness of the liquid crystal layer 930, to be constant. To suppress an in-plane variation in the thickness of the liquid crystal layer 930, a columnar spacer is formed on a light blocking portion (for example, on a wiring line) in the display region DR by using an ultraviolet curable resin. In recent years, as seen in an LCD panel for a liquid crystal television and a smart phone, a width of the frame region FR not contributing to display is very reduced.

In the TFT substrate 910, a TFT 912, a gate bus line (scanning line) GL, a source bus line (display signal line) SL, a pixel electrode 914, an auxiliary capacitance electrode (not illustrated), and a CS bus line (auxiliary capacity line) (not illustrated) are formed on the transparent substrate 911. The CS bus line is provided parallel to the gate bus line. Alternatively, the gate bus line of the next stage may be used as the CS bus line (CS on-gate structure).

The pixel electrode 914 is covered with an alignment film (for example, a polyimide film) configured to control liquid crystal alignment. The alignment film is provided to come into contact with the liquid crystal layer 930. The TFT substrate 910 is often disposed on the backlight side (the side opposite to the viewer side).

The counter substrate 920 is often disposed on the viewer side of the liquid crystal layer 930. The counter substrate 920 includes a color filter layer (not illustrated), a counter electrode 924, and an alignment film (not illustrated) on the transparent substrate 921. Since the counter electrode 924 is provided in common to a plurality of the pixels P constituting the display region DR, the counter electrode 924 is also referred to as a common electrode. The color filter layer includes a color filter (for example, a red filter, a green filter, and a blue filter) provided for each pixel P, and a black matrix (light shielding layer) configured to block light unnecessary for display. The black matrix is disposed, for example, to block light between the pixels P in the display region DR and to block light at the frame region FR.

The pixel electrode 914 of the TFT substrate 910, the counter electrode 924 of the counter substrate 920, and the liquid crystal layer 930 disposed between the pixel electrode 914 and the counter electrode 924 constitute liquid crystal capacitance Clc. Individual liquid crystal capacitance correspond to a pixel. To retain a voltage applied to the liquid crystal capacitance Clc (to increase a so-called voltage retention rate), auxiliary capacitance CS electrically connected in parallel to the liquid crystal capacitance Clc is formed. The auxiliary capacitance CS typically includes an electrode having the same potential as a potential of the pixel electrode 914, an inorganic insulating layer (for example, a gate insulating layer ($SiO_2$ layer)), and an auxiliary capacitance electrode connected to the CS bus line. Typically, the same common voltage as a voltage of the counter electrode 924 is supplied from the CS bus line.

Factors responsible for lowering a voltage (effective voltage) applied to the liquid crystal capacitance Clc are (1) a factor based on a CR time constant which is a product of a capacitance value Ccie of the liquid crystal capacitance Clc and a resistance value R, and (2) interfacial polarization due to an ionic impurity incorporated in the liquid crystal material and/or orientation polarization of liquid crystal molecules. Among these, contribution of the CR time constant of the liquid crystal capacitance Clc is large, and the CR time constant can be increased by providing the auxiliary capacitance CS electrically connected in parallel to the liquid crystal capacitance Clc. Note that a volume resistivity of the liquid crystal layer 930 serving as the dielectric layer of the liquid crystal capacitance Clc exceeds the order of $10^{12}$ Ω·cm in the case of a nematic liquid crystal material widely used.

A display signal supplied to the pixel electrode 914 is a display signal supplied to the source bus line SL connected to the TFT 912 when the TFT 912 selected by a scanning signal supplied from the gate driver GD to the gate bus line GL is turned on. Accordingly, TFTs 912 connected to a certain gate bus line GL are simultaneously turned on, and at that time, a corresponding display signal is supplied from the source bus line SL connected to the TFT 912 of each of the pixels P in that row. This action is sequentially performed from a first row (for example, an uppermost row of a display surface) to an mth row (for example, a lowermost row of the display surface) and thus, one image (frame) is written and displayed in the display region DR including m rows of the pixels. Assuming that the pixels P are arranged in a matrix shape of m rows and n columns, at least one source bus line SL is provided corresponding to each pixel column, and at least n source bus lines SL are provided in total.

Such scanning is referred to as line-sequential scanning, time after one pixel row is selected until the next pixel row is selected is referred to as a horizontal scan period, (1H), and time after a certain row is selected until the certain row is again selected is referred to as a vertical scanning period (1V) or a frame. Note that, in general, 1V (or 1 frame) is obtained by adding a blanking period to a period m·H in which all the m pixel rows are selected.

For example, when an input video signal is an NTSC signal, IV (=1 frame) of an existing LCD panel is ¹⁄₆₀ seconds (16.7 milliseconds). The NTSC signals are interlaced signals, the frame frequency is 30 Hz, and the field frequency is 60 Hz, but in LCD panels, since it is necessary to supply display signals to all the pixels in each field, they are driven with 1V=(1/60) second (driven at 60 Hz). Note that, in recent years, to improve moving picture display characteristics, there are also an LCD panel driven at double speed driving (120 Hz driving, 1V=(1/120) seconds), and an LCD panel driven at quad speed (240 Hz driving, 1V=(1/240) seconds) for 3D display.

When a DC voltage is applied to the crystal layer 930, an effective voltage decreases and luminance of the pixel P decreases. Since the interface polarization and/or the orientation polarization contribute to the decrease in the effective voltage as described above, it is difficult to completely prevent the decrease in the effective voltage even when the auxiliary capacitance CS is provided. For example, when a display signal corresponding to a certain intermediate gray scale is written into each pixel for each frame, the luminance fluctuates for each frame and is observed as flicker. In addition, when a DC voltage is applied to the liquid crystal layer 930 for an extended period of time, electrolysis of the liquid crystal material may occur. In addition, impurity ions segregate in the electrode on one side, and the effective voltage may not be applied to the liquid crystal layer and the liquid crystal molecules may not move. To prevent this, in the LCD panel 900a, so-called AC driving is performed. Typically, frame-reversal driving at which a polarity of a display signal is inverted for each frame (for each vertical scanning period) is performed. For example, in an existing LCD panel, polarity inversion is performed every 1/60 seconds (a polarity inversion period is 30 Hz).

In addition, dot inversion driving, line reversal driving, or the like is performed to uniformly distribute the pixels having different polarities of applied voltage even within one frame. This is because it is difficult to completely match magnitudes of the effective voltage applied to the liquid crystal layer between a positive polarity and a negative polarity. For example, in a case where the volume resistivity of the liquid crystal material exceeds the order of $10^{12}$ Ω·cm, and the dot inversion or line reversal driving is performed every 1/60 seconds, flicker is almost visually unrecognizable.

The scanning signal and the display signal in the LCD panel 900a are supplied from the gate driver GD and the source driver SD to the gate bus line GL and the source bus line SL, respectively, on the basis of signals supplied from the control circuit CNTL to the gate driver GD and the source driver SD. For example, the gate driver GD and the source driver SD are each connected to a corresponding terminal provided on the TFT substrate 910. The gate driver GD and the source driver SD may be mounted on the frame region FR of the TFT substrate 910 as a driver IC, for example, or may be formed monolithically in the frame region FR of the TFT substrate 910.

The counter electrode 924 of the counter substrate 920 is electrically connected to a terminal (not illustrated) of the TFT substrate 910 via a conductive portion (not illustrated) referred to as a transfer. The transfer is formed, for example, to overlap with the sealing portion, or to impart conductivity to a part of the sealing portion. This is for the purpose of narrowing the frame region FR. A common voltage is directly or indirectly supplied from the control circuit CNTL to the counter electrode 924. Typically, the common voltage is also supplied to the CS bus line as described above.

Basic Structure of Scanning Antenna

A scanning antenna using antenna units utilizing anisotropy (birefringence) of a large dielectric constant M (εm) of a liquid crystal material controls a voltage applied to each liquid crystal layer of each antenna unit corresponding to a pixel of an LCD panel, and changes the effective dielectric constant M (εm) of the liquid crystal layer of each antenna unit to form a two-dimensional pattern with the antenna units having different electrostatic capacitance (corresponding to display of an image by an LCD). An electromagnetic wave (for example, a microwave) emitted from an antenna or received by an antenna is given a phase difference depending on the electrostatic capacitance of each antenna unit, and gains a strong directivity in a particular direction depending on the two-dimensional pattern formed with the antenna units having different electrostatic capacitance (beam scanning). For example, an electromagnetic wave emitted from an antenna is obtained by integrating, in consideration for the phase difference given by each antenna unit, a spherical wave obtained as a result of an input electromagnetic wave entering each antenna unit and being scattered by each antenna unit. It can also be considered that each antenna unit functions as a "phase shifter". As for a basic structure and action principles of a scanning antenna using a liquid crystal material, refer to PTL 1 to PTL 4 and NPL 1 and NPL 2. NPL 2 discloses a basic structure of a scanning antenna in which spiral slots are arranged. The entire contents of the disclosures of PTL 1 to PTL 4 and NPL 1 and NPL 2 are incorporated herein by reference.

Figure 1:
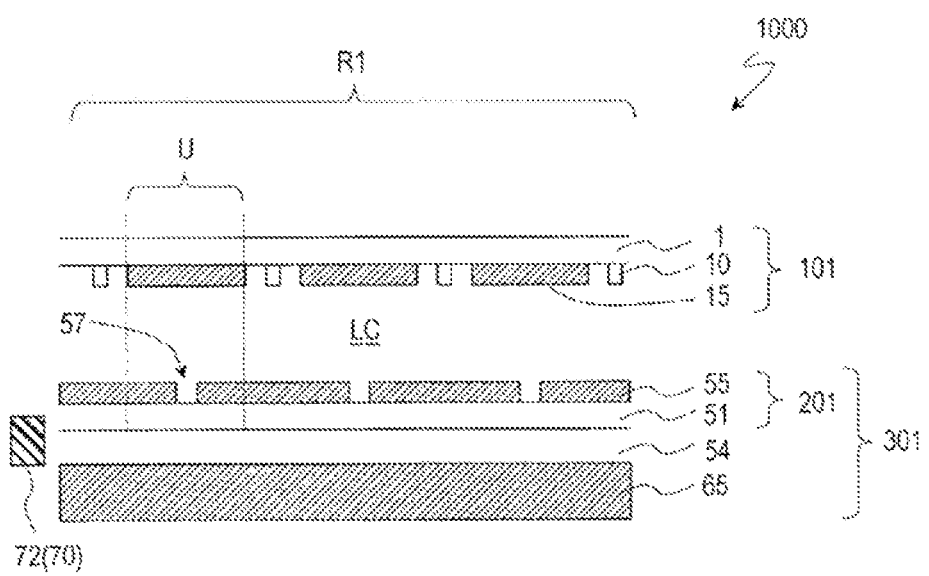
FIG. 1 is a cross-sectional view schematically illustrating a portion of a scanning antenna 1000 according to a first embodiment.

Note that although the antenna units in the scanning antenna according to an embodiment of the disclosure are similar to pixels of an LCD panel, a structure of each antenna unit is different from a structure of each pixel of the LCD panel, and arrangement of the plurality of antenna units is also different from arrangement of the pixels in the LCD panel. A basic structure of the scanning antenna according to an embodiment of the disclosure will be described with reference to FIG. 1 illustrating a scanning antenna 1000 of a first embodiment described in detail below. Although the scanning antenna 1000 is a radial in-line slot antenna in which slots are arranged in a concentric circle shape, the scanning antenna according to an embodiment of the disclosure is not limited to this. For example, the arrangement of the slots may be any of various types of known arrangement.

FIG. 1 is a cross-sectional view schematically illustrating a portion of the scanning antenna 1000 of the present embodiment, and schematically illustrates a part of a cross section along a radial direction from a power feed pin 72 (see FIG. 2B) provided near or at the center of the slots arranged in a concentric circle shape.

The scanning antenna 1000 includes a TFT substrate 101, a slot substrate 201, a liquid crystal layer LC disposed between the TFT substrate 101 and the slot substrate 201, and a reflective conductive plate 65 disposed to face the slot substrate 201 via an air layer 54. The scanning antenna 1000 transmits and receives microwaves from the TFT substrate 101 side.

The TFT substrate 101 includes a dielectric substrate 1 such as a glass substrate, and a plurality of patch electrodes 15 and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on the liquid crystal layer LC side of the dielectric substrate 51. The slot electrode 55 includes a plurality of slots 57.

The reflective conductive plate 65 is disposed to face the slot substrate 201 via the air layer 54. In place of the air layer 54, a layer formed of a dielectric (for example, a fluorine resin such as PTFE) having a small dielectric constant M for microwaves can be used. The slot electrode 55, the reflective conductive plate 65, and the dielectric substrate 51 and the air layer 54 disposed between the slot electrode 55 and the reflective conductive plate 65 function as a waveguide 301.

Figure 17:
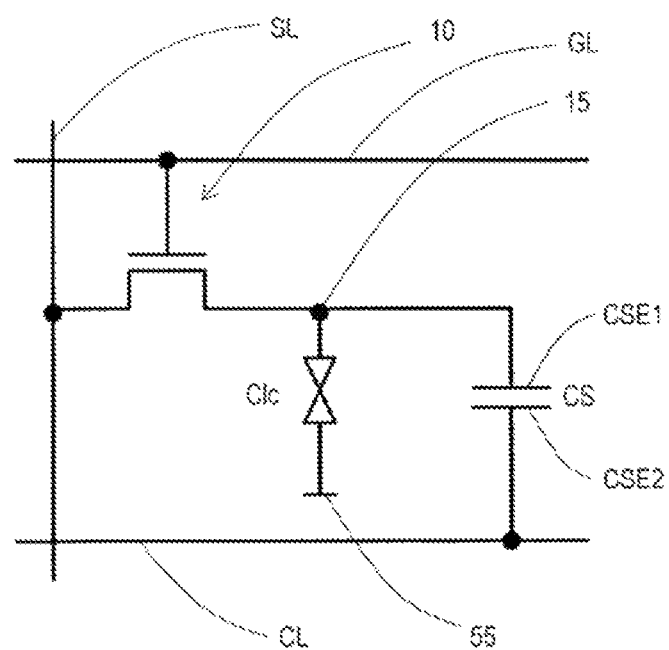
FIG. 17 is a view illustrating an equivalent circuit of one antenna unit in a scanning antenna according to an embodiment of the disclosure.

The patch electrode 15, the portion of the slot electrode 55 including the slots 57, and the liquid crystal layer LC disposed between the patch electrode 15 and the portion of the slot electrode 55 constitute an antenna unit U. In each antenna unit U, one patch electrode 15 faces via the liquid crystal layer LC the portion of the slot electrode 55 including one slot 57, and constitutes the liquid crystal capacitance. The structure in which the patch electrode 15 and the slot electrode 55 oppose each other with the liquid crystal layer LC interposed therebetween is similar to the structure illustrated in FIG. 53A and FIG. 53B in which the pixel electrode 914 and the counter electrode 924 of the LCD panel 900a oppose each other with the liquid crystal layer 930 interposed therebetween. That is, the antenna unit U of the scanning antenna 1000 and the pixel P in the LCD panel 900a have a similar configuration. In addition, the antenna unit has a configuration similar to the configuration of the pixel P in the LCD panel 900a in that the antenna unit has auxiliary capacitance electrically connected in parallel to the liquid crystal capacitance (see FIG. 13A and FIG. 17). However, the scanning antenna 1000 has many differences from the LCD panel 900a.

First, performance required of the dielectric substrates 1 and 51 of the scanning antenna 1000 is different from performance required of a substrate of an LCD panel.

Generally, a substrate transparent to visible light is used for an LCD panel. For example, a glass substrate or a plastic substrate is used for an LCD panel. In a reflective LCD panel, since a substrate on the back side does not need transparency, a semiconductor substrate may be used for the substrate on the back side. In contrast, it is preferable that the dielectric substrates 1 and 51 used for the antenna each have a small dielectric loss for microwaves (a dielectric tangent for microwaves is denoted by tan $\varepsilon_M$). The tan $\delta_M$ of each of the dielectric substrates 1 and 51 is preferably approximately less than or equal to 0.03, and more preferably less than or equal to 0.01. Specifically, a glass substrate or a plastic substrate can be used. A glass substrate is more excellent than a plastic substrate in dimensional stability and heat resistance, and is suitable for forming a circuit element such as a TFT, a wiring line, and an electrode by using LCD technology. For example, in a case where a material forming a waveguide includes air and glass, a dielectric loss of glass is greater and thus, from a viewpoint that thinner glass can reduce a waveguide loss, a thickness of the glass substrate is preferably less than or equal to 400 µm, and more preferably less than or equal to 300 µm. There is no particular lower limit in the thickness, as long as the glass can be handled without break in a manufacturing process.

Conductive materials used for electrodes are also different. An ITO film is often used as a transparent conductive film for a pixel electrode or a counter electrode of an LCD panel. However, ITO has a large tan $\delta_M$ for microwaves, and cannot be used as a conductive layer in an antenna. The slot electrode 55 functions as a wall of the waveguide 301 together with the reflective conductive plate 65. Accordingly, to suppress transmission of microwaves in the wall of the waveguide 301, it is preferable that a thickness of the metal wall of the waveguide 301, that is, a thickness of the metal layer (Cu layer or Al layer) be large. It is known that in a case where the thickness of the metal layer is three times a skin depth, electromagnetic waves are attenuated to 1/20 (−26 dB), and that in a case where the thickness of the metal layer is five times the skin depth, electromagnetic waves are attenuated to about 1/150 (−43 dB). Accordingly, in a case where the thickness of the metal layer is five times the skin depth, a transmittance of electromagnetic waves can be reduced to 1%. For example, for microwaves of 10 GHz, in a case where a Cu layer having a thickness of greater than or equal to 3.3 µm and an Al layer having a thickness of greater than or equal to 4.0 µm are used, the microwaves can be reduced to 1/150. In addition, for microwaves of 30 GHz, in a case where a Cu layer having a thickness of greater than or equal to 1.9 µm and an Al layer having a thickness of greater than or equal to 2.3 µm are used, the microwaves can be reduced to 1/150. In this way, the slot electrode 55 is preferably formed of a relatively thick Cu layer or Al layer. There is no particular upper limit in the thickness of the Cu layer or the Al layer, and the thicknesses of the Cu layer or the Al layer can be set appropriately in consideration for film formation time and cost. When the Cu layer is used, an advantage of enabling formation of the metal layer thinner than in the case of using the Al layer can be obtained. The relatively thick Cu layer or Al layer can be formed not only by a thin film deposition method used in an LCD manufacturing process, but also by other methods such as bonding Cu foil or Al foil to a substrate. The thickness of the metal layer is, for example, from 2 µm to 30 µm, inclusive. When the thin film deposition methods are used, the thickness of the metal layer is preferably less than or equal to 6 µm. Note that an aluminum plate, a copper plate, or the like having a thickness of several mm can be used as the reflective conductive plate 65, for example.

Since the patch electrode 15 does not constitute the waveguide 301 as with the slot electrode 55, a Cu layer or an Al layer having a smaller thickness than a thickness of the slot electrode 55 can be used. However, the patch electrode 15 preferably has low resistance to avoid a loss resulting from oscillation of free electrons near the slot 57 of the slot electrode 55 changing to heat when oscillation of free electrons in the patch electrode 15 is induced. From the viewpoint of mass production, an Al layer is preferably used rather than a Cu layer, and the thickness of the Al layer is preferably from 0.3 to 2 µm, for example.

In addition, an arrangement pitch of the antenna units U is considerably different from a pixel pitch. For example, considering an antenna for microwaves of 12 GHz (Ku band), a wavelength λ is 25 mm, for example. Then, as described in PTL 4, since the pitch of the antenna units U is less than or equal to λ/4 and/or less than or equal to λ/5, the arrangement pitch of the antenna units U becomes less than or equal to 6.25 mm and/or less than or equal to 5 mm. This is ten times greater than the pixel pitch of the LCD panel. Accordingly, a length and a width of each antenna unit U are also approximately ten times greater than a length and a width of each pixel of an LCD panel.

Of course, arrangement of the antenna units U may be different from arrangement of the pixels in the LCD panel. Although an example in which the antenna units U are arranged in a concentric circle shape (for example, refer to JP 2002-217640 A) is described here, the arrangement of the antenna units U is not limited to such arrangement, and the antenna units may be arranged in a spiral shape as described in NPL 2, for example. Further, the antenna units may be arranged in a matrix shape as described in PTL 4.

Properties required of the liquid crystal material of the liquid crystal layer LC of the scanning antenna 1000 are different from properties required of a liquid crystal material of an LCD panel. In the LCD panel, a change in a refractive index of the liquid crystal layer of pixels gives a phase difference to polarized visible light (wavelength of from 380 nm to 830 nm) to change a polarization state (for example, to rotate a polarization axis direction of linearly polarized light, or to change a degree of circular polarization of circularly polarized light) and thus, display is performed. In contrast, in the scanning antenna 1000 according to the embodiment, a phase of microwaves excited (re-radiated) from each patch electrode is changed by changing an electrostatic capacitance value of the liquid crystal capacitance of the antenna unit U. Accordingly, the liquid crystal layer preferably has large anisotropy ($\Delta\varepsilon M$) of the dielectric constant M ($\varepsilon_M$) for microwaves, and the tan $\delta_M$ is preferably small. For example, the $\Delta\varepsilon_M$ of greater than or equal to 4 and the tan $\delta_M$ of less than or equal to 0.02 (a value of 19 GHz in any of the cases) as described in M. Witteck et al, SID 2015 DIGEST pp. 824-826 can be used suitably. In addition, a liquid crystal material having the $\Delta\varepsilon_M$ of greater than or equal to 0.4 and the tan $\delta_M$ of less than or equal to 0.04 as described in Kuki, POLYMERS 55 vol. August issue pp. 599-602 (2006) can be used.

In general, a dielectric constant of a liquid crystal material has frequency dispersion, but the dielectric anisotropy $\Delta\varepsilon_M$ for microwaves has a positive correlation with refractive index anisotropy $\Delta n$ for visible light. Accordingly, it can be said that a liquid crystal material for an antenna unit for microwaves is preferably a material having a large refractive index anisotropy $\Delta n$ for visible light. The refractive index anisotropy $\Delta n$ of a liquid crystal material for LCD is evaluated with refractive index anisotropy for light having a wavelength of 550 nm. Here again, when the $\Delta n$ (birefringence) for light having a wavelength of 550 nm is used as an index, nematic liquid crystal having the $\Delta n$ of greater than or equal to 0.3, preferably greater than or equal to 0.4, can be used for the antenna unit for microwaves. There is no particular upper limit in the $\Delta n$. However, since a liquid crystal material having a large $\Delta n$ tends to have a strong polarity, such a liquid crystal material may decrease reliability. From a viewpoint of reliability, the $\Delta n$ is preferably less than or equal to 0.4. A thickness of the liquid crystal layer is, for example, from 1 µm to 500 µm.

Hereinafter, a structure and a manufacturing method of a scanning antenna according to an embodiment of the disclosure will be described in more detail.

First Embodiment

First, description will be given with reference to FIG. 1 and FIGS. 2A and 2B. FIG. 1 is a schematic partial cross-sectional view of a portion near the center of the scanning antenna 1000 as described above in detail, and FIG. 2A and FIG. 2B are schematic plan views illustrating a TFT substrate 101 and a slot substrate 201 in the scanning antenna 1000, respectively.

The scanning antenna 1000 includes a plurality of antenna units U arranged two-dimensionally. In the scanning antenna 1000 exemplified here, the plurality of antenna units are arranged in a concentric circle shape. In the following description, a region of the TFT substrate 101 and a region of the slot substrate 201 corresponding to the antenna units U, respectively will be referred to as "antenna unit regions," and be denoted by the same reference sign U as the reference sign of the antenna units. In addition, as illustrated in FIG. 2A and FIG. 2B, in the TFT substrate 101 and the slot substrate 201, a region defined by a plurality of the antenna unit regions two-dimensionally arranged is referred to as a "transmission and/or reception region R1," and a region other than the transmission and/or reception region R1 is referred to as a "non-transmission and/or reception region R2". A terminal section, a driving circuit, and the like are provided in the non-transmission and/or reception region R2.

Figure 2A:
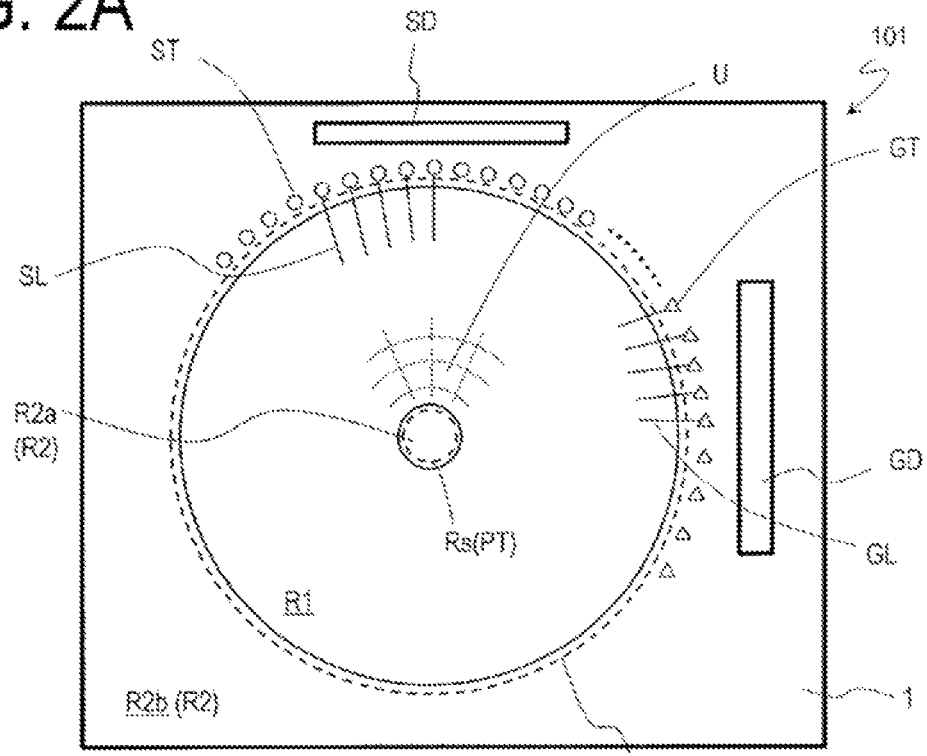
FIG. 2A and FIG. 2B are schematic plan views illustrating a TFT substrate 101 and a slot substrate 201 in the scanning antenna 1000, respectively.

FIG. 2A is a schematic plan view illustrating the TFT substrate 101 in the scanning antenna 1000.

In the illustrated example, the transmission and/or reception region R1 has a donut shape as viewed from a normal direction of the TFT substrate 101. The non-transmission and/or reception region R2 includes a first non-transmission and/or reception region R2a located at a central portion of the transmission and/or reception region R1 and a second non-transmission and/or reception region R2b located at a peripheral portion of the transmission and/or reception region R1. An outer diameter of the transmission and/or reception region R1, for example, is from 200 mm to 1500 mm, and is set according to a data traffic volume or the like.

A plurality of gate bus lines GL and a plurality of source bus lines SL supported on a dielectric substrate 1 are provided in the transmission and/or reception region R1 of the TFT substrate 101, and the antenna unit regions U are defined by these wiring lines. The antenna unit regions U are arranged, for example, in a concentric circle shape in the transmission and/or reception region R1. Each of the antenna unit regions U includes a TFT and a patch electrode electrically connected to the TFT. A source electrode of the TFT is electrically connected to a source bus line SL, and a gate electrode is electrically connected to a gate bus line GL. In addition, a drain electrode is electrically connected to the patch electrode.

In the non-transmission and/or reception region R2 (R2a, R2b), a seal region Rs is disposed to surround the transmission and/or reception region R1. A sealing member (not illustrated) is applied to the seal region Rs. The sealing member bonds the TFT substrate 101 and the slot substrate 201 to each other, and also encloses liquid crystal between these substrates 101 and 201.

A gate terminal section GT, A gate driver GD, a source terminal section ST, and a source driver SD are provided outside the sealing region Rs in the non-transmission and/or reception region R2. Each of the gate bus lines GL is connected to the gate driver GD via the gate terminal section GT. Each of the source bus lines SL is connected to the source driver SD via the source terminal section ST. Note that, in this example, although the source driver SD and the gate driver GD are formed on the dielectric substrate 1, one or both of these drivers may be provided on another dielectric substrate.

In addition, a plurality of transfer terminal sections PT are provided in the non-transmission and/or reception region R2. Each transfer terminal section PT is electrically connected to the slot electrode 55 (FIG. 2B) of the slot substrate 201. Herein, a connection section between each transfer terminal section PT and a slot electrode 55 is referred to as a "transfer section". As illustrated in the figure, the transfer terminal sections PT (transfer sections) may be disposed in the seal region Rs. In this case, a resin containing conductive particles may be used as the sealing member. In this way, liquid crystal is enclosed between the TFT substrate 101 and the slot substrate 201, and electrical connection between each transfer terminal section PT and the slot electrode 55 of the slot substrate 201 can be secured. In this example, although the transfer terminal sections PT are disposed in both the first non-transmission and/or reception region R2a and the second non-transmission and/or reception region R2b, the transfer terminal sections PT may be disposed in only any one of the first non-transmission and/or reception region R2a and the second non-transmission and/or reception region R2b.

Note that the transfer terminal sections PT (transfer sections) may not be disposed in the seal region Rs. For example, the transfer terminal sections PT may be disposed outside the seal region Rs in the non-transmission and/or reception region R2.

Figure 2B:
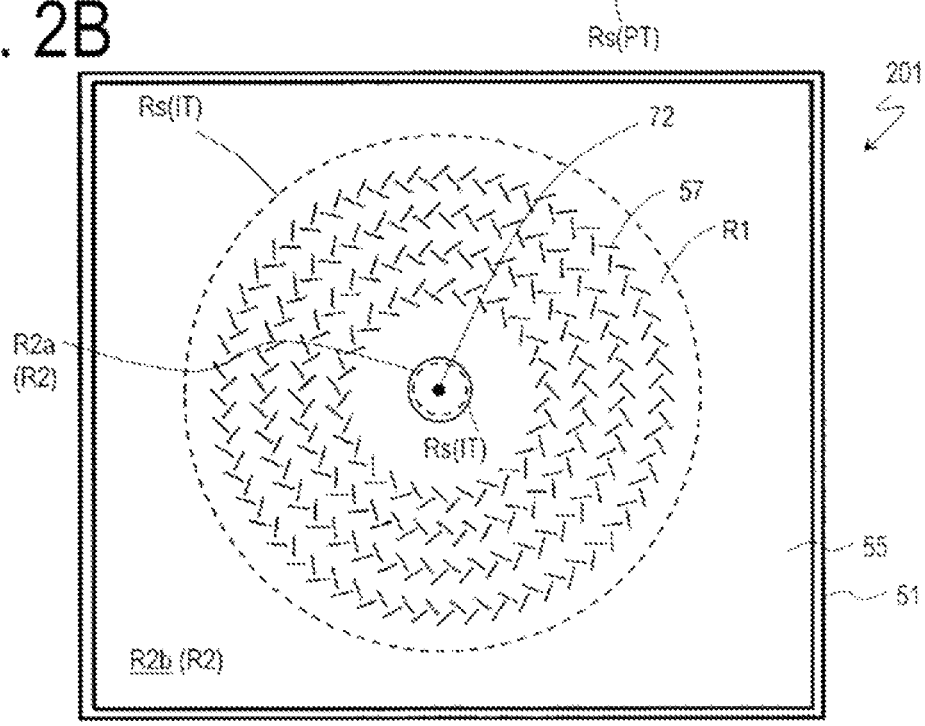

FIG. 2B is a schematic plan view illustrating the slot substrate 201 in the scanning antenna 1000, and illustrates a surface on a liquid crystal layer LC side of the slot substrate 201.

In the slot substrate 201, the slot electrode 55 is formed on a dielectric substrate 51 extending across the transmission and/or reception region R1 and the non-transmission and/or reception region R2.

In the transmission and/or reception region R1 of the slot substrate 201, a plurality of slots 57 are disposed in the slot electrode 55. Each slot 57 is disposed corresponding to each antenna unit region U on the TFT substrate 101. In the illustrated example, the plurality of slots 57 are arranged in pairs, and a pair of the slots 57 extend in a direction substantially orthogonal to each other and pairs of the slots 57 are arranged in a concentric circle shape to constitute a radial inline slot antenna. Since the scanning antenna 1000 includes the slots substantially orthogonal to each other, the scanning antenna 1000 can transmit and receive a circularly polarized wave.

A plurality of terminal sections IT of the slot electrode 55 are provided in the non-transmission and/or reception region R2. The terminal sections IT are electrically connected to the transfer terminal sections PT (FIG. 2A) of the TFT substrate 101. In this example, the terminal sections IT are disposed in the seal region Rs, and are electrically connected to the corresponding transfer terminal sections PT by a sealing member containing conductive particles.

In addition, a power feed pin 72 is disposed on a rear surface side of the slot substrate 201 in the first non-transmission and/or reception region R2a. Microwaves are inserted by the power feed pin 72 into a waveguide 301 including the slot electrode 55, a reflective conductive plate 65, and the dielectric substrate 51. The power feed pin 72 is connected to a power feed device 70. Power feed is performed from the center of the concentric circle in which the slots 57 are arranged. A power feed method may be any of a direct coupling power feed method and an electromagnetic coupling method, and a known power feed structure can be adopted.

Hereinafter, each constituent element of the scanning antenna 1000 will be described in detail with reference to the drawings.

Structure of TFT Substrate 101
Antenna Unit Region U

Figure 3A:
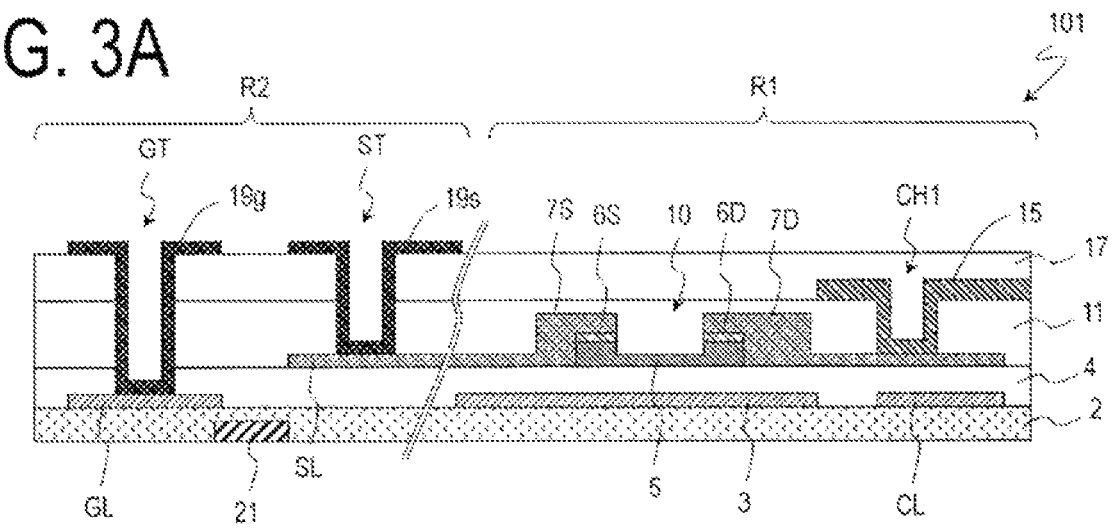
FIG. 3A and FIG. 3B are a cross-sectional view and a plane view schematically illustrating an antenna unit region U of the TFT substrate 101, respectively.
Figure 3B:
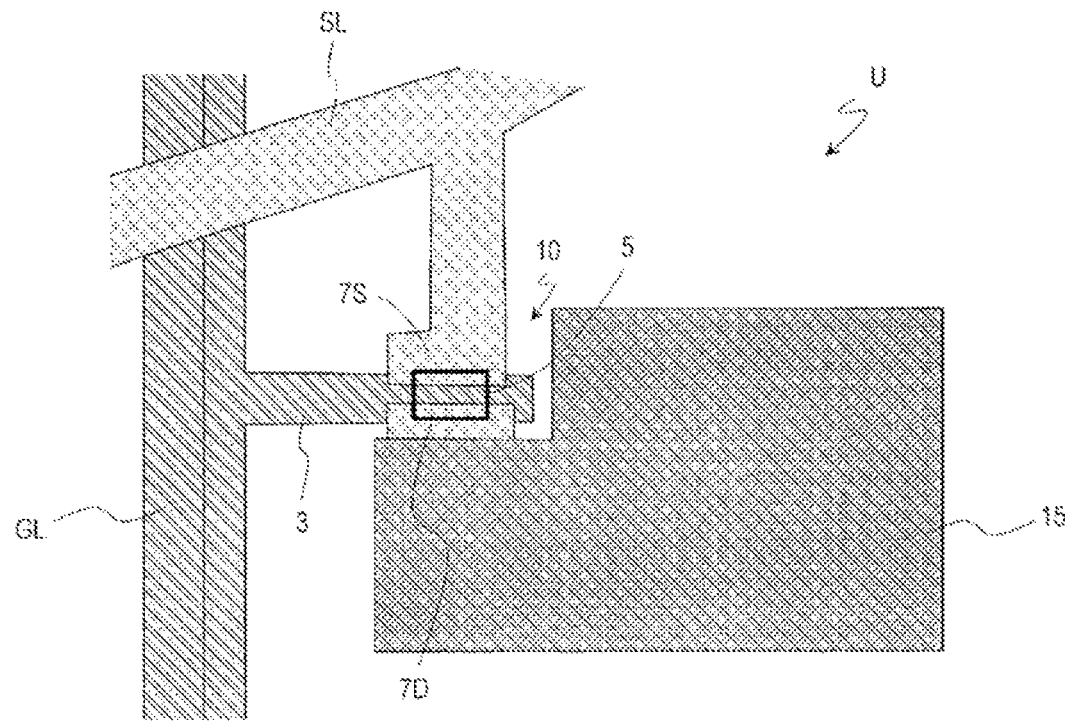

FIG. 3A and FIG. 3B are a cross-sectional view and a plane view schematically illustrating the antenna unit region U of the TFT substrate 101, respectively.

Each of the antenna unit regions U includes a dielectric substrate (not illustrated), a TFT 10 supported on the dielectric substrate, a first insulating layer 11 covering the TFT 10, a patch electrode 15 formed on the first insulating layer 11 and electrically connected to the TFT 10, and a second insulating layer 17 covering the patch electrode 15. The TFT 10 is disposed, for example, at or near an intersection point of each gate bus line GL and each source bus line SL.

The TFT 10 includes a gate electrode 3, a semiconductor layer 5 having an island shape, a gate insulating layer 4 disposed between the gate electrode 3 and the semiconductor layer 5, a source electrode 7S, and a drain electrode 7D. A structure of the TFT 10 is not particularly limited. In this example, the TFT 10 is a channel etched type TFT having a bottom gate structure.

The gate electrode 3 is electrically connected to the gate bus line GL, and a scanning signal is supplied from the gate bus line GL. The source electrode 7S is electrically connected to the source bus line SL, and a data signal is supplied from the source bus line SL. The gate electrode 3 and the gate bus line GL may be formed of the same conductive film (gate conductive film). The source electrode 7S, the drain electrode 7D, and the source bus line SL may be formed of the same conductive film (source conductive film). The gate conductive film and the source conductive film are, for example, metal films. Herein, a layer formed by using the gate conductive film may be referred to as a "gate metal layer," and a layer formed by using the source conductive film may be referred to as a "source metal layer".

The semiconductor layer 5 is disposed to overlap with the gate electrode 3 via the gate insulating layer 4. In the illustrated example, a source contact layer 6S and a drain contact layer 6D are formed on the semiconductor layer 5. The source contact layer 6S and the drain contact layer 6D are disposed respectively on both sides of a region where a channel is formed in the semiconductor layer 5 (channel region). The semiconductor layer 5 may be an intrinsic amorphous silicon (i-a-Si) layer, and the source contact layer 6S and the drain contact layer 6D may be $n^+$ type amorphous silicon ($n^+$-a-Si) layers.

The source electrode 7S is provided to come into contact with the source contact layer 6S and is connected to the semiconductor layer 5 via the source contact layer 6S. The drain electrode 7D is provided to come into contact with the drain contact layer 6D and is connected to the semiconductor layer 5 via the drain contact layer 6D.

The first insulating layer 11 includes a contact hole CH1 reaching at least the drain electrode 7D of the TFT 10.

The patch electrode 15 is provided on the first insulating layer 11 and in the contact hole CH1, and is in contact with the drain electrode 7D in the contact hole CH1. The patch electrode 15 includes a metal layer. The patch electrode 15 may be a metal electrode formed of a metal layer alone. A material of the patch electrode 15 may be the same as a material of the source electrode 7S and the drain electrode 7D. However, a thickness of the metal layer in the patch electrode 15 (a thickness of the patch electrode 15 when the patch electrode 15 is a metal electrode) is set to be greater than a thickness of each of the source electrode 7S and the drain electrode 7D. The thickness of the metal layer in the patch electrode 15 in the case of being formed using an Al layer is set to, for example, greater than or equal to 0.3 μm.

A CS bus line CL may be provided by using the same conductive film as a conductive film of the gate bus line GL. The CS bus line CL may be disposed to overlap with the drain electrode (or an extending portion of the drain electrode) 7D via the gate insulating layer 4, and may constitute auxiliary capacity CS including the gate insulating layer 4 as a dielectric layer.

An alignment mark (for example, a metal layer) 21 and a base insulating film 2 covering the alignment mark 21 may be formed at a position closer to the dielectric substrate than a position of the gate bus line GL. For example, when m TFT substrates are prepared from one glass substrate, and the number of photomasks is n (where n<m), it is necessary to perform each exposure step multiple times. In this way, when the number (n) of photomasks is less than the number (m) of TFT substrates 101 prepared from one glass substrate 1, the alignment mark 21 is used for alignment of the photomasks. The alignment mark 21 may be omitted.

In the present embodiment, the patch electrode 15 is formed in a layer different from the source metal layer. In this way, the following advantages can be obtained.

Since the source metal layer is typically formed using a metal film, it is conceivable to form a patch electrode in the source metal layer. However, the patch electrode preferably has a low resistance, to the extent that the electron oscillation is not inhibited, and is formed of, for example, an Al layer having a relatively thicker thickness of 0.3 µm or greater. From the viewpoint of antenna performance, a thicker patch electrode is preferred. Nevertheless, while dependent on the TFT configuration as well, when a patch electrode having a thickness exceeding 1 µm, for example, is formed in the source metal layer, the problem of not achieving the desired patterning accuracy may occur. For example, a problem may arise in which the gap (corresponding to the channel length of the TFT) between the source electrode and the drain electrode cannot be controlled at high accuracy. In contrast, in the present embodiment, since the patch electrode 15 is formed separately from the source metal layer, a thickness of the source metal layer and a thickness of the patch electrode 15 can be controlled independently. Accordingly, controllability can be secured when the source metal layer is formed, and the patch electrode 15 having a desired thickness can be formed.

In the present embodiment, the thickness of the patch electrode 15 can be set with a high degree of freedom separately from the thickness of the source metal layer. Note that since a size of the patch electrode 15 does not need to be controlled as strictly as the source bus line SL or the like, a line width shift (deviation from a design value) may be increased by thickening the patch electrode 15. Note that a case where the thickness of the patch electrode 15 is equal to the thickness of the source metal layer is not excluded.

The patch electrode 15 may include a Cu layer or an Al layer as a main layer. Performance of the scanning antenna correlates with electric resistance of the patch electrode 15, and a thickness of the main layer is set to obtain desired resistance. From a viewpoint of the electric resistance, there is a possibility that the Cu layer can reduce the thickness of the patch electrode 15 more than the Al layer.

Figure 4A:
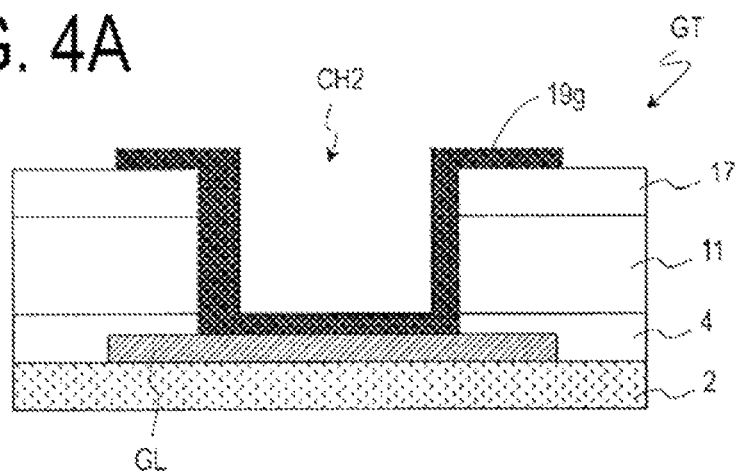
FIG. 4A to FIG. 4C are cross-sectional views schematically illustrating a gate terminal section GT, a source terminal section ST, and a transfer terminal section PT of the TFT substrate 101, respectively.
Figure 4B:
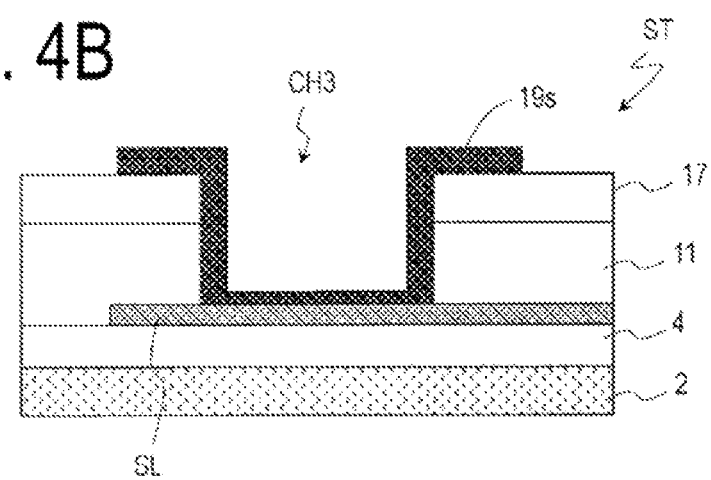
Figure 4C:
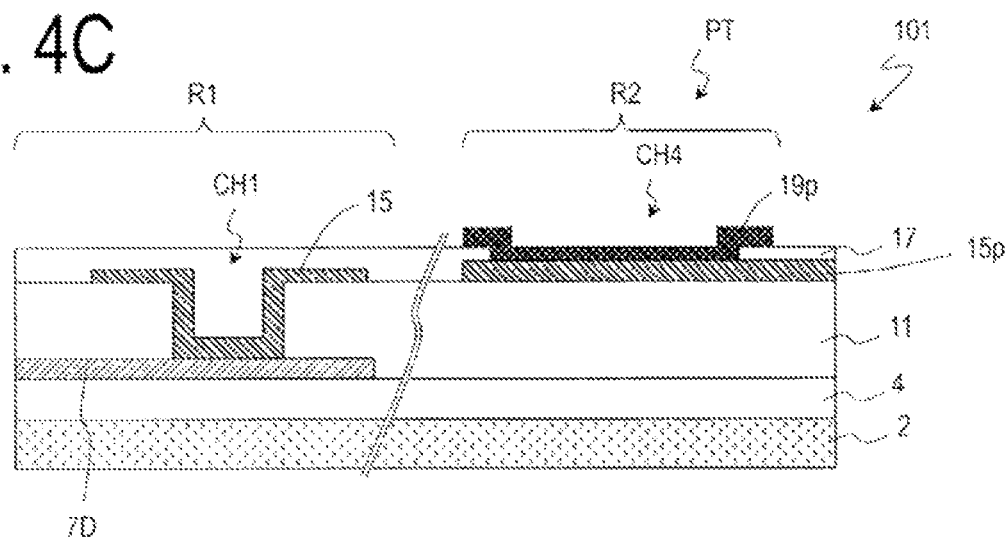

Gate Terminal Section GT, Source Terminal Section ST, and Transfer Terminal Section PT FIG. 4A to FIG. 4C are cross-sectional views schematically illustrating the gate terminal section GT, the source terminal section ST, and the transfer terminal section PT, respectively.

The gate terminal section GT includes the gate bus line GL formed on the dielectric substrate, an insulating layer covering the gate bus line GL, and a gate terminal upper connection section 19g. The gate terminal upper connection section 19g is in contact with the gate bus line GL in a contact hole CH2 formed in the insulating layer. In this example, the insulating layer covering the gate bus line GL includes the gate insulating layer 4, the first insulating layer 11 and the second insulating layer 17 in order from the dielectric substrate side. The gate terminal upper connection section 19g is, for example, a transparent electrode formed of a transparent conductive film provided on the second insulating layer 17.

The source terminal section ST includes the source bus line SL formed on the dielectric substrate (here, on the gate insulating layer 4), an insulating layer covering the source bus line SL, and a source terminal upper connection section 19s. The source terminal upper connection section 19s is in contact with the source bus line SL in a contact hole CH3 formed in the insulating layer. In this example, the insulating layer covering the source bus line SL includes the first insulating layer 11 and the second insulating layer 17. The source terminal upper connection section 19s is, for example, a transparent electrode formed of a transparent conductive film provided on the second insulating layer 17.

The transfer terminal section PT includes a patch connection section 15p formed on the first insulating layer 11, the second insulating layer 17 covering the patch connection section 15p, and a transfer terminal upper connection section 19p. The transfer terminal upper connection section 19p is in contact with the patch connection section 15p in a contact hole CH4 formed in the second insulating layer 17. The patch connection section 15p is formed of the same conductive film as a conductive film of the patch electrode 15. The transfer terminal upper connection section (also referred to as an upper transparent electrode) 19p is, for example, a transparent electrode formed of a transparent conductive film provided on the second insulating layer 17. In the present embodiment, the upper connection sections 19g, 19s, and 19p of the respective terminal sections are formed of the same transparent conductive film.

In the present embodiment, there is an advantage of enabling simultaneous formation of the contact holes CH2, CH3, and CH4 of the respective terminal sections by an etching step performed after formation of the second insulating layer 17. A manufacturing process will be described in detail below.

Manufacturing Method of TFT Substrate 101

Figure 5:
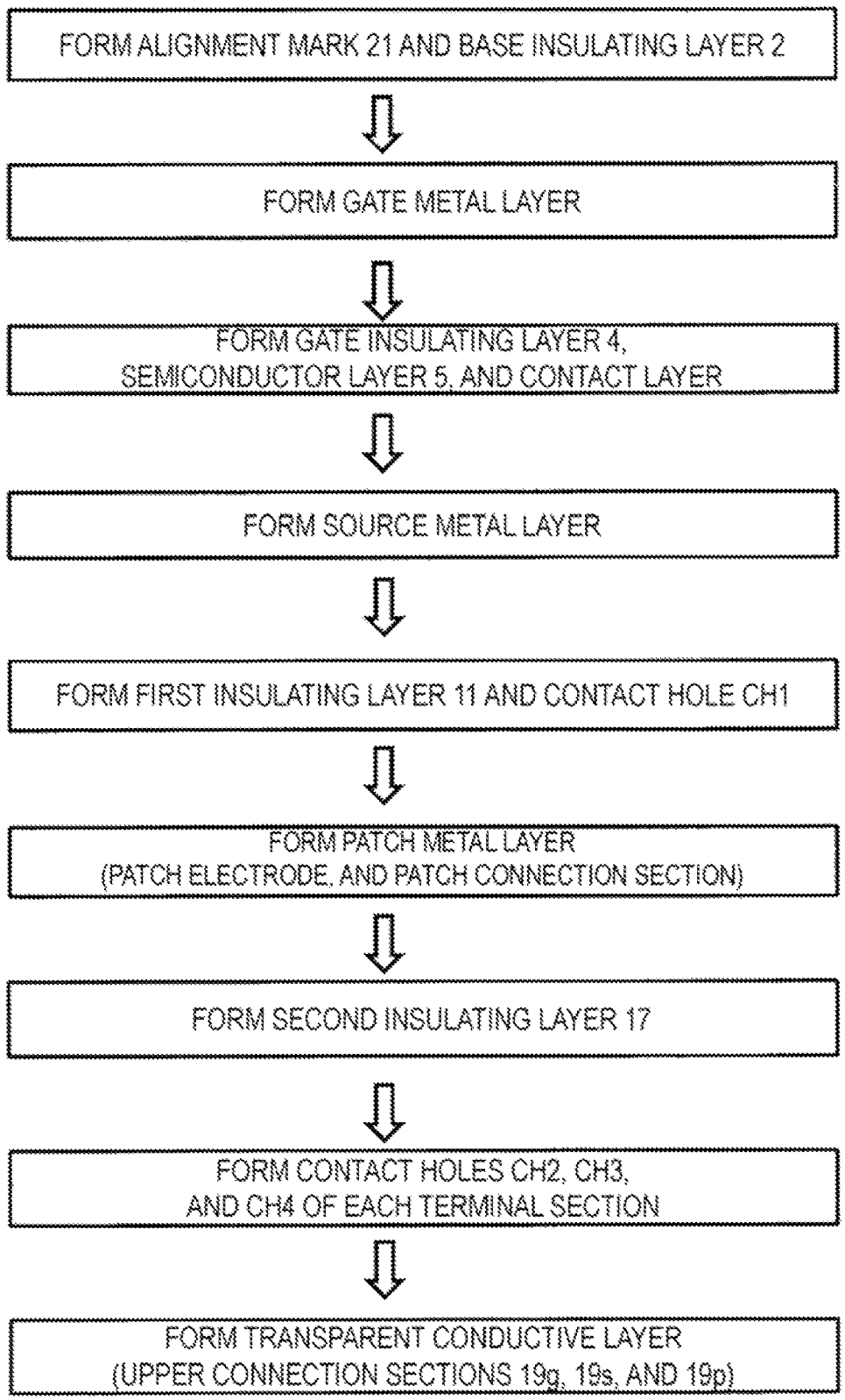
FIG. 5 is a view illustrating an example of the manufacturing steps of the TFT substrate 101.

The TFT substrate 101 can be manufactured by the following method, for example. FIG. 5 is a view exemplifying manufacturing steps of the TFT substrate 101.

First, a metal film (for example, a Ti film) is formed on a dielectric substrate and patterned to form the alignment mark 21. For example, a glass substrate, a plastic substrate (resin substrate) having heat resistance, or the like can be used as the dielectric substrate. Then, the base insulating film 2 is formed to cover the alignment mark 21. For example, an $SiO_2$ film is used as the base insulating film 2.

Subsequently, a gate metal layer including the gate electrode 3 and the gate bus line GL is formed on the base insulating film 2.

The gate electrode 3 can be formed integrally with the gate bus line GL. Here, a gate conductive film not illustrated (thickness of greater than or equal to 50 nm and less than or equal to 500 nm, for example) is formed on the dielectric substrate by sputtering or the like. Then, the gate conductive film is patterned to obtain the gate electrode 3 and the gate bus line GL. A material of the gate conductive film is not particularly limited. A film containing a metal such as aluminum (Al), tungsten (W), molybdenum (Mo), tantalum (Ta), chromium (Cr), titanium (Ti), and copper (Cu), an alloy thereof, or a metal nitride thereof can be used appropriately. Here, a layered film including MoN (thickness of 50 nm, for example), Al (thickness of 200 nm, for example), and MoN (thickness of 50 nm, for example) layered one on another in this order is formed as the gate conductive film.

Then, the gate insulating layer 4 is formed to cover the gate metal layer. The gate insulating layer 4 can be formed by CVD or the like. As the gate insulating layer 4, a silicon oxide ($SiO_2$) layer, a silicon nitride (SiNx) layer, a silicon oxynitride ($SiO_xN_y$; x>y) layer, a silicon nitride oxide ($SiN_xO_y$; x>y) layer, or the like may be used appropriately. The gate insulating layer 4 may have a layered structure. Here, an SiNx layer (thickness of 410 nm, for example) is formed as the gate insulating layer 4.

Then, the semiconductor layer 5 and a contact layer are formed on the gate insulating layer 4. Here, an intrinsic amorphous silicon film (thickness of 125 nm, for example) and an n$^+$ type amorphous silicon film (thickness of 65 nm, for example) are formed in this order and patterned to obtain the semiconductor layer 5 having an island shape and the contact layer. The semiconductor film used for the semiconductor layer 5 is not limited to an amorphous silicon film. For example, an oxide semiconductor layer may be formed as the semiconductor layer 5. In this case, the contact layer may not be provided between the semiconductor layer 5 and the source/drain electrodes.

Then, a source conductive film (thickness of greater than or equal to 50 nm and less than or equal to 500 nm, for example) is formed on the gate insulating layer 4 and on the contact layer, and patterned to form a source metal layer including the source electrode 7S, the drain electrode 7D, and the source bus line SL. At this time, the contact layer is also etched, and the source contact layer 6S and the drain contact layer 6D separated from each other are formed.

A material of the source conductive film is not particularly limited. A film containing a metal such as aluminum (Al), tungsten (W), molybdenum (Mo), tantalum (Ta), chromium (Cr), titanium (Ti), and copper (Cu), an alloy thereof, or a metal nitride thereof can be used appropriately. Here, a layered film including MoN (thickness of 30 nm, for example), Al (thickness of 200 nm, for example), and MoN (thickness of 50 nm, for example) layered one on another in this order is formed as the source conductive film. Note that alternatively, a layered film including Ti (thickness of 30 nm, for example), MoN (thickness of 30 nm, for example), Al (thickness of 200 nm, for example), and MoN (thickness of 50 nm, for example) layered one on another in this order is formed as the source conductive film.

Here, for example, the source conductive film is formed by sputtering and is patterned by wet etching (source/drain separation). Thereafter, a portion of the contact layer located on a region serving as the channel region of the semiconductor layer 5 is removed by, for example, dry etching to form a gap portion, and the source contact layer 6S and the drain contact layer 6D are separated. At this time, in the gap portion, an area around a surface of the semiconductor layer 5 is also etched (overetching).

Note that, for example, when a layered film including a Ti film and an Al film layered one on another in this order is used as the source conductive film, the Al film may be patterned by wet etching by using, for example, an aqueous solution of phosphoric acid, acetic acid, and nitric acid, and thereafter the Ti film and the contact layer (n$^+$ type amorphous silicon layer) 6 may be patterned simultaneously by dry etching. Alternatively, it is also possible to collectively etch the source conductive film and the contact layer. However, in the case of simultaneously etching the source conductive film or a lower layer of the source conductive film and the contact layer 6, it may be difficult to control distribution of an etching amount of the semiconductor layer 5 (an amount of excavation of the gap portion) in the entire substrate. In contrast, as described above, in the case where the source/drain separation and the gap portion formation are performed in the separate etching steps, the etching amount of the gap portion can be controlled more easily.

Next, the first insulating layer 11 is formed to cover the TFT 10. In this example, the first insulating layer 11 is disposed to come into contact with the channel region of the semiconductor layer 5. In addition, the contact hole CH1 reaching at least the drain electrode 7D is formed in the first insulating layer 11 by known photolithography.

The first insulating layer 11 may be, for example, an inorganic insulating layer such as a silicon oxide (SiO$_2$) film, a silicon nitride (SiNx) film, a silicon oxynitride (SiOxNy; x>y) film, and a silicon nitride oxide (SiNxOy; x>y) film. Here, as the first insulating layer 11, an SiNx layer having a thickness of, for example, 330 nm is formed by, for example, CVD.

Then, a patch conductive film is formed on the first insulating layer 11 and in the contact hole CH1, and is patterned. In this way, the patch electrode 15 is formed in the transmission and/or reception region R1, and the patch connection section 15p is formed in the non-transmission and/or reception region R2. The patch electrode 15 is in contact with the drain electrode 7D in the contact hole CH1. Note that herein, the layer including the patch electrode 15 and the patch connection section 15p and formed of the patch conductive film may be referred to as a "patch metal layer".

The same material as the material of the gate conductive film or the source conductive film can be used as a material of the patch conductive film. However, the patch conductive film is set to have a thickness larger than a thickness of each of the gate conductive film and the source conductive film. This allows the sheet resistance of the patch electrode to reduce. And thus, the loss resulting from the oscillation of free electrons in the patch electrode changing to heat can be reduced. A suitable thickness of the patch conductive film is, for example, greater than or equal to 0.3 μm. When the thickness is thinner, the sheet resistance is 0.10 Ω/sq or greater, and may result in the problem of greater loss. The thickness of the patch conductive film is, for example, less than or equal to 3 μm, and more preferably less than or equal to 2 μm. In a case where the thickness of the patch conductive film is greater than 3 μm, warp of the substrate may occur. When the warping is significant, problems such as transport problems, substrate chipping, or substrate cracking may occur.

Here, a layered film (MoN/Al/MoN) including MoN (thickness of 50 nm, for example), Al (thickness of 1000 nm, for example), and MoN (thickness of 50 nm, for example) layered one on another in this order is formed as the patch conductive film. Note that alternatively, a layered film (MoN/Al/MoN/Ti) including Ti (thickness of 50 nm, for example), MoN (thickness of 50 nm, for example), Al (thickness of 2000 nm, for example), and MoN (thickness of 50 nm, for example) layered one on another in this order may be formed. Alternatively, a layered film (MoN/Al/MoN/Ti) including Ti (thickness of 50 nm, for example), MoN (thickness of 50 nm, for example), Al (thickness of 500 nm, for example), and MoN (thickness of 50 nm, for example) layered one on another in this order may be formed. Alternatively, a layered film (Ti/Cu/Ti) including a Ti film, a Cu film, and a Ti film layered one on another in this order, or a layered film (Cu/Ti) including a Ti film and a Cu film layered one on another in this order may be used.

Then, the second insulating layer (thickness of greater than or equal to 100 nm and less than or equal to 300 nm, for example) 17 is formed on the patch electrode 15 and the first insulating layer 11. The second insulating layer 17 is not particularly limited, and, for example, a silicon oxide (SiO$_2$) film, a silicon nitride (SiNx) film, a silicon oxynitride (SiOxNy; x>y) film, a silicon nitride oxide (SiNxOy; x>y) film, or the like can be used appropriately as the second insulating layer 17. Here, as the second insulating layer 17, for example, an SiNx layer having a thickness of 200 nm is formed.

Thereafter, the inorganic insulating films (the second insulating layer 17, the first insulating layer 11, and the gate insulating layer 4) are etched collectively by dry etching using a fluorine-based gas, for example. During the etching, the patch electrode 15, the source bus line SL, and the gate bus line GL each function as an etch stop. In this way, the contact hole CH2 reaching at least the gate bus line GL is formed in the second insulating layer 17, the first insulating layer 11, and the gate insulating layer 4, and the contact hole CH3 reaching at least the source bus line SL is formed in the second insulating layer 17 and the first insulating layer 11. In addition, the contact hole CH4 reaching at least the patch connection section 15p is formed in the second insulating layer 17.

In this example, since the inorganic insulating films are etched collectively, side surfaces of the second insulating layer 17, the first insulating layer 11, and the gate insulating layer 4 are aligned on a side wall of the contact hole CH2 obtained, and side walls of the second insulating layer 17 and the first insulating layer 11 are aligned on a side wall of the contact hole CH3. Note that herein, the expression "side surfaces" of different two or more layers "are aligned" in the contact hole does not only refer to a case where the side surfaces exposed in the contact hole in these layers are flush in a vertical direction, but also refers to a case where inclined surfaces such as surfaces having tapered shapes are continuously formed. Such a configuration can be obtained, for example, by etching these layers by using the same mask, or by using one of these layers as a mask to etch the other layers.

Next, a transparent conductive film (thickness of greater than or equal to 50 nm and less than or equal to 200 nm) is formed on the second insulating layer 17 and in the contact holes CH2, CH3, and CH4 by sputtering, for example. An indium tin oxide (ITO) film, an IZO film, a zinc oxide (ZnO) film or the like can be used as the transparent conductive film. Here, an ITO film having a thickness of, for example, 100 nm is used as the transparent conductive film.

Then, the transparent conductive film is patterned to form the gate terminal upper connection section 19g, the source terminal upper connection section 19s, and the transfer terminal upper connection section 19p. The gate terminal upper connection section 19g, the source terminal upper connection section 19s, and the transfer terminal upper connection section 19p are used for protecting the electrodes or wiring lines exposed at respective terminal sections. In this way, the gate terminal section GT, the source terminal section ST, and the transfer terminal section PT are obtained.
Structure of Slot Substrate 201

Then, a structure of the slot substrate 201 will be described specifically.

Figure 6:
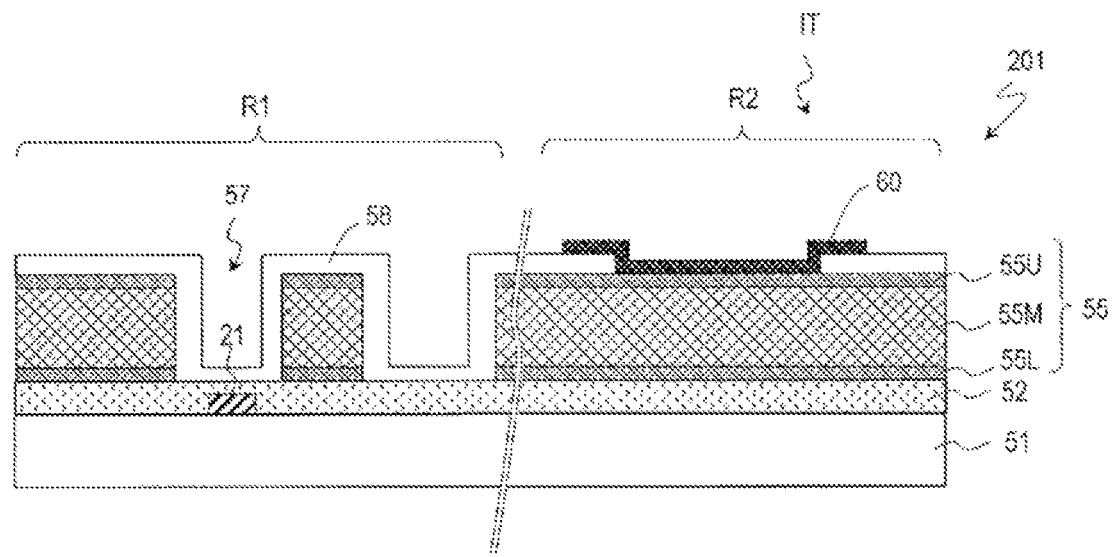
FIG. 6 is a cross-sectional view schematically illustrating an antenna unit region U and a terminal section IT in the slot substrate 201.

FIG. 6 is a cross-sectional view schematically illustrating the antenna unit region U and the terminal section IT in the slot substrate 201.

The slot substrate 201 includes the dielectric substrate 51 including a surface and a rear surface, a third insulating layer 52 formed on the surface of the dielectric substrate 51, the slot electrode 55 formed on the third insulating layer 52, and a fourth insulating layer 58 covering the slot electrode 55. A reflective conductive plate 65 is disposed to face the rear surface of the dielectric substrate 51 via a dielectric layer (air layer) 54. The slot electrode 55 and the reflective conductive plate 65 function as walls of the waveguide 301.

In the transmission and/or reception region R1, the plurality of slots 57 are formed in the slot electrode 55. Each slot 57 is an opening penetrating the slot electrode 55. In this example, one slot 57 is disposed in each antenna unit region U.

The fourth insulating layer 58 is formed on the slot electrode 55 and in the slot 57. A material of the fourth insulating layer 58 may be the same as the material of the third insulating layer 52. Since the slot electrode 55 is covered with the fourth insulating layer 58 to prevent the slot electrode 55 and the liquid crystal layer LC from being in direct contact with each other, reliability can be enhanced. In a case where the slot electrode 55 is formed of a Cu layer, Cu may elute into the liquid crystal layer LC. In addition, in a case where the slot electrode 55 is formed of an Al layer by using a thin film deposition technique, the Al layer may include a void. The fourth insulating layer 58 can prevent the liquid crystal material from entering the void of the Al layer. Note that in a case where the slot electrode 55 is prepared by bonding aluminum foil as the Al layer on the dielectric substrate 51 with an adhesive and patterning the Al layer, a problem of the void can be avoided.

The slot electrode 55 includes a main layer 55M such as a Cu layer and an Al layer. The slot electrode 55 may include a layered structure including the main layer 55M, and an upper layer 55U and a lower layer 55L disposed to sandwich the main layer 55M between the upper layer 55U and the lower layer 55L. A thickness of the main layer 55M may be set in consideration for a skin effect depending on a material, and may be, for example, greater than or equal to 2 μm and less than or equal to 30 μm. The thickness of the main layer 55M is typically greater than the thickness of each of the upper layer 55U and the lower layer 55L.

In the illustrated example, the main layer 55M is a Cu layer, and the upper layer 55U and the lower layer 55L are Ti layers. Adhesion between the slot electrode 55 and the third insulating layer 52 can be improved by disposing the lower layer 55L between the main layer 55M and the third insulating layer 52. In addition, corrosion of the main layer 55M (for example, the Cu layer) can be suppressed by providing the upper layer 55U.

Since the reflective conductive plate 65 constitutes the wall of the waveguide 301, it is preferable that the reflective conductive plate 65 have a thickness three times or greater the skin depth, and preferably five times or greater the skin depth. For example, an aluminum plate, a copper plate, or the like prepared by a cutting out process and having a thickness of several millimeters can be used as the reflective conductive plate 65.

Figure 7:
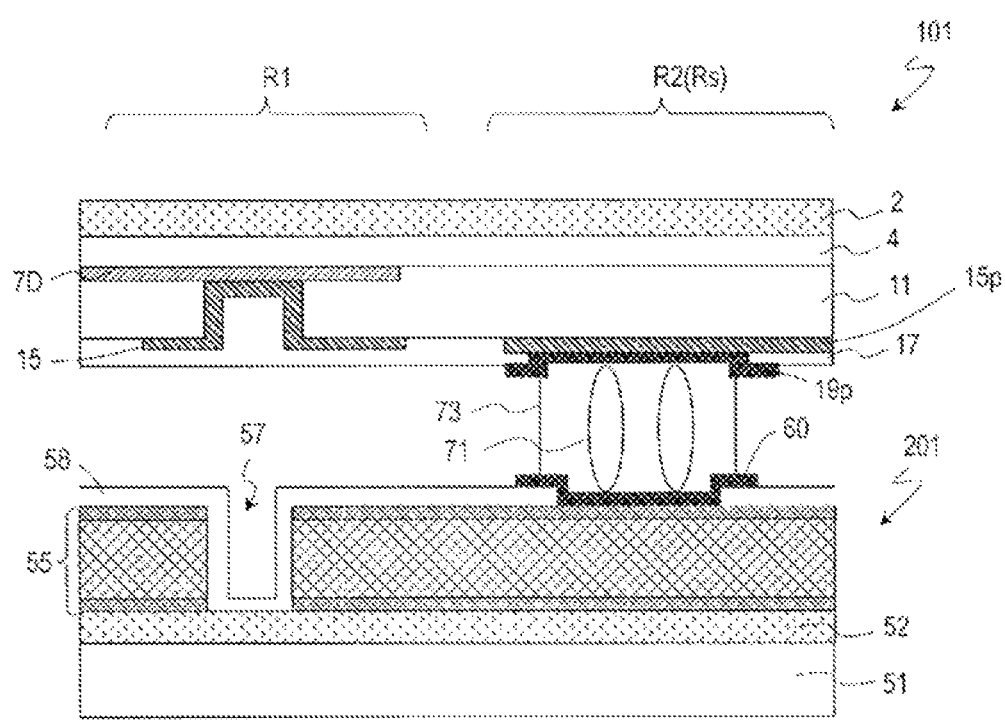
FIG. 7 is a schematic cross-sectional view for illustrating a transfer section in the TFT substrate 101 and the slot substrate 201.

The terminal section IT is provided in the non-transmission and/or reception region R2. The terminal section IT includes the slot electrode 55, the fourth insulating layer 58 covering the slot electrode 55, and an upper connection section 60. The fourth insulating layer 58 includes an opening reaching at least the slot electrode 55. The upper connection section 60 is in contact with the slot electrode 55 in the opening. In the present embodiment, the terminal section IT is disposed in the seal region Rs, and is connected to the transfer terminal section on the TFT substrate (transfer section) by a sealing resin containing conductive particles.
Transfer Section FIG. 7 is a schematic cross-sectional view for explaining the transfer section configured to connect the transfer terminal section PT of the TFT substrate 101 and the terminal section IT of the slot substrate 201. In FIG. 7, the same constituent elements as the constituent elements in FIG. 1 to FIG. 4C are denoted by the same reference signs.

In the transfer section, the upper connection section 60 of the terminal section IT is electrically connected to the transfer terminal upper connection section 19p of the transfer terminal section PT in the TFT substrate 101. In the present embodiment, the upper connection section 60 and the transfer terminal upper connection section 19p are connected via a resin (sealing resin) 73 (may also be referred to as a sealing portion 73) including conductive beads 71.

Any of the upper connection sections 60 and 19p is a transparent conductive layer such as an ITO film or an IZO film, and an oxide film may be formed on a surface of the transparent conductive layer. When the oxide film is formed, there is a possibility that electrical connection between the transparent conductive layers cannot be ensured, and that contact resistance increase. In contrast, in the present embodiment, since these transparent conductive layers are bonded via a resin including the conductive beads (for example, Au beads) 71, even in a case where a surface oxide film is formed, the conductive beads pierce (penetrate) the surface oxide film and thus, it is possible to suppress an increase in contact resistance. The conductive beads 71 may penetrate not only the surface oxide film but also may penetrate the upper connection sections 60 and 19p which are the transparent conductive layers, and may be in direct contact with the patch connection section 15p and the slot electrode 55.

The transfer section may be disposed at each of a central portion and a peripheral portion of the scanning antenna 1000 (that is, inside and outside of the transmission and/or reception region R1 having a donut shape as viewed from the normal direction of the scanning antenna 1000), or may be disposed only at any one of the central portion and the peripheral portion of the scanning antenna 1000. The transfer section may be disposed in the seal region Rs in which the liquid crystal is enclosed, or may be disposed outside the seal region Rs (opposite to the liquid crystal layer).

Manufacturing Method of Slot Substrate 201

The slot substrate 201 can be manufactured by the following method, for example.

First, the third insulating layer (thickness of 200 nm, for example) 52 is formed on the dielectric substrate. A substrate such as a glass substrate and a resin substrate having a high transmittance to electromagnetic waves (the dielectric constant EM and the dielectric loss tan 5m are small) can be used as the dielectric substrate. The dielectric substrate is preferably thin to suppress attenuation of electromagnetic waves. For example, constituent elements such as the slot electrode 55 may be formed on a surface of the glass substrate by a process described below, and thereafter the glass substrate may be thinned from the rear surface side. In this way, a thickness of the glass substrate can be reduced to 500 µm or less, for example.

When a resin substrate is used as the dielectric substrate, constituent elements such as TFTs may be formed directly on the resin substrate, or may be formed on the resin substrate by using a transfer method. According to the transfer method, for example, a resin film (for example, a polyimide film) is formed on the glass substrate, and the constituent elements are formed on the resin film by a process described below, and thereafter the resin film on which the constituent elements are formed is separated from the glass substrate. Generally, the dielectric constant $\varepsilon_M$ and the dielectric loss tan $\delta_M$ of a resin are smaller than the dielectric constant $\varepsilon_M$ and the dielectric loss tan $\delta_M$ of glass. A thickness of the resin substrate is, for example, from 3 µm to 300 µm. Besides polyimide, for example, a liquid crystal polymer can also be used as the resin material.

The third insulating layer 52 is not particularly limited, but, for example, a silicon oxide ($SiO_2$) film, a silicon nitride (SiNx) film, a silicon oxynitride (SiOxNy; x>y) film, a silicon nitride oxide (SiNxOy; x>y) film, or the like can be used appropriately.

Then, a metal film is formed on the third insulating layer 52, and is patterned to obtain the slot electrode 55 including the plurality of slots 57. As the metal film, a Cu film (or Al film) having a thickness of from 2 to 6 µm may be used. Here, a layered film including a Ti film, a Cu film, and a Ti film layered one on another in this order is used. Note that alternatively, a layered film including Ti (thickness of 50 nm, for example) and Cu (thickness of 5000 nm, for example) layered one on another in this order may be formed.

Thereafter, the fourth insulating layer (thickness of 100 nm or 200 nm, for example) 58 is formed on the slot electrode 55 and in the slot 57. A material of the fourth insulating layer 58 may be the same as the material of the third insulating layer. Thereafter, in the non-transmission and/or reception region R2, an opening reaching at least the slot electrode 55 is formed in the fourth insulating layer 58.

Then, a transparent conductive film is formed on the fourth insulating layer 58 and in the opening of the fourth insulating layer 58, and is patterned to form the upper connection section 60 being in contact with the slot electrode 55 in the opening. In this way, the terminal section IT is obtained.

Material and Structure of TFT 10

In the present embodiment, the TFT including the semiconductor layer 5 as an active layer is used as a switching element disposed in each pixel. The semiconductor layer 5 is not limited to an amorphous silicon layer, and may be a polysilicon layer or an oxide semiconductor layer.

In a case where an oxide semiconductor layer is used, an oxide semiconductor incorporated in the oxide semiconductor layer may be an amorphous oxide semiconductor or may be a crystalline oxide semiconductor including a crystalline portion. Examples of the crystalline oxide semiconductor include a polycrystalline oxide semiconductor, a microcrystalline oxide semiconductor, and a crystalline oxide semiconductor having a c-axis oriented substantially orthogonal to a layer surface.

The oxide semiconductor layer may include a layered structure of two or more layers. In a case where the oxide semiconductor layer includes a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In a case where the oxide semiconductor layer includes a two-layer structure including an upper layer and a lower layer, an energy gap of the oxide semiconductor incorporated in the upper layer is preferably greater than an energy gap of the oxide semiconductor incorporated in the lower layer. However, when a difference in the energy gap between these layers is relatively small, the energy gap of the oxide semiconductor in the lower layer may be larger than the energy gap of the oxide semiconductor in the upper layer.

JP 2014-007399 A, for example, describes materials and structures of an amorphous oxide semiconductor and of each of the above-described crystalline oxide semiconductors, a film formation method, a configuration of an oxide semiconductor layer including a layered structure, and the like. The entire contents of the disclosure of JP 2014-007399 A are incorporated herein by reference.

The oxide semiconductor layer may include, for example, at least one metal element of In, Ga, and Zn. In the present embodiment, the oxide semiconductor layer includes, for example, an In—Ga—Zn—O based semiconductor (for example, indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2. Such an oxide semiconductor layer can be formed of an oxide semiconductor film including the In—Ga—Zn—O based semiconductor. Note that a channel etched type TFT including an active layer including an oxide semiconductor such as the In—Sn—Zn—O based semiconductor may be referred to as a "CE-OS-TFT".

The In—Sn—Zn—O based semiconductor may be an amorphous semiconductor or a crystalline semiconductor. A crystalline In—Sn—Zn—O based semiconductor having a c-axis oriented substantially orthogonal to a layer surface is preferable as the crystalline In—Ga—Zn—O based semiconductor.

Note that a crystal structure of the crystalline In—Sn—Zn—O based semiconductor is disclosed in, for example, JP 2014-007399 A, JP 2012-134475 A, and JP 2014-209727 A described above. The entire contents of disclosures of JP 2012-134475 A and JP 2014-209727 A are incorporated herein by reference. Since a TFT including an In—Sn—Zn—O based semiconductor layer has high mobility (more than 20 times in comparison with an a-Si TFT) and low leakage current (less than 1/100th in comparison with an a-Si TFT), such a TFT can suitably be used as a driving TFT (for example, a TFT incorporated in a driving circuit provided in the non-transmission and/or reception region) and a TFT provided in each antenna unit region.

The oxide semiconductor layer may include another oxide semiconductor in place of the In—Sn—Zn—O based semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

In the example illustrated in FIG. 3A and FIG. 3B, the TFT 10 is a channel etched type TFT including a bottom gate structure. The "channel etched type TFT" does not include an etch stop layer formed on a channel region, and a lower face of an end portion on the channel side of each of source and drain electrodes is disposed to come into contact with an upper face of a semiconductor layer. The channel etched type TFT is formed by, for example, forming a conductive film for the source/drain electrode on the semiconductor layer and performing source/drain separation. In the source/drain separation step, a surface portion of the channel region may be etched.

Note that the TFT 10 may be an etch stop type TFT including an etch stop layer formed on a channel region. In the etch stop type TFT, a lower face of an end portion on the channel side of each of source and drain electrodes is located, for example, on the etch stop layer. The etch stop type TFT is formed by, for example, forming the etch stop layer covering a portion serving as the channel region in a semiconductor layer, and thereafter forming a conductive film for the source/drain electrode on the semiconductor layer and on the etch stop layer to perform source/drain separation.

In addition, although the TFT 10 includes a top contact structure in which the source and drain electrodes are in contact with the upper face of the semiconductor layer, the source and drain electrodes may be disposed to be in contact with the lower face of the semiconductor layer (a bottom contact structure). Further, the TFT 10 may include a bottom gate structure including a gate electrode on the dielectric substrate side of the semiconductor layer, or may include a top gate structure including the gate electrode above the semiconductor layer.

Second Embodiment

A scanning antenna of a second embodiment will be described with reference to the drawings. A TFT substrate of the scanning antenna of the present embodiment differs from the TFT substrate 101 illustrated in FIG. 2A in that a transparent conductive layer serving as an upper connection section of each terminal section is provided between a first insulating layer and a second insulating layer in the TFT substrate.

Figure 8A:
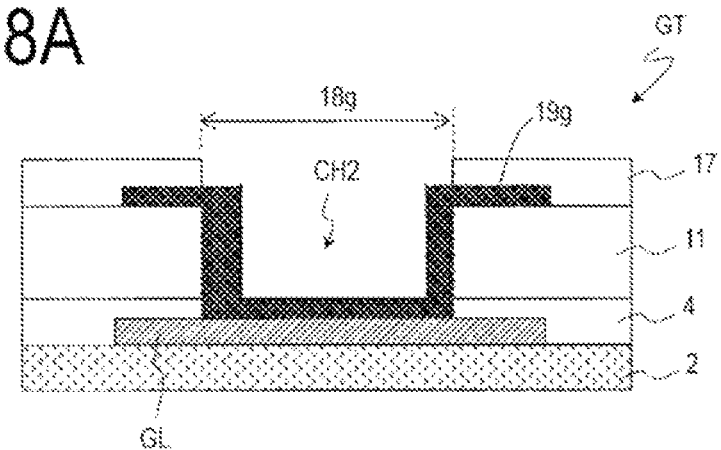
FIG. 8A to FIG. 8C are cross-sectional views illustrating a gate terminal section GT, a source terminal section ST, and a transfer terminal section PT of a TFT substrate 102 in a second embodiment, respectively.
Figure 8B:
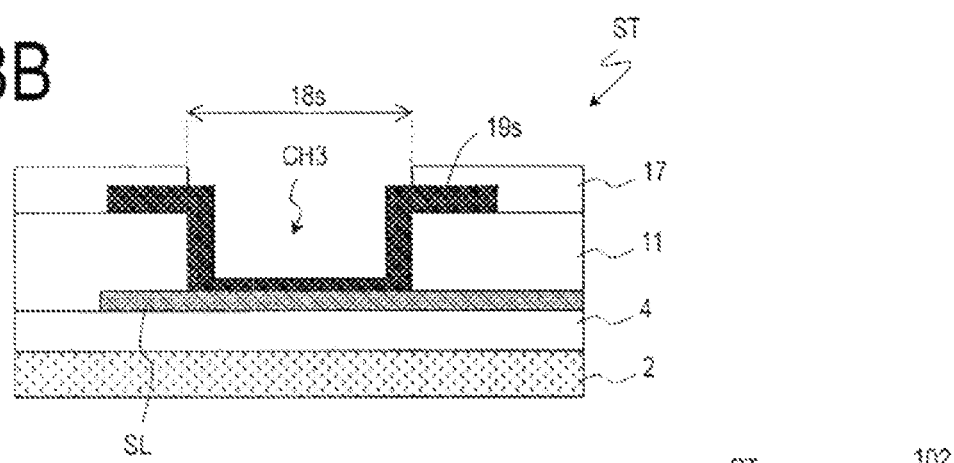
Figure 8C:
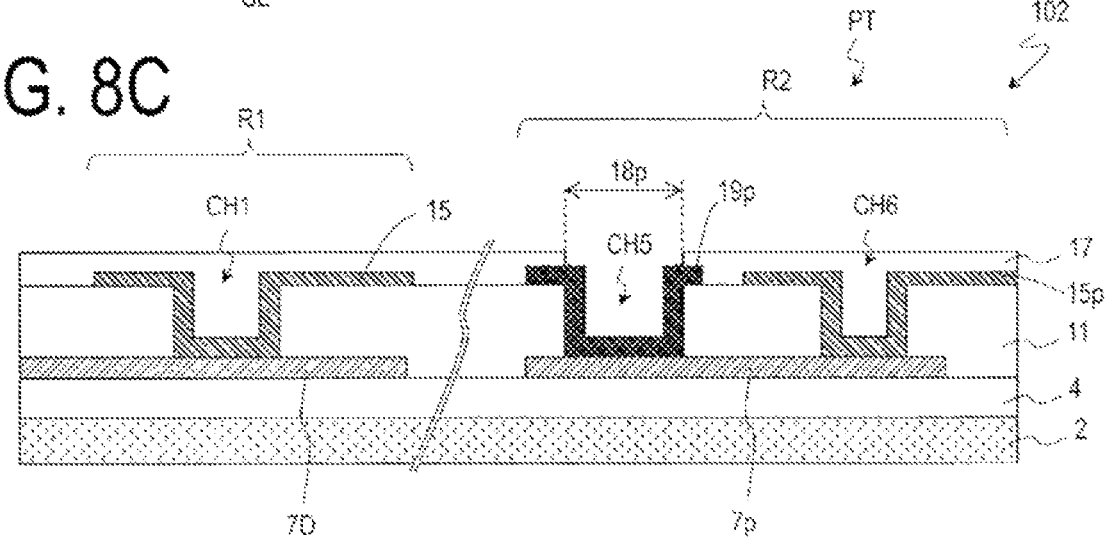

FIG. 8A to FIG. 8C are cross-sectional views illustrating a gate terminal section GT, a source terminal section ST, and a transfer terminal section PT of a TFT substrate 102 in the present embodiment, respectively. The same constituent elements as the constituent elements in FIG. 4A to FIG. 4C are denoted by the same reference signs, and description of these constituent elements will be omitted. Note that since a cross-sectional structure of an antenna unit region U is similar to the cross-sectional structure of the antenna unit region U of the above-described embodiment (FIG. 3A and FIG. 3B), illustration and description of the cross-sectional structure of the antenna unit region U will be omitted.

The gate terminal section GT in the present embodiment includes a gate bus line GL formed on a dielectric substrate, an insulating layer covering the gate bus line GL, and a gate terminal upper connection section 19g. The gate terminal upper connection section 19g is in contact with the gate bus line GL in a contact hole CH2 formed in the insulating layer. In this example, the insulating layer covering the gate bus line GL includes a gate insulating layer 4 and a first insulating layer 11. A second insulating layer 17 is formed on the gate terminal upper connection section 19g and on the first insulating layer 11. The second insulating layer 17 includes an opening 18g exposing a part of the gate terminal upper connection section 19g. In this example, the opening 18g of the second insulating layer 17 may be disposed to expose entirely the contact hole CH2.

The source terminal section ST includes a source bus line SL formed on the dielectric substrate (here, on the gate insulating layer 4), an insulating layer covering the source bus line SL, and a source terminal upper connection section 19s. The source terminal upper connection section 19s is in contact with the source bus line SL in a contact hole CH3 formed in the insulating layer. In this example, the insulating layer covering the source bus line SL includes only the first insulating layer 11. The second insulating layer 17 extends on the source terminal upper connection section 19s and on the first insulating layer 11. The second insulating layer 17 includes an opening 18s exposing a part of the source terminal upper connection section 19s. The opening 18s of the second insulating layer 17 may be disposed to expose entirely the contact hole CH3.

The transfer terminal section PT includes a source connection wiring line 7p formed of the same conductive film (source conductive film) as a conductive film of the source bus line SL, the first insulating layer 11 extending on the source connection wiring line 7p, and a transfer terminal upper connection section 19p and a patch connection section 15p formed on the first insulating layer 11.

Contact holes CH5 and CH6 are provided in the first insulating layer 11 to expose the source connection wiring line 7p. The transfer terminal upper connection section 19p is disposed on the first insulating layer 11 and in the contact hole CH5, and is in contact with the source connection wiring line 7p in the contact hole CH5. The patch connection section 15p is disposed on the first insulating layer 11 and in the contact hole CH6, and is in contact with the source connection wiring line 7p in the contact hole CH6. The transfer terminal upper connection section 19p is a transparent electrode formed of a transparent conductive film. The patch connection section 15p is formed of the same conductive film as a conductive film of a patch electrode 15. Note that the upper connection sections 19g, 19s, and 19p of the respective terminal sections may be formed of the same transparent conductive film.

The second insulating layer 17 extends on the transfer terminal upper connection section 19p, the patch connection section 15p, and the first insulating layer 11. The second insulating layer 17 includes an opening 18p exposing a part of the transfer terminal upper connection section 19p. In this example, the opening 18p of the second insulating layer 17 is disposed to expose entirely the contact hole CH5. On the other hand, the patch connection section 15p is covered with the second insulating layer 17.

In this way, in the present embodiment, the source connection wiring line 7p formed in a source metal layer electrically connects the transfer terminal upper connection section 19p of the transfer terminal section PT and the patch connection section 15p. Although not illustrated in the drawings, as with the above-described embodiment, the transfer terminal upper connection section 19p is connected to a slot electrode of a slot substrate 201 by a sealing resin containing conductive particles.

In the above-described embodiment, the contact holes CH1 to CH4 having different depths are collectively formed after formation of the second insulating layer 17. For example, while the relatively thick insulating layers (the gate insulating layer 4, the first insulating layer 11 and the second insulating layer 17) are etched on the gate terminal section GT, only the second insulating layer 17 is etched in the transfer terminal section PT. For this reason, there is a possibility that a conductive film (for example, a patch electrode conductive film) serving as a base of a shallow contact hole be considerably damaged during etching.

In contrast, in the present embodiment, the contact holes CH1 to CH3, CH5, and CH6 are formed prior to the formation of the second insulating layer 17. Since these contact holes are formed only in the first insulating layer 11 or in a layered film of the first insulating layer 11 and the gate insulating layer 4, a difference in a depth among the contact holes collectively formed can be reduced more than in the above-described embodiment. Accordingly, a damage to a conductive film serving as a base of a contact hole can be reduced. Particularly, when an Al film is used for the patch electrode conductive film, and an ITO film is brought into direct contact with the Al film, favorable contact cannot be obtained and thus, a cap layer such as an MoN layer may be formed on an upper layer of the Al film. In such a case, it is unnecessary to increase a thickness of the cap layer in consideration for a damage during etching and thus, such a case is advantageous.

Manufacturing Method of TFT Substrate 102

Figure 9:
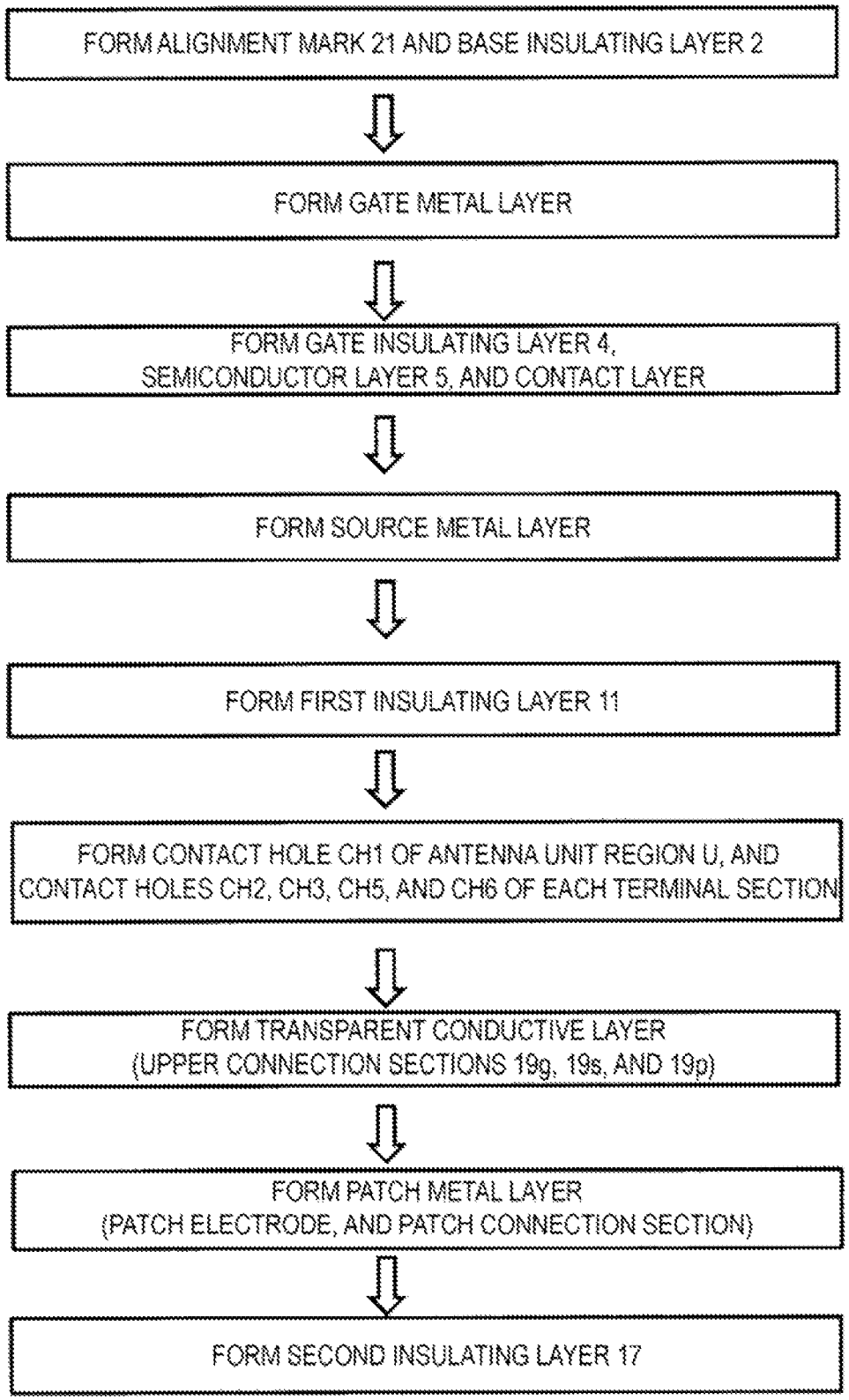
FIG. 9 is a view illustrating an example of the manufacturing steps of the TFT substrate 102.

The TFT substrate 102 is manufactured by the following method, for example. FIG. 9 is a view illustrating an example of manufacturing steps of the TFT substrate 102. Note that hereinafter, in a case where a material, a thickness, a formation method, and the like of each layer are the same as in the case of the TFT substrate 101 described above, description of the material, the thickness, the formation method, and the like of each layer will be omitted.

First, an alignment mark, a base insulating layer, a gate metal layer, a gate insulating layer, a semiconductor layer, a contact layer, and a source metal layer are formed on a dielectric substrate by the same method as in the case of the TFT substrate 101, and a TFT is obtained. In the step of forming the source metal layer, in addition to source and drain electrodes and a source bus line, the source connection wiring line 7p is also formed of a source conductive film.

Next, the first insulating layer 11 is formed to cover the source metal layer. Thereafter, the first insulating layer 11 and the gate insulating layer 4 are collectively etched to form the contact holes CH1 to CH3, CH5, and CH6. During the etching, each of the source bus line SL and the gate bus line GL functions as an etch stop. In this way, in a transmission and/or reception region R1, the contact hole CH1 reaching at least the drain electrode of the TFT is formed in the first insulating layer 11. In addition, in a non-transmission and/or reception region R2, the contact hole CH2 reaching at least the gate bus line GL is formed in the first insulating layer 11 and the gate insulating layer 4, and the contact hole CH3 reaching at least the source bus line SL and the contact holes CH5 and CH6 reaching at least the source connection wiring line 7p are formed in the first insulating layer 11. The contact hole CH5 may be disposed in the seal region Rs and the contact hole CH6 may be disposed outside the seal region Rs. Alternatively, both the contact hole CH5 and the contact hole CH6 may be disposed outside the seal region Rs.

Then, a transparent conductive film is formed on the first insulating layer 11 and in the contact holes CH1 to CH3, CH5, and CH6, and is patterned. In this way, the gate terminal upper connection section 19g being in contact with the gate bus line GL in the contact hole CH2, the source terminal upper connection section 19s being in contact with the source bus line SL in the contact hole CH3, and the transfer terminal upper connection section 19p being in contact with the source connection wiring line 7p in the contact hole CH5 are formed.

Next, a patch electrode conductive film is formed on the first insulating layer 11, the gate terminal upper connection section 19g, the source terminal upper connection section 19s, and the transfer terminal upper connection section 19p, and in the contact holes CH1 and CH6, and is patterned. In this way, the patch electrode 15 being in contact with a drain electrode 7D in the contact hole CH1 is formed in the transmission and/or reception region R1, and the patch connection section 15p being in contact with the source connection wiring line 7p in the contact hole CH6 is formed in the non-transmission and/or reception region R2. The patterning of the patch electrode conductive film may be performed by wet etching. Here, an etchant capable of increasing an etching selection ratio between the transparent conductive film (ITO or the like) and the patch electrode conductive film (for example, an Al film) is used. In this way, when the patch electrode conductive film is patterned, the transparent conductive film can function as an etch stop. Since portions of the source bus line SL, the gate bus line GL, and the source connection wiring line 7p exposed by the contact holes CH2, CH3, and CH5 are covered with an etch stop (transparent conductive film), the portions are not etched.

Subsequently, the second insulating layer 17 is formed. Thereafter, the second insulating layer 17 is patterned by, for example, dry etching using a fluorine-based gas. In this way, the opening 18g exposing the gate terminal upper connection section 19g, the opening 18s exposing the source terminal upper connection section 19s, and the opening 18p exposing the transfer terminal upper connection section 19p are provided in the second insulating layer 17. In this way, the TFT substrate 102 is obtained.

Third Embodiment

A scanning antenna of a third embodiment will be described with reference to the drawings. A TFT substrate in the scanning antenna of the present embodiment differs from the TFT substrate 102 illustrated in FIGS. 8A to 8C in that an upper connection section including a transparent conductive film is not provided in a transfer terminal section.

Figure 10A:
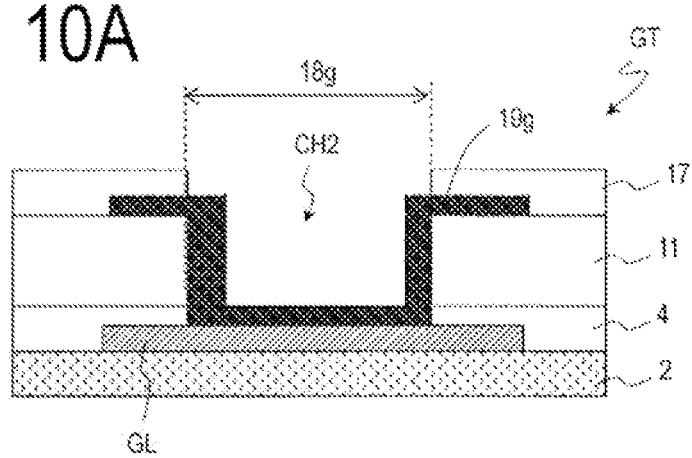
FIG. 10A to FIG. 10C are cross-sectional views illustrating a gate terminal section GT, a source terminal section ST, and a transfer terminal section PT of a TFT substrate 103 in a third embodiment, respectively.
Figure 10B:
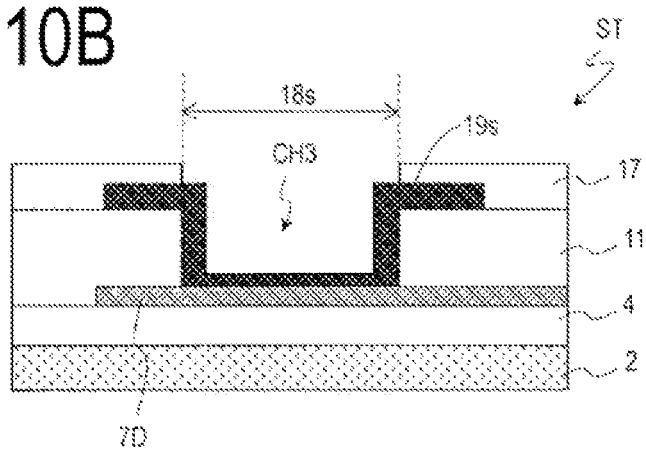
Figure 10C:
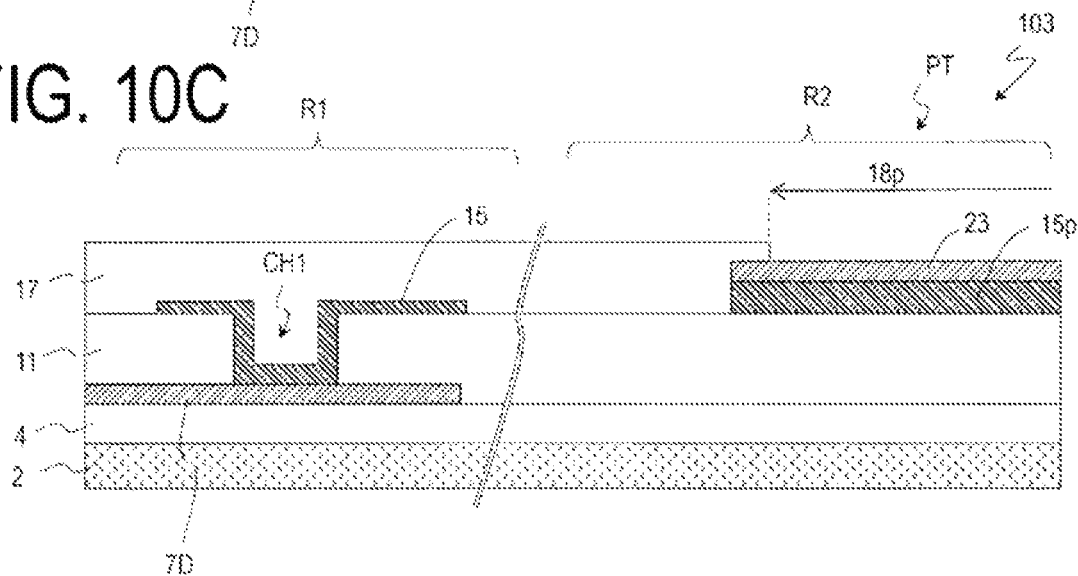

FIG. 10A to FIG. 10C are cross-sectional views illustrating a gate terminal section GT, a source terminal section ST, and a transfer terminal section PT of a TFT substrate 103 in the present embodiment, respectively. The same constituent elements as the constituent elements in FIG. 8A to FIG. 8C are denoted by the same reference signs, and description of these constituent elements will be omitted. Note that since a structure of an antenna unit region U is similar to the structure of the antenna unit region U in the above-described embodiment (FIG. 3A and FIG. 3B), illustration and description of the structure of the antenna unit region U will be omitted.

Structures of the gate terminal section GT and the source terminal section ST are similar to the structures of the gate terminal section and the source terminal section of the TFT substrate 102 illustrated in FIG. 8A and FIG. 8B.

The transfer terminal section PT includes a patch connection section 15p formed on a first insulating layer 11 and a protective conductive layer 23 layered on the patch connection section 15p. A second insulating layer 17 extends on the protective conductive layer 23 and includes an opening 18p exposing a part of the protective conductive layer 23. On the other hand, a patch electrode 15 is covered with the second insulating layer 17.

Manufacturing Method of TFT Substrate 103

Figure 11:
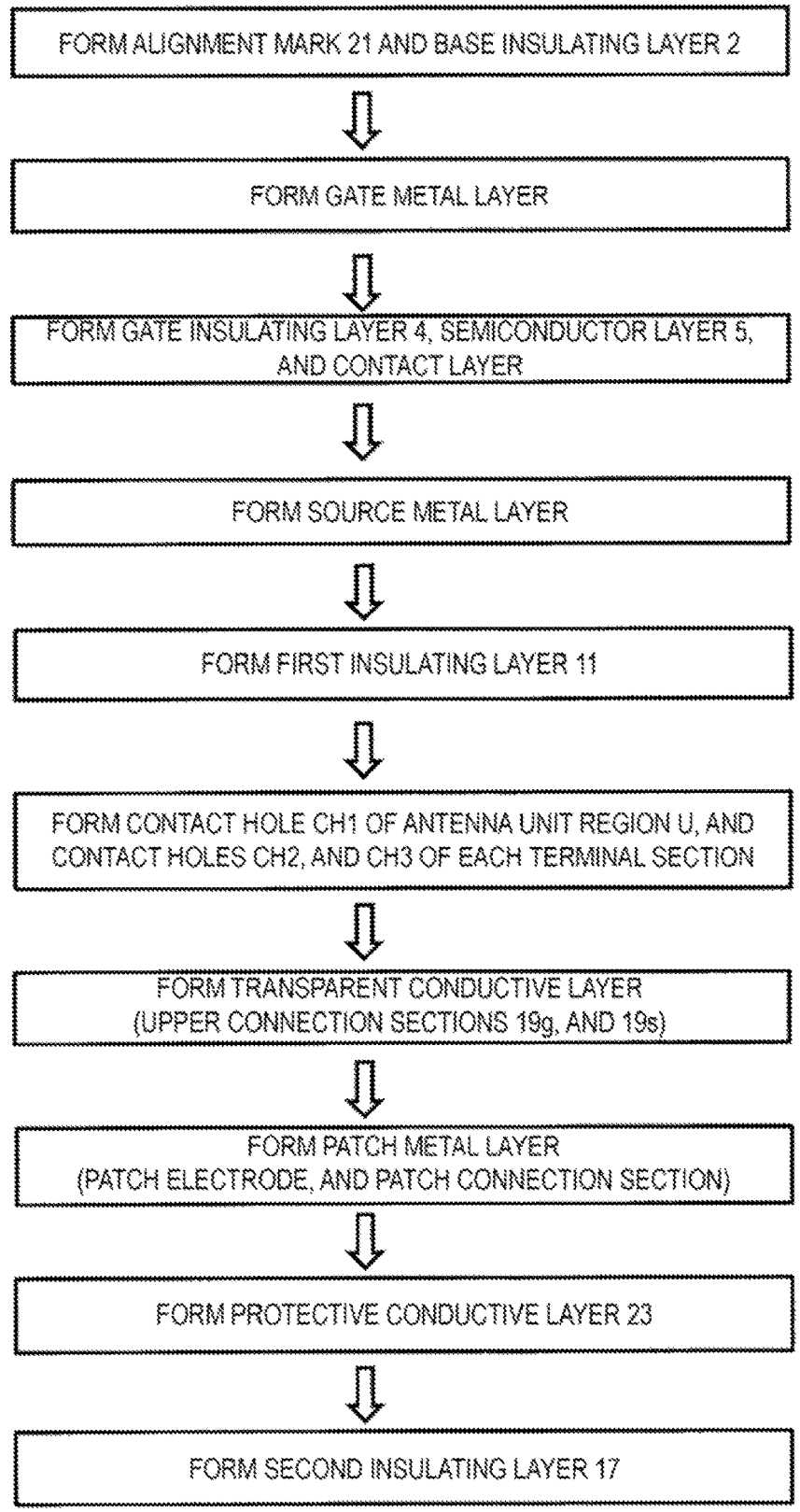
FIG. 11 is a view illustrating an example of the manufacturing steps of the TFT substrate 103.

A TFT substrate 103 is manufactured by the following method, for example. FIG. 11 is a view illustrating an example of manufacturing steps of the TFT substrate 103. Note that hereinafter, in a case where a material, a thickness, a formation method, and the like of each layer are the same as in the case of the TFT substrate 101 described above, description of the material, the thickness, the formation method, and the like of each layer will be omitted.

First, an alignment mark, a base insulating layer, a gate metal layer, a gate insulating layer, a semiconductor layer, a contact layer, and a source metal layer are formed on a dielectric substrate in the same method as in the case of the TFT substrate 101, and a TFT is obtained.

Next, the first insulating layer 11 is formed to cover the source metal layer. Thereafter, the first insulating layer 11 and a gate insulating layer 4 are collectively etched to form contact holes CH1 to CH3. During the etching, each of a source bus line SL and a gate bus line GL functions as an etch stop. In this way, the contact hole CH1 reaching at least a drain electrode of the TFT is formed in the first insulating layer 11, the contact hole CH2 reaching at least the gate bus line GL is formed in the first insulating layer 11 and the gate insulating layer 4, and the contact hole CH3 reaching at least the source bus line SL is formed in the first insulating layer 11. No contact hole is formed in a region where the transfer terminal section is formed.

Then, a transparent conductive film is formed on the first insulating layer 11 and in the contact holes CH1, CH2, and CH3, and is patterned. In this way, a gate terminal upper connection section 19g being in contact with the gate bus line GL in the contact hole CH2 and a source terminal upper connection section 19s being in contact with the source bus line SL in the contact hole CH3 are formed. In a region where the transfer terminal section is formed, the transparent conductive film is removed.

Next, a patch electrode conductive film is formed on the first insulating layer 11, the gate terminal upper connection section 19g and the source terminal upper connection section 19s, and in the contact hole CH1, and is patterned. In this way, the patch electrode 15 being in contact with a drain electrode 7D in the contact hole CH1 is formed in a transmission and/or reception region R1, and the patch connection section 15p is formed in a non-transmission and/or reception region R2. As with the above-described embodiments, an etchant capable of ensuring an etching selection ratio between the transparent conductive film (ITO or the like) and the patch electrode conductive film is used for patterning the patch electrode conductive film.

Subsequently, the protective conductive layer 23 is formed on the patch connection section 15p. A Ti layer, an ITO layer, an indium zinc oxide (IZO) layer (thickness of greater than or equal to 50 nm and less than or equal to 100 nm, for example), and the like can be used as the protective conductive layer 23. Here, a Ti layer (thickness of 50 nm, for example) is used as the protective conductive layer 23. Note that the protective conductive layer may be formed on the patch electrode 15.

Then, the second insulating layer 17 is formed. Thereafter, the second insulating layer 17 is patterned by, for example, dry etching using a fluorine-based gas. In this way, an opening 18g exposing the gate terminal upper connection section 19g, an opening 18s exposing the source terminal upper connection section 19s, and an opening 18p exposing the protective conductive layer 23 are provided in the second insulating layer 17. In this way, the TFT substrate 103 is obtained.

Structure of Slot Substrate 203

Figure 12:
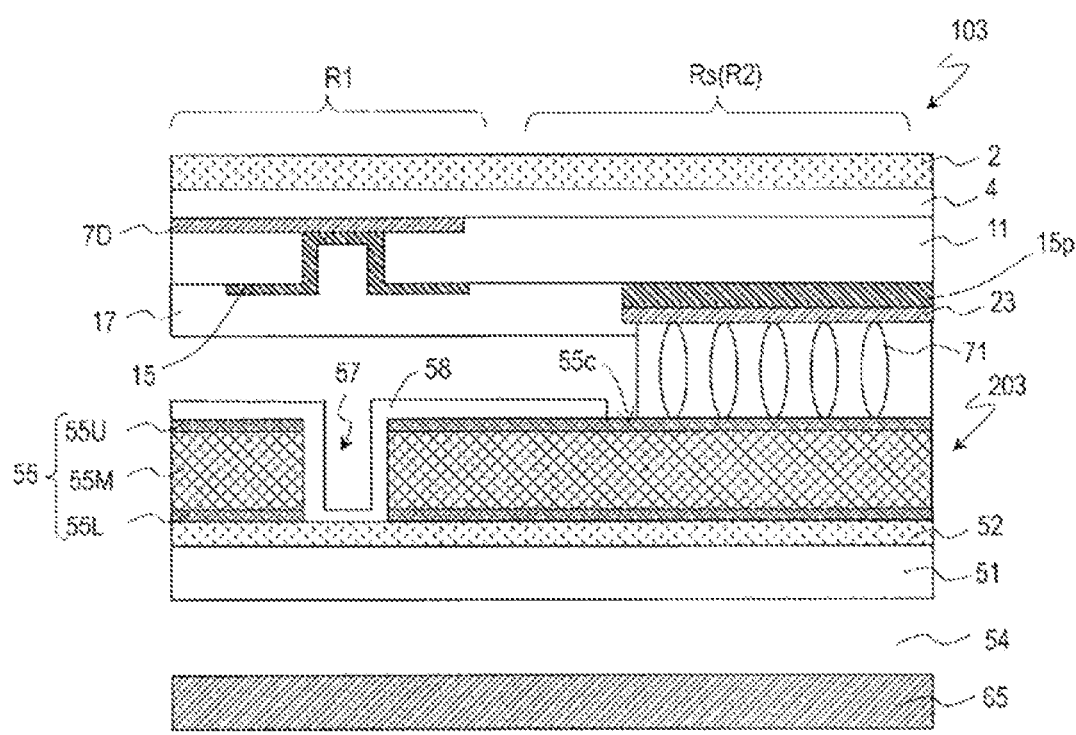
FIG. 12 is a schematic cross-sectional view for explaining a transfer section in the TFT substrate 103 and a slot substrate 203.

FIG. 12 is a schematic cross-sectional view for explaining a transfer section configured to connect the transfer terminal section PT of the TFT substrate 103 and a terminal section IT of a slot substrate 203 in the present embodiment. In FIG. 12, the same constituent elements as the constituent elements in the embodiments described above are denoted by the same reference signs.

First, the slot substrate 203 in this embodiment will be described. The slot substrate 203 includes a dielectric substrate 51, a third insulating layer 52 formed on a surface of the dielectric substrate 51, a slot electrode 55 formed on the third insulating layer 52, and a fourth insulating layer 58 covering the slot electrode 55. A reflective conductive plate 65 is disposed to face a rear surface of the dielectric substrate 51 via a dielectric layer (air layer) 54. The slot electrode 55 and the reflective conductive plate 65 function as walls of a waveguide 301.

The slot electrode 55 includes a layered structure including a Cu layer or an Al layer as a main layer 55M. In the transmission and/or reception region R1, a plurality of slots 57 are formed in the slot electrode 55. The structure of the slot electrode 55 in the transmission and/or reception region R1 is the same as the structure of the slot substrate 201 described above with reference to FIG. 6.

The terminal section IT is provided in the non-transmission and/or reception region R2. The terminal section IT includes an opening exposing a surface of the slot electrode 55 and provided in the fourth insulating layer 58. An exposed area of the slot electrode 55 serves as a contact surface 55c. In this way, in the present embodiment, the contact surface 55c of the slot electrode 55 is not covered with the fourth insulating layer 58.

In the transfer section, the protective conductive layer 23 covering the patch connection section 15p of the TFT substrate 103 and the contact surface 55c of the slot electrode 55 of the slot substrate 203 are connected to each other via a resin (sealing resin) containing conductive beads 71.

As with the above-described embodiments, the transfer section in the present embodiment may be disposed at each of a central portion and a peripheral portion of the scanning antenna, or may be disposed in only any one of the central portion and the peripheral portion of the scanning antenna. In addition, the transfer section may be disposed in a seal region Rs or may be disposed outside the seal region Rs (opposite to the liquid crystal layer).

In the present embodiment, no transparent conductive film is provided on the transfer terminal section PT and the contact surface of the terminal section IT. Thus, the protective conductive layer 23 and the slot electrode 55 of the slot substrate 203 can be connected to each other via a sealing resin containing conductive particles.

In addition, in the present embodiment, since a difference in a depth among the contact holes collectively formed is small in comparison with the first embodiment (FIG. 3A to FIG. 4C), a damage to a conductive film serving as a base of a contact hole can be reduced.

Manufacturing Method of Slot Substrate 203

The slot substrate 203 is manufactured as follows. Since a material, a thickness, and a formation method of each layer are the same as in the case of the slot substrate 201, description of the material, the thickness, and the formation method of each layer will be omitted.

First, the third insulating layer 52 and the slot electrode 55 are formed on the dielectric substrate by the same method as in the case of the slot substrate 201, and the plurality of slots 57 are formed in the slot electrode 55. Then, the fourth insulating layer 58 is formed on the slot electrode 55 and in each slot. Thereafter, the opening 18p is provided in the fourth insulating layer 58 to expose a region serving as the contact surface of the slot electrode 55. In this way, the slot substrate 203 is manufactured.

Internal Heater Structure

As described above, it is preferable that dielectric anisotropy $\Delta_{\varepsilon M}$ of a liquid crystal material used for an antenna unit of an antenna be large. However, viscosity of a liquid crystal material (nematic liquid crystal) having large dielectric anisotropy $\Delta_{\varepsilon M}$ is high, and there is a problem of a slow response speed. Particularly, as temperature decreases, viscosity increases. An environmental temperature of a scanning antenna mounted on a moving body (for example, a ship, an aircraft, and an automobile) fluctuates. Accordingly, it is preferable that a temperature of the liquid crystal material can be adjusted to a certain extent, for example 30° C. or greater, or 45° C. or greater. A set temperature is preferably set to cause the viscosity of the nematic liquid crystal material to be about 10 cP (centipoise) or less.

In addition to the above-described structure, the scanning antenna according to an embodiment of the disclosure preferably includes an internal heater structure. A resistance heating type heater utilizing Joule heat is preferable as the internal heater. A material of a heater resistive film is not particularly limited, but, for example, a conductive material having relatively high specific resistance such as ITO and IZO can be used. In addition, to adjust a resistance value, the resistive film may be formed of thin lines or meshes made of a metal (for example, nichrome, titanium, chromium, platinum, nickel, aluminum, and copper). Thin lines or meshes made of ITO and IZO can also be used. The resistance value may be set according to a required calorific value.

For example, to set a heat generation temperature of the resistive film to 30° C. in the area (roughly 90000 mm²) of a circle having a diameter of 340 mm with 100 V AC (60 Hz), the resistance value of the resistive film may be set to 139Ω, a current may be set to 0.7 A, and power density may be set to 800 W/m². To set the heat generation temperature of the resistive film to 45° C. in the same area with 100 V AC (60 Hz), the resistance value of the resistive film may be set to 82Ω, a current may be set to 1.2 A, and power density may be set to 1350 W/m².

Figure 13A:
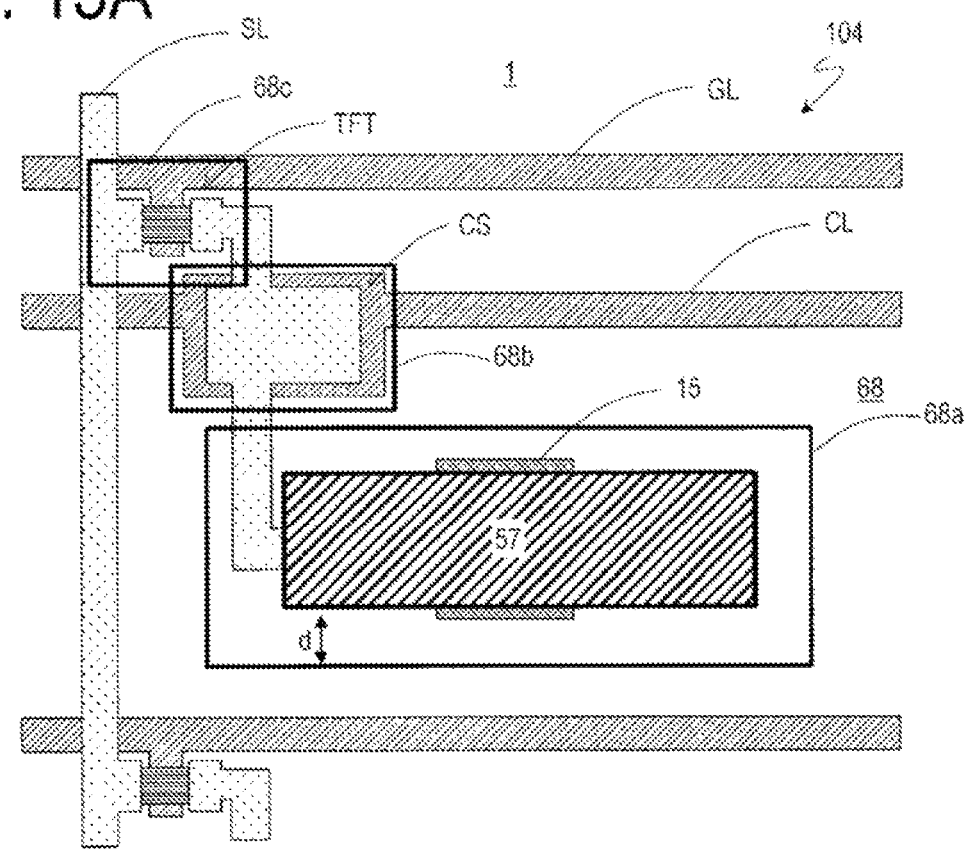
FIG. 13A is a schematic plan view of a TFT substrate 104 including a heater resistive film 68.

The heater resistive film may be provided anywhere as long as the heater resistive film does not affect an action of the scanning antenna, but to efficiently heat the liquid crystal material, the resistive film is preferably provided near the liquid crystal layer. For example, as illustrated in a TFT substrate 104 illustrated in FIG. 13A, a resistive film 68 may be formed almost entirely on a surface of a dielectric substrate 1. FIG. 13A is a schematic plan view of the TFT substrate 104 including the heater resistive film 68. The resistive film 68 is covered with, for example, the base insulating film 2 illustrated in FIG. 3A. The base insulating film 2 is formed to have sufficient dielectric strength voltage.

The resistive film 68 preferably includes openings 68a, 68b, and 68c. When the TFT substrate 104 and a slot substrate are bonded to each other, each slot 57 is located to face a patch electrode 15. At this time, the opening 68a is disposed to prevent the resistive film 68 from being present around in a distance d from an edge of the slot 57. The distance d is 0.5 mm, for example. In addition, it is also preferable to dispose the opening 68b under auxiliary capacitance CS and to dispose the opening 68c under a TFT.

Figure 13B:
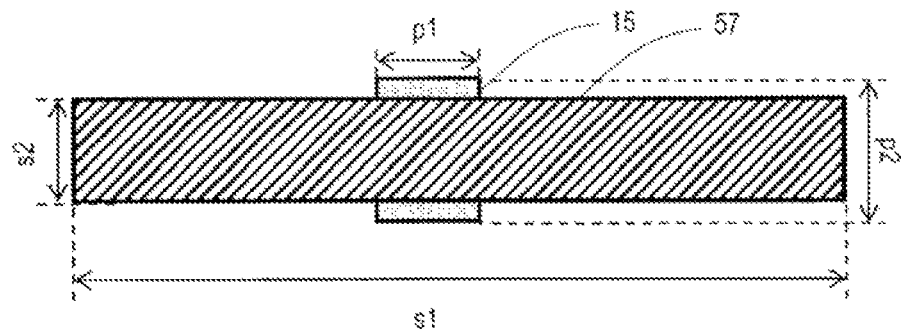
FIG. 13B is a schematic plan view for explaining sizes of a slot 57 and a patch electrode 15.

Note that a size of an antenna unit U is, for example, 4 mm×4 mm. In addition, as illustrated in FIG. 13B, a width s2 of the slot 57 is 0.5 mm, a length s1 of the slot 57 is 3.3 mm, a width p2 of the patch electrode 15 in a width direction of the slot 57 is 0.7 mm, and a width p1 of the patch electrode 15 in a length direction of the slot is 0.5 mm. Note that sizes, shapes, disposition relationships, and the like of the antenna unit U, the slot 57, and the patch electrode 15 are not limited to the examples illustrated in FIG. 13A and FIG. 13B.

To further reduce influence of an electric field from the heater resistive film 68, a shield conductive layer may be formed. The shield conductive layer is formed, for example, on the base insulating film 2 and almost entirely on the surface of the dielectric substrate 1. The shield conductive layer does not need to be provided with the openings 68a and 68b as with the resistive film 68, but is preferably provided with the opening 68c. The shield conductive layer is formed of, for example, an aluminum layer, and is set to have a ground potential.

In addition, the resistive film preferably has distribution of the resistance value to enable uniform heating of the liquid crystal layer. Temperature distribution of the liquid crystal layer preferably has a difference between a maximum temperature and a minimum temperature (temperature fluctuation) of, for example, less than or equal to 15° C. When the temperature fluctuation exceeds 15° C., defects such as variation in phase difference modulation in the plane, and failure in achieving good beam formation may occur. In addition, when the temperature of the liquid crystal layer approaches a Tni point (for example, 125° C.), the $\Delta_{\varepsilon M}$ becomes small and thus, such a temperature of the liquid crystal layer is not preferable.

With reference to FIG. 14A, FIG. 14B, and FIG. 15A to FIG. 15C, the distribution of the resistance value in the resistive film will be described. FIG. 14A, FIG. 14B, and FIG. 15A to FIG. 15C illustrate schematic structures and current distribution of resistance heating structures 80a to 80e. The resistance heating structures each includes a resistive film and a heater terminal.

Figure 14A:
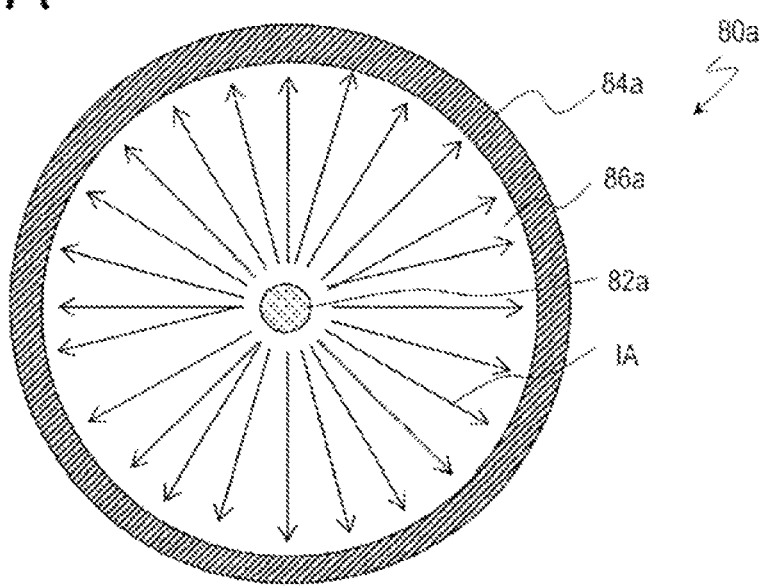
FIG. 14A and FIG. 14B are views illustrating schematic structures and current distribution of resistance heating structures 80a and 80b, respectively.

The resistance heating structure 80a illustrated in FIG. 14A includes a first terminal 82a, a second terminal 84a, and a resistive film 86a connected to the first terminal 82a and the second terminal 84a. The first terminal 82a is disposed at the center of a circle, and the second terminal 84a is disposed entirely along a circumference of the circle. Here, the circle corresponds to a transmission and/or reception region R1. When a DC voltage is applied between the first terminal 82a and the second terminal 84a, for example, a current IA flows radially from the first terminal 82a to the second terminal 84a. Accordingly, even though an in-plane resistance value is constant, the resistive film 86a can uniformly generate heat. Of course, a direction of a current flow may be a direction from the second terminal 84a to the first terminal 82a.

Figure 14B:
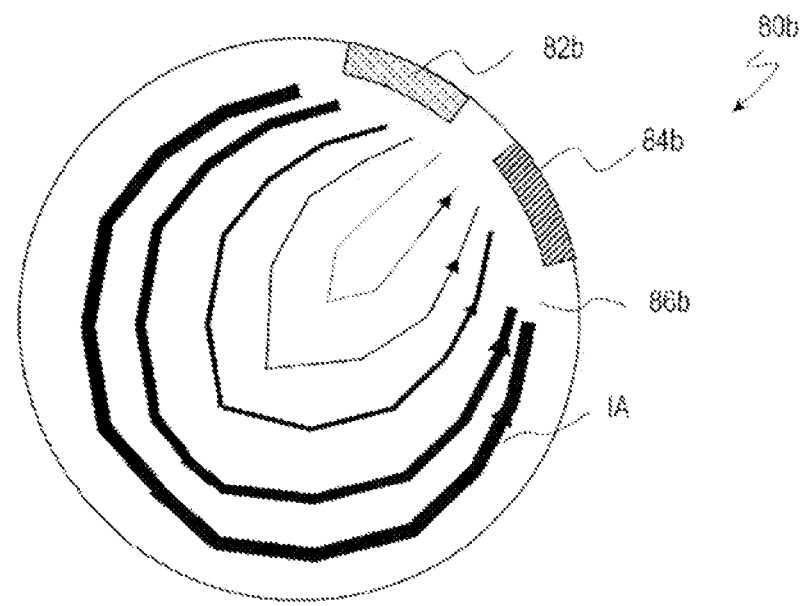

The resistance heating structure 80b illustrated in FIG. 14B includes a first terminal 82b, a second terminal 84b, and a resistive film 86b connected to the first terminal 82b and the second terminal 84b. The first terminal 82b and the second terminal 84b are disposed adjacent to each other along a circumference of a circle. A resistance value of the resistive film 86b has an in-plane distribution to cause a calorific value per unit area generated by the current IA flowing between the first terminal 82b and the second terminal 84b in the resistive film 86b to be constant. In a case where for example, the resistive film 86b is formed of thin lines, the in-plane distribution of the resistance value of the resistive film 86 may be adjusted by thicknesses of the thin lines and density of the thin lines.

Figure 15A:
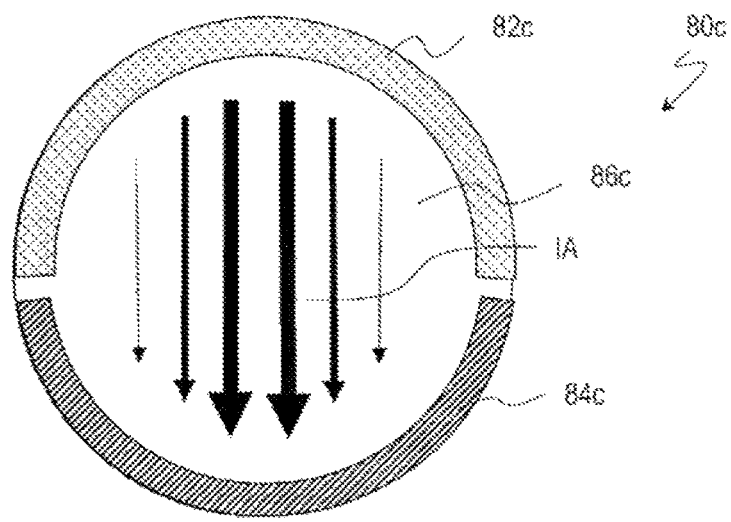
FIG. 15A to FIG. 15C are views illustrating schematic structures and current distribution of resistance heating structures 80c to 80e, respectively.

The resistance heating structure 80c illustrated in FIG. 15A includes a first terminal 82c, a second terminal 84c, and a resistive film 86c connected to the first terminal 82c and the second terminal 84c. The first terminal 82c is disposed along a circumference of an upper half of a circle, and the second terminal 84c is disposed along a circumference of a lower half of the circle. When the resistive film 86c is constituted by thin lines extending vertically between the first terminal 82c and the second terminal 84c, for example, a thickness and a density of the thin lines near the center are adjusted such that the amount of heat generated per unit area by the current IA is constant in the plane.

Figure 15B:
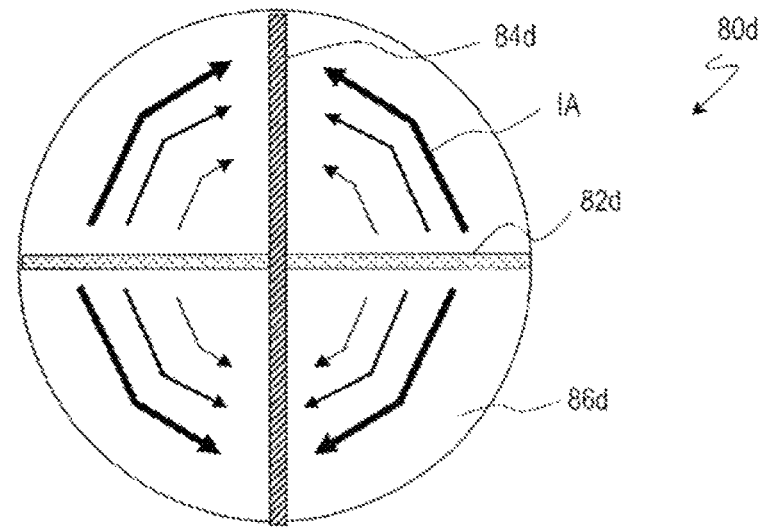

A resistance heating structure 80d illustrated in FIG. 15B includes a first terminal 82d, a second terminal 84d, and a resistive film 86d connected to the first terminal 82d and the second terminal 84d. The first terminal 82d and the second terminal 84d are provided to extend in a vertical direction and a horizontal direction, respectively, along a diameter of a circle. Although simplified in the figure, the first terminal 82d and the second terminal 84d are electrically insulated from each other.

Figure 15C:
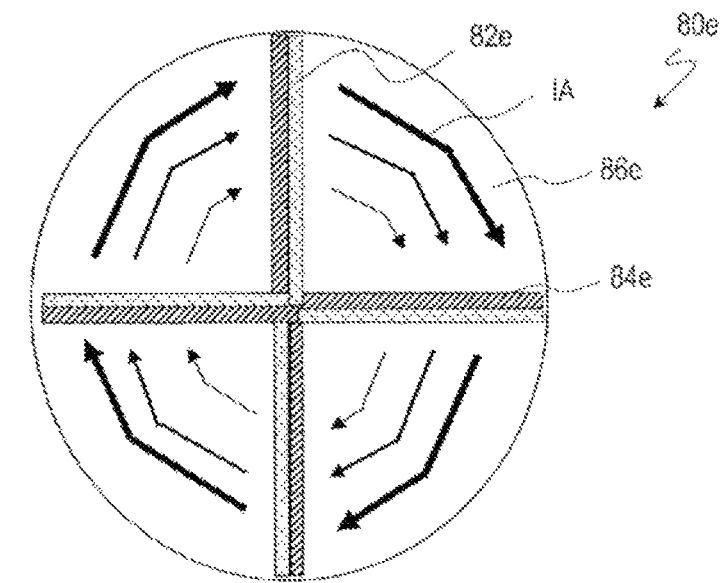

In addition, a resistance heating structure 80e illustrated in FIG. 15C includes a first terminal 82e, a second terminal 84e, and a resistive film 86e connected to the first terminal 82e and the second terminal 84e. Unlike the resistance heating structure 80d, any of the first terminal 82e and the second terminal 84e of the resistance heating structure 80e includes four portions extending from the center of a circle in four directions including the vertical direction and the horizontal direction. Each portion of the first terminal 82e and each portion of the second terminal 84e forming a 90 degree angle with each other are disposed to cause the current IA to flow clockwise.

In any of the resistance heating structure 80d and the resistance heating structure 80e, for example, the thin lines closer to the circumference of the circle are adjusted to be thick and to have higher density to cause a calorific value per unit area to be uniform in the plane and to cause the current IA to flow more as closer to the circumference of the circle.

For example, such an internal heater structure may be configured to detect a temperature of the scanning antenna to automatically act when the temperature falls below a preset temperature. Of course, the internal heater structure may be configured to act in response to an operation of a user.

External Heater Structure

Instead of the internal heater structure described above, or in addition to the internal heater structure, the scanning antenna according to an embodiment of the disclosure may include an external heater structure. As an external heater, various known heaters can be used, but a resistance heating type heater utilizing Joule heat is preferable. A part configured to generate heat in the heater will be referred to as a heater section. Hereinafter, an example in which a resistive film is used as the heater section will be described. Hereinafter, the resistive film is also denoted by reference sign 68.

Figure 16A:
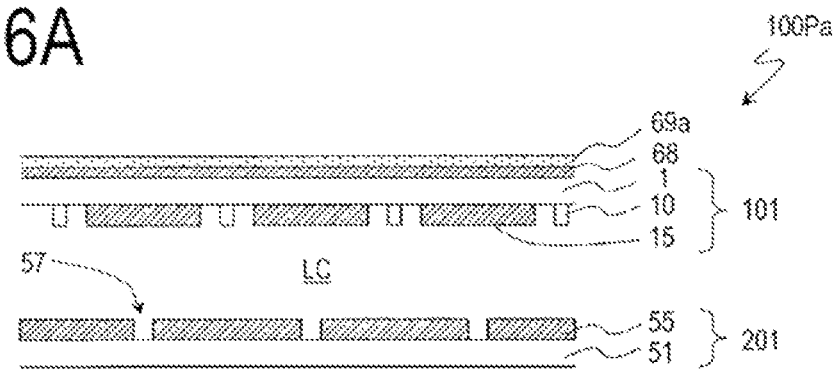
FIG. 16A is a schematic cross-sectional view of a liquid crystal panel 100Pa including the heater resistive film 68.
Figure 16B:
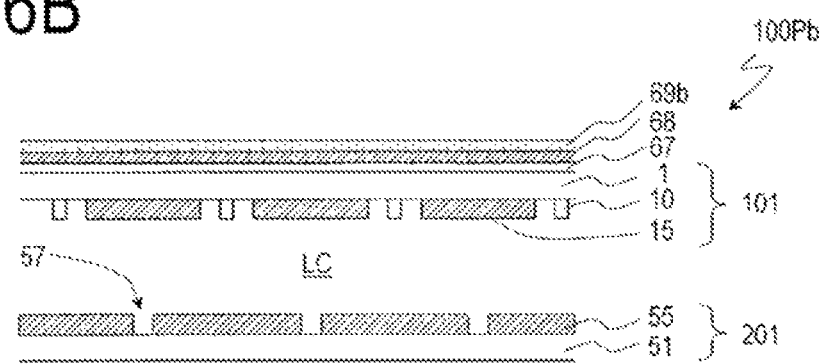
FIG. 16B is a schematic cross-sectional view of a liquid crystal panel 100Pb including the heater resistive film 68.

For example, the heater resistive film 68 is preferably disposed in the liquid crystal panel 100Pa or 100Pb as illustrated in FIGS. 16A and 16B. Here, the liquid crystal panels 100Pa and 100Pb each include the TFT substrate 101, the slot substrate 201, and the liquid crystal layer LC provided between the TFT substrate 101 and the slot substrate 201 of the scanning antenna 1000 illustrated in FIG. 1, and further each include a resistance heating structure including the resistive film 68 on an outer side of the TFT substrate 101. The resistive film 68 may be formed on the liquid crystal layer LC side of the dielectric substrate 1 of the TFT substrate 101. However, such a configuration complicates a manufacturing process of the TFT substrate 101 and thus, the resistive film 68 is preferably disposed on the outer side of the TFT substrate 101 (opposite to the liquid crystal layer LC).

The liquid crystal panel 100Pa illustrated in FIG. 16A includes the heater resistive film 68 formed on an outer surface of the dielectric substrate 1 of the TFT substrate 101 and a protection layer 69a covering the heater resistive film 68. The protection layer 69a may be omitted. The scanning antenna is housed in, for example, a case made of plastic and thus, a user is prevented from coming into direct contact with the resistive film 68.

The resistive film 68 can be formed on the outer surface of the dielectric substrate 1 by using, for example, a known thin film deposition technique (for example, sputtering, CVD), an application method, or a printing method. The resistive film 68 is patterned as necessary. The patterning is performed by a photolithography process, for example.

A material of the heater resistive film 68 is not particularly limited as described above for the internal heater structure, but, for example, a conductive material having relatively high specific resistance such as ITO and IZO can be used. In addition, to adjust a resistance value, the resistive film 68 may be formed of thin lines or meshes made of a metal (for example, nichrome, titanium, chromium, platinum, nickel, aluminum, and copper). Thin lines or meshes made of ITO and IZO may also be used. The resistance value may be set according to a required calorific value.

The protection layer 69*a* is formed of an insulating material and formed to cover the resistive film 68. The protection layer 69*a* may not be formed on a portion where the resistive film 68 is patterned and the dielectric substrate 1 is exposed. The resistive film 68 is patterned to prevent a decrease in antenna performance as described below. In a case where owing to presence of a material forming the protection layer 69*a*, the antenna performance decreases, the protection layer 69*a* patterned is preferably used as with the resistive film 68.

The protection layer 69*a* may be formed by any of a wet process and a dry process. For example, a liquid curable resin (or a precursor of a resin) or a solution is applied onto the surface of the dielectric substrate 1 on which the resistive film 68 is formed, and thereafter, the curable resin is cured to form the protection layer 69*a*. The liquid resin or the resin solution is applied onto the surface of the dielectric substrate 1 to have a predetermined thickness by various application methods (for example, by using a slot coater, a spin coater, or a spray) or various printing methods. Thereafter, room temperature curing, thermal curing, or light curing can be performed depending on a kind of the resin to form the protection layer 69*a* with an insulating resin film. The insulating resin film can be patterned by a photolithography process, for example.

A curable resin material is favorably used as a material for forming the protection layer 69*a*. The curable resin material includes a thermal curing type resin material and a light curing type resin material. The thermal curing type includes a thermal cross-linking type and a thermal polymerization type.

Examples of the thermal cross-linking type resin material include a combination of an epoxy-based compound (for example, an epoxy resin) and an amine-based compound, a combination of an epoxy-based compound and a hydrazide-based compound, a combination of an epoxy-based compound and an alcohol-based compound (for example, including a phenol resin), a combination of an epoxy-based compound and a carboxylic acid-based compound (for example, including an acid anhydride), a combination of an isocyanate-based compound and an amine-based compound, a combination of an isocyanate-based compound and a hydrazide-based compound, a combination of an isocyanate-based compound and an alcohol-based compound (for example, including a urethane resin), and a combination of an isocyanate-based compound and a carboxylic acid-based compound. In addition, examples of a cationic polymerization type adhesive material include a combination of an epoxy-based compound and a cationic polymerization initiator (a typical cationic polymerization initiator: an aromatic sulfonium salt). Examples of the resin material of radical polymerization type include a combination of a monomer and/or an oligomer containing a vinyl group of various acrylic, methacrylic, and urethane modified acrylic (methacrylic) resins and a radical polymerization initiator (a representative radical polymerization initiator: azo-based compound (e.g., azobisisobutyronitrile (AIBN))), and examples of the resin material of ring-opening polymerization type include an ethylene oxide-based compound, an ethyleneimine-based compound, and a siloxane-based compound. In addition, a maleimide resin, a combination of a maleimide resin and an amine, a combination of maleimide and a methacrylic compound, a bismaleimide-triazine resin, and a polyphenylene ether resin can be used. In addition, polyimide can be used favorably. Note that "polyimide" includes a polyamic acid that is a precursor of polyimide. Polyimide is used in combination with an epoxy-based compound or an isocyanate-based compound, for example.

From a viewpoint of heat resistance, chemical stability, and mechanical characteristics, the thermal curing type resin material is preferably used. Particularly, a resin material containing an epoxy resin or a polyimide resin is preferable, and from a viewpoint of the mechanical characteristics (particularly, mechanical strength) and hygroscopicity, a resin material containing a polyimide resin is preferable. A polyimide resin and an epoxy resin can also be mixed to be used. In addition, a polyimide resin and/or an epoxy resin may be mixed with a thermoplastic resin and/or an elastomer. Further, a rubber-modified resin may be mixed as a polyimide resin and/or an epoxy resin. A thermoplastic resin or an elastomer can be mixed to improve flexibility or toughness. Even when the rubber-modified resin is used, the same effect can be obtained.

The light curing type resin material undergoes cross-linking reaction and/or polymerization reaction and cures by ultraviolet light or visible light. The light curing type includes a radical polymerization type and a cationic polymerization type, for example. A typical example of the radical polymerization type resin material includes a combination of an acrylic resin (an epoxy modified acrylic resin, a urethane modified acrylic resin, a silicone modified acrylic resin) and a photopolymerization initiator. Examples of an ultraviolet radical polymerization initiator include an acetophenone type initiator and a benzophenone type initiator. Examples of a visible light radical polymerization initiator can include a benzylic type initiator and a thioxanthone type initiator. A typical example of a cationic polymerization type resin material includes a combination of an epoxy-based compound and a photo cationic polymerization initiator. An example of the photo cationic polymerization initiator can include an iodonium salt-based compound. Note that a resin material having both light curing characteristics and thermal curing characteristics can also be used.

The liquid crystal panel 100Pb illustrated in FIG. 16B is different from the liquid crystal panel 100Pa in that the liquid crystal panel 100Pb further includes an adhesive layer 67 between the resistive film 68 and the dielectric substrate 1. Moreover, the liquid crystal panel 100Pb is different from the liquid crystal panel 100Pa in that a protection layer 69*b* is formed by using a polymer film or a glass plate prepared in advance.

For example, the liquid crystal panel 100Pb including the protection layer 69*b* formed of a polymer film is manufactured as follow.

First, an insulating polymer film serving as the protection layer 69*b* is provided. As the polymer film, for example, a polyester film made of polyethylene terephthalate, polyethylene naphthalate or the like, and a film made of super engineering plastic such as polyphenylene sulfone, polyimide, and polyamide are used. A thickness of the polymer film (that is, a thickness of the protection layer 69b) is greater than or equal to 5 µm and less than or equal to 200 µm, for example.

The resistive film 68 is formed on one surface of this polymer film. The resistive film 68 can be formed by the above-described method. The resistive film 68 may be patterned, and the polymer film may also be patterned as necessary.

The polymer film on which the resistive film 68 is formed (that is, a member including the protection layer 69b and the resistive film 68 integrally formed with each other) is bonded to the dielectric substrate 1 by using an adhesive material. As the adhesive material, the same curable resin as the curable resin used to form the protection layer 69a described above can be used. Further, a hot-melt type resin material (adhesive material) can also be used. The hot-melt type resin material contains a thermoplastic resin as a main component, and melts by heating and solidifies by cooling. Examples of the hot-melt type resin material include polyolefin-based (for example, polyethylene, polypropylene), polyamide-based, and ethylene vinyl acetate-based resin materials. In addition, a reactive urethane-based hot-melt resin material (adhesive material) is also commercially available. From a viewpoint of adhesiveness and durability, the reactive urethane-based resin material is preferable.

In addition, the adhesive layer 67 may be patterned as with the resistive film 68 and the protection layer (polymer film) 69b. However, since the adhesive layer 67 only needs to fix the resistive film 68 and the protection layer 69b to the dielectric substrate 1, the adhesive layer 67 may be smaller than any of the resistive film 68 and the protection layer 69b.

In place of the polymer film, the glass plate can also be used to form the protection layer 69b. A manufacturing process may be the same as in the case of using the polymer film. A thickness of the glass plate is preferably less than or equal to 1 mm and more preferably less than or equal to 0.7 mm. There is no particular lower limit of the thickness of the glass plate, but from a viewpoint of handleability, the thickness of the glass plate is preferably greater than or equal to 0.3 mm.

In the liquid crystal panel 100Pb illustrated in FIG. 16B, the resistive film 68 formed on the protection layer (the polymer film or the glass plate) 69b is fixed to the dielectric substrate 1 via the adhesive layer 67, but the resistive film 68 only needs to be disposed to come into contact with the dielectric substrate 1, and the resistive film 68 and the protection layer 69b are not necessarily fixed (bonded) to the dielectric substrate 1. That is, the adhesive layer 67 may be omitted. For example, the polymer film on which the resistive film 68 is formed (that is, the member including the protection layer 69b and the resistive film 68 integrally formed with each other) may be disposed to bring the resistive film 68 into contact with the dielectric substrate 1 and may be pressed against the dielectric substrate 1 with the case housing the scanning antenna. For example, since thermal contact resistance may increase when the polymer film on which the resistive film 68 is formed is merely disposed, the polymer film is preferably pressed against the dielectric substrate to decrease the thermal contact resistance. When such a configuration is adopted, the member including the resistive film 68 and the protection layer (the polymer film or the glass plate) 69b integrally formed with each other can be detachable.

Note that in a case where the resistive film 68 (and the protection layer 69b) is patterned as described below, the resistive film 68 (and the protection layer 69b) is preferably fixed to the dielectric substrate 1 to the extent that a position of the resistive film 68 (and the protection layer 69b) with respect to the TFT substrate does not shift to prevent antenna performance from decreasing.

The heater resistive film 68 may be provided anywhere as long as the heater resistive film 68 does not affect an action of the scanning antenna, but to efficiently heat the liquid crystal material, the heater resistive film 68 is preferably provided near the liquid crystal layer. Accordingly, the heater resistive film 68 is preferably provided on the outer side of the TFT substrate 101 as illustrated in FIGS. 16A and 16B. In addition, energy efficiency is higher, and controllability of temperature is higher in the case where the resistive film 68 is directly provided on the outer side of the dielectric substrate 1 of the TFT substrate 101 as illustrated in FIG. 16A than in the case where the resistive film 68 is provided on the outer side of the dielectric substrate 1 via the adhesive layer 67 as illustrated in FIG. 16B and thus, the case as illustrated in FIG. 16A is preferable.

For example, the resistive film 68 may be formed on almost the entire surface of the dielectric substrate 1 of the TFT substrate 104 illustrated in FIG. 13A. The resistive film 68 preferably includes openings 68a, 68b, and 68c as described above for the internal heater structure.

The protection layers 69a and 69b may be each formed entirely on the surface to cover the resistive film 68. As described above, in a case where the protection layer 69a or 69b has an adverse effect on antenna characteristics, openings corresponding to the openings 68a, 68b, and 68c of the resistive film 68 may be provided. In this case, the openings of the protection layer 69a or 69b are formed inside the openings 68a, 68b, and 68c of the resistive film 68.

To further reduce influence of an electric field from the heater resistive film 68, a shield conductive layer may be formed. The shield conductive layer is formed on the dielectric substrate 1 side of the resistive film 68 via an insulating film, for example. The shield conductive layer is formed almost entirely on the surface of the dielectric substrate 1. The shield conductive layer does not need to be provided with the openings 68a and 68b as with the resistive film 68, but is preferably provided with the opening 68c. The shield conductive layer is formed of, for example, an aluminum layer, and is set to have a ground potential. In addition, the resistive film preferably has distribution of a resistance value to enable uniform heating of the liquid crystal layer. These configurations are also as described above for the internal heater structure.

Since the resistive film only needs to heat the liquid crystal layer LC in the transmission and/or reception region R1, the resistive film may be provided in a region corresponding to the transmission and/or reception region R1 as described above as an example, but is not limited to this example. For example, in the case where the TFT substrate 101 has an outline capable of defining a rectangular region including the transmission and/or reception region R1 as illustrated in FIG. 2A, the resistive film may be provided in a region corresponding to the rectangular region including the transmission and/or reception region R1. Of course, the outline of the resistive film is not limited to a rectangle, and may have any shape including the transmission and/or reception region R1.

In the above-described example, the resistive film is disposed on the outer side of the TFT substrate 101, but the resistive film may be disposed on an outer side of the slot substrate 201 (opposite to the liquid crystal layer LC). In this case, similarly, the resistive film may be formed directly on the dielectric substrate 51 as with the liquid crystal panel 100Pa in FIG. 16A, or the resistive film formed on the protection layer (the polymer film or the glass plate) via the adhesive layer may be fixed to the dielectric substrate 51 as with the liquid crystal panel 100Pb in FIG. 16B. Alternatively, the protection layer on which the resistive film is formed without the adhesive layer (that is, the member including the protection layer and the resistive film integrally formed with each other) may be disposed to bring the resistive film into contact with the dielectric substrate 51. For example, since thermal contact resistance may increase in a case where the polymer film on which the resistive film is formed is merely disposed, the polymer film is preferably pressed against the dielectric substrate 51 to decrease the thermal contact resistance. When such a configuration is adopted, the member including the resistive film and the protection layer (the polymer film or the glass plate) integrally formed with each other can be detachable. Note that in a case where the resistive film (and the protection layer) is patterned, the resistive film (and the protection layer) is preferably fixed to the dielectric substrate to the extent that a position of the resistive film (and the protection layer) with respect to the slot substrate does not shift to prevent antenna performance from decreasing.

In a case where the resistive film is disposed on the outer side of the slot substrate 201, openings are preferably provided at positions corresponding to the slots 57 of the resistive film. In addition, the resistive film has preferably a thickness sufficient to transmit microwaves.

Here, the example in which the resistive film is used as the heater section is described, but other than this, a nichrome line (for example, winding wire), an infrared light heater section, and the like can be used as the heater section, for example. In such a case, similarly, the heater section is preferably disposed to prevent antenna performance from decreasing.

For example, such an external heater structure may be configured to detect a temperature of the scanning antenna to automatically act when the temperature falls below a preset temperature. Of course, the external heater structure may be configured to act in response to an operation of a user.

As a temperature control device configured to cause the external heater structure to automatically act, various known thermostats can be used, for example. For example, a thermostat using bimetal may be connected between one of two terminals connected to the resistive film and a power source. Of course, a temperature control device using a temperature sensor to supply a current from the power source to the external heater structure to prevent the temperature from falling below a preset temperature may be used.

Driving Method

Since an antenna unit array of the scanning antenna according to an embodiment of the disclosure includes a structure similar to a structure of an LCD panel, line sequential driving is performed in the same manner as in an LCD panel. However, in a case where an existing driving method of an LCD panel is applied, the following problems may occur. Problems that may occur in the scanning antenna will be described with reference to an equivalent circuit diagram illustrated in FIG. 17 of one antenna unit of the scanning antenna.

First, as mentioned above, since the specific resistance of liquid crystal materials having large dielectric anisotropies $\Delta\varepsilon_M$ (birefringence index $\Delta n$ with respect to visible light) in the microwave range is low, in a case where driving methods for LCD panels are applied as is, the voltage applied to the liquid crystal layer cannot be sufficiently maintained. Then, an effective voltage applied to the liquid crystal layer decreases, and an electrostatic capacitance value of the liquid crystal capacitance does not reach a target value.

When the voltage applied to the liquid crystal layer deviates from the predetermined value in this way, a direction in which a gain of the antenna becomes maximum deviates from a desired direction. Then, for example, a communication satellite cannot be tracked accurately. To prevent this, the auxiliary capacitance CS is provided electrically in parallel to the liquid crystal capacitance Clc to sufficiently increase a capacitance value C-Ccs of the auxiliary capacitance CS. The capacitance value C-Ccs of the auxiliary capacitance CS is preferably set appropriately to cause a voltage retention rate of the liquid crystal capacitance Clc to be 90% or greater.

In addition, when a liquid crystal material having low specific resistance is used, a voltage reduction due to interface polarization and/or orientation polarization also occurs. To prevent the voltage reduction due to interface polarization and/or orientation polarization, it is conceivable to apply a sufficiently high voltage in anticipation of an amount of the voltage drop. However, when a high voltage is applied to the liquid crystal layer having low specific resistance, a dynamic scattering effect (DS effect) may occur. The DS effect is caused by convection of an ionic impurity in a liquid crystal layer, and the dielectric constant $\varepsilon_M$ of the liquid crystal layer approaches an average value $((\varepsilon_M//+2_{\varepsilon_M\perp})/3)$. Also, to control the dielectric constant $\varepsilon_M$ of the liquid crystal layer in multiple stages (multiple gray scales), it is not always possible to apply a sufficiently high voltage.

To suppress the above-described DS effect and/or the above-described voltage drop due to the polarization, a polarity inversion period of a voltage applied to the liquid crystal layer may be shortened sufficiently. As is well known, in a case where the polarity inversion period of the applied voltage is shortened, a threshold voltage at which the DS effect occurs increases. Accordingly, a polarity inversion frequency may be determined to cause a maximum value of a voltage (absolute value) applied to the liquid crystal layer to be less than the threshold voltage at which the DS effect occurs. When the polarity inversion frequency is 300 Hz or greater, a good action can be ensured even in a case where a voltage having an absolute value of 10 V is applied to a liquid crystal layer having specific resistance of $1\times10^{10}$ Ω·cm and the dielectric anisotropy $\Delta\varepsilon(@1$ kHz) of about $-0.6$. In addition, when the polarity inversion frequency (typically equal to twice a frame frequency) is 300 Hz or greater, the above-described voltage drop due to the polarization is also suppressed. From the viewpoint of power consumption and the like, an upper limit of the polarity inversion period is preferably about less than or equal to 5 kHz.

As described above, since viscosity of the liquid crystal material depends on temperature, it is preferable that a temperature of the liquid crystal layer be appropriately controlled. Physical properties of the liquid crystal material and driving conditions described here correspond to values under an operating temperature of the liquid crystal layer. Conversely, the temperature of the liquid crystal layer is preferably controlled to enable driving under the above-described conditions.

An example of a waveform of a signal used for driving the scanning antenna will be described with reference to FIG. 18A to FIG. 18G. Note that FIG. 18D illustrates a waveform of a display signal Vs (LCD) supplied to a source bus line of an LCD panel for comparison.

FIG. 18A illustrates a waveform of a scanning signal Vg supplied to a gate bus line G-L1, FIG. 18B illustrates a waveform of the scanning signal Vg supplied to a gate bus line G-L2, FIG. 18C illustrates a waveform of the scanning signal Vg supplied to a gate bus line G-L3, FIG. 18E illustrates a waveform of a data signal Vda supplied to the source bus line, FIG. 18F illustrates a waveform of a slot voltage Vidc supplied to the slot electrode of the slot substrate (slot electrode), and FIG. 18G illustrates a waveform of a voltage applied to the liquid crystal layer of each antenna unit.

As illustrates in FIG. 18A to FIG. 18C, a voltage of the scanning signal Vg supplied to each gate bus line sequentially changes from a low level (VgL) to a high level (VgH). The VgL and the VgH can be set appropriately according to characteristics of the TFT. For example, VgL=from −5 V to 0 V, and VgH=+20 V. In addition, The VgL and the VgH may be set to VgL=−20 V and VgH=+20 V. A period from time when a voltage of the scanning signal Vg of a certain gate bus line changes from the low level (VgL) to the high level (VgH) until time when a voltage of the next gate bus line changes from the VgL to the VgH will be referred to as one horizontal scan period (1H). In addition, a period during which a voltage of each gate bus line is at the high level (VgH) will be referred to as a select period PS. In this select period PS, the TFT connected to each gate bus line is turned on, and a voltage at that time of the data signal Vda supplied to the source bus line is supplied to the corresponding patch electrode. The data signal Vda is, for example, from −15 V to +15 V (an absolute value is 15 V), and, for example, the data signal Vda having a different absolute value corresponding to 12 gray scales, or preferably corresponding to 16 gray scales is used.

Here, a case where a certain intermediate voltage is applied to all the antenna units will be described as an example. That is, it is assumed that the voltage of the data signal Vda is constant with respect to all the antenna units (assumed to be connected to m gate bus lines). This corresponds to a case where certain gray levels are displayed entirely on a surface in the LCD panel. At this time, dot inversion driving is performed in the LCD panel. That is, in each frame, a display signal voltage is supplied to cause polarities of pixels (dots) adjacent to each other to be opposite to each other.

FIG. 18D illustrates the waveform of the display signal of the LCD panel in which the dot inversion driving is performed. As illustrated in FIG. 18D, a polarity of the Vs (LCD) is inverted every 1H. A polarity of the Vs (LCD) supplied to the source bus line adjacent to the source bus line supplied with the Vs (LCD) having this waveform is opposite to the polarity of the Vs (LCD) illustrated in FIG. 18D. In addition, a polarity of a display signal supplied to each pixel is inverted for each frame. In the LCD panel, it is difficult to perfectly match magnitudes of the effective voltage applied to the liquid crystal layer between a positive polarity and a negative polarity, and a difference in the effective voltage becomes a difference in luminance viewed as flicker. To make this flicker difficult to view, the pixels (dots) to which voltage having different polarities is applied are spatially dispersed in each frame. Typically, the pixels (dots) having different polarities are arranged in a checkered pattern by performing dot inversion driving.

In contrast, in the scanning antenna, flicker itself is not problematic. That is, the electrostatic capacitance value of the liquid crystal capacitance only needs to be a desired value, and spatial distribution of a polarity in each frame is not problematic. Accordingly, from a viewpoint of low power consumption or the like, it is preferable to reduce the number of times of polarity inversion of the data signal Vda supplied from the source bus line, that is, to lengthen the period of polarity inversion. For example, as illustrated in FIG. 18E, the period of polarity inversion may be set to 10H (polarity inversion occurs every 5H). Of course, assuming that the number of the antenna units connected to each source bus line (typically equal to the number of the gate bus lines) is m, the period of polarity inversion of the data signal Vda may be 2 m·H (polarity inversion occurs every m·H). The period of polarity inversion of the data signal Vda may be equal to 2 frames (polarity inversion occurs for each frame).

In addition, the polarity of the data signal Vda supplied from each source bus line may be the same. Accordingly, for example, in a certain frame, the data signal Vda having a positive polarity may be supplied from each source bus line, and in the next frame, the data signal Vda having a negative polarity may be supplied from each source bus line.

Alternatively, the polarities of the data signals Vda supplied from the source bus lines adjacent to each other may be opposite to each other. For example, in a certain frame, the data signal Vda having a positive polarity is supplied from each odd-numbered source bus line, and the data signal Vda having a negative polarity is supplied from each even-numbered source bus line. Then, in the next frame, the data signal Vda having a negative polarity is supplied from each odd-numbered source bus line, and the data signal Vda having a positive polarity is supplied from each even-numbered source bus line. In the LCD panel, such a driving method is referred to as source line reversal driving. In a case where the data signals Vda supplied from the source bus lines adjacent to each other have opposite polarities, electric charges stored in the liquid crystal capacitance can be canceled between columns adjacent to each other by connecting (short-circuiting) the source bus lines adjacent to each other before inverting the polarities of the data signals Vda supplied between the frames. Accordingly, an advantage of enabling a reduction in an amount of electric charges supplied from the source bus line in each frame can be obtained.

As illustrated in FIG. 18F, the voltage Vidc of the slot electrode is, for example, a DC voltage, and is typically a ground potential. Since a capacitance value of capacitance (liquid crystal capacitance and auxiliary capacitance) of the antenna unit is greater than a capacitance value of pixel capacitance of an LCD panel (for example, about 30 times in comparison with a 20-inch LCD panel), there is no influence from a pull-in voltage due to parasitic capacitance of the TFT, and even in a case where the voltage Vidc of the slot electrode is a ground potential and the data signal Vda is a positive or negative symmetrical voltage on the basis of the ground potential, a voltage supplied to the patch electrode is a positive or negative symmetrical voltage. In the LCD panel, the positive and negative symmetrical voltage is applied to the pixel electrode by adjusting a voltage (common voltage) of the counter electrode in consideration for the pull-in voltage of the TFT, but this is not necessary for the slot voltage of the scanning antenna, and the slot voltage may be a ground potential. In addition, although not illustrated in FIG. 18A to FIG. 18G, the same voltage as the slot voltage Vidc is supplied to the CS bus line.

The voltage applied to the liquid crystal capacitance of each antenna unit is the voltage of the patch electrode with respect to the voltage Vidc (FIG. 18F) of the slot electrode (that is, the voltage of the data signal Vda illustrated in FIG. 18E) and thus, when the slot voltage Vidc is a ground potential, the voltage applied to the liquid crystal capacitance of each antenna unit as illustrated in FIG. 18G matches the waveform of the data signal Vda illustrated in FIG. 18E.

The waveform of the signal used for driving the scanning antenna is not limited to the above example. For example, as described below with reference to FIG. 19A to FIG. 19E and FIG. 20A to FIG. 20E, a Viac having an oscillation waveform may be used as the voltage of the slot electrode.

For example, signals such as those exemplified in FIG. 19A to FIG. 19E can be used. In FIG. 19A to FIG. 19E, although the waveform of the scanning signal Vg supplied to the gate bus line is omitted, the scanning signals Vg described with reference to FIG. 18A to FIG. 18C are also used here.

Figure 19A:
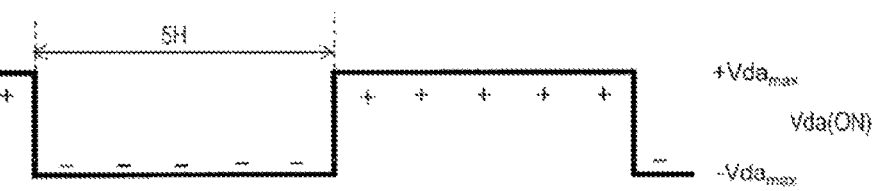
FIG. 19A to FIG. 19E are each a view illustrating another example of a waveform of each signal used for driving the scanning antenna according to an embodiment.

As illustrated in FIG. 19A, as with in FIG. 18E, a case where polarity inversion of the waveform of the data signal Vda occurs at a 10H period (every 5H) will be exemplified. Here, a case where an amplitude is a maximum value $|Vda_{max}|$ is described as the data signal Vda. As described above, polarity inversion of the waveform of the data signal Vda may occur at a two frame period (for each frame).

Figure 19B:
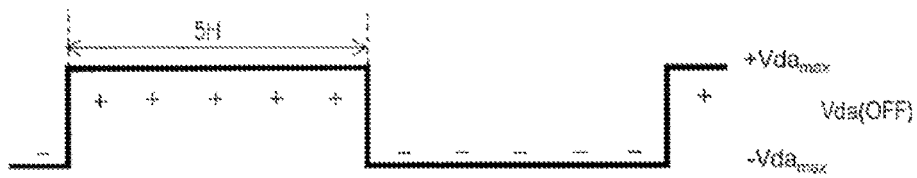
Figure 19C:

Here, as illustrated in FIG. 19C, the voltage Viac of the slot electrode is an oscillation voltage having a polarity opposite to a polarity of a data signal Vda (ON), and having the same oscillation period as an oscillation period of the data signal Vda (ON). An amplitude of the voltage Viac of the slot electrode is equal to the maximum value $|Vda_{max}|$ of the amplitude of the data signal Vda. That is, it is assumed that the slot voltage Viac is a voltage having the same period of polarity inversion as a period of polarity inversion of the data signal Vda (ON) and having a polarity opposite to the polarity of the data signal Vda (ON) (a phase differs by 180°), and oscillating between $-Vda_{max}$ and $+Vda_{max}$.

Figure 19D:
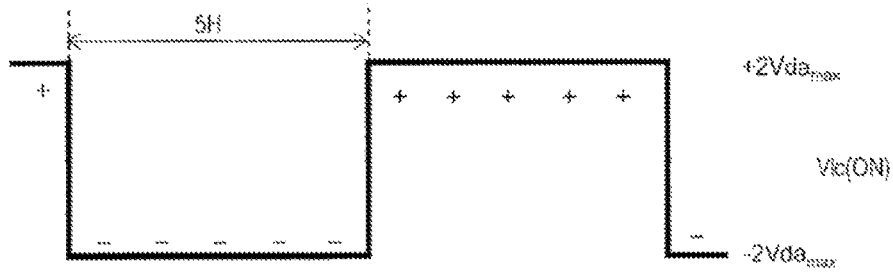

Since a voltage Vlc applied to the liquid crystal capacitance of each antenna unit is the voltage of the patch electrode with respect to the voltage Viac (FIG. 19C) of the slot electrode (that is, the voltage of the data signal Vda (ON) illustrated in FIG. 19A), when the amplitude of the data signal Vda oscillates at $\pm Vda_{max}$, the voltage applied to the liquid crystal capacitance has a waveform oscillating at an amplitude twice $Vda_{max}$ as illustrated in FIG. 19D. Accordingly, a maximum amplitude of the data signal Vda required to cause a maximum amplitude of the voltage Vlc applied to the liquid crystal capacitance to be $\pm Vda_{max}$ is $\pm Vda_{max}/2$.

The maximum amplitude of the data signal Vda can be halved by using such a slot voltage Viac and thus, for example, an advantage of enabling use of a general-purpose driver IC having a breakdown voltage of 20 V or less as a driver circuit configured to output the data signal Vda can be obtained.

Figure 19E:

Note that to cause a voltage Vic (OFF) applied to the liquid crystal capacitance of each antenna unit to be zero as illustrated in FIG. 19E, a data signal Vda (OFF) may have the same waveform as the waveform of the slot voltage Viac as illustrated in FIG. 19B.

For example, a case where the maximum amplitude of the voltage Vic applied to the liquid crystal capacitance is ±15 V will be considered. When the Vidc illustrated in FIG. 18F is used as the slot voltage to obtain Vidc=0 V, the maximum amplitude of the Vda illustrated in FIG. 18E becomes ±15 V. In contrast, when the Viac illustrated in FIG. 19C is used as the slot voltage and a maximum amplitude of the Viac is ±7.5 V, a maximum amplitude of the Vda (ON) illustrated in FIG. 19A becomes ±7.5 V.

When the voltage Vic applied to the liquid crystal capacitance is 0 V, the Vda illustrated in FIG. 18E may be set to 0 V, and a maximum amplitude of the Vda (OFF) illustrated in FIG. 19B may be set to ±7.5 V.

In a case where the Viac illustrated in FIG. 19C is used, the amplitude of the voltage Vlc applied to the liquid crystal capacitance is different from the amplitude of Vda and thus, appropriate conversion is necessary.

Signals as exemplified in FIG. 20A to FIG. 20E can also be used. The signals illustrated in FIG. 20A to FIG. 20E are the same as the signals illustrated in FIG. 19A to FIG. 19E in that the voltage Viac of the slot electrode is an oscillation voltage having an oscillation phase shifted by 180° from an oscillation phase of the data signal Vda (ON) as illustrated FIG. 20C. However, as illustrated in each of FIG. 20A to FIG. 20C, any of the data signals Vda (ON) and Vda (OFF) and the slot voltage Viac is a voltage oscillating between 0 V and a positive voltage. An amplitude of the voltage Viac of the slot electrode is equal to the maximum value $|Vda_{max}|$ of the amplitude of the data signal Vda.

When such a signal is used, the driving circuit only needs to output a positive voltage, and contributes to cost reduction. Even in the case where the voltage oscillating between 0 V and a positive voltage is used in this way, a polarity of the voltage Vlc (ON) applied to the liquid crystal capacitance is inverted as illustrated in FIG. 20D. In a voltage waveform illustrated in FIG. 20D, + (positive) indicates that the voltage of the patch electrode is higher than the slot voltage, and − (negative) indicates that the voltage of the patch electrode is lower than the slot voltage. That is, a direction (polarity) of an electric field applied to the liquid crystal layer is inverted as with the other examples. An amplitude of the voltage Vic (ON) applied to the liquid crystal capacitance is the $Vda_{max}$.

Figure 20A:
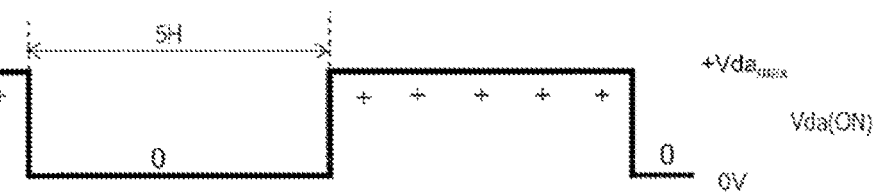
Figure 20B:
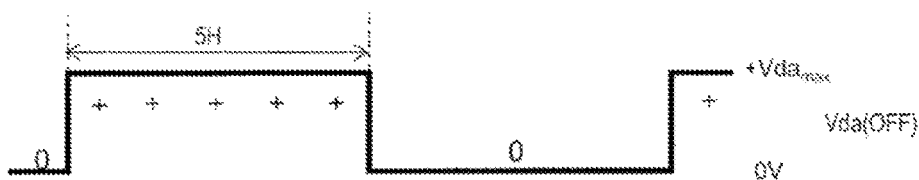
Figure 20C:
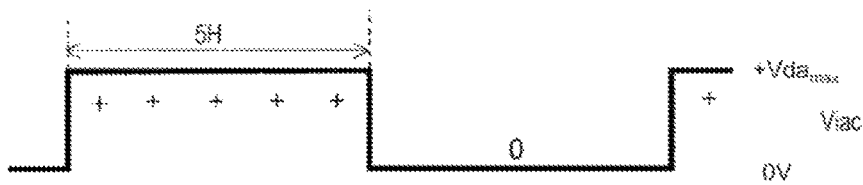
Figure 20D:
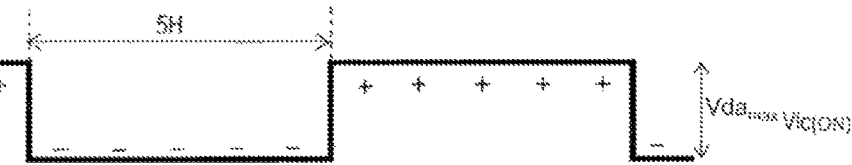

Note that, to make the voltage Vic (OFF) applied to the liquid crystal capacitance of each antenna unit zero as illustrated in FIG. 20E, the data signal Vda (OFF) may have the same waveform as the waveform of the slot voltage Viac as illustrated in FIG. 20B.

The driving method described with reference to FIG. 19A to FIG. 19E and FIG. 20A to FIG. 20E including oscillating (inverting) the voltage Viac of the slot electrode corresponds to a driving method including inverting a counter voltage (may be referred to as "common reversal driving") in terms of the driving method of an LCD panel. In an LCD panel, since flicker cannot be suppressed sufficiently, the common reversal driving is not adopted. In contrast, in the scanning antenna, since flicker does not become problematic, the slot voltage can be inverted. The oscillation (inversion) is performed for each frame, for example (the 5H in FIG. 19A to FIG. 19E and FIG. 20A to FIG. 20E is set to 1 V (vertical scanning period or frame)).

In the above description, although the example in which the voltage Viac of the slot electrode is applied as one voltage value, that is, the example in which the slot electrode common to all the patch electrodes is provided, the slot electrode may be divided corresponding to one row or two or more rows of the patch electrodes. Here, the row refers to a set of the patch electrodes connected to one gate bus line via the TFT. When the slot electrode is divided into a plurality of row portions in this way, polarities of voltage of the respective portions of the slot electrode can be made independent from one another. For example, in any frame, polarities of the voltage applied to the patch electrodes connected to the gate bus lines adjacent to each other can be inverted. In this way, it is possible to perform not only row inversion in which the polarities are inverted for each single row (1H inversion) of the patch electrodes, but also m-row inversion (mH inversion) in which the polarities are inverted every two or more rows. Of course, the row inversion and the frame reversal can be combined.

From a viewpoint of simplicity of driving, it is preferable that in any frame, the polarities of the voltage applied to the patch electrodes be all the same, and the polarities be inverted for each frame.

Example of Antenna Unit Array and Connection of Gate Bus Line and Source Bus Line In the scanning antenna according to an embodiment of the disclosure, the antenna units are arranged in a concentric circle shape, for example.

For example, in a case where the antenna units are arranged in m concentric circles, one gate bus line is provided, for example, for each circle and a total of m gate bus lines is provided. Assuming that an outer diameter of the transmission and/or reception region R1 is, for example, 800 mm, m is, for example, 200. Assuming that the innermost gate bus line is the first one, n (30, for example) antenna units are connected to the first gate bus line and nx (620, for example) antenna units are connected to the mth gate bus line.

In such arrangement, the number of the antenna units connected to each gate bus line is different. In addition, although m antenna units are connected to the nx source bus lines connected to the nx antenna units constituting the outermost circle, the number of the antenna units connected to the source bus lines connected to the antenna units constituting the inner circle becomes less than m.

In this way, the arrangement of the antenna units in the scanning antenna is different from the arrangement of pixels (dots) in an LCD panel, and the number of the connected antenna units differs depending on the gate bus lines and/or the source bus lines. Accordingly, in a case where the capacitance (liquid crystal capacitance+auxiliary capacitance) of all the antenna units is set to be the same, connected electrical loads differ depending on the gate bus lines and/or the source bus lines. In such a case, there is a problem of occurrence of variation in writing of a voltage into the antenna unit.

Therefore, to prevent this, for example, the capacitance value of the auxiliary capacitance is preferably adjusted, or the number of the antenna units connected to the gate bus lines and/or the source bus lines is preferably adjusted to make the electrical loads connected to the respective gate bus lines and the respective source bus lines substantially the same.

Fourth Embodiment

Below, the scanning antenna of a fourth embodiment will be described.

In the TFT substrate used in the scanning antenna of the present embodiment, the patch electrode is formed from the same conductive film as the gate electrode.

Figure 21A:
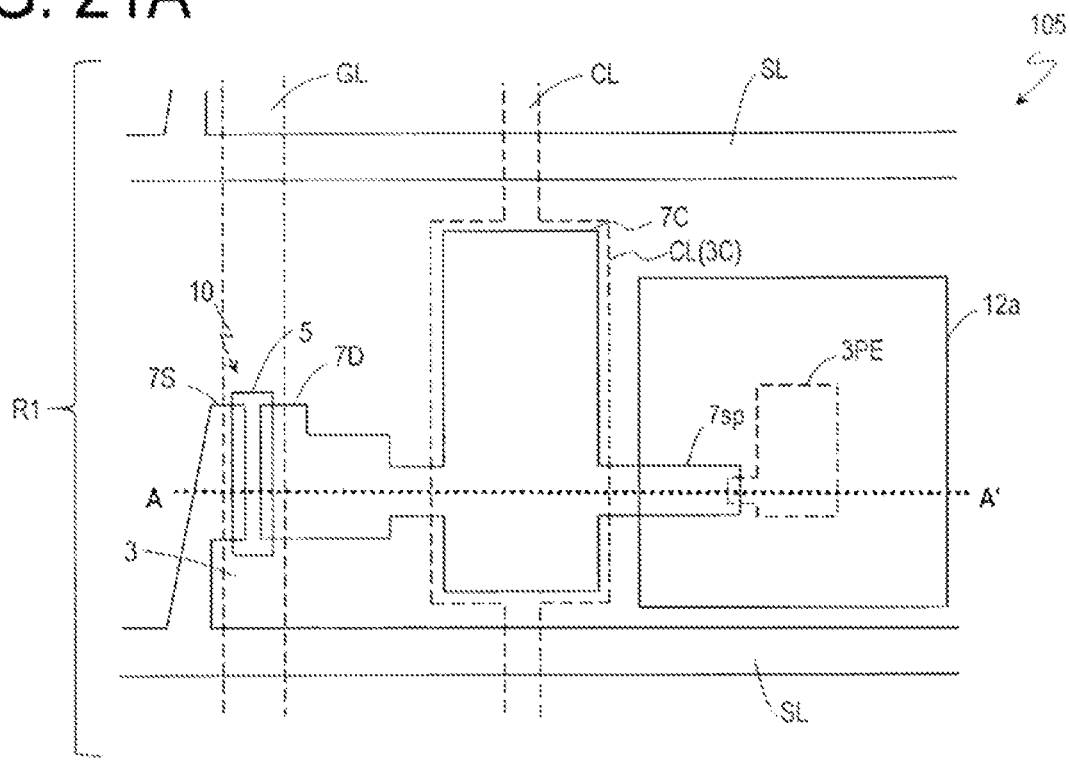
FIG. 21A and FIG. 21B are each a schematic plan view illustrating a TFT substrate 105 of a fourth embodiment.
Figure 21B:
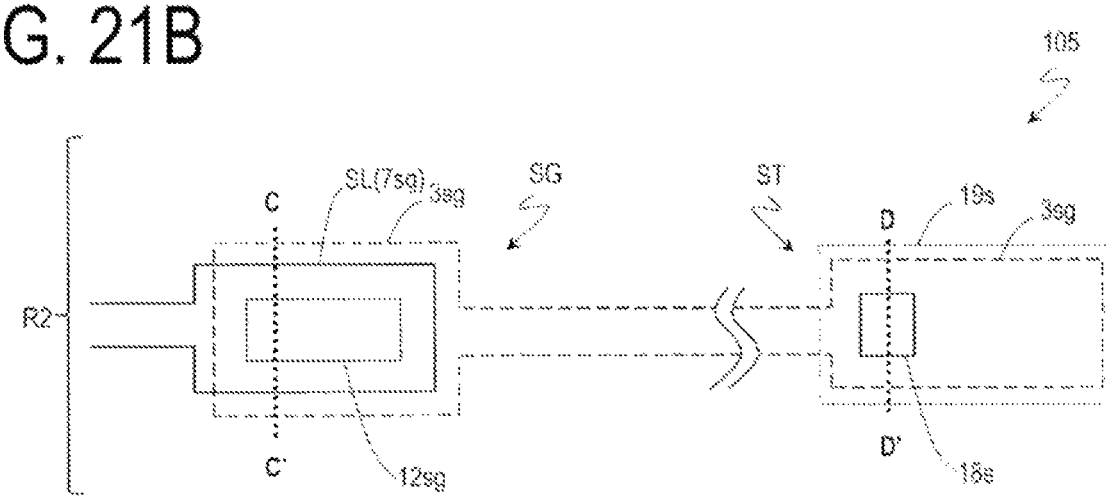
Figure 22:
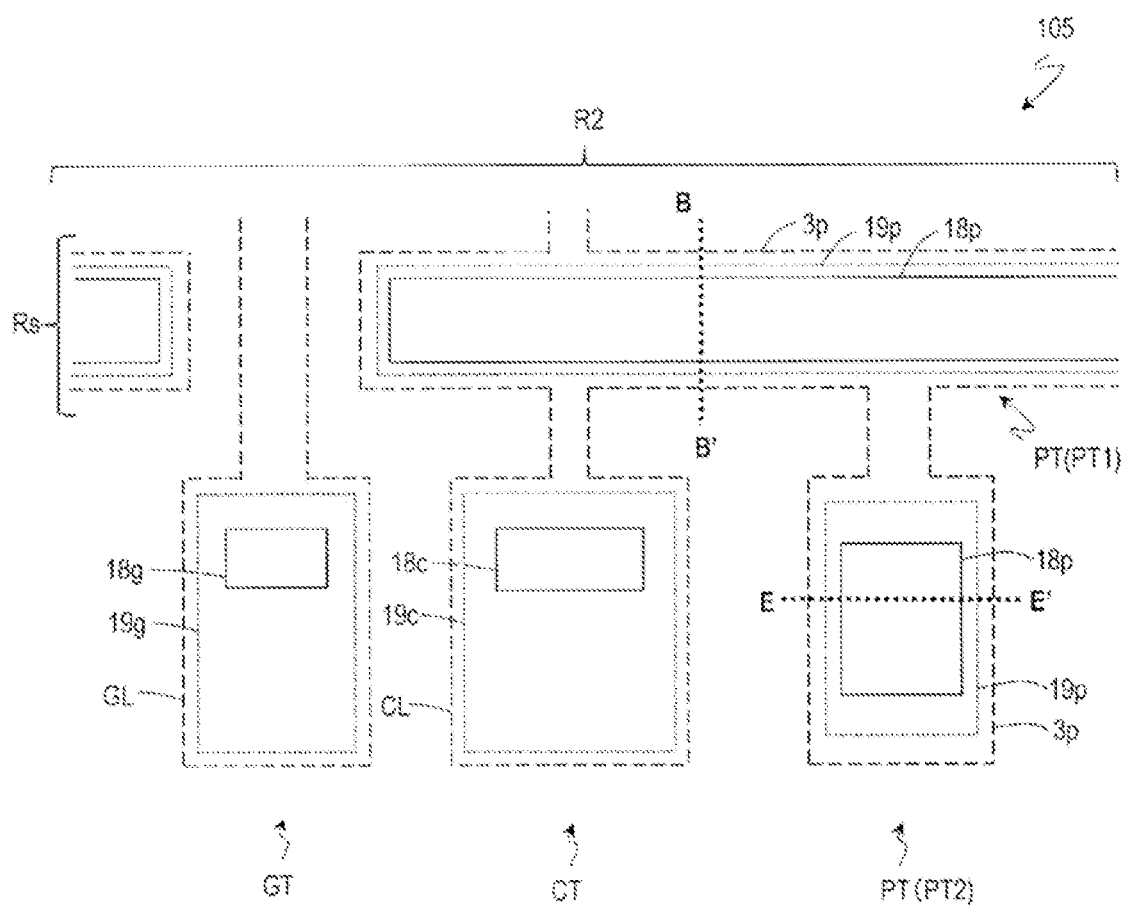
FIG. 22 is a schematic plan view illustrating the TFT substrate 105.

FIGS. 21A, 21B, and 22 are each a schematic plan view illustrating a TFT substrate 105 of the present embodiment.

The TFT substrate 105 includes the transmission and/or reception region R1 in which the plurality of antenna unit regions U are arranged, and the non-transmission and/or reception region R2 provided with a terminal section and the like. In the non-transmission and/or reception region R2 (R2a, R2b), a seal region Rs is disposed surrounding the transmission and/or reception region R1. The seal region Rs is positioned between a terminal section region where the terminal section is disposed and the transmission and/or reception region R1.

FIG. 21A illustrates the antenna unit region U of the transmission and/or reception region R1, FIG. 21B illustrates a source-gate connection section SG and the source terminal section ST provided to the non-transmission and/or reception region R2, and FIG. 22 illustrates the transfer terminal section PT, the gate terminal section GT, and a CS terminal section CT provided to the non-transmission and/or reception region R2. The transfer terminal section (also called the transfer section) PT includes a first transfer terminal section PT1 positioned in the seal region Rs, and a second transfer terminal section PT2 provided outward of the seal region Rs. In this example, the first transfer terminal section PT1 extends along the seal region Rs, encompassing the transmission and/or reception region R1.

In general, the gate terminal section GT and the source terminal section ST are provided to each of the gate bus lines and source bus lines, respectively. While FIG. 22 illustrates the CS terminal section CT and the second transfer terminal section PT2 aligned with the gate terminal section GT, the number and arrangement of the CS terminal sections CT and the second transfer terminal sections PT2 are each set independently of the gate terminal section GT. Normally, the number of the CS terminal sections CT and the second transfer terminal sections PT2 is less than the number of the gate terminal sections GS, and is suitably set taking into consideration the uniformity of the voltage of the slot electrode and the CS electrode. Further, the second transfer terminal section PT2 may be omitted when the first transfer terminal section PT1 is formed.

Figure 23A:
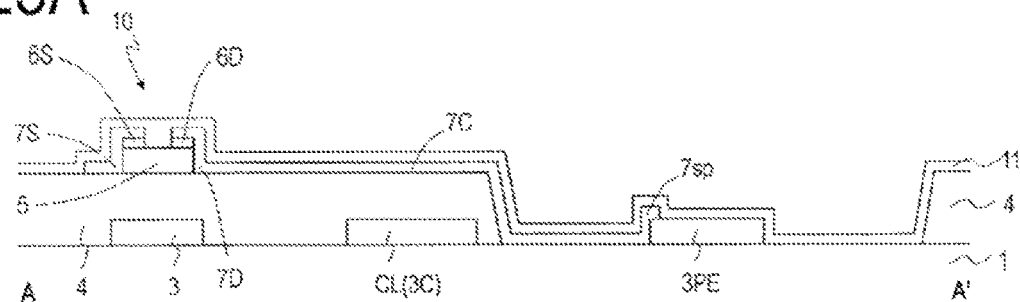
FIG. 23A to FIG. 23E are each a schematic cross-sectional view of the TFT substrate 105.
Figure 23B:
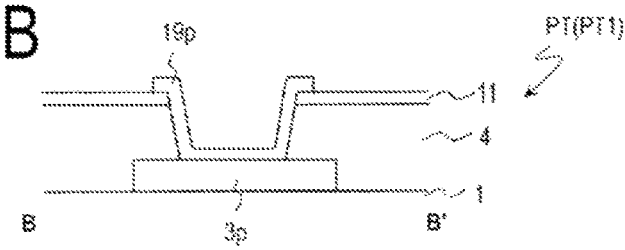
Figure 23C:
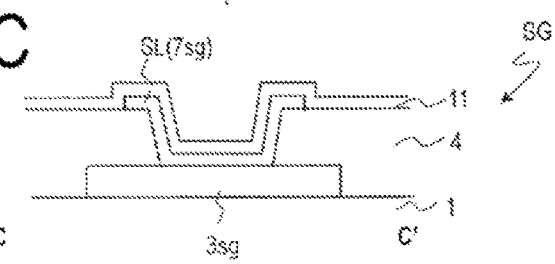
Figure 23D:
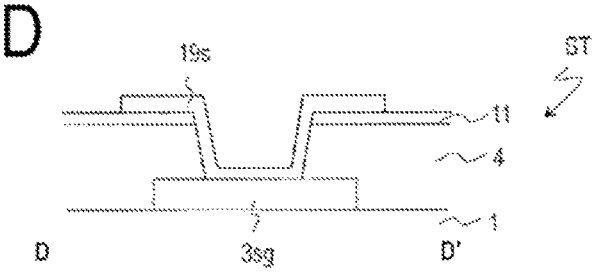
Figure 23E:
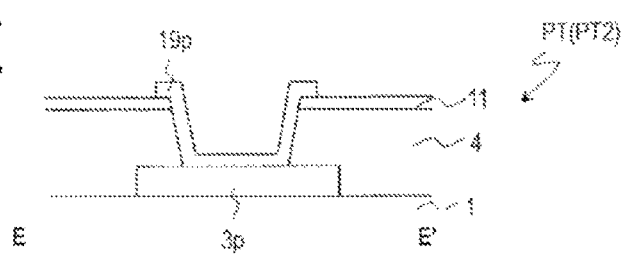

FIGS. 23A to 23E are each a schematic cross-sectional view of the TFT substrate 105. FIG. 23A illustrates a cross section of the antenna unit region U along the line A-A' in FIG. 21A, FIG. 23B illustrates a cross section of the transfer terminal section PT along the line B-B' in FIG. 22, FIG. 23C illustrates a cross section of the source-gate connection section SG along the line C-C' in FIG. 21B, FIG. 23D illustrates a cross section of the source terminal section ST along the line D-D' in FIG. 21B, and FIG. 23E illustrates a cross section of the transfer terminal section PT along the line E-E' in FIG. 22.

Antenna Unit Region U

As illustrated in FIGS. 21A and 23A, the antenna unit regions U of the TFT substrate 105 each include the gate bus line GL and the source bus line SL formed on the dielectric substrate 1, the TFT 10, the first insulating layer 11 covering the TFT 10, and a patch electrode 3PE.

The TFT 10 includes the gate electrode 3, the island-shaped semiconductor layer 5, the contact layers 6S and 6D, the gate insulating layer 4 disposed between the gate electrode 3 and the semiconductor layer 5, the source electrode 7S, and the drain electrode 7D. The configuration of the TFT 10 is the same as the configuration described above with reference to FIGS. 3A, 3B, and the like. The source electrode 7S of each of the TFTs 10 is connected to the source bus line SL, the drain electrode 7D is connected to the patch electrode 3PE, and the gate electrode 3 is connected to the gate bus line GL.

The patch electrode 3PE is formed from the same conductive film as the patch electrode 3.

In the TFT substrate 105, because the patch electrode 3PE is formed from the same conductive film as the gate electrode 3, it is possible to reduce the number of manufacturing steps (the number of photomasks, for example). For example, in the manufacturing process of the TFT substrate 101 in the first embodiment described with reference to FIGS. 3A to 5, seven photomasks are used (excluding the formation of the alignment mark 21). In contrast, the TFT substrate 105 in the present embodiment can be manufactured using six photomasks. A manufacturing process will be described in detail below.

In the present embodiment, the conductive film that includes the gate electrode and the patch electrode is also called a gate conductive film. Further, the layer formed using the gate conductive film including the gate electrode and the patch electrode is also called a gate metal layer. In the present embodiment, the gate metal layer preferably satisfies the preferred conditions of a metal film that forms a patch electrode already described. For example, the gate metal layer of the present embodiment is preferably from 0.3 to 3 µm, inclusive, and more preferably from 0.3 to 2 µm, inclusive. In the present embodiment, the gate electrode 3 and the patch electrode 3PE each have a thickness from 0.3 to 3 µm, inclusive, for example. The gate electrode 3 and the patch electrode 3PE may each have a thickness from 0.3 to 2 µm, inclusive.

As described above, when the patch electrode is formed in the source metal layer, problems such as those described below may occur when the thickness of the patch electrode is increased. While dependent on the TFT configuration as well, when a patch electrode having a thickness exceeding 1 µm, for example, is formed in the source metal layer, the problem of not achieving the desired patterning accuracy may occur. For example, a problem may arise in which the gap (corresponding to the channel length of the TFT) between the source electrode and the drain electrode cannot be controlled at high accuracy.

In contrast, in the present embodiment, the patch electrode 3PE is formed from the same conductive film as the patch electrode 3, and thus such problems do not occur. The patterning accuracy required for the gate metal layer is lower than that for the source metal layer, resulting in loose restrictions on thickness in comparison with when the patch electrode is formed in the source metal layer. For example, in the present embodiment, the thickness of the patch electrode can be increased when the patch electrode is formed in the source metal layer. According to the present embodiment, it is possible to form a patch electrode having adequate thickness while reducing the number of manufacturing steps (the number of photomasks, for example). In the present embodiment, the gate electrode 3 and the patch electrode 3PE may each have a thickness that exceeds 0.5 µm, for example.

The gate electrode 3 and the patch electrode 3PE may be formed by only a low resistance metal layer (a Cu layer, an Al layer, an Ag layer, an Au layer, or a layered structure including any of these), or may include a layered structure including a low resistance metal layer. The layered structure including a low resistance metal layer includes a layer containing a metal having a high melting point above and/or below that of the low resistance metal layer. Note that a "layer containing a metal having a high melting point" refers to a layer formed by titanium (Ti), tungsten (W), molybdenum (Mo), tantalum (Ta), niobium (Nb), an alloy containing these, a nitride of these, or a solid solution of the metals or alloys and the nitride, for example. The low resistance metal layer of the gate electrode 3 and the patch electrode 3PE may have a thickness from 0.2 to 2.9 µm, inclusive, for example. When the gate electrode 3 and the patch electrode 3PE include an Al layer, the Al layer preferably has a thickness from 0.3 to 2.9 µm, inclusive. When the gate electrode 3 and the patch electrode 3PE include a Cu layer, the Cu layer preferably has a thickness from 0.2 to 2.0 µm, inclusive.

The TFT substrate 105 may further include a CS bus line (an auxiliary capacity line) CL. In this example, the CS bus line CL may be formed using the same conductive film as the gate bus line GL. The CS bus line CL extends substantially in parallel with the gate bus line GL. A part of the CS bus line CL faces a part of a section extending from the drain electrode 7D via the gate insulating layer 4, forming an auxiliary capacity. In this specification, the section of the CS bus line CL serving as a lower electrode of the auxiliary capacity is called the lower capacitance electrode 3C, and the section serving as the upper electrode of the auxiliary capacity of the section of the drain electrode 7D is called the upper capacitance electrode 7C. A width of the lower capacitance electrode 3C may be greater than a width of the CS bus line CL other than the lower capacitance electrode 3C. A width of the upper capacitance electrode 7C may be greater than a width of the section other than the upper capacitance electrode 7C of the section extending from the drain electrode 7D.

In this specification, the section extended from the drain electrode 7D over the patch electrode 3PE is called the patch electrode connection section 7sp. In this example, when viewed from a normal direction of the dielectric substrate 1, the patch electrode connection section 7sp extends from the upper capacitance electrode 7C. Note that the arrangement relationship between the auxiliary capacitance and the patch electrode 3PE is not limited to the illustrated example.

The gate insulating layer 4 includes an opening 12a exposing the patch electrode 3PE. The patch electrode connection section 7sp is disposed inside the opening 12a, and is in contact with the patch electrode 3PE inside the opening 12a. Here, the opening 12a is formed so as to expose the patch electrode 3PE in its entirety. That is, when viewed from the normal direction of the dielectric substrate 1, the patch electrode 3PE is on an inner side of the opening 12a.

Transfer Terminal Section PT

The first transfer terminal section PT1, as illustrated in FIGS. 22 and 23B, includes a gate connection section 3p, the gate insulating layer 4 and the first insulating layer 11 covering the gate connection section 3p, and a transfer upper connection section 19p formed on the first insulating layer 11.

The gate connection section 3p is formed using the same conductive film as the gate bus line GL, and is electrically separated from the gate bus line GL. The gate connection section 3p is connected to the CS bus line CL (integrally formed with the CS bus line).

The gate insulating layer 4 and the first insulating layer 11 include an opening (contact hole) 18p exposing a part of the gate connection section 3p. The transfer upper connection section 19p is disposed on the first insulating layer 11 and inside the opening 18p, and is in contact with the gate connection section 3p inside the opening 18p. The transfer upper connection section 19p is, for example, connected with a transfer connection section on the slot substrate side by a sealing material containing conductive particles, for example (refer to FIG. 7).

In this example, the gate connection section 3p is disposed between two of the gate bus lines GL adjacent to each other. The two gate connection sections 3p disposed sandwiching the gate bus line GL may be electrically connected via a conductive connection section (not illustrated). The conductive connection section may be formed from the same conductive film as the source bus line, for example.

Note that while here the gate connection section 3p is connected to the transfer upper connection section 19p by one opening 18p, a plurality of the openings 18p may be provided for each gate connection section 3p.

The gate connection section 3p, when viewed from the normal direction of the substrate 1, extends outwardly (opposite to the transmission and/or reception region R1) and constitutes the second transfer terminal section PT2.

The second transfer terminal section PT2 is provided on an outer side of the seal region Rs (on the side opposite the transmission and/or reception region R1). The second transfer terminal section PT2, as illustrated in FIG. 23E, has the same cross-sectional structure as the first transfer terminal section PT1 illustrated in FIG. 23B. That is, the second transfer terminal section PT2 includes the gate connection section 3p formed using the same conductive film as the gate bus line GL, the gate insulating layer 4 and the first insulating layer 11 covering the gate connection section 3p, and the transfer upper connection section 19p formed on the gate insulating layer 4 and the first insulating layer 11. The gate insulating layer 4 and the first insulating layer 11 include the opening 18p exposing a part of the gate connection section 3p. The transfer upper connection section 19p is disposed on the first insulating layer 11 and inside the opening 18p, and is in contact with the gate connection section 3p inside the opening 18p.

In the second transfer upper connection section PT2 as well, the transfer upper connection section 19p may be connected with a transfer connection section on the slot substrate side by a sealing material containing conductive particles, for example.

Source-Gate Connection Section SG

As illustrated in FIGS. 21B and 23C, the source-gate connection section SG electrically connects the source bus line SL and a gate connection wiring line 3sg.

Specifically, the source-gate connection section SG includes the gate connection wiring line 3sg, the gate insulating layer 4 extending over the gate connection wiring line 3sg, and the source bus line SL formed on the gate insulating layer 4.

The gate connection wiring line 3sg is formed using the same conductive film as the gate bus line GL, and is electrically separated from the gate bus line GL. When viewed from the normal direction of the dielectric substrate 1, at least a part of the gate connection wiring line 3sg is disposed so as to not overlap the source bus line SL.

In this specification, the section of the source bus lines SL positioned at the source-gate connection section SG is also called the "source connection section 7sg". A width of the source connection section 7sg may be greater than the width of the source bus line SL.

The gate insulating layer 4 includes an opening 12sg exposing a part of the gate connection wiring line 3sg, that is, an opening 12sg that reaches the gate connection wiring line 3sg.

The source connection section 7sg is disposed on the gate insulating layer 4 and inside the opening 12sg, and is in contact with the gate connection wiring line 3sg inside the opening 12sg. The source connection section 7sg may be covered by the first insulating layer 11.

Source Terminal Section ST, Gate Terminal Section GT, and CS Terminal Section CT The source terminal section ST, as illustrated in FIGS. 21B and 23D, includes the gate connection wiring line 3sg extending from the source-gate connection section SG, the gate insulating layer 4 and the first insulating layer 11 covering the gate connection wiring line 3sg, and the source terminal upper connection section 19s. The gate insulating layer 4 and the first insulating layer 11 include the opening 18s exposing a part of the gate connection wiring line 3sg. The source terminal upper connection section 19s is disposed on the first insulating layer 11 and inside the opening 18s, and is in contact with the gate connection wiring line 3sg inside the opening 18s.

The gate terminal section GT and the CS terminal section CT, as illustrated in FIG. 22, may have the same configuration as the source terminal section ST.

In this example, the gate terminal section GT includes the gate bus line GL, the gate insulating layer 4 and the first insulating layer 11 formed on the gate bus line GL, and the gate terminal upper connection section 19g formed on the first insulating layer 11. The gate insulating layer 4 and the first insulating layer 11 include the opening 18g exposing a part of the gate bus line GL. The gate terminal upper connection section 19g is disposed on the first insulating layer 11 and inside the opening 18g, and is in contact with the gate bus line GL inside the opening 18g.

The CS terminal section CT includes the CS bus line CL, the gate insulating layer 4 and the first insulating layer 11 formed on the CS bus line CL, and a CS terminal upper connection section 19c formed on the first insulating layer 11. The gate insulating layer 4 and the first insulating layer 11 include an opening 18c that reaches the CS bus line CL. The CS terminal upper connection section 19c is disposed on the first insulating layer 11 and inside the opening 18c, and is in contact with the CS bus line CL inside the opening 18c.

Manufacturing Method of TFT Substrate 105

As described above, in the present embodiment, the TFT substrate 105 includes the gate metal layer, the gate insulating layer 4, the source metal layer, the first insulating layer 11, and the upper transparent conductive layer on the dielectric substrate 1, in this order. The gate metal layer includes the gate bus line GL, the gate electrode 3 of the TFT 10, the gate connection wiring line 3sg, the gate connection section 3p, the CS bus line CL, and the patch electrode 3PE. The source metal layer includes the source bus line SL, the source electrode 7S and the drain electrode 7D of the TFT 10, and a section extending from the drain electrode 7D (including the upper capacitance electrode 7D and the patch electrode connection section 7sp). The upper transparent conductive includes the upper connection sections 19s, 19g, 19c, 19p of each terminal section.

FIGS. 24AA to 24BK are each a process cross-sectional view illustrating an example of a manufacturing method of the TFT substrate 105. These diagrams illustrate cross sections respectively corresponding to FIGS. 23A to 23E. Descriptions of the material, thickness, formation method, and the like of each layer are suitably omitted when the method is the same as that described above with reference to FIG. 5.

First, as illustrated in FIG. 24AA, a gate conductive film 3' is formed on the dielectric substrate 1 by a sputtering method or the like. Here, as the gate conductive film 3', a layered film (Cu/Ti) is formed by layering a Ti film (having a thickness of 20 nm, for example) and a CU film (having a thickness of 500 nm, for example), in this order.

Next, as illustrated in FIG. 24AB, the gate metal layer including the gate electrode 3, the gate bus line GL, the lower capacitance electrode 3C, the patch electrode 3PE, the CS bus line CL, the gate connection section 3P, and the gate connection wiring line 3sg is obtained by patterning the gate conductive film 3'. Here, the patterning of the gate conductive film 3' is performed by wet etching.

Subsequently, as illustrated in FIG. 24AC, the gate insulating layer 4, an intrinsic amorphous silicon film 5', and an n+ type amorphous silicon film 6' are formed, in this order, so as to cover the gate metal layer. Here, as the gate insulating layer 4, for example, a silicon nitride (SixNy) film having a thickness of 350 nm is formed. Further, the intrinsic amorphous silicon film 5' having a thickness of 120 nm, for example, and an n+type amorphous silicon film 6' having a thickness of 30 nm, for example, are formed.

Then, the island-shaped semiconductor layer 5 and the contact layer 6 are obtained as illustrated in FIG. 24AD by patterning the intrinsic amorphous silicon film 5' and the n+ type amorphous silicon film 6'. The semiconductor film used for the semiconductor layer 5 is not limited to an amorphous silicon film. For example, an oxide semiconductor layer may be formed as the semiconductor layer 5. In this case, the contact layer may not be provided between the semiconductor layer 5 and the source/drain electrodes.

Then, as illustrated in FIG. 24AE, the opening 12a exposing the patch electrode 3PE in the antenna unit formation region, and the opening 12sg that reaches the gate connection wiring line 3sg in the source-gate connection section formation region is formed in the gate insulating layer 4 by a known photolithography process. Here, the opening 12a is formed so as to expose the patch electrode 3PE in its entirety. At this time, when viewed from the normal direction of the dielectric substrate 1, the patch electrode 3PE is on the inner side of the opening 12a. The opening 12sg is formed so as to expose only a part of the gate connection wiring line 3sg, for example.

Next, as illustrated in FIG. 24AF, a source conductive film 7' is formed on the gate insulating layer 4, on the contact layer 6, inside the opening 12a, and inside the opening 12sg. Here, as the source conductive film 7', a layered film (MoN/Al/MoN) is formed by layering MoN (having a thickness of 50 nm, for example), Al (having a thickness of 150 nm, for example), and MoN (having a thickness of 100 nm, for example), in this order.

Then, as illustrated in FIG. 24BG, the source metal layer including the source bus line SL (including the source connection section 7sg), the source electrode 7S, the drain electrode 7D, the upper capacitance electrode 7C, and the patch electrode connection section 7sp is formed by patterning the source conductive film 7'. At this time, the contact layer 6 is also etched, and the source contact layer 6S and the drain contact layer 6D separated from each other are formed. Thus, the TFT 10 and the source-gate connection section SG are obtained.

In the patterning of the source conductive film 7', etching conditions are adjusted so that an etching rate for the patch electrode 3PE is less than an etching rate for the source conductive film 7'. For example, materials and etchants of the gate conductive film 3' and the source conductive film 7' are selected as appropriate. Here, the patterning of the source conductive film 7' is performed by wet etching. As an etching solution, for example, an aqueous solution containing phosphoric acid, nitric acid, and acetic acid is used.

Next, the first insulating layer 11 is formed so as to cover the TFT 10 and the source metal layer, as illustrated in FIG. 24BH. In this example, the first insulating layer 11 is disposed to come into contact with the channel region of the semiconductor layer 5. Here, as the first insulating layer 11, for example, a silicon nitride (SixNy) film having a thickness of 330 nm is formed.

Then, the first insulating layer 11 and the gate insulating layer 4 are etched by a known photolithography process. Thus, as illustrated in FIG. 24BI, the opening 18p that reaches the gate connection section 3p in the transfer terminal section formation region, and the opening 18s that reaches the gate connection wiring line 3sg in the source terminal section formation region are formed in the first insulating layer 11 and the gate insulating layer 4. In this etching process, in the terminal section formation region, the first insulating layer 11 and the gate insulating layer 4 are etched at the same time. At side walls of the obtained openings 18p, 18s, side walls of the first insulating layer 11 and the gate insulating layer 4 are aligned.

Then, as illustrated in FIG. 24BJ, a transparent conductive film 19' is formed on the first insulating layer 11, inside the opening 18p, and inside the opening 18s by a sputtering method, for example. Here, an ITO film having a thickness of, for example, 70 nm is used as the transparent conductive film 19'.

Then, the transparent conductive film 19' is patterned. Thus, as illustrated in FIG. 24BK, the transfer upper connection section 19p in contact with the gate connection section 3p inside the opening 18p, and the source terminal upper connection section 19s in contact with the gate connection wiring line 3sg inside the opening 18s are formed. Thus, the transfer terminal section PT and the source terminal section ST are obtained. Note that, although not illustrated, the gate terminal section GT and the CS terminal section CT may be formed using the same method as that for the source terminal section ST.

In this manner, the TFT substrate 105 is manufactured.

Modification 1

Below is described the TFT substrate of modification 1 of the present embodiment with reference to FIGS. 25A to 27E.

Figure 25A:
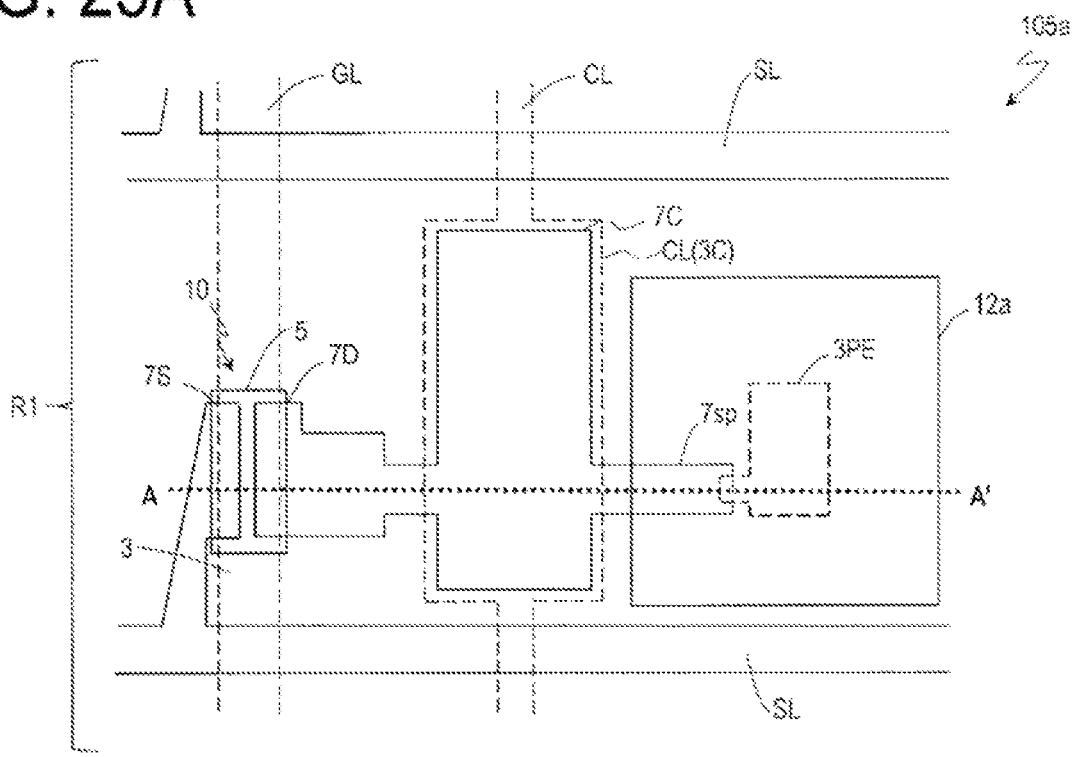
FIG. 25A and FIG. 25B are each a schematic plan view illustrating a TFT substrate 105*a* of modification 1 of the fourth embodiment.
Figure 25B:
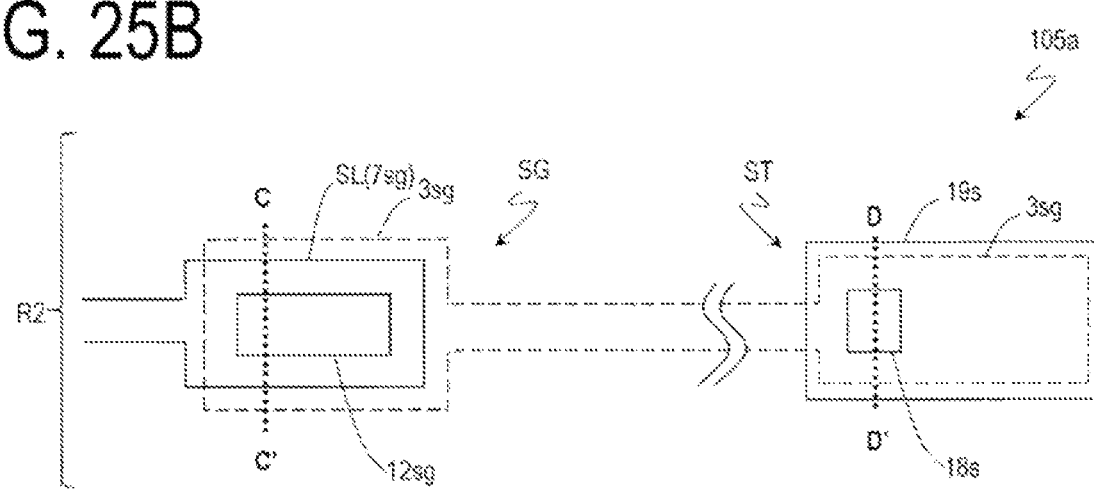
Figure 26:
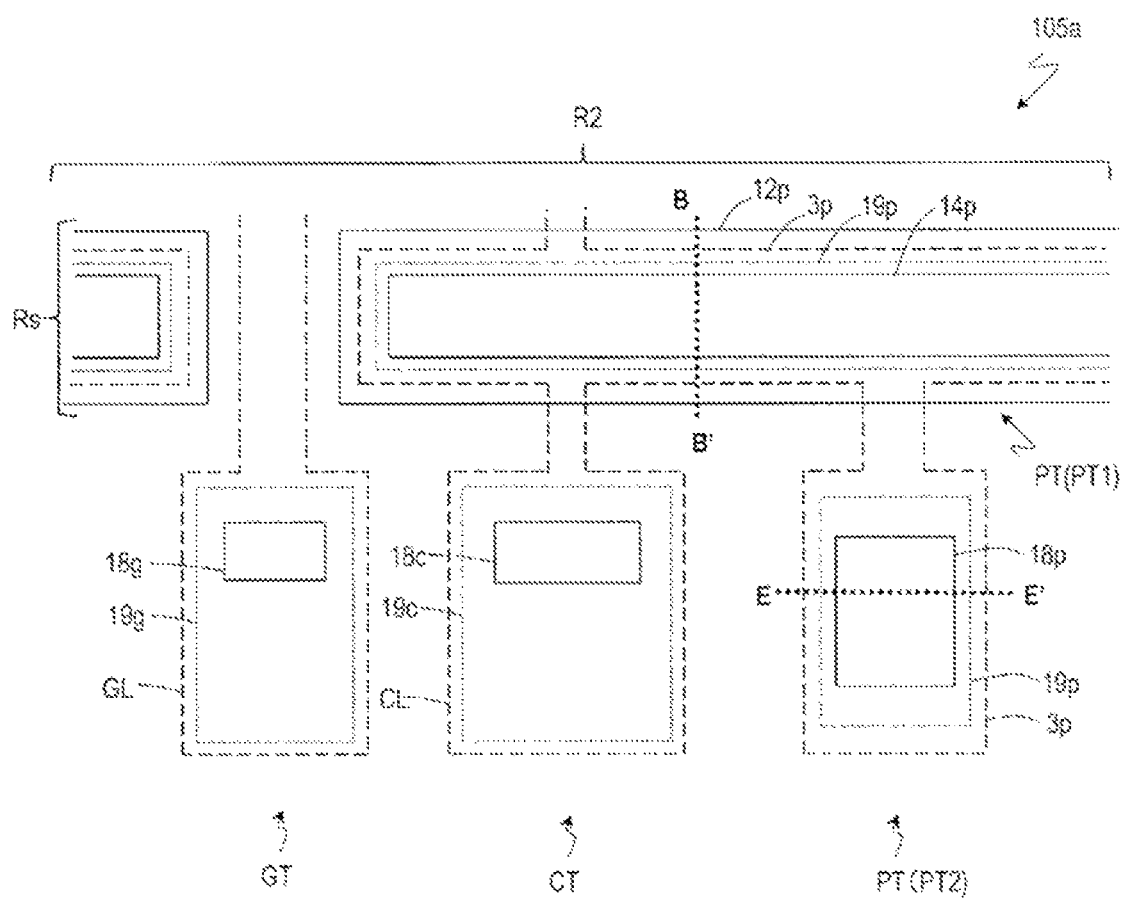
FIG. 26 is a schematic plan view illustrating the TFT substrate 105*a*.
Figure 27A:
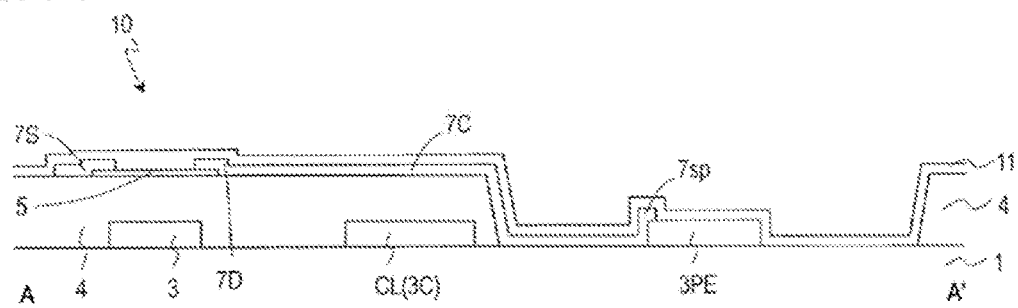
FIG. 27A to FIG. 27E are each a schematic cross-sectional view of the TFT substrate 105*a*.
Figure 27B:
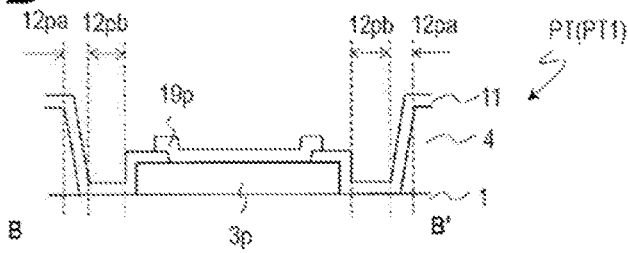
Figure 27C:
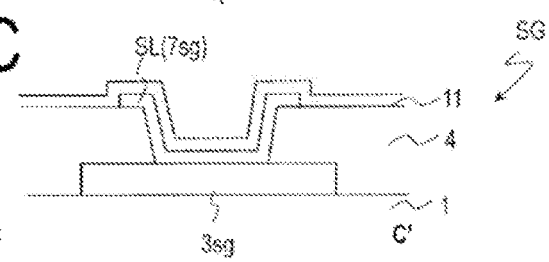
Figure 27D:
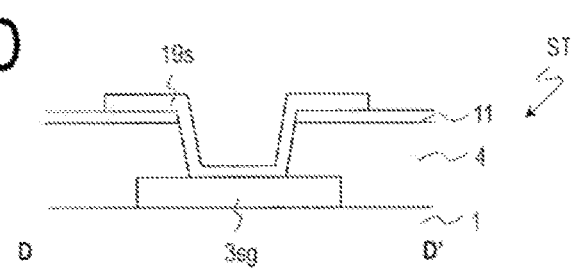
Figure 27E:
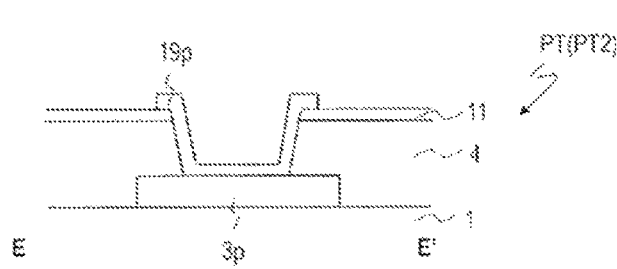

FIGS. 25A, 25B, and 26 are each a schematic plan view illustrating a TFT substrate 105a of modification 1 of the present embodiment. FIG. 25A illustrates the antenna unit region U of the transmission and/or reception region R1, FIG. 25B illustrates the source-gate connection section SG and the source terminal section ST provided to the non-transmission and/or reception region R2, and FIG. 26 illustrates the transfer terminal section PT, the gate terminal section GT, and the CS terminal section CT provided to the non-transmission and/or reception region R2. FIGS. 27A to 27E are each a schematic cross-sectional view of the TFT substrate 105a. FIG. 27A illustrates a cross section of the antenna unit region U along the line A-A' in FIG. 25A, FIG. 27B illustrates a cross section of the transfer terminal section PT along the line B-B' in FIG. 26, FIG. 27C illustrates a cross section of the source-gate connection section SG along the line C-C' in FIG. 25B, FIG. 27D illustrates a cross section of the source terminal section ST along the line D-D' in FIG. 25B, and FIG. 27E illustrates a cross section of the transfer terminal section PT along the line E-E' in FIG. 26.

The TFT substrate 105a has a structure that differs from that of the TFT substrate 105 in the first transfer terminal section PT1. Hereinafter, the differences from the TFT substrate 105 are mainly described.

As described with reference to FIGS. 22 and 23B, in the first transfer terminal section PT1 of the TFT substrate 105, the transfer upper connection section 19p is disposed on the first insulating layer 11 and inside the opening 18p, and the opening 18p is provided in the gate insulating layer 4 and the first insulating layer 11. Thus, a step in the transfer upper connection section 19p caused by the opening 18p corresponds to a sum of the thickness of the gate insulating layer 4 and the thickness of the first insulating layer 11.

In contrast, in the TFT substrate 105a, as illustrated in FIGS. 26 and 27B, the transfer upper connection section 19p is disposed on the first insulating layer 11 and inside an opening 14p, and the opening 14p is provided only in the first insulating layer 11. Thus, a step in the transfer upper connection section 19p caused by the opening 14p corresponds to the thickness of the first insulating layer 11. As already described, the transfer upper connection section 19p is, for example, connected with a transfer connection section on the slot substrate side by a sealing material containing conductive particles (refer to FIG. 7, for example). In the TFT substrate 105a, with the step in the transfer upper connection section 19p being small, the contact between the conductive particles and the transfer upper connection section 19p is stabilized. The TFT substrate 105a has the advantage of achieving easy control of the thickness of the liquid crystal layer (cell gap). From the viewpoint of achieving the effect of easy control of the thickness of the liquid crystal layer, preferably the thickness of the first insulating layer 11 is small, and is preferably, for example, 200 nm or less.

Below, a description is given of a specific structure of the first transfer terminal section PT1 of the TFT substrate 105a.

As illustrated in FIG. 27B, the first transfer terminal section PT1 includes the gate connection section 3p, an opening 12p of the gate insulating layer 4, the first insulating layer 11 extending over the gate connection section 3p, and the transfer upper connection section 19p formed on the first insulating layer 11.

The first transfer terminal section PT1 is provided on an inner side of the opening 12p of the gate insulating layer 4. The first insulating layer 11 is provided on the gate connection section 3p and inside the opening 12p, and is in contact with the gate connection section 3p inside the opening 12p. The first insulating layer 11 includes the opening 14p exposing a part of the gate connection section 3p. The transfer upper connection section 19p is provided on the first insulating layer 11 and inside the opening 14p, and is in contact with the gate connection section 3p inside the opening 14p.

In the TFT substrate 105a having such a configuration as well, it is possible to achieve the same effect as that of the TFT substrate 105.

Note that, while the TFT substrate 105 is inferior to the TFT substrate 105a from the perspective of the TFT substrate 105a achieving easy control of the thickness of the liquid crystal layer, the TFT substrate 105 has the advantage of having superior reliability over the TFT substrate 105a. This point is described below.

In the first transfer terminal section PT1 of the TFT substrate 105a, the opening 12p includes on an outer side of the gate connection section 3p a first section 12p a having a layered structure including the gate insulating layer 4 and the first insulating layer 11 on the substrate 1, and a second section 12p b having a layered structure including only the first insulating layer 11 on the substrate 1.

In contrast, in the first transfer terminal section PT1 of the TFT substrate 105, the entire region on the outer side of the gate connection section 3p has a layered structure including the gate insulating layer 4 and the first insulating layer 11 on the substrate 1. This makes it possible to enhance the reliability to a greater degree than that of the TFT substrate 105a. From the viewpoint of achieving the effect of having excellent reliability, preferably the thickness of the gate insulating layer 4 and/or the first insulating layer 11 is large.

A method for manufacturing the TFT substrate 105a will now be described with reference to FIGS. 28AA to 28BK. FIGS. 28AA to 28BK are each a process cross-sectional view illustrating an example of the manufacturing method of the TFT substrate 105a. These diagrams illustrate cross sections respectively corresponding to FIGS. 27A to 27E. Hereinafter, the differences from the manufacturing method of the TFT substrate 105 are mainly described.

As illustrated in FIGS. 28AA to 28AD, the gate metal layer, the gate insulating layer 4, and the island-shaped semiconductor layer 5 are formed. These steps are similar to the steps illustrated in FIGS. 24AA to 24AD. Here, as the gate conductive film 3', a layered film (Cu/Ti) is formed by layering a Ti film (having a thickness of 20 nm, for example) and a CU film (having a thickness of 500 nm, for example), in this order. Further, here, as the gate insulating layer 4, a layered film (SiOx/SixNy) is formed by layering a silicon nitride (SixNy) film (having a thickness of 300 nm, for example) and a silicon oxide (SiOx) film (having a thickness of 50 nm, for example), in this order. Further, here, the oxide semiconductor layer 5 may be formed as the semiconductor layer 5. As the oxide semiconductor film 5', an In—Sn—Zn—O based semiconductor film having a thickness of 70 nm, for example, is formed, and this is then patterned to obtain the island-shaped oxide semiconductor layer 5. Thus, when the oxide semiconductor layer 5 is formed as the semiconductor layer 5, the contact layer between the semiconductor layer 5 and the source/drain electrodes may be omitted.

Then, the gate insulating layer 4 is etched. Here, the step differs from the etching step illustrated in FIG. 24AE in that the gate insulating layer 4 is etched even in the first transfer terminal section formation region. Thus, as illustrated in FIG. 28AE, the opening 12p exposing the gate connection section 3p is formed in the first transfer terminal section formation region in addition to the opening 12a exposing the patch electrode 3PE and the opening 12sg exposing the gate connection wiring line 3sg.

Then, as illustrated in FIG. 28AF, the source conductive film 7' is formed on the gate insulating layer 4, on the oxide semiconductor layer 5, on the patch electrode 3PE, inside the opening 12a, inside the opening 12sg, and inside the opening 12p. Here, as a source conductive film 7', a layered film (Ti/Al/Ti) is formed by layering Ti (having a thickness of 50 nm, for example), Al (having a thickness of 200 nm, for example), and Ti (having a thickness of 50 nm, for example), in this order.

Figure 28B:
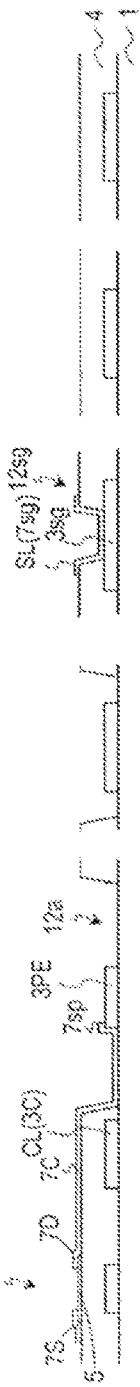
FIG. 28BG to FIG. 28BK are each a process cross-sectional view illustrating an example of a manufacturing method of the TFT substrate 105*a*.
Figure 28B:
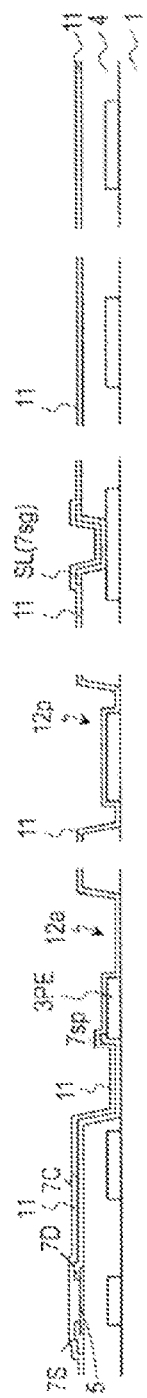
Figure 28B:
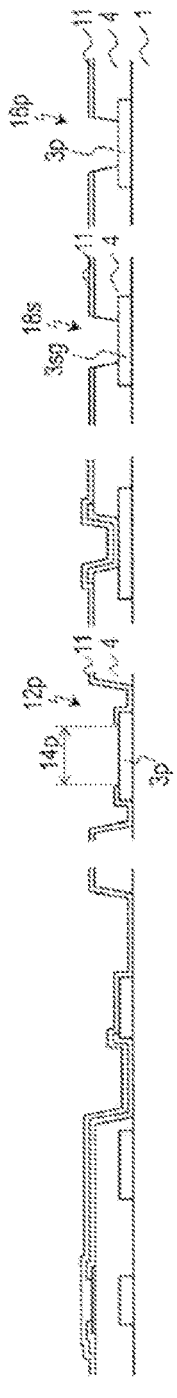
Figure 28B:
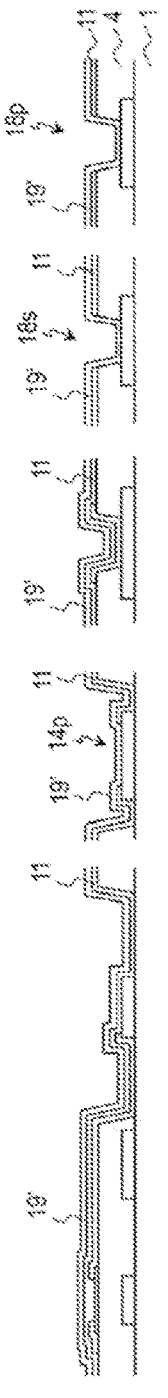
Figure 28B:
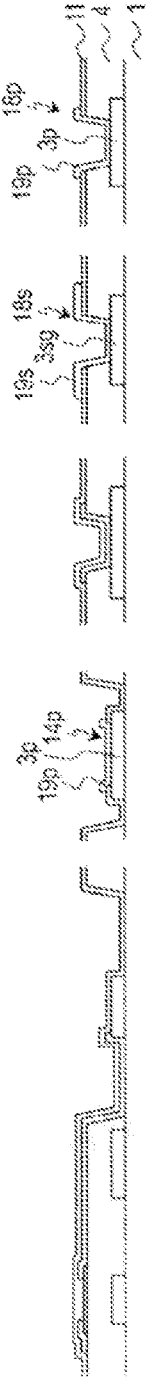

Then, as illustrated in FIG. 28BG, the source metal layer is formed by patterning the source conductive film 7'. In the patterning of the source conductive film 7', etching conditions are adjusted so that the etching rate for the patch electrode 3PE is less than the etching rate for the source conductive film 7', similar to the patterning illustrated in FIG. 24BG. For example, materials and etchants of the gate conductive film 3' and the source conductive film 7' are selected as appropriate. Here, the patterning of the source conductive film 7' is performed by dry etching using fluorine gas, for example.

Next, the first insulating layer 11 is formed so as to cover the TFT 10 and the source metal layer, as illustrated in FIG. 28BH. This step is similar to the step illustrated in FIG. 24BH. Further, here, as the first insulating layer 11, a layered film (SixNy/SioX) is formed by layering a silicon oxide (SiOx) film (having a thickness of 50 nm, for example) and a silicon nitride (SixNy) film (having a thickness of 50 nm, for example), in this order.

Then, the first insulating layer 11 and the gate insulating layer 4 are etched. Here, the step differs from the etching step illustrated in FIG. 24BI in that only the first insulating layer 11 in the first transfer terminal section formation region is etched. Thus, as illustrated in FIG. 28BI, the opening 18s that reaches the gate connection wiring line 3sg, the opening 18*p* that reaches the gate connection section 3*p* in the second transfer terminal section formation region, and the opening 14*p* exposing a part of the gate connection section 3*p* in the first transfer terminal section formation region are formed.

Then, as illustrated in FIG. 28BJ, the transparent conductive film 19' is formed on the first insulating layer 11, inside the opening 14*p*, and inside the openings 18*p*, 18*s*.

Then, the transparent conductive film 19' is patterned. Here, as illustrated in FIG. 28BK, in the first transfer terminal formation region, the transfer upper connection section 19*p* that is disposed on the first insulating layer 11 and inside the opening 14*p* and is in contact with the gate connection section 3*p* inside the opening 14*p* is formed.

In this manner, the TFT substrate 105*a* is manufactured.

Note that while the above illustrates a case where the semiconductor layer 5 made from an oxide semiconductor is formed as the semiconductor layer 5 of the TFT substrate 105*a*, the TFT substrate of modification 1 is not limited thereto. As in the semiconductor layer 5 of the TFT substrate 105, the semiconductor layer 5 may be formed from an intrinsic amorphous silicon film.

Modification 2

Below is described the TFT substrate of modification 2 of the present embodiment with reference to FIGS. 29A to 31E.

Figure 29A:
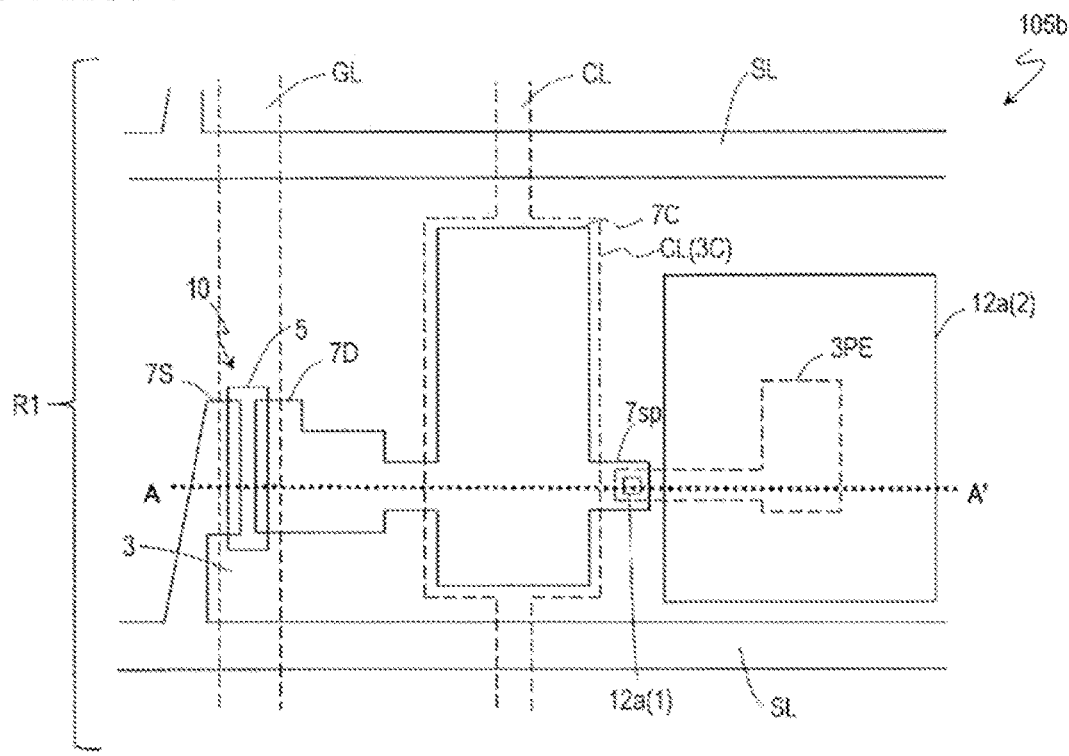
FIG. 29A and FIG. 29B are each a schematic plan view illustrating a TFT substrate 105*b* of modification 2 of the fourth embodiment.
Figure 29B:
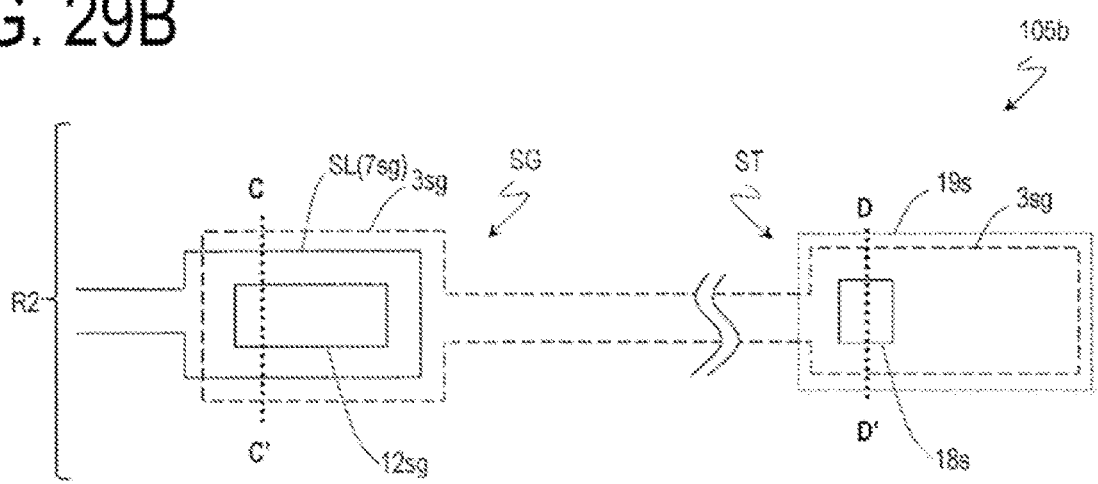
Figure 30:
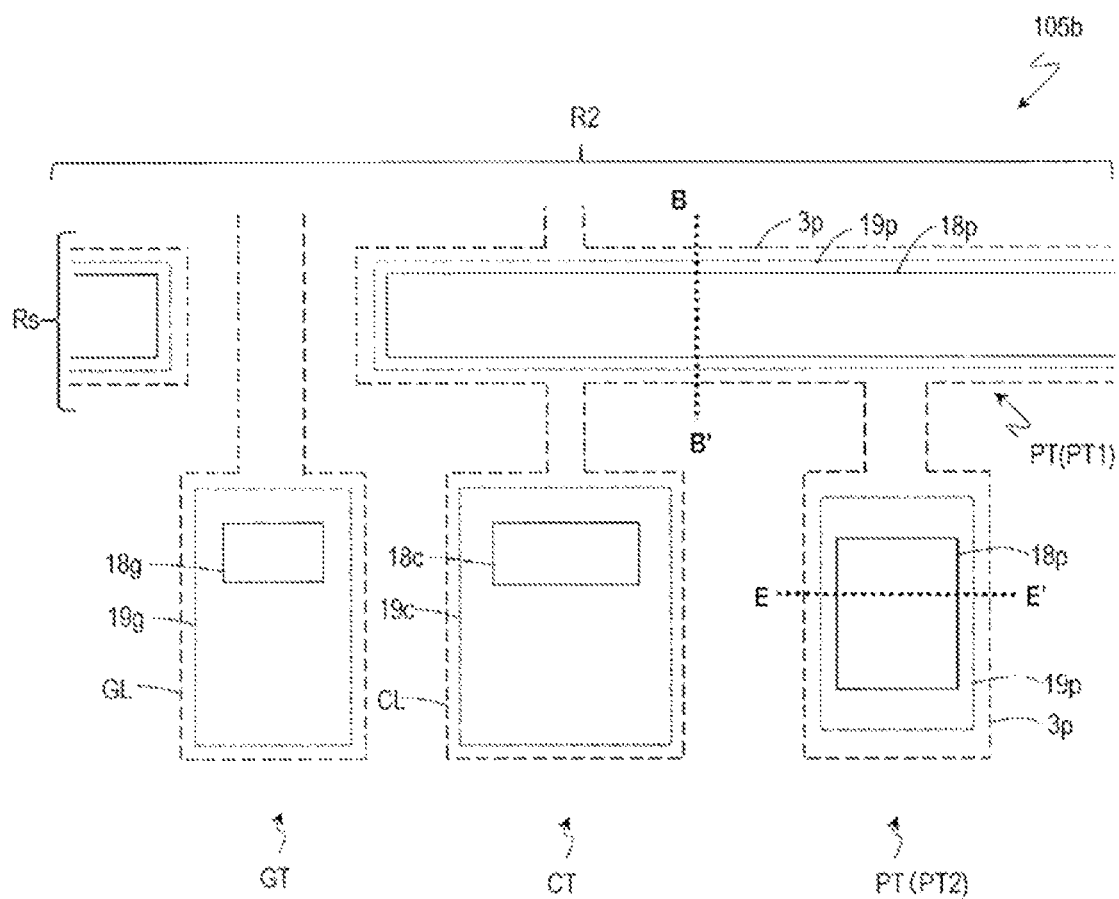
FIG. 30 is a schematic plan view illustrating the TFT substrate 105*b*.
Figure 31A:
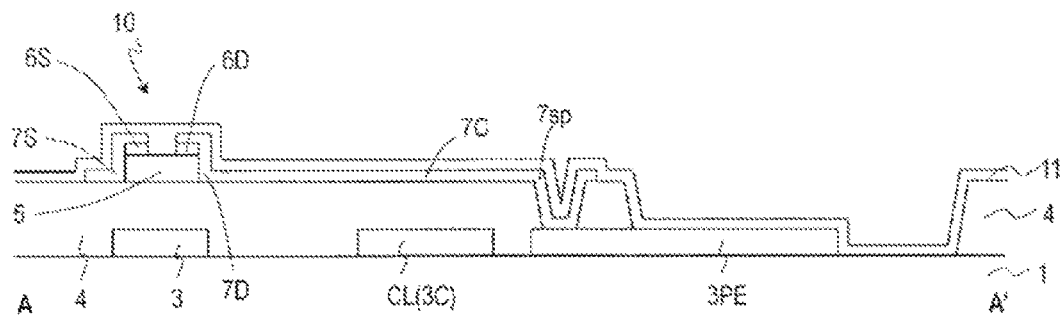
FIG. 31A to FIG. 31E are each a schematic cross-sectional view illustrating the TFT substrate 105*b*.
Figure 31B:
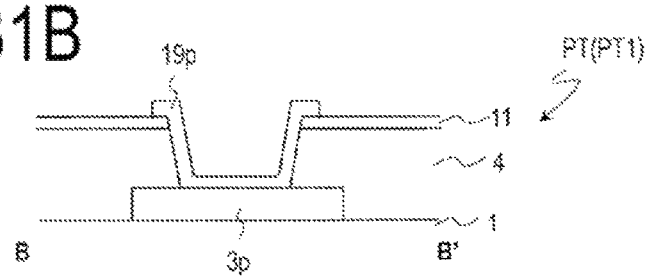
Figure 31C:
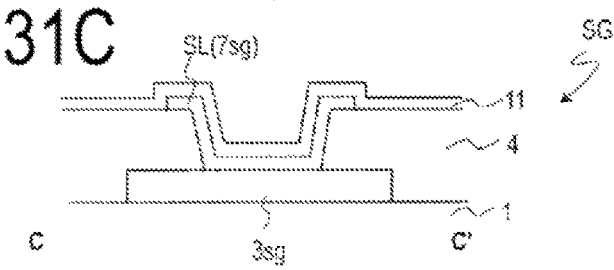
Figure 31D:
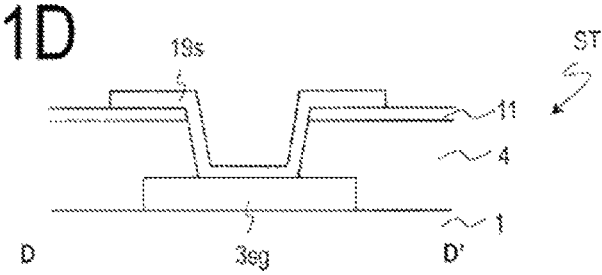
Figure 31E:
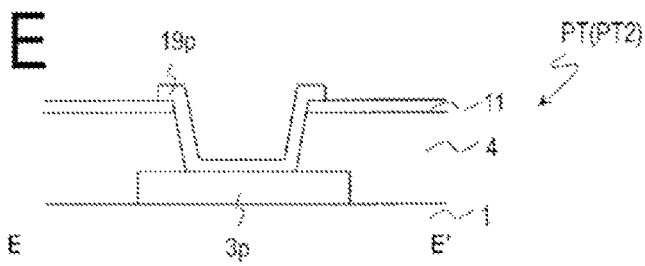

FIGS. 29A, 29B, and 30 are each a schematic plan view illustrating a TFT substrate 105*b* of modification 2 of the present embodiment. FIG. 29A illustrates the antenna unit region U of the transmission and/or reception region R1, FIG. 29B illustrates the source-gate connection section SG and the source terminal section ST provided to the non-transmission and/or reception region R2, and FIG. 30 illustrates the transfer terminal section PT, the gate terminal section GT, and the CS terminal section CT provided to the non-transmission and/or reception region R2. FIGS. 31A to 31E are each a schematic cross-sectional view of the TFT substrate 105*b*. FIG. 31A illustrates a cross section of the antenna unit region U along the line A-A' in FIG. 29A, FIG. 31B illustrates a cross section of the transfer terminal section PT along the line B-B' in FIG. 30, FIG. 31C illustrates a cross section of the source-gate connection section SG along the line C-C' in FIG. 29B, FIG. 31D illustrates a cross section of the source terminal section ST along the line D-D' in FIG. 29B, and FIG. 31E illustrates a cross section of the transfer terminal section PT along the line E-E' in FIG. 30.

The TFT substrate 105*b* differs from the TFT substrate 105 in that the gate insulating layer 4 of the TFT substrate 105*b* includes an opening 12*a* (1) exposing only a part of the patch electrode 3PE in the antenna unit region U. Hereinafter, the differences from the TFT substrate 105 are mainly described.

As described with reference to FIGS. 21A and 23A, the patch electrode 3PE is on an inner side of the opening 12*a* in the antenna unit region U of the TFT substrate 105, when viewed from the normal direction of the dielectric substrate 1. That is, the opening 12*a* is formed so as to expose the patch electrode 3PE in its entirety.

In contrast, in the TFT substrate 105*b*, as illustrated in FIGS. 29A and 31A, the gate insulating layer 4 includes the opening 12*a* (1) extending over the patch electrode 3PE and exposing a part of the patch electrode 3PE. The patch electrode connection section 7*sp* is disposed inside the opening 12*a* (1), and is in contact with the patch electrode 3PE inside the opening 12*a* (1).

The TFT substrate 105*b* can be manufactured using the manufacturing method described with reference to FIGS. 32AA to 32BL, and thus, during the etching of the source conductive film, has the advantage of not requiring adjustment of etching conditions to ensure that the etching rate for the patch electrode is less than the etching rate for the source conductive film.

The manufacturing process of the TFT substrate 105*b* will now be described with reference to FIGS. 32AA to 32BL.

FIGS. 32AA to 32BL are each a process cross-sectional view illustrating an example of a manufacturing method of the TFT substrate 105*b*. These diagrams illustrate cross sections respectively corresponding to FIGS. 31A to 31E. Hereinafter, the differences from the manufacturing method of the TFT substrate 105 are mainly described.

As illustrated in FIGS. 32AA to 32AD, the gate metal layer, the gate insulating layer 4, the island-shaped semiconductor layer 5, and the contact layer 6 are formed. These steps are similar to the steps illustrated in FIGS. 24AA to 24AD. Here, as the gate conductive film 3', a layered film (MoN/Al) is formed by layering an Al film (having a thickness of 800 nm, for example) and an MoN film (having a thickness of 100 nm, for example), in this order. Further, here, as the gate insulating layer 4, a layered film (SiOx/SixNy) is formed by layering a silicon nitride (SixNy) film (having a thickness of 300 nm, for example) and a silicon oxide (SiOx) film (having a thickness of 50 nm, for example), in this order.

Then, the gate insulating layer 4 is etched. Here, as illustrated in FIG. 32AE, the etching step differs from that illustrated in FIG. 24AE in that the opening 12*a* (1) exposing only a part of the patch electrode 3PE is formed in the antenna unit formation region.

Then, as illustrated in FIG. 32AF, the source conductive film 7' is formed on the gate insulating layer 4, on the contact layer 6, on the patch electrode 3PE, inside the opening 12*a* (1), inside the opening 12*sg*, and inside the opening 12*p*. Here, as the source conductive film 7', a layered film (MoN/Al/MoN) is formed by layering MoN (having a thickness of 50 nm, for example), Al (having a thickness of 150 nm, for example), and MoN (having a thickness of 100 nm, for example), in this order.

Then, as illustrated in FIG. 32BG, the source metal layer is formed by patterning the source conductive film 7'. The patterning of the source conductive film 7' differs from the patterning illustrated in FIG. 24BG in that the patch electrode 3PE is not exposed. Thus, etching conditions do not need to be adjusted to ensure that the etching rate for the patch electrode 3PE is less than the etching rate for the source conductive film 7'. For example, the gate conductive film 3' and the source conductive film 7' may be formed from the same metal film. For example, the gate conductive film 3' and the source conductive film 7' may be formed from the same low resistance metal film (a CU film, an Al film, an Ag film, or Au film, for example).

Subsequently, as illustrated in FIG. 32BH, an opening 12*a* (2) exposing the remaining part of the patch electrode 3PE is formed by etching the gate insulating layer 4 once again.

Next, the first insulating layer 11 is formed so as to cover the TFT 10 and the source metal layer, as illustrated in FIG. 32BI. This step is similar to the step illustrated in FIG. 24BH. Further, here, as the first insulating layer 11, a layered film (SixNy/SiOX) is formed by layering a silicon oxide (SiOx) film (having a thickness of 50 nm, for example) and a silicon nitride (SixNy) film (having a thickness of 50 nm, for example), in this order.

Then, as illustrated in FIG. 32BJ, the opening 18*p* that reaches the gate connection section 3*p*, and the opening 18*s* that reaches the gate connection wiring line 3*sg* are formed by etching the first insulating layer 11 and the gate insulating layer 4. This step is similar to the etching step illustrated in FIG. 24BI.

Then, as illustrated in FIG. 32BK, the transparent conductive film 19' is formed on the first insulating layer 11, and inside the openings 18p, 18s. This step is similar to the step illustrated in FIG. 24BJ.

Then, as illustrated in FIG. 32BL, the transfer upper connection section 19p that reaches the gate connection section 3p inside the opening 18p, and the source terminal upper connection section 19s in contact with the gate connection wiring line 3sg inside the opening 18s are formed by patterning the transparent conductive film 19'. This step is similar to the step illustrated in FIG. 24BK.

In this manner, the TFT substrate 105b is manufactured.

While the TFT substrate 105 can be manufactured using six photomasks, seven photomasks are used in the manufacturing process of the TFT substrate 105b described above. Thus, from the viewpoint of reducing the number of photomasks, the TFT substrate 105b is inferior to the TFT substrate 105.

Nevertheless, the TFT substrate 105b can be manufactured using the manufacturing method described above and thus, during the etching of the source conductive film, has the advantage of not requiring adjustment of etching conditions to ensure that the etching rate for the patch electrode is less than the etching rate for the source conductive film.

Note that the opening 12a (2) may be omitted. In this case, the TFT substrate 105b can be manufactured using six photomasks, and thus has the effect of making it possible to reduce the number of photomasks compared to the TFT substrate 101 in the first embodiment.

Note that while the above illustrates a case where the semiconductor layer 5 made from an intrinsic amorphous silicon film is formed as the semiconductor layer 5 of the TFT substrate 105b, the TFT substrate of the modification 2 is not limited thereto. The oxide semiconductor layer 5 may be provided as the semiconductor layer 5, as with the TFT substrate 105a of modification 1.

Further, the first transfer terminal section PT1 of the TFT substrate 105b is not limited to having the same structure as the first transfer terminal section PT1 of the TFT substrate 105, and may have a structure similar to that of the first transfer terminal section PT1 of the TFT substrate 105a of modification 1.

Fifth Embodiment

Below, the scanning antenna of a fifth embodiment will be described.

In the TFT substrate used in the scanning antenna of the present embodiment, the patch electrode is formed from the same conductive film as the gate electrode, similar to the fourth embodiment. The TFT substrate of this embodiment differs from that of the fourth embodiment in that the TFT substrate includes an etch stop (channel protective layer) on the semiconductor layer (oxide semiconductor layer, for example).

Below is described the TFT substrate of the present embodiment with reference to FIGS. 33A to 35E. Hereinafter, the differences from the fourth embodiment are mainly described.

Figure 33A:
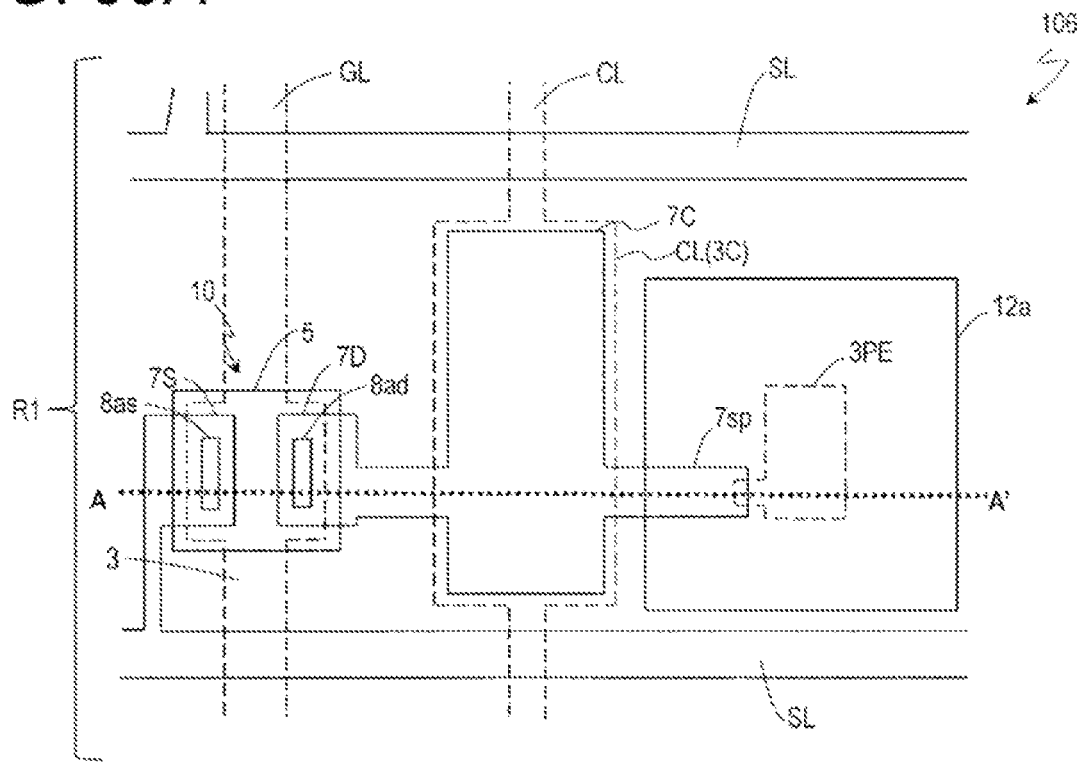
FIG. 33A and FIG. 33B are each a schematic plan view illustrating a TFT substrate 106 of a fifth embodiment.
Figure 33B:
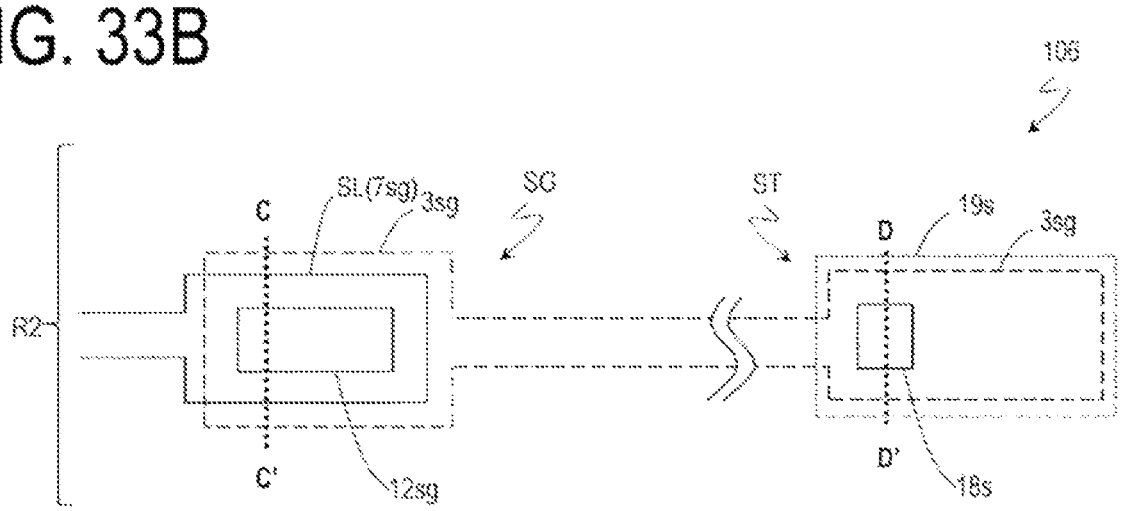
Figure 34:
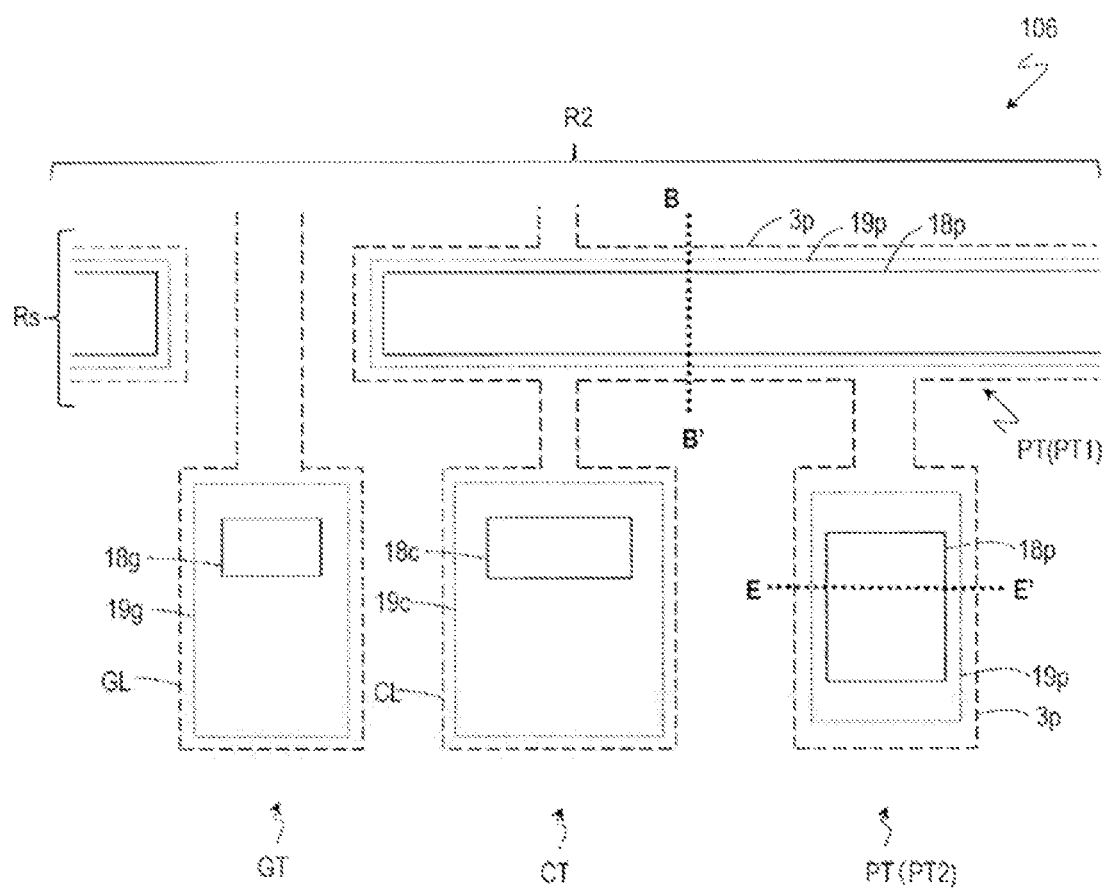
FIG. 34 is a schematic plan view illustrating the TFT substrate 106.
Figure 35A:
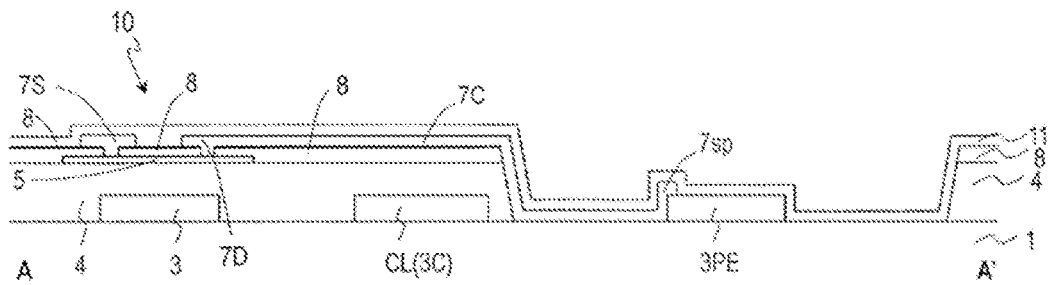
FIG. 35A to FIG. 35E are each a schematic cross-sectional view of the TFT substrate 106.
Figure 35B:
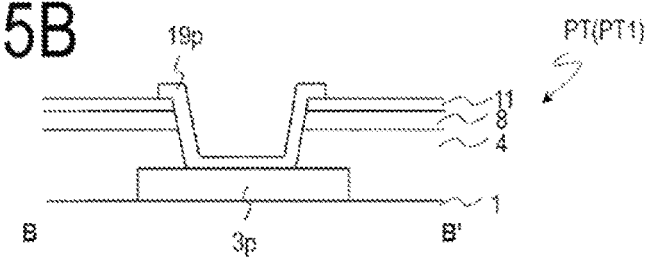
Figure 35C:
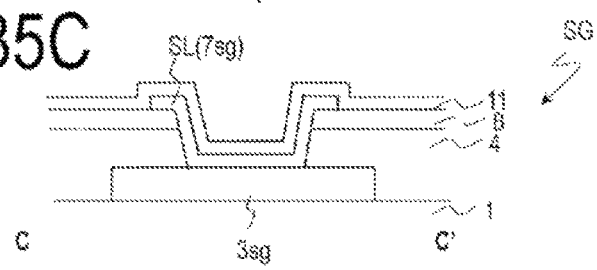
Figure 35D:
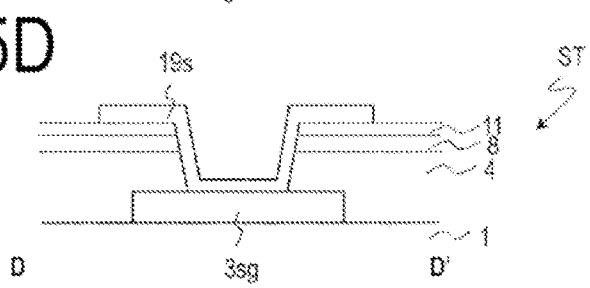
Figure 35E:
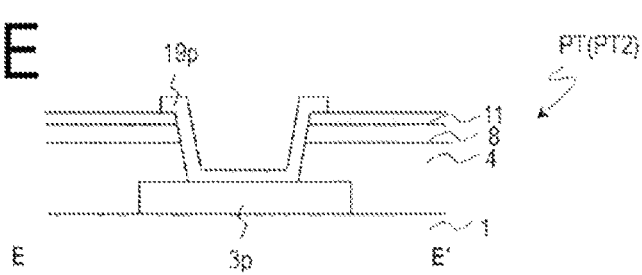

FIGS. 33A, 33B, and 34 are each a schematic plan view illustrating a TFT substrate 106 of the present embodiment. FIG. 33A illustrates the antenna unit region U of the transmission and/or reception region R1, FIG. 33B illustrates the source-gate connection section SG and the source terminal section ST provided to the non-transmission and/or reception region R2, and FIG. 34 illustrates the transfer terminal section PT, the gate terminal section GT, and the CS terminal section CT provided to the non-transmission and/or reception region R2. FIGS. 35A to 35E are each a schematic cross-sectional view of the TFT substrate 106. FIG. 35A illustrates a cross section of the antenna unit region U along the line A-A' in FIG. 33A, FIG. 35B illustrates a cross section of the transfer terminal section PT along the line B-B' in FIG. 34, FIG. 35C illustrates a cross section of the source-gate connection section SG along the line C-C' in FIG. 33B, FIG. 35D illustrates a cross section of the source terminal section ST along the line D-D' in FIG. 33B, and FIG. 35E illustrates a cross section of the transfer terminal section PT along the line E-E' in FIG. 34.

The TFT substrate 106 differs from the TFT substrate 105 of the fourth embodiment in that the TFT substrate includes an etch stop (channel protective layer) 8 on the semiconductor layer (oxide semiconductor layer, for example) 5.

Antenna Unit Region U

As illustrated in FIGS. 33A and 35A, the TFT substrate 106 includes the etch stop 8 formed so as to be in contact with the channel region of the semiconductor layer 5. The etch stop 8 includes a first opening 8as that reaches a source region of the semiconductor layer 5, and a second opening 8ad that reaches a drain region of the semiconductor layer 5. The source electrode 7S is provided on the etch stop 8 and inside the first opening 8as, and is in contact with the source region of the semiconductor layer 5 inside the first opening 8as. The drain electrode 7D is provided on the etch stop 8 and inside the second opening 8ad, and is in contact with the drain region of the semiconductor layer 5 inside the second opening 8ad.

With the patch electrode 3PE being formed from the same conductive film as the gate electrode 3, it is possible to reduce the number of manufacturing steps (the number of photomasks, for example) of the TFT substrate 106. The TFT substrate 106, as described with reference to FIGS. 36AA to 36BL, can be manufactured using six photomasks.

Furthermore, the TFT substrate 106 protects at least the channel region of the semiconductor layer 5 using the etch stop 8, making it possible to suppress process damage to the semiconductor layer 5 in the etching step of the source conductive film 7', in particular. This makes it possible to effectively suppress deterioration (resistance reduction) of the semiconductor layer 5.

The etch stop 8 may be an insulating film. When the semiconductor layer 5 is formed by an oxide semiconductor, preferably an oxide film, such as a silicon oxide (SiOx) film, for example, is used as the etch stop 8. When an oxide film is used and oxygen deficiency occurs in the oxide semiconductor layer 5, the oxygen deficiency can be recovered by the oxygen contained in the oxide film, making it possible to more effectively reduce oxygen deficiencies in the oxide semiconductor layer 5.

As illustrated in FIGS. 33A and 35A, the gate insulating layer 4 and the etch stop 8 include the opening 12a exposing the patch electrode 3PE. The patch electrode connection section 7sp is disposed inside the opening 12a, and is in contact with the patch electrode 3PE inside the opening 12a. Here, the opening 12a is formed so as to expose the patch electrode 3PE in its entirety. That is, when viewed from the normal direction of the dielectric substrate 1, the patch electrode 3PE is on the inner side of the opening 12a.

Transfer Terminal Section PT

The first transfer terminal section PT1 and the second transfer terminal section PT2, as illustrated in FIGS. 34, 35B, and 35E, include the gate connection section 3p; the gate insulating layer 4, the etch stop 8, and the first insulating layer 11 covering the gate connection section 3p, and the transfer upper connection section 19p formed on the first insulating layer 11. The gate insulating layer 4, the etch stop 8, and the first insulating layer 11 include the opening (contact hole) 18p exposing a part of the gate connection section 3p. The transfer upper connection section 19p is disposed on the first insulating layer 11 and inside the opening 18p, and is in contact with the gate connection section 3p inside the opening 18p.

Similar to the TFT substrate 105, in the first transfer terminal section PT1 of the TFT substrate 106, the entire region on the outer side of the gate connection section 3p has a layered structure including the gate insulating layer 4, the etch stop 8, and the first insulating layer 11 on the substrate 1. Thus, the TFT substrate 106 has excellent reliability.

Source-Gate Connection Section SG

As illustrated in FIGS. 33B and 35C, the source-gate connection section SG includes the gate connection wiring line 3sg, the gate insulating layer 4 and the etch stop 8 extending over the gate connection wiring line 3sg, and the source bus line SL formed on the etch stop 8.

The gate connection wiring line 3sg is formed using the same conductive film as the gate bus line GL, and is electrically separated from the gate bus line GL. When viewed from the normal direction of the dielectric substrate 1, at least a part of the gate connection wiring line 3sg is disposed so as to not overlap the source bus line SL.

The gate insulating layer 4 and the etch stop 8 include the opening 12sg exposing a part of the gate connection wiring line 3sg. The source connection section 7sg is disposed on the etch stop 8 and inside the opening 12sg, and is in contact with the gate connection wiring line 3sg inside the opening 12sg. The source connection section 7sg may be covered by the first insulating layer 11.

Source Terminal Section ST, Gate Terminal Section GT, and CS Terminal Section CT The source terminal section ST, as illustrated in FIGS. 33B and 35D, includes the gate connection wiring line 3sg extending from the source-gate connection section SG; the gate insulating layer 4, the etch stop 8, and the first insulating layer 11 covering the gate connection wiring line 3sg; and the source terminal upper connection section 19s. The gate insulating layer 4, the etch stop 8, and the first insulating layer 11 include the opening 18s exposing a part of the gate connection wiring line 3sg. The source terminal upper connection section 19s is disposed on the first insulating layer 11 and inside the opening 18s, and is in contact with the gate connection wiring line 3sg inside the opening 18s.

The gate terminal section GT and the CS terminal section CT, as illustrated in FIG. 34, for example, may have the same configuration as the source terminal section ST.

In this example, the gate terminal section GT includes the gate bus line GL; the gate insulating layer 4, the etch stop 8, and the first insulating layer 11 formed on the gate bus line GL; and the gate terminal upper connection section 19g formed on the first insulating layer 11. The gate insulating layer 4, the etch stop 8, and the first insulating layer 11 include the opening 18g exposing a part of the gate bus line GL. The gate terminal upper connection section 19g is disposed on the first insulating layer 11 and inside the opening 18g, and is in contact with the gate bus line GL inside the opening 18g.

The CS terminal section CT includes the CS bus line CL; the gate insulating layer 4, the etch stop 8, and the first insulating layer 11 formed on the CS bus line CL; and the CS terminal upper connection section 19c formed on the first insulating layer 11. The gate insulating layer 4, the etch stop 8, and the first insulating layer 11 include the opening 18c exposing a part of the CS bus line CL. The CS terminal upper connection section 19c is disposed on the first insulating layer 11 and inside the opening 18c, and is in contact with the CS bus line CL inside the opening 18c.

Manufacturing Method of TFT Substrate 106

A method for manufacturing the TFT substrate 106 will now be described with reference to FIGS. 36AA to 36BL. FIGS. 36AA to 36BL are each a process cross-sectional view illustrating an example of a manufacturing method of the TFT substrate 106. These diagrams illustrate cross sections respectively corresponding to FIGS. 35A to 35E. The description below focuses on the differences from the manufacturing method of the TFT substrate 105 described with reference to FIGS. 24AA to 24BK.

As illustrated in FIGS. 36AA to 36AD, the gate metal layer, the gate insulating layer 4, and the island-shaped oxide semiconductor layer 5 are formed. These steps are similar to the steps illustrated in FIGS. 24AA to 24AD. Here, as the gate conductive film 3', a layered film (Cu/Ti) is formed by layering a Ti film (having a thickness of 20 nm, for example) and a CU film (having a thickness of 500 nm, for example), in this order. Further, here, as the gate insulating layer 4, a layered film (SiOx/SixNy) is formed by layering a silicon nitride (SixNy) film (having a thickness of 300 nm, for example) and a silicon oxide (SiOx) film (having a thickness of 50 nm, for example), in this order. Further, here, the oxide semiconductor layer 5 may be formed as the semiconductor layer 5. As the oxide semiconductor film 5', an In—Sn—Zn—O based semiconductor film having a thickness of 70 nm, for example, is formed, and this is then patterned to obtain the island-shaped oxide semiconductor layer 5.

Then, as shown in FIG. 36AE, an etch stop insulating film 8' is formed on the gate insulating layer 4 and on the oxide semiconductor layer 5. Here, a silicon oxide layer (SiOx) film (having a thickness of 300 nm, for example) is formed as the etch stop insulating film 8'.

Then, the gate insulating layer 4 and the etch stop insulating film 8' are etched. As illustrated in FIG. 36AF, in the TFT formation region, the etch stop 8 is obtained by forming the first opening 8a s and the second opening 8a d that reach the semiconductor layer 5 in the etch stop insulating film 8'. In this example, the first opening 8a s and second opening 8ad are formed in sections of the etch stop insulating film 8' that are positioned on both sides of the section that is to become the channel of the semiconductor layer 5. At the same time, the opening 12a exposing the patch electrode 3PE in the antenna unit formation region, and the opening 12sg exposing the gate connection wiring line 3sg in the source-gate connection section formation region are formed in the gate insulating layer 4 and the etch stop 8.

Then, as illustrated in FIG. 36AG, the source conductive film 7' is formed on the etch stop 8, inside the first opening 8as, inside the second opening 8ad, on the patch electrode 3PE, inside the opening 12a, and inside the opening 12sg. Here, as the source conductive film 7', a layered film (MoN/Al/MoN) is formed by layering MoN (having a thickness of 50 nm, for example), Al (having a thickness of 150 nm, for example), and MoN (having a thickness of 100 nm, for example), in this order.

Then, as illustrated in FIG. 36BH, the source metal layer including the source bus line SL (including the source connection section 7sg), the source electrode 7S, the drain electrode 7D, the upper capacitance electrode 7C, and the patch electrode connection section 7sp is formed by patterning the source conductive film 7'. This step is similar to the patterning step illustrated in FIG. 24BG. According to this step, the source electrode 7S is provided on the etch stop 8 and inside the first opening 8as, and is in contact with the section that is to become the source region of the semiconductor layer 5 inside the first opening 8as. The drain electrode 7D is formed on the etch stop 8 and inside the second opening 8a d, and is in contact with the section that is to become the drain region of the semiconductor layer 5 inside the second opening 8ad.

Next, the first insulating layer 11 is formed so as to cover the TFT 10 and the source metal layer, as illustrated in FIG. 36BI. In this example, the first insulating layer 11 is disposed so as to be in contact with the etch stop 8 covering the channel region of the semiconductor layer 5. This step is similar to the step illustrated in FIG. 24BH. Further, here, as the first insulating layer 11, a layered film (SixNy/SioX) is formed by layering a silicon oxide (SiOx) film (having a thickness of 50 nm, for example) and a silicon nitride (SixNy) film (having a thickness of 50 nm, for example), in this order.

Then, as illustrated in FIG. 36BJ, the opening 18p that reaches the gate connection section 3p in the transfer terminal section formation region, and the opening 18s that reaches the gate connection wiring line 3sg in the source terminal section formation region are formed in the first insulating layer 11, the etch stop 8, and the gate insulating layer 4 by a known photolithography process. This step is similar to the step illustrated in FIG. 24BI.

Then, as illustrated in FIG. 36BK, the transparent conductive film 19' is formed on the first insulating layer 11 and inside the openings 18p, 18s by a sputtering method, for example. This step is similar to the step illustrated in FIG. 24BJ.

Then, the transparent conductive film 19' is patterned. Thus, as illustrated in FIG. 36BL, the transfer upper connection section 19p that reaches the gate connection section 3p inside the opening 18p, and the source terminal upper connection section 19s in contact with the gate connection wiring line 3sg inside the opening 18s are formed. This step is similar to the step illustrated in FIG. 24BK.

In this manner, the TFT substrate 106 is manufactured.

Note that while the above illustrates a case where the semiconductor layer 5 made from an oxide semiconductor is formed as the semiconductor layer 5 of the TFT substrate 106, the present embodiment is not limited thereto, and the semiconductor layer 5 may be formed from an intrinsic amorphous silicon film.

Modification 1

Below is described the TFT substrate of modification 1 of the present embodiment with reference to FIGS. 37A to 39E.

Figure 37A:
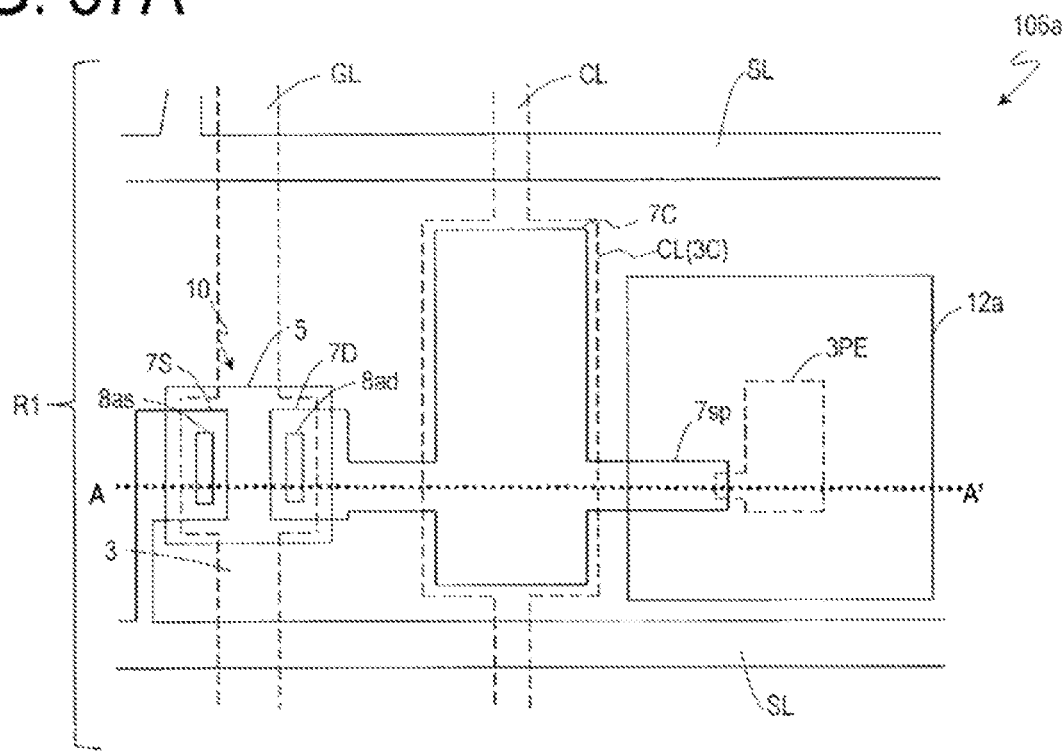
FIG. 37A and FIG. 37B are each a schematic plan view illustrating a TFT substrate 106*a* of modification 1 of the fifth embodiment.
Figure 37B:
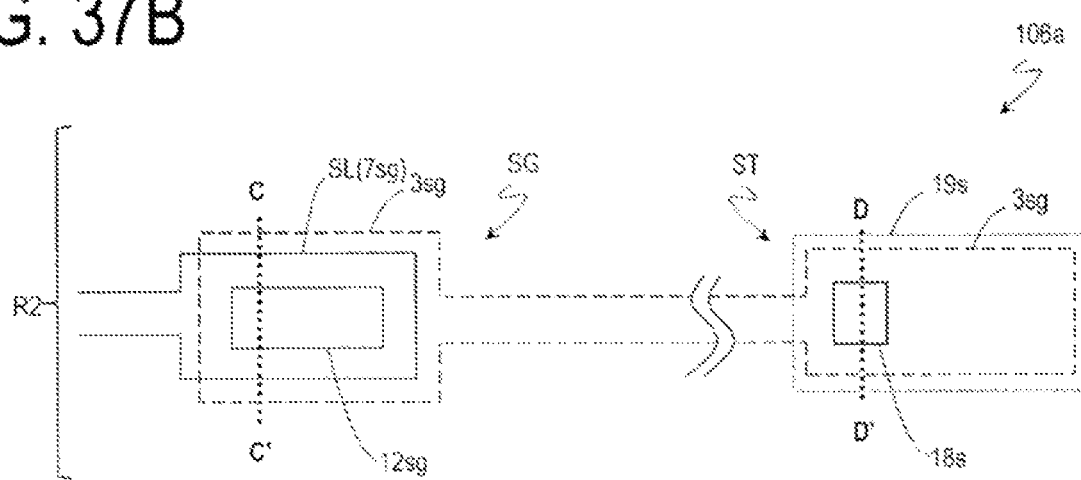
Figure 38:
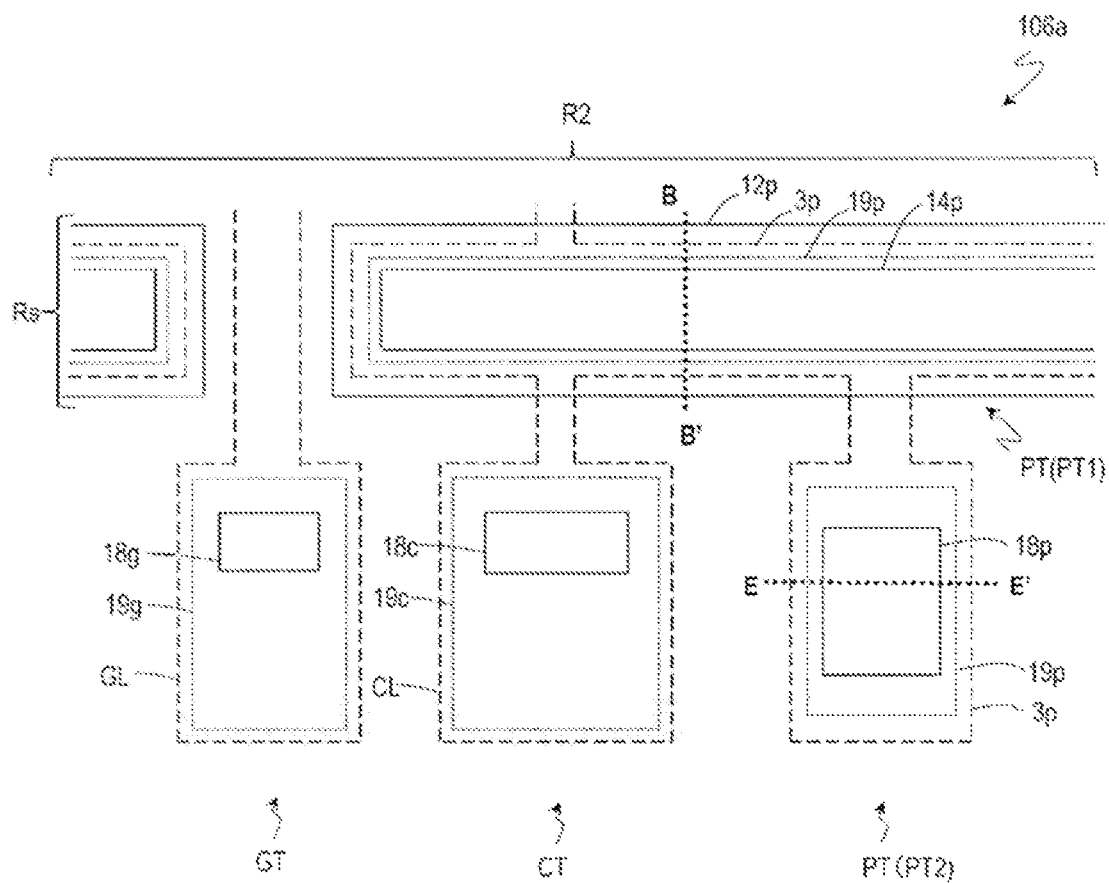
FIG. 38 is a schematic plan view illustrating the TFT substrate 106*a*.

FIGS. 37A, 37B, and 39 are each a schematic plan view illustrating a TFT substrate 106a of modification 1 of the present embodiment. FIG. 37A illustrates the antenna unit region U of the transmission and/or reception region R1, FIG. 37B illustrates the source-gate connection section SG and the source terminal section ST provided to the non-transmission and/or reception region R2, and FIG. 38 illustrates the transfer terminal section PT, the gate terminal section GT, and the CS terminal section CT provided to the non-transmission and/or reception region R2. FIGS. 39A to 39E are each a schematic cross-sectional view of the TFT substrate 106a. FIG. 39A illustrates a cross section of the antenna unit region U along the line A-A' in FIG. 37A, FIG. 39B illustrates a cross section of the transfer terminal section PT along the line B-B' in FIG. 38, FIG. 39C illustrates a cross section of the source-gate connection section SG along the line C-C' in FIG. 37B, FIG. 39D illustrates a cross section of the source terminal section ST along the line D-D' in FIG. 37B, and FIG. 39E illustrates a cross section of the transfer terminal section PT along the line E-E' in FIG. 38.

The TFT substrate 106a has a structure that differs from that of the TFT substrate 106 in the first transfer terminal section PT1. Hereinafter, the differences from the TFT substrate 106 are mainly described. The TFT substrate 106a, similar to the TFT substrate 105a, has the advantage of achieving easy control of the thickness of the liquid crystal layer (cell gap).

As described with reference to FIGS. 34 and 35B, in the first transfer terminal section PT1 of the TFT substrate 106, the transfer upper connection section 19p is disposed on the first insulating layer 11 and inside the opening 18p, and the opening 18p is provided in the gate insulating layer 4, the etch stop 8, and the first insulating layer 11. Thus, a step in the transfer upper connection section 19p caused by the opening 18p corresponds to the sum of the thickness of the gate insulating layer 4, the thickness of the etch stop 8, and the thickness of the first insulating layer 11.

Figure 39A:
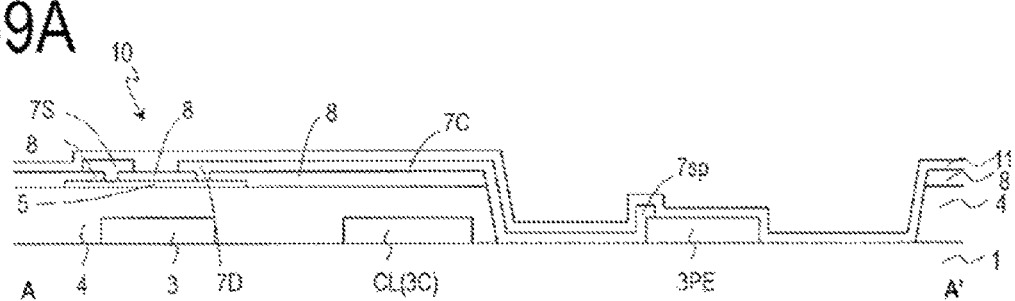
FIG. 39A to FIG. 39E are each a schematic cross-sectional view of the TFT substrate 106*a*.
Figure 39B:
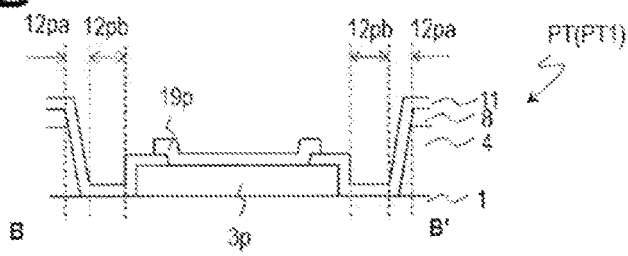
Figure 39C:
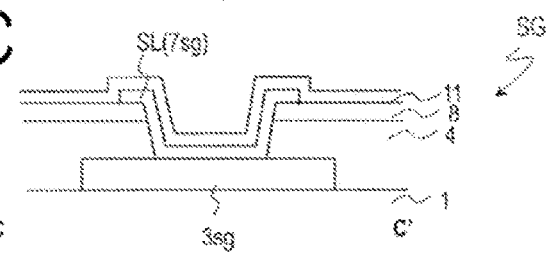
Figure 39D:
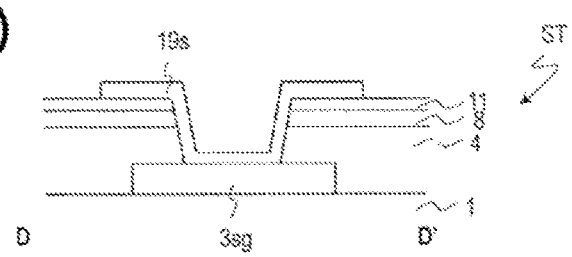
Figure 39E:
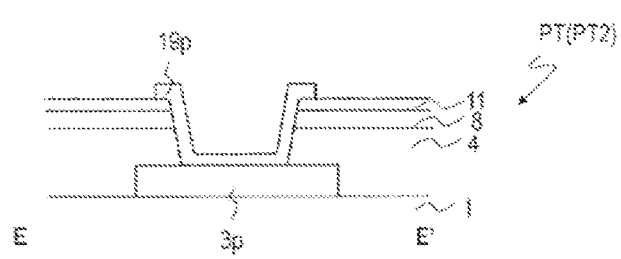

In the TFT substrate 106a, as illustrated in FIGS. 38 and 39B, the transfer upper connection section 19p is disposed on the first insulating layer 11 and inside the opening 14p, and the opening 14p is provided only in the first insulating layer 11. Thus, a step in the transfer upper connection section 19p caused by the opening 14p corresponds to the thickness of the first insulating layer 11. In the TFT substrate 106a, with the step in the transfer upper connection section 19p being small, the contact between the conductive particles and the transfer upper connection section 19p is stabilized. The TFT substrate 106a has the advantage of achieving easy control of the thickness of the liquid crystal layer (cell gap).

In the TFT substrate 106a, the first transfer terminal section PT1 includes the gate connection section 3p, the opening (contact hole) 12p formed in the gate insulating layer 4 and the etch stop 8, the first insulating layer 11 extending over the gate connection section 3p, and the transfer upper connection section 19p formed on the first insulating layer 11. That is, the first transfer terminal section PT1 is provided on the inner side of the opening 12p formed in the gate insulating layer 4 and the etch stop 8.

The first insulating layer 11 is provided on the gate connection section 3p and inside the opening 12p, and is in contact with the gate connection section 3p inside the opening 12p. The first insulating layer 11 includes the opening 14p exposing a part of the gate connection section 3p. The transfer upper connection section 19p is provided on the first insulating layer 11 and inside the opening 14p, and is in contact with the gate connection section 3p inside the opening 14p.

In the TFT substrate 106a having such a configuration as well, it is possible to achieve the same effect as that of the TFT substrate 106.

A method for manufacturing the TFT substrate 106a will now be described with reference to FIGS. 40AA to 40BL. FIGS. 40AA to 40BL are each a process cross-sectional view illustrating an example of the manufacturing method of the TFT substrate 106a. These diagrams illustrate cross sections respectively corresponding to FIGS. 39A to 39E. Hereinafter, the differences from the manufacturing method of the TFT substrate 106 are mainly described.

As illustrated in FIGS. 40AA to 40AE, the gate metal layer, the gate insulating layer 4, the island-shaped semiconductor layer 5, and the etch stop insulating film 8' are formed. These steps are similar to the steps illustrated in FIGS. 36AA to 36AE. Here, as the gate conductive film 3', a layered film (Cu/Ti) is formed by layering a Ti film (having a thickness of 20 nm, for example) and a CU film (having a thickness of 500 nm, for example), in this order.

Then, the gate insulating layer 4 is etched. Here, the step differs from the etching step illustrated in FIG. 36AF in that the gate insulating layer 4 is etched even in the first transfer terminal section formation region. Thus, as illustrated in FIG. 40AF, the opening 12p exposing the gate connection section 3p is formed in the first transfer terminal section formation region in addition to the opening 12a exposing the patch electrode 3PE and the opening 12sg exposing the gate connection wiring line 3sg.

Then, as illustrated in FIG. 40AG, the source conductive film 7' is formed on the etch stop 8, inside the first opening 8a s, inside the second opening 8a d, on the patch electrode 3PE, inside the opening 12a, inside the opening 12p, and inside the opening 12sg. Here, as the source conductive film 7', a layered film (MoN/Al/MoN/Ti) is formed by layering Ti (having a thickness of 20 nm, for example), MoN (having a thickness of 50 nm, for example), Al (having a thickness of 150 nm, for example), and MoN (having a thickness of 100 nm, for example), in this order.

Figure 40B:
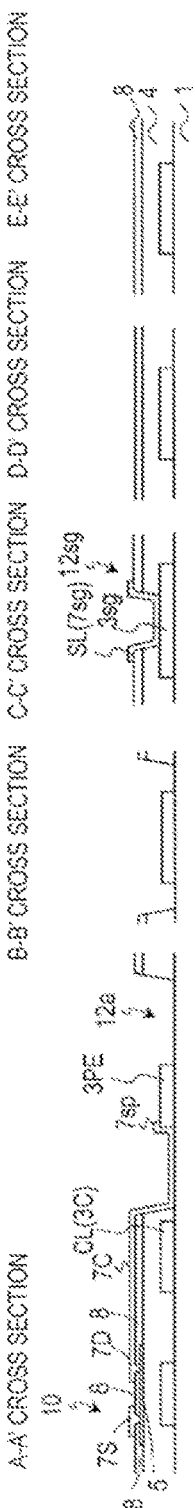
FIG. 40BH to FIG. 40BL are each a process cross-sectional view illustrating an example of a manufacturing method of the TFT substrate 106*a*.
Figure 40B:
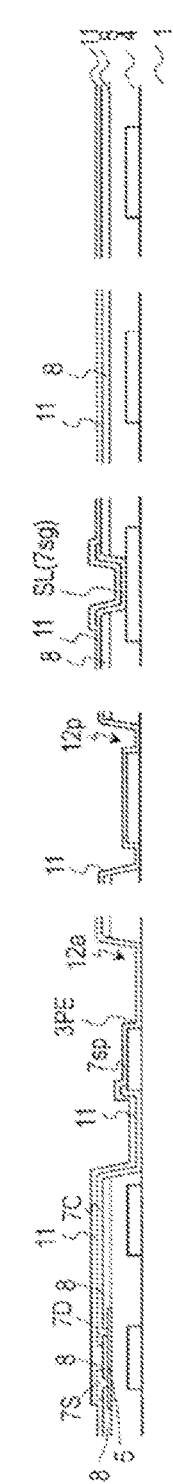
Figure 40B:
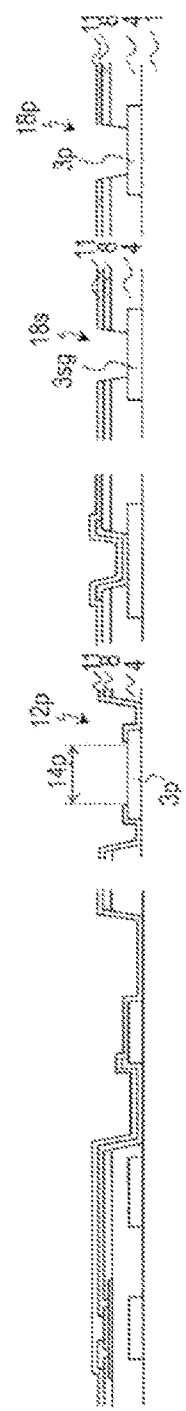
Figure 40B:
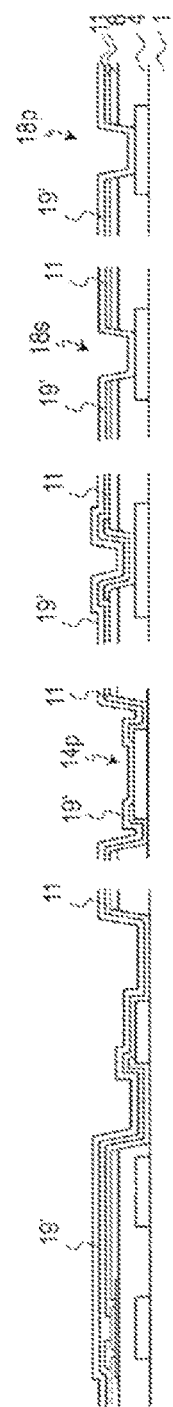
Figure 40B:
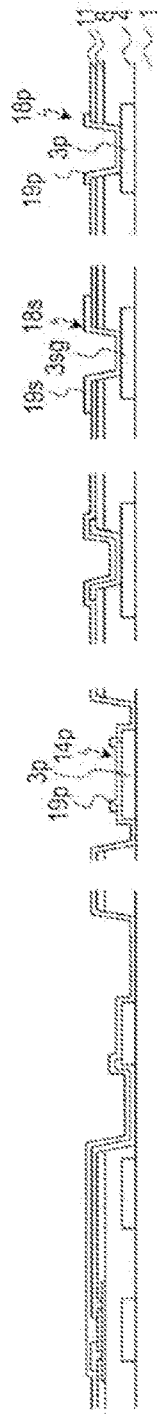

Then, as illustrated in FIG. 40BH, the source metal layer is formed by patterning the source conductive film 7'. In the patterning of the source conductive film 7', etching conditions are adjusted so that the etching rate for the patch electrode 3PE is less than the etching rate for the source conductive film 7', similar to the patterning step illustrated in FIG. 36BG. For example, materials and etchants of the gate conductive film 3' and the source conductive layer 7' are selected as appropriate. Here, the patterning of the source conductive film 7' is performed by, for example, dry etching using a fluorine gas, and by wet etching using an aqueous solution containing phosphoric acid, nitric acid, and acetic acid as an etching solution.

Next, the first insulating layer 11 is formed so as to cover the TFT 10 and the source metal layer, as illustrated in FIG. 40BI. This step is similar to the step illustrated in FIG. 36BI.

Then, the first insulating layer 11, the etch stop 8, and the gate insulating layer 4 are etched. Here, the step differs from the etching step illustrated in FIG. 36BJ in that only the first insulating layer 11 in the first transfer terminal section formation region is etched. Thus, as illustrated in FIG. 40BJ, the opening 18s that reaches the gate connection wiring line 3sg, the opening 18p that reaches the gate connection section 3p in the second transfer terminal section formation region, and the opening 14p exposing a part of the gate connection section 3p in the first transfer terminal section formation region are formed.

Then, as illustrated in FIG. 40BK, the transparent conductive film 19' is formed on the first insulating layer 11, inside the opening 14p, and inside the openings 18p, 18s.

Then, the transparent conductive film 19' is patterned. Here, as illustrated in FIG. 40BL, in the first transfer terminal formation region, the transfer upper connection section 19p that is disposed on the first insulating layer 11 and inside the opening 14p and is in contact with the gate connection section 3p inside the opening 14p is formed.

In this manner, the TFT substrate 106a is manufactured.
Modification 2

Below is described the TFT substrate of modification 2 of the present embodiment with reference to FIGS. 41A to 43E.

Figure 41A:
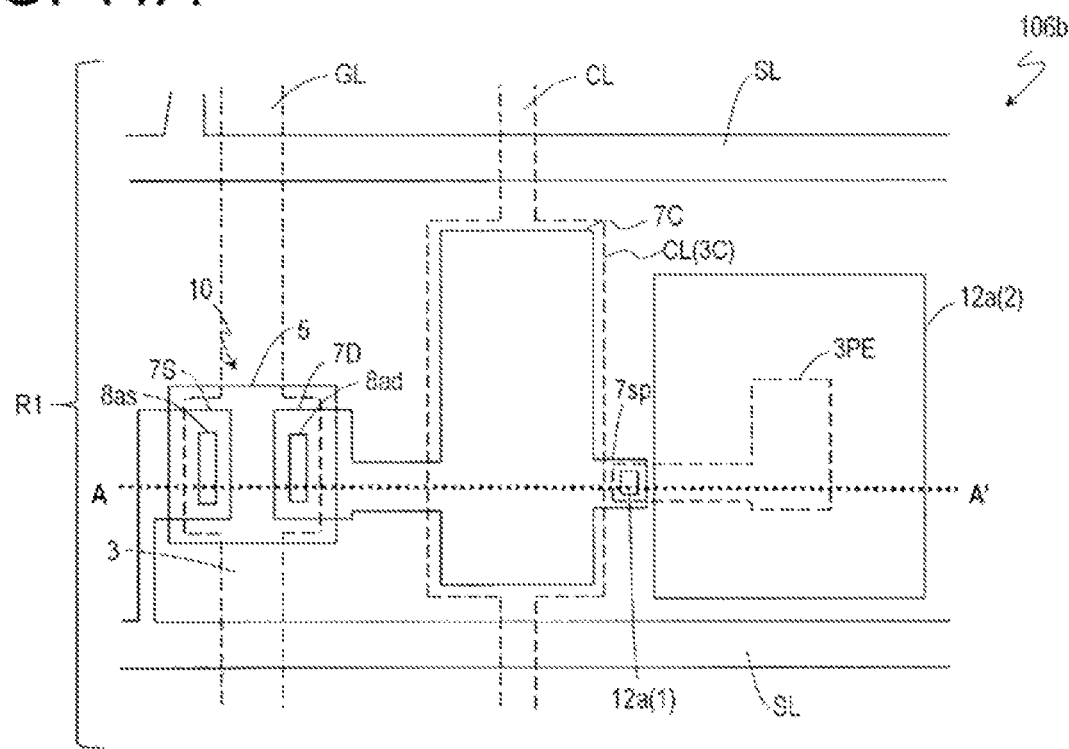
FIG. 41A and FIG. 41B are each a schematic plan view illustrating a TFT substrate 106*b* of modification 2 of the fifth embodiment.
Figure 41B:
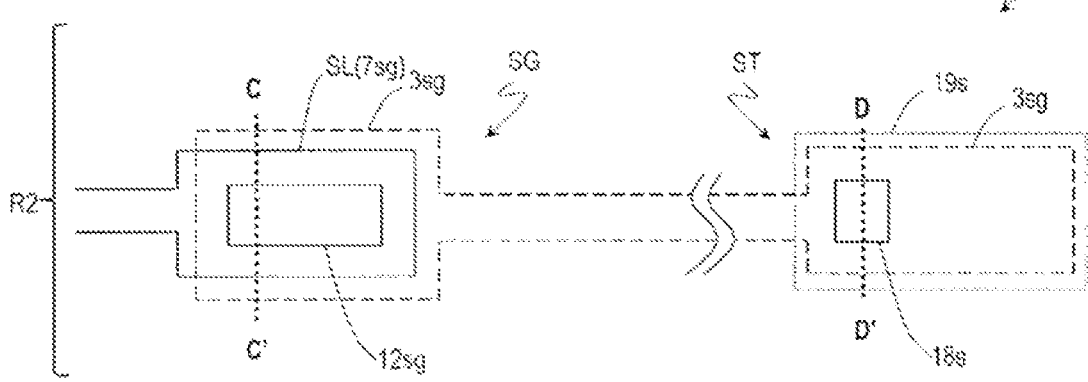
Figure 42:
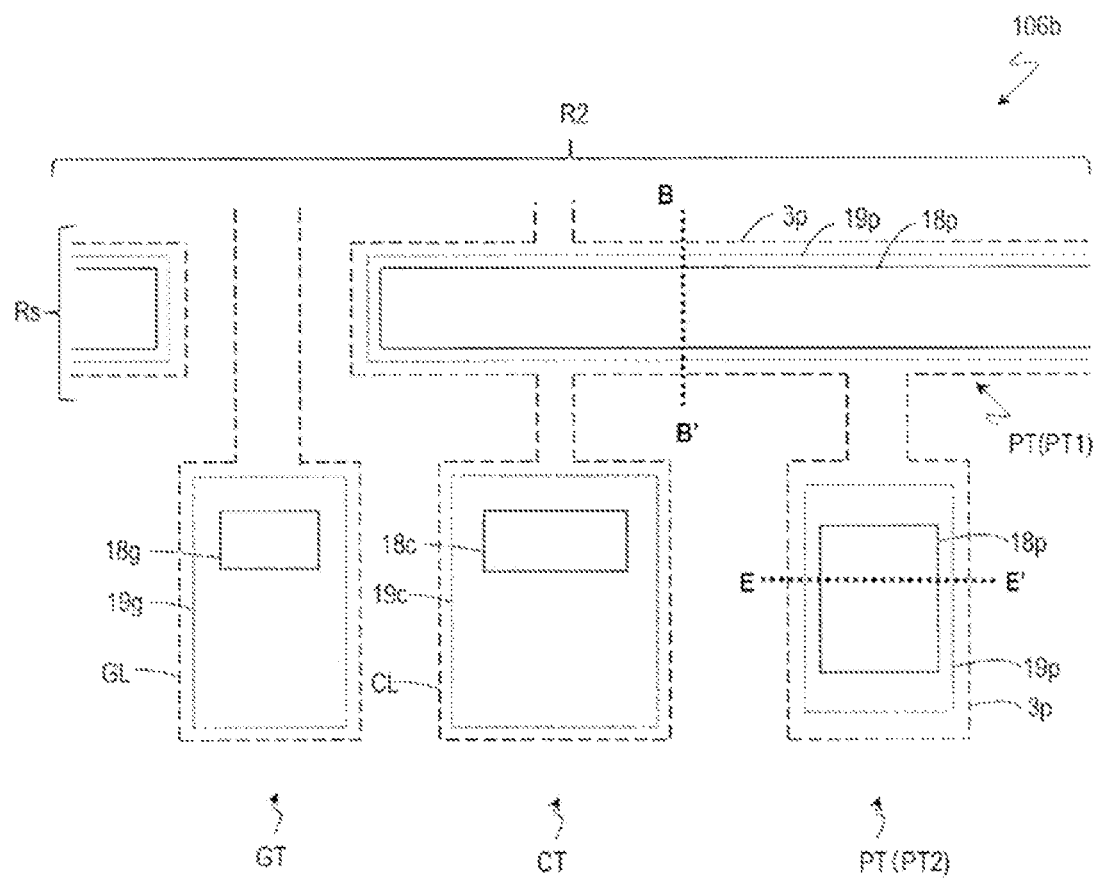
FIG. 42 is a schematic plan view illustrating the TFT substrate 106*b*.
Figure 43A:
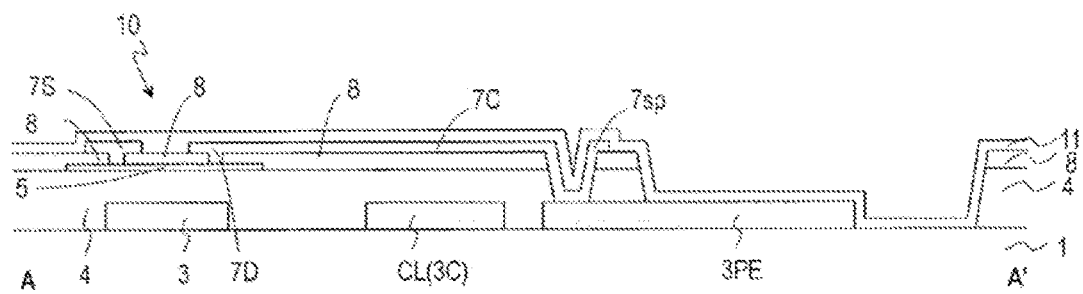
FIG. 43A to FIG. 43E are each a schematic cross-sectional view of the TFT substrate 106*b*.
Figure 43B:
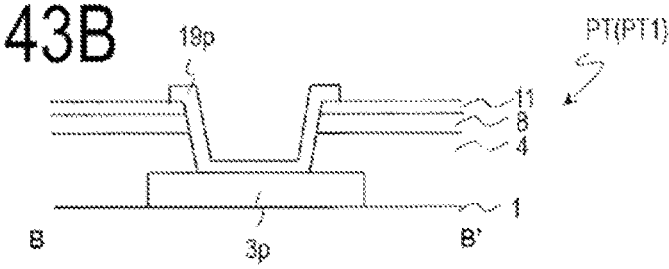
Figure 43C:
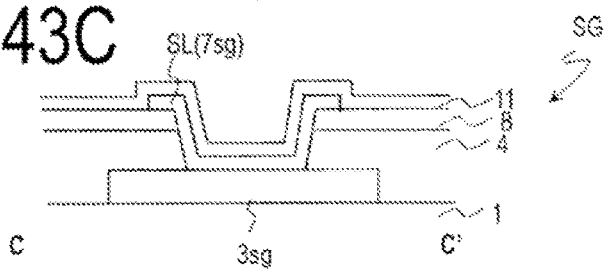
Figure 43D:
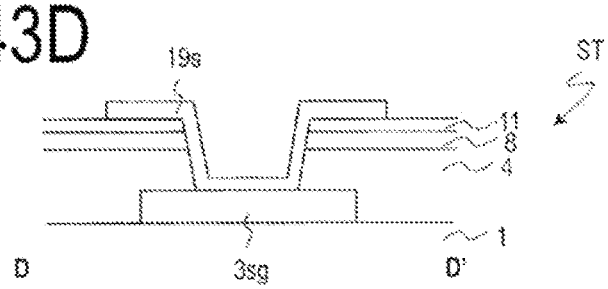
Figure 43E:
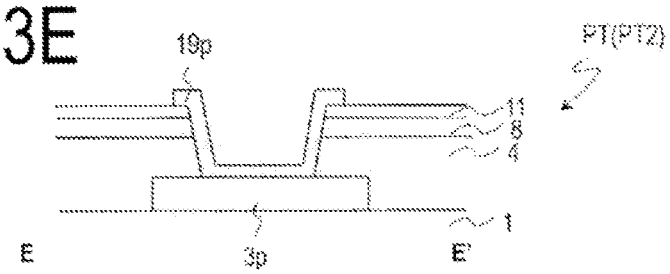

FIGS. 41A, 41B, and 42 are each a schematic plan view illustrating a TFT substrate 106b of modification 2 of the present embodiment. FIG. 41A illustrates the antenna unit region U of the transmission and/or reception region R1, FIG. 41B illustrates the source-gate connection section SG and the source terminal section ST provided to the non-transmission and/or reception region R2, and FIG. 42 illustrates the transfer terminal section PT, the gate terminal section GT, and the CS terminal section CT provided to the non-transmission and/or reception region R2. FIGS. 43A to 43E are each a schematic cross-sectional view of the TFT substrate 106b. FIG. 43A illustrates a cross section of the antenna unit region U along the line A-A' in FIG. 41A, FIG. 43B illustrates a cross section of the transfer terminal section PT along the line B-B' in FIG. 42, FIG. 43C illustrates a cross section of the source-gate connection section SG along the line C-C' in FIG. 41B, FIG. 43D illustrates a cross section of the source terminal section ST along the line D-D' in FIG. 41B, and FIG. 43E illustrates a cross section of the transfer terminal section PT along the line E-E' in FIG. 42.

The TFT substrate 106b differs from the TFT substrate 106 in that the gate insulating layer 4 and the etch stop 8 of the TFT substrate 106b include the opening 12a (1) exposing only a part of the patch electrode 3PE in the antenna unit region U. Hereinafter, the differences from the TFT substrate 106 are mainly described.

As described with reference to FIGS. 33A and 35A, the patch electrode 3PE is on the inner side of the opening 12a in the antenna unit region U of the TFT substrate 106, when viewed from the normal direction of the dielectric substrate 1. That is, the opening 12a is formed so as to expose the patch electrode 3PE in its entirety.

In contrast, in the TFT substrate 106b, as illustrated in FIGS. 41A and 43A, the gate insulating layer 4 and the etch stop 8 include the opening 12a (1) extending over the patch electrode 3PE and exposing a part of the patch electrode 3PE. The patch electrode connection section 7sp is disposed inside the opening 12a (1), and is in contact with the patch electrode 3PE inside the opening 12a (1).

The TFT substrate 106b can be manufactured using the manufacturing method described with reference to FIGS. 44AA to 44BM, and thus, during the etching of the source conductive film, has the advantage of not requiring adjustment of etching conditions to ensure that the etching rate for the patch electrode is less than the etching rate for the source conductive film, for the same reasons as described for the TFT substrate 105b.

The manufacturing process of the TFT substrate 106b will now be described with reference to FIGS. 44AA to 44BM.

FIGS. 44AA to 44BM are each a process cross-sectional view illustrating an example of a manufacturing method of the TFT substrate 106b. These diagrams illustrate cross sections respectively corresponding to FIGS. 43A to 43E. Hereinafter, the differences from the manufacturing method of the TFT substrate 106 are mainly described.

As illustrated in FIGS. 44AA to 44AE, the gate metal layer, the gate insulating layer 4, the island-shaped semiconductor layer 5, and the etch stop insulating film 8' are formed. These steps are similar to the steps illustrated in FIGS. 36AA to 36AE. Here, as the gate conductive film 3', a layered film (Cu/Ti) is formed by layering a Ti film (having a thickness of 20 nm, for example) and a CU film (having a thickness of 500 nm, for example), in this order.

Then, the gate insulating layer 4 and the etch stop insulating film 8' are etched. Here, as illustrated in FIG. 44AF, the etching step differs from that illustrated in FIG. 36AF in that the opening 12a (1) exposing only a part of the patch electrode 3PE is formed in the antenna unit formation region.

Then, as illustrated in FIG. 44AG, the source conductive film 7' is formed on the gate insulating layer 4, on the contact layer 6, on the patch electrode 3PE, inside the opening 12a (1), inside the opening 12sg, and inside the opening 12p. Here, as the source conductive film 7', a layered film (Cu/Ti) is formed by layering a Ti film (having a thickness of 20 nm, for example) and a CU film (having a thickness of 200 nm, for example), in this order.

Then, as illustrated in FIG. 44BH, the source metal layer is formed by patterning the source conductive film 7'. The patterning of the source conductive film 7' differs from the patterning illustrated in FIG. 36BH in that the patch electrode 3PE is not exposed. Thus, etching conditions do not need to be adjusted so that the etching rate for the patch electrode 3PE is less than the etching rate for the source conductive film 7'. For example, as illustrated here, the gate conductive film 3' and the source conductive film 7' may be formed from the same metal film.

Subsequently, as illustrated in FIG. 44BI, the opening 12a (2) exposing the remaining part of the patch electrode 3PE is formed by etching the gate insulating layer 4 and the etch stop 8 once again.

Next, the first insulating layer 11 is formed so as to cover the TFT 10 and the source metal layer, as illustrated in FIG. 44BJ. This step is similar to the step illustrated in FIG. 36BI.

Then, as illustrated in FIG. 44BK, the opening 18p that reaches the gate connection section 3p, and the opening 18s that reaches the gate connection wiring line 3sg are formed by etching the etch stop 8 and the gate insulating layer 4. This step is similar to the etching step illustrated in FIG. 36BJ.

Then, as illustrated in FIG. 44BL, the transparent conductive film 19' is formed on the first insulating layer 11, and inside the openings 18p, 18s. This step is similar to the step illustrated in FIG. 36BK.

Then, as illustrated in FIG. 44BM, the transfer upper connection section 19p that reaches the gate connection section 3p inside the opening 18p, and the source terminal upper connection section 19s in contact with the gate connection wiring line 3sg inside the opening 18s are formed by patterning the transparent conductive film 19'. This step is similar to the step illustrated in FIG. 36BL.

In this manner, the TFT substrate 106b is manufactured.

While the TFT substrate 106 can be manufactured using six photomasks, seven photomasks are used in the manufacturing process of the TFT substrate 106b described above. Thus, from the viewpoint of reducing the number of photomasks, the TFT substrate 106b is inferior to the TFT substrate 106.

Nevertheless, the TFT substrate 106b can be manufactured using the manufacturing method described above and thus, during the etching of the source conductive film, has the advantage of not requiring adjustment of etching conditions to ensure that the etching rate for the patch electrode is less than the etching rate for the source conductive film.

Note that the opening 12a (2) may be omitted. In this case, the TFT substrate 106b can be manufactured using six photomasks, and thus has the effect of making it possible to reduce the number of photomasks compared to the TFT substrate 101 in the first embodiment.

Here, while the first transfer terminal section PT1 of the TFT substrate 106b has been illustrated as having the same structure as the first transfer terminal section PT1 of the TFT substrate 106, modification 2 of the present embodiment is not limited thereto. The first transfer terminal section PT1 may have the same structure as the first transfer terminal section PT1 of the TFT substrate 106a of modification 1 of the present embodiment.

Sixth Embodiment

Below, the scanning antenna of a sixth embodiment will be described.

In the TFT substrate used in the scanning antenna of the present embodiment, the patch electrode is formed from the same conductive film as the gate electrode, similar to the fourth embodiment. The TFT substrate of the present embodiment differs from that in the fourth embodiment as follows. In the TFT substrate of the present embodiment, the patch electrode is electrically connected to the drain electrode via a conductive layer provided on a layer above the source metal layer.

Below is described the TFT substrate of the present embodiment with reference to FIGS. 45A to 47B. Hereinafter, the differences from the fourth embodiment are mainly described.

Figure 45A:
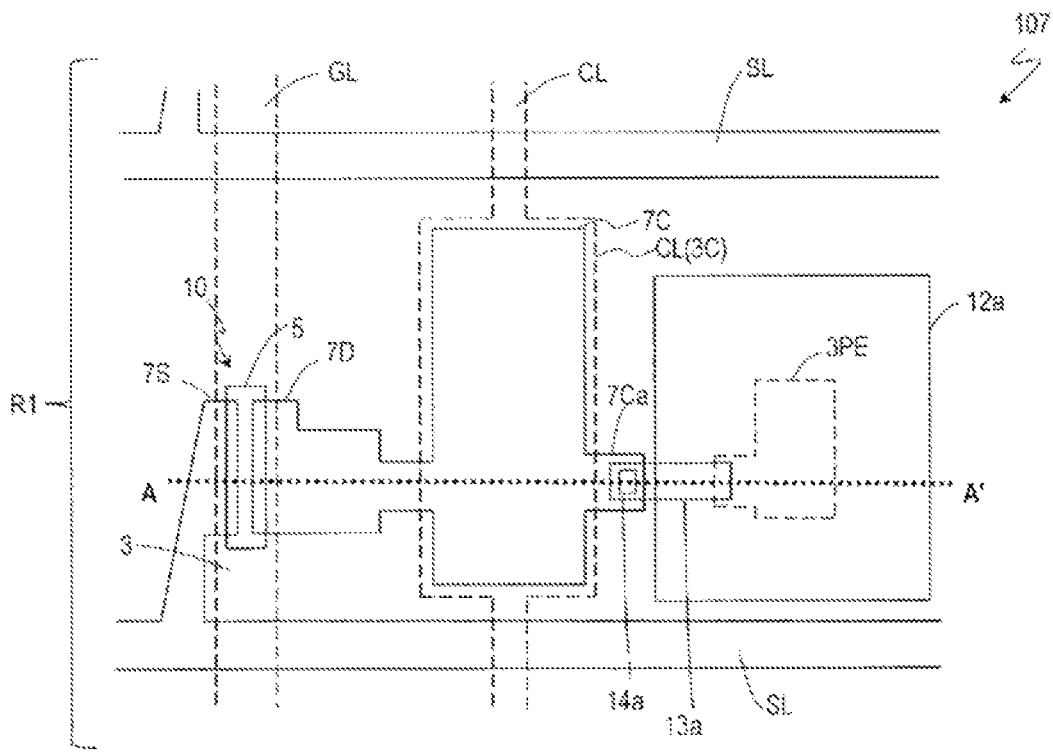
FIG. 45A and FIG. 45B are each a schematic plan view illustrating a TFT substrate 107 of a sixth embodiment.
Figure 45B:
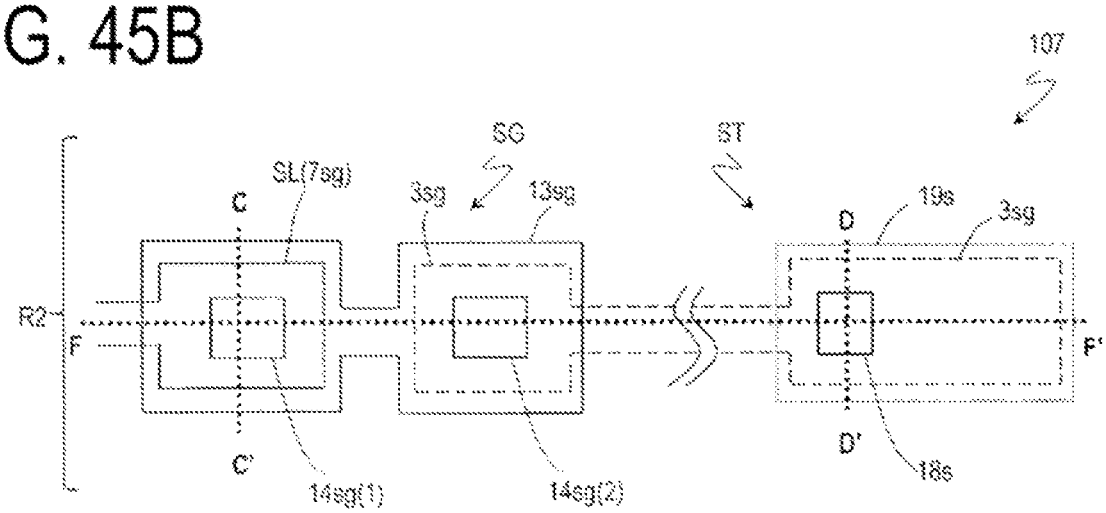
Figure 46:
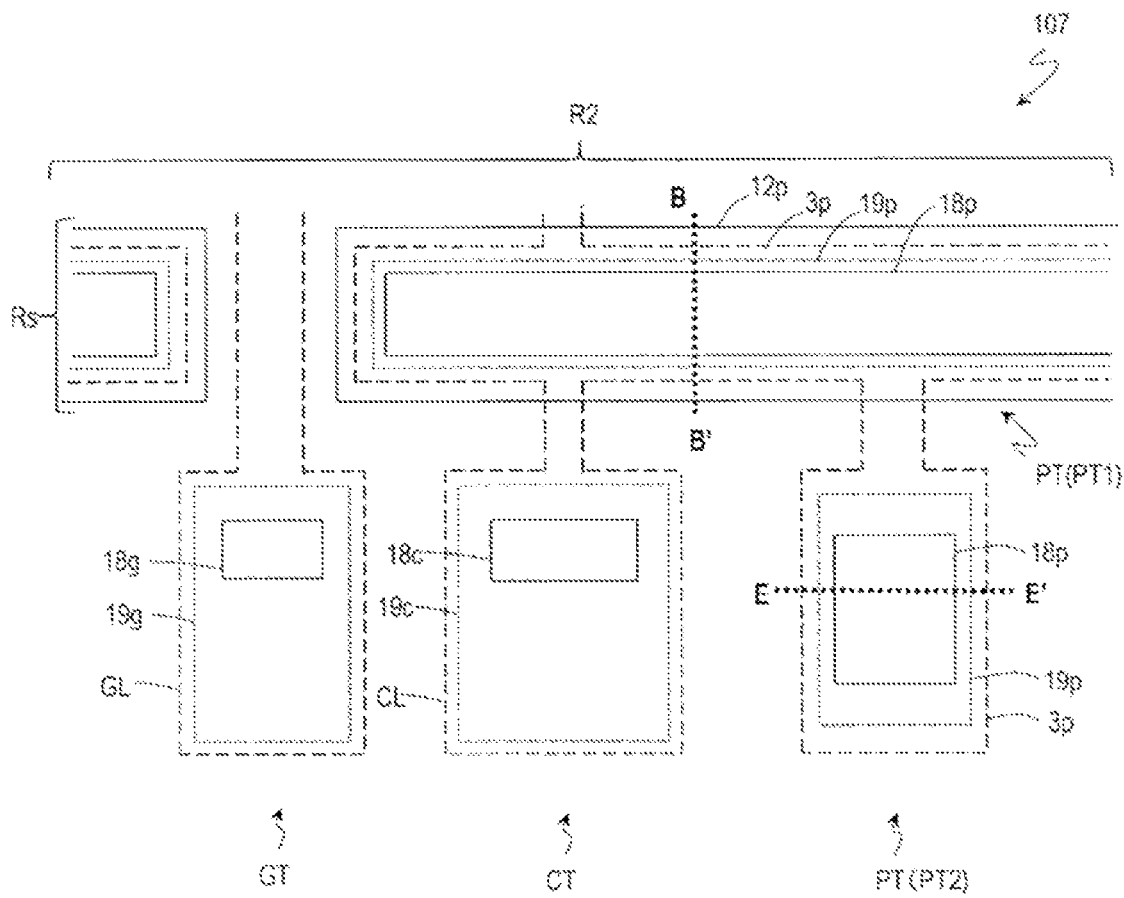
FIG. 46 is a schematic plan view illustrating the TFT substrate 107.
Figure 47A:
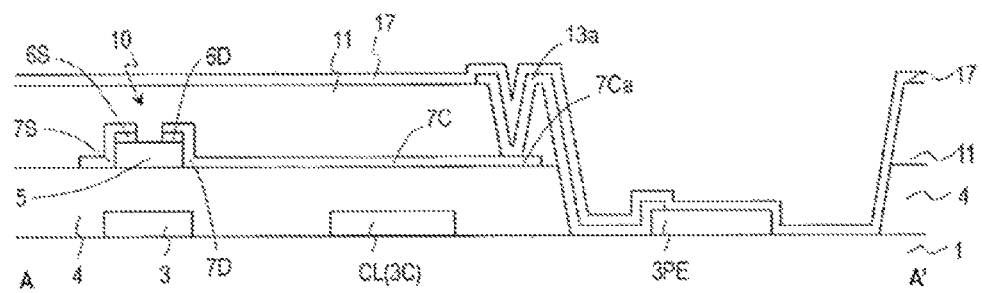
FIG. 47AA to FIG. 47AE are each a schematic cross-sectional view of the TFT substrate 107.
Figure 47A:
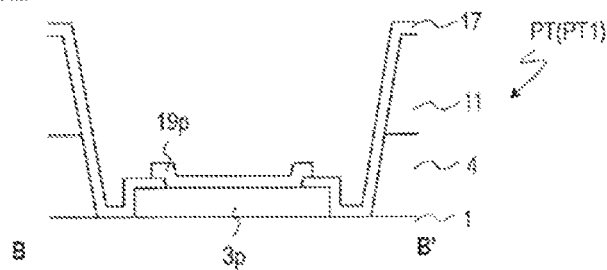
Figure 47A:
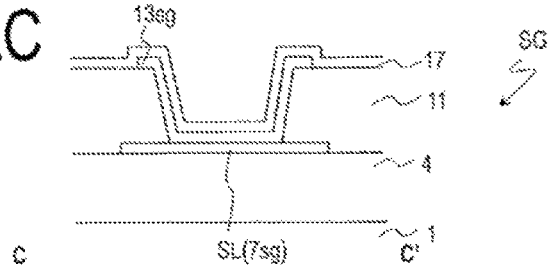
Figure 47A:
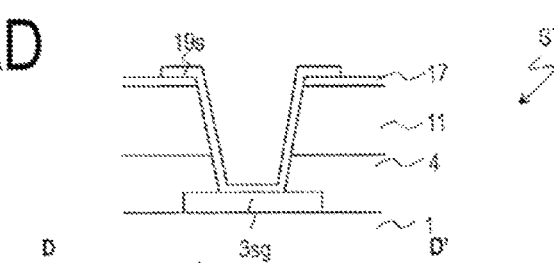
Figure 47A:
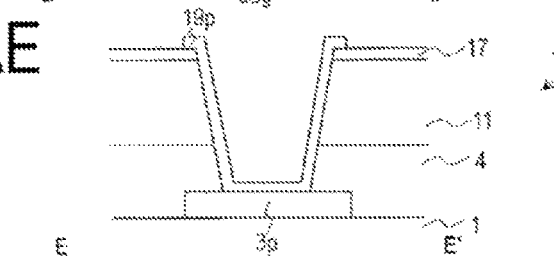
Figure 47B:
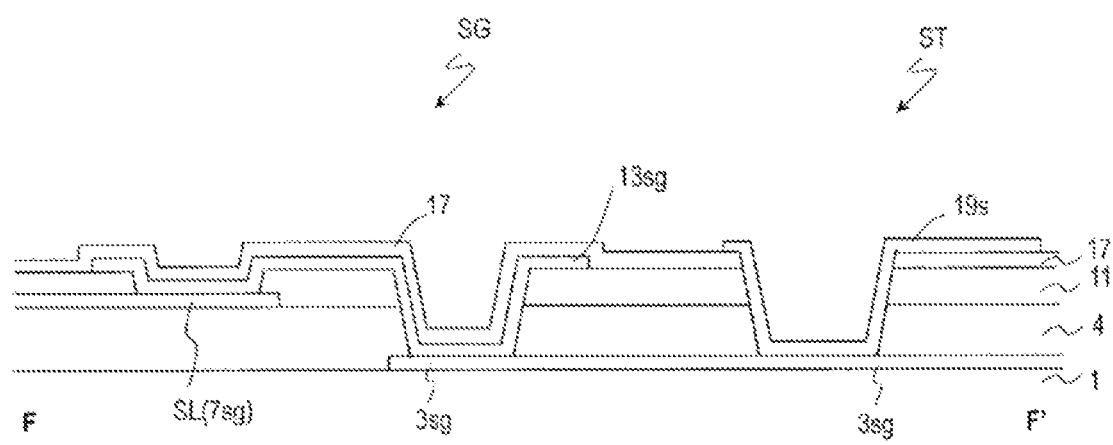
FIG. 47BF is a schematic cross-sectional view of the TFT substrate 107.

FIGS. 45A, 45B, and 46 are each a schematic plan view illustrating a TFT substrate 107 of the present embodiment. FIG. 45A illustrates the antenna unit region U of the transmission and/or reception region R1, FIG. 45B illustrates the source-gate connection section SG and the source terminal section ST provided to the non-transmission and/or reception region R2, and FIG. 46 illustrates the transfer terminal section PT, the gate terminal section GT, and the CS terminal section CT provided to the non-transmission and/or reception region R2. FIGS. 47AA to 47BF are each a schematic cross-sectional view of the TFT substrate 107. FIG. 47AA illustrates a cross section of the antenna unit region U along the line A-A' in FIG. 45A, FIG. 47AB illustrates a cross section of the transfer terminal section PT along the line B-B' in FIG. 46, FIG. 47AC illustrates a cross section of the source-gate connection section SG along the line C-C' in FIG. 45B, FIG. 47AD illustrates a cross section of the source terminal section ST along the line D-D' in FIG. 45B, FIG. 47AE illustrates a cross section of the transfer terminal section PT along the line E-E' in FIG. 46, and FIG. 47BF illustrates a cross section of the source-gate connection section SG and the source terminal section ST along the line F-F' in FIG. 46.

Antenna Unit Region

As illustrated in FIG. 45A and FIG. 47AA, the TFT substrate 107 includes a conductive connection section 13a formed on the first insulating layer 11 covering the TFT 10 in the antenna unit region U. The patch electrode 3PE is electrically connected to the drain electrode 7D via the conductive connection section 13a.

Specifically, the antenna unit region U of the TFT substrate 107 has, for example, the following structure. The gate insulating layer 4 and the first insulating layer 11 include the opening (contact hole) 12a exposing the patch electrode 3PE. The first insulating layer 11 includes an opening 14a exposing a part of a section 7Ca extending from the drain electrode 7D. Here, the opening 14a exposes a part of the section 7Ca extending from the upper capacitance electrode 7C of the section extending from the drain electrode 7D. The conductive connection section 13a is disposed inside the opening 14a and inside the opening 12a, is in contact with the section 7Ca extending from the drain electrode 7D inside the opening 14a, and is in contact with the patch electrode 3PE inside the opening 12a.

The first insulating layer 11 and the conductive connection section 13a may be covered with the second insulating layer 17.

Here, the opening 12a is formed so as to expose the patch electrode 3PE in its entirety. That is, when viewed from the normal direction of the dielectric substrate 1, the patch electrode 3PE is on the inner side of the opening 12a.

The opening 14a may be formed so as to expose a part of the section extending from the drain electrode 7D, or may be formed so as to expose a part of the drain electrode 7D.
Source-Gate Connection Section SG The source-gate connection section SG of the TFT substrate 106, as illustrated in FIGS. 45B, 47AC and 47BF, differs from that in the fourth embodiment in that the source bus line SL and the gate connection wiring line 3sg are electrically connected via a conductive connection section 13sg. The conductive connection section 13sg is, for example, formed using the same conductive film as the conductive connection section 13a, and is electrically separated from the conductive connection section 13a.

More specifically, the source-gate connection section SG includes the gate connection wiring line 3sg supported by the dielectric substrate 1, the gate insulating layer 4 extending over the gate connection wiring line 3sg, the source bus line SL formed on the gate insulating layer 4, the first insulating layer 11 extending over the source bus line SL, and the conductive connection section 13sg formed on the first insulating layer. When viewed from the normal direction of the dielectric substrate 1, at least a part of the gate connection wiring line 3sg is disposed so as to not overlap the source bus line SL. A first opening 14sg (1) exposing a part of the source bus line SL (source connection section 7sg) is formed in the first insulating layer 11. An opening 14sg (2) exposing a part of the gate connection wiring line 3sg is formed in the gate insulating layer 4 and the first insulating layer 11. The conductive connection section 13sg is disposed on the first insulating layer 11, inside the opening 14sg (1), and inside the opening 14sg (2), in contact with the source bus line SL inside the opening 14sg (1), and in contact with the gate connection wiring line 3sg inside the opening 14sg (2). Thus, the source bus line SL and the gate connection wiring line 3sg are electrically connected. The conductive connection section 13a may be covered with the second insulating layer 17.

The opening 14sg (1) and the opening 14sg (2) may be continuous. That is, a single opening exposing a part of the source bus line SL and a part of the gate connection wiring line 3sg may be formed, and the conductive connection section 13a may be provided inside this opening.
Transfer Terminal Section PT The first transfer terminal section PT1 includes the gate connection section 3p, the opening (contact hole) 12p formed in the gate insulating layer 4 and the first insulating layer 11, the second insulating layer 17 extending over the gate connection section 3p, and the transfer upper connection section 19p formed on the second insulating layer 17. That is, the first transfer terminal section PT1 is provided on the inner side of the opening 12p formed in the gate insulating layer 4 and the first insulating layer 11.

The second insulating layer 17 is provided on the gate connection section 3p and inside the opening 12p, and is in contact with the gate connection section 3p inside the opening 12p. The second insulating layer 17 includes the opening 14p exposing a part of the gate connection section 3p. The transfer upper connection section 19p is disposed on the second insulating layer 17 and inside the opening 14p, and is in contact with the gate connection section 3p inside the opening 14p.

The TFT substrate 107, similar to the TFT substrate 105a, has the advantage of achieving easy control of the thickness of the liquid crystal layer (cell gap). In the TFT substrate 107, the transfer upper connection section 19p is disposed on the second insulating layer 17 and inside the opening 14p, and the opening 14p is provided only in the second insulating layer 17. Thus, a step in the transfer upper connection section 19p caused by the opening 14p corresponds to the thickness of the second insulating layer 17. In the TFT substrate 107, with the step in the transfer upper connection section 19p being small, the contact between the conductive particles and the transfer upper connection section 19p is stabilized.

The second transfer terminal section PT2, as illustrated in FIGS. 46 and 47AE, includes the gate connection section 3p; the gate insulating layer 4, the first insulating layer 11, and the second insulating layer 17 covering the gate connection section 3p; and the transfer upper connection section 19p formed on the second insulating layer 17. The gate insulating layer 4, the first insulating layer 11, and the second insulating layer 17 include the opening (contact hole) 18p exposing a part of the gate connection section 3p. The transfer upper connection section 19p is disposed on the second insulating layer 17 and inside the opening 18p, and is in contact with the gate connection section 3p inside the opening 18p.
Source Terminal Section ST, Gate Terminal Section GT, and CS Terminal Section CT The source terminal section ST, as illustrated in FIGS. 45B, 47AD, and 47BF, includes the gate connection wiring line 3sg extending from the source-gate connection section SG; the gate insulating layer 4, the first insulating layer 11, and the second insulating layer 17 covering the gate connection wiring line 3sg; and the source terminal upper connection section 19s. The gate insulating layer 4, the first insulating layer 11, and the second insulating layer 17 include the opening 18s exposing a part of the gate connection wiring line 3sg. The source terminal upper connection section 19s is disposed on the second insulating layer 17 and inside the opening 18s, and is in contact with the gate connection wiring line 3sg inside the opening 18s.

The gate terminal section GT and the CS terminal section CT, as illustrated in FIG. 46, may have the same configuration as the source terminal section ST.

In this example, the gate terminal section GT includes the gate bus line GL; the gate insulating layer 4, the first insulating layer 11, and the second insulating layer 17 formed on the gate bus line GL; and the gate terminal upper connection section 19g formed on the second insulating layer 17. The gate insulating layer 4, the first insulating layer 11, and the second insulating layer 17 include the opening 18g exposing a part of the gate bus line GL. The gate terminal upper connection section 19g is disposed on the second insulating layer 17 and inside the opening 18g, and is in contact with the gate bus line GL inside the opening 18g.

The CS terminal section CT includes the CS bus line CL; the gate insulating layer 4, the first insulating layer 11, and the second insulating layer 17 formed on the CS bus line CL; and the CS terminal upper connection section 19c formed on the second insulating layer 17. The gate insulating layer 4, the first insulating layer 11, and the second insulating layer 17 include the opening 18c that reaches the CS bus line CL. The CS terminal upper connection section 19c is disposed on the second insulating layer 17 and inside the opening 18c, and is in contact with the CS bus line CL inside the opening 18c.

Manufacturing Method of TFT Substrate 107

A method for manufacturing the TFT substrate 107 will now be described with reference to FIGS. 48AA to 48CN. FIGS. 48AA to 48CN are each a process cross-sectional view illustrating an example of the manufacturing method of the TFT substrate 107. These diagrams illustrate cross sections respectively corresponding to FIGS. 47A to 47E. The description below focuses on the differences from the manufacturing method of the TFT substrate 105 described with reference to FIGS. 24AA to 24BK.

As illustrated in FIGS. 48AA to 48AD, the gate metal layer, the gate insulating layer 4, the island-shaped semiconductor layer 5, and the contact layer 6 are formed. Here, the steps differ from those illustrated in FIGS. 24AA to 24AD in the gate connection wiring line 3sg is not formed in the source-gate connection section formation region ("C-C' cross section). Note that the semiconductor film used for the semiconductor layer 5 is not limited to an amorphous silicon film. For example, an oxide semiconductor layer may be formed as the semiconductor layer 5. In this case, the contact layer may not be provided between the semiconductor layer 5 and the source/drain electrodes. Here, as the gate conductive film 3', a layered film (Cu/Ti) is formed by layering a Ti film (having a thickness of 20 nm, for example) and a CU film (having a thickness of 500 nm, for example), in this order.

Next, as illustrated in FIG. 48AE, the source conductive film 7' is formed on the gate insulating layer 4 and on the contact layer 6. Here, the steps differ from those illustrated in FIGS. 24AE to 24AF in that the gate insulating layer 4 is not etched before formation of the source conductive film 7'.

Then, as illustrated in FIG. 48AF, the source metal layer including the source bus line SL (including the source connection section 7sg), the source electrode 7S, the drain electrode 7D, the upper capacitance electrode 7C, and the section 7Ca extending from the drain electrode 7D is formed by patterning the source conductive film 7'.

Figure 48B:
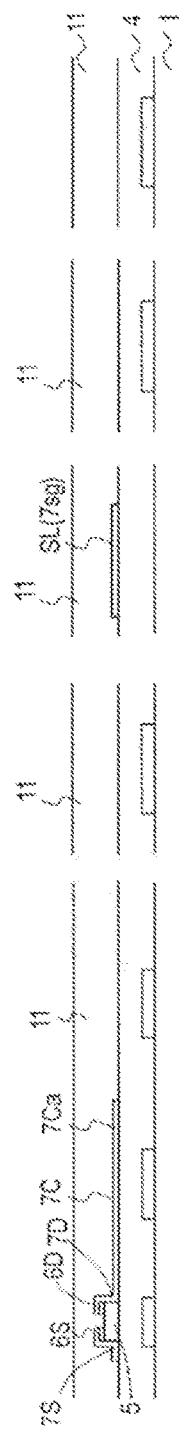
FIG. 48BG to FIG. 48BJ are each a process cross-sectional view illustrating an example of a manufacturing method of the TFT substrate 107.
Figure 48B:
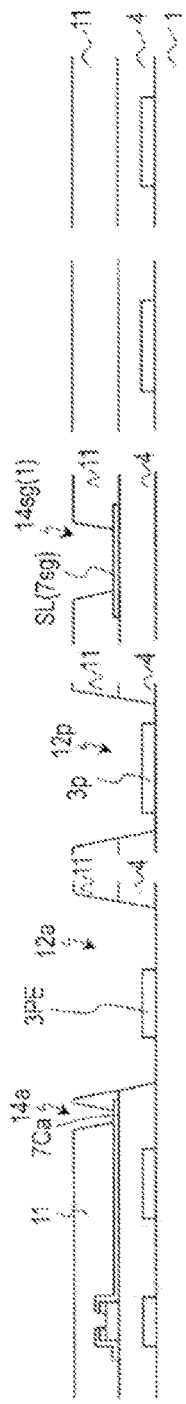
Figure 48B:
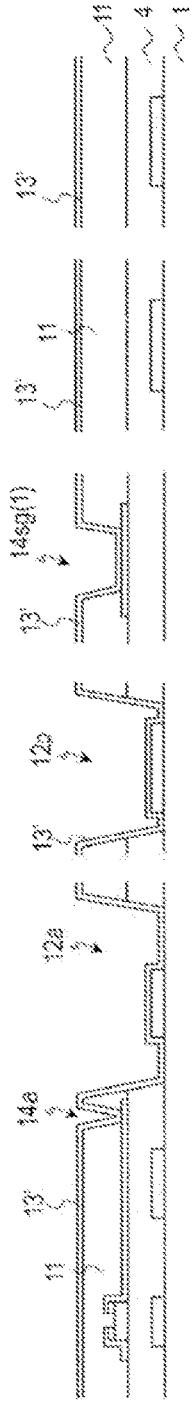
Figure 48B:
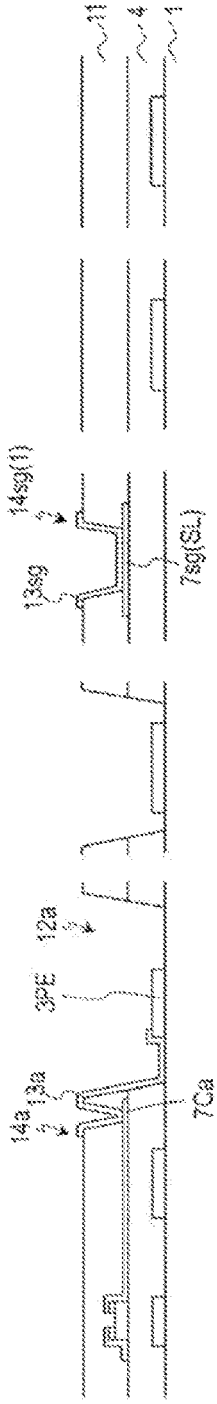

Next, the first insulating layer 11 is formed so as to cover the TFT 10 and the source metal layer, as illustrated in FIG. 48BG. In this example, the first insulating layer 11 is disposed to come into contact with the channel region of the semiconductor layer 5. This step is similar to the step illustrated in FIG. 24BH.

Then, as illustrated in FIG. 48BH, the opening 12a exposing the patch electrode 3PE in the antenna unit formation region, and the opening 12p that reaches the gate connection section 3p in the transfer terminal section formation region are formed in the first insulating layer 11 and the gate insulating layer 4 by a known photolithography process. At the same time, the opening 14a that reaches the section 7Ca extending from the drain electrode 7D in the antenna unit formation region, and the opening 14sg (1) that reaches the source connection section 7sg in the source-gate connection section formation region are formed in the first insulating layer 11.

Then, as illustrated in FIG. 48BI, a connection section conductive film 13' is formed on the first insulating layer 11, inside the opening 14a, inside the opening 12a, inside the opening 12p, and inside the opening 14sg (1). Here, as the connection section conductive film 13', a layered film (Ti/Al/Ti) is formed by layering Ti (having a thickness of 50 nm, for example), Al (having a thickness of 200 nm, for example), and Ti (having a thickness of 50 nm, for example), in this order.

Then, the connection section conductive film 13' is patterned using a known photolithography process. Thus, as illustrated in FIG. 48BJ, the conductive connection section 13a inside the antenna unit formation region, and the conductive connection section 13sg inside the source-gate connection section formation region are formed. The conductive connection section 13a is in contact with the patch electrode 3PE inside the opening 12a, and in contact with the section 7Ca extending from the drain electrode 7D inside the opening 14a. The conductive connection section 13sg is in contact with the source connection section 7sg inside the opening 14sg.

In the patterning of the connection section conductive film 13', etching conditions are adjusted so that the etching rate for the patch electrode 3PE is less than the etching rate for the connection section conductive film 13'. For example, materials and etchants of the gate conductive film 3' and the connection section conductive layer 13' are selected as appropriate. Here, the connection section conductive film 13' is patterned by dry etching using fluorine gas, for example.

Then, as illustrated in FIG. 48CK, the second insulating layer 17 is formed on the first insulating layer 11 and the conductive connection sections 13a, 13sg. Here, as the second insulating layer 17, for example, a silicon nitride (SixNy) film having a thickness of 50 nm is formed.

Subsequently, the gate insulating layer 4, the first insulating layer 11, and the second insulating layer 17 are etched by a known photolithography process. Thus, as illustrated in FIG. 48CL, the opening 18p that reaches the gate connection section 3p in the second transfer terminal section formation region, and the opening 18s that reaches the gate connection wiring line 3sg in the source terminal section formation region are formed in the gate insulating layer 4, the first insulating layer 11, and the second insulating layer 17. At the same time, the opening 14p exposing a part of the gate connection section 3p in the first transfer terminal section formation region is formed in the second insulating layer 17.

Then, as illustrated in FIG. 48CM, the transparent conductive film 19' is formed on the second insulating layer 17, inside the opening 14p, inside the opening 18s, and inside the opening 18p by a sputtering method, for example.

Then, the transparent conductive film 19' is patterned. Thus, as illustrated in FIG. 48CN, the transfer upper connection section 19p in contact with the gate connection section 3p inside the opening 18p in the second transfer terminal section formation region, the source terminal upper connection section 19s in contact with the gate connection wiring line 3sg inside the opening 18s in the source terminal section formation region, and the transfer upper connection section 19p in contact with the gate connection section 3[ inside the opening 14p in the first transfer terminal section formation region are formed.

In this manner, the TFT substrate 107 is manufactured.

Modification 1

Below is described the TFT substrate of modification 1 of the present embodiment with reference to FIGS. 49A to 51B.

Figure 49A:
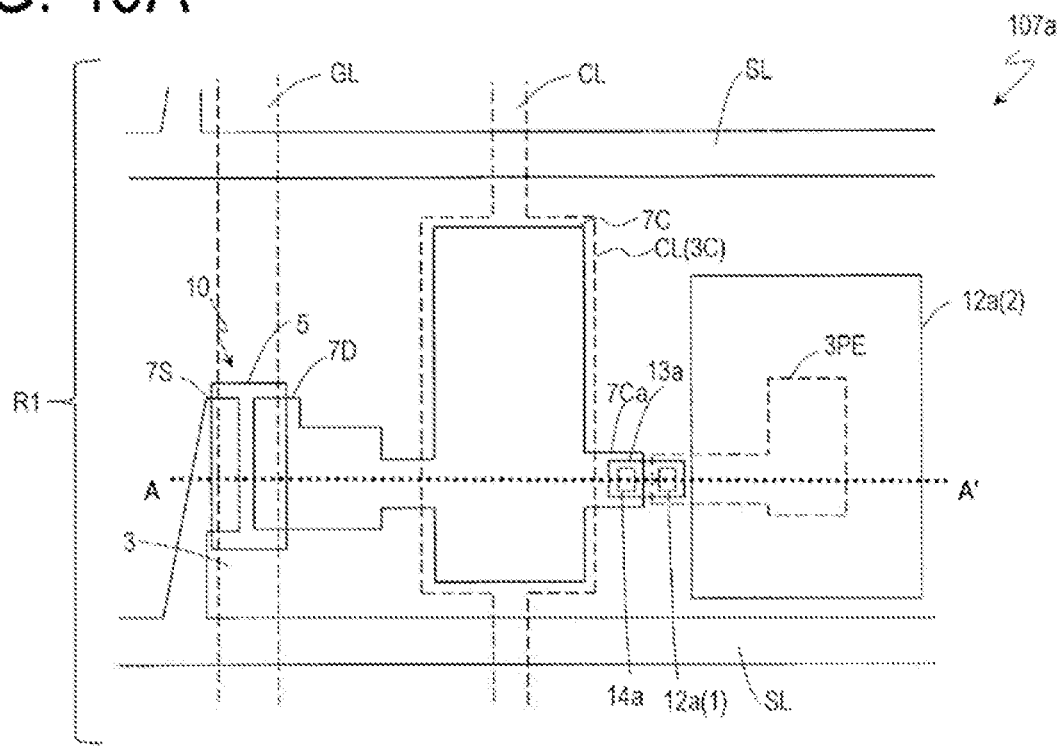
FIG. 49A and FIG. 49B are each a schematic plan view illustrating a TFT substrate 107*a* of modification 1 of the sixth embodiment.
Figure 49B:
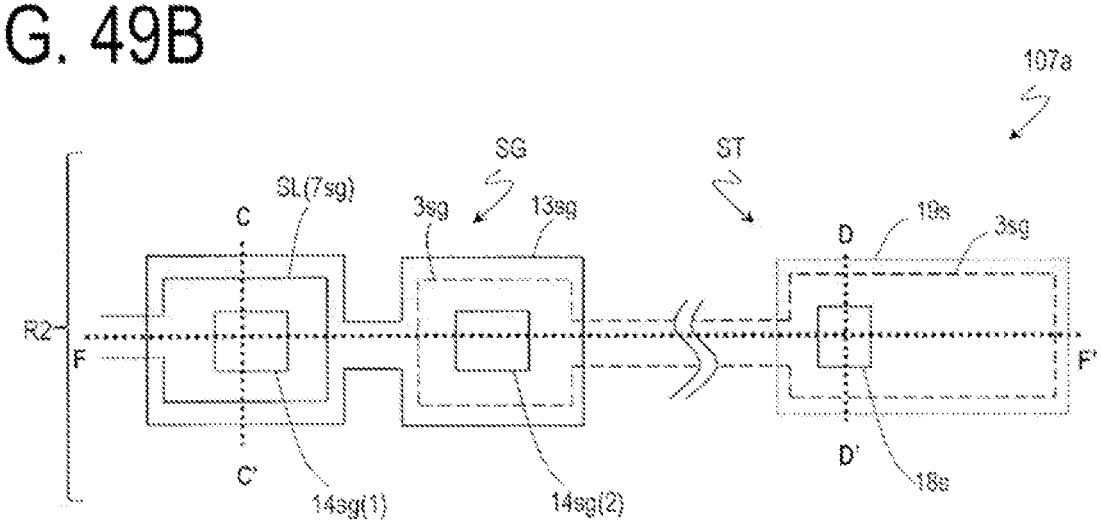
Figure 50:
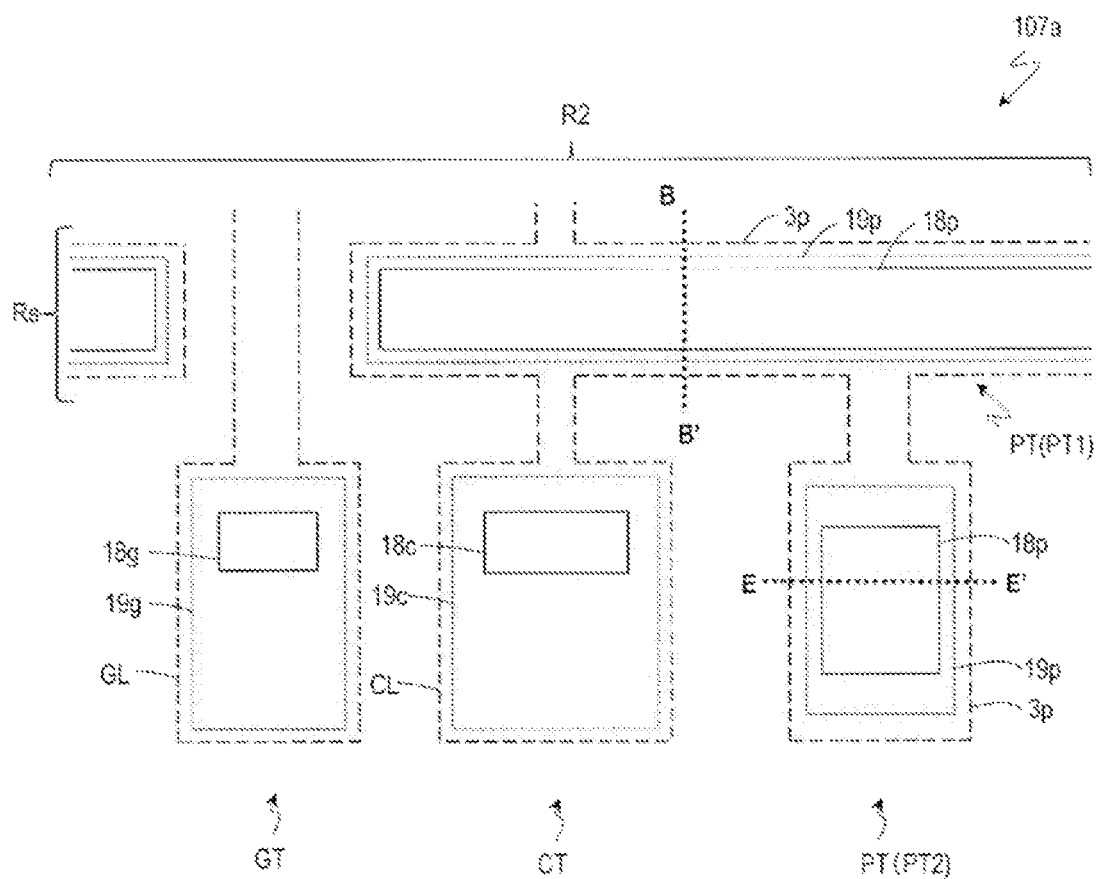
FIG. 50 is a schematic plan view illustrating the TFT substrate 107*a*.
Figure 51A:
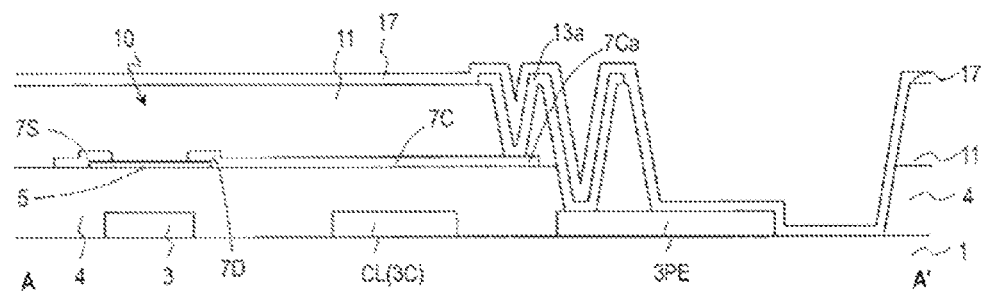
FIG. 51AA to FIG. 51AE are each a schematic cross-sectional view of the TFT substrate 107*a*.
Figure 51A:
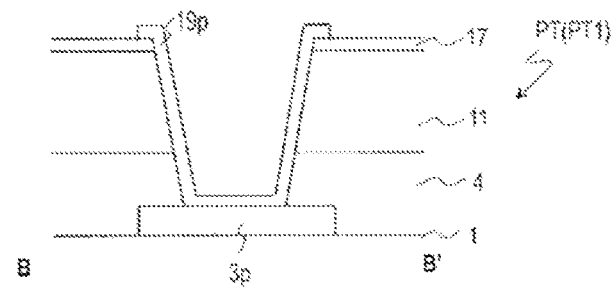
Figure 51A:
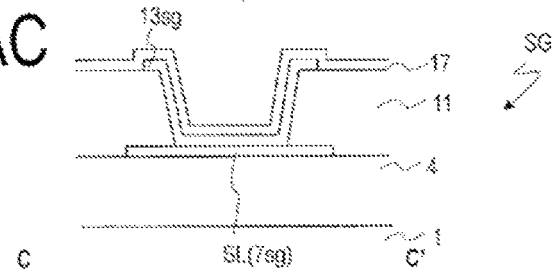
Figure 51A:
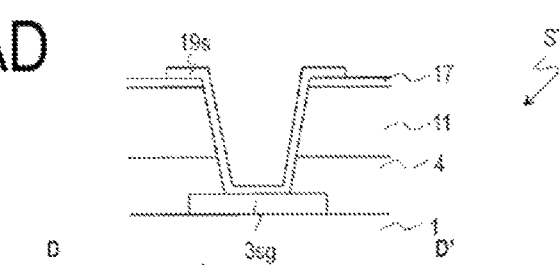
Figure 51A:
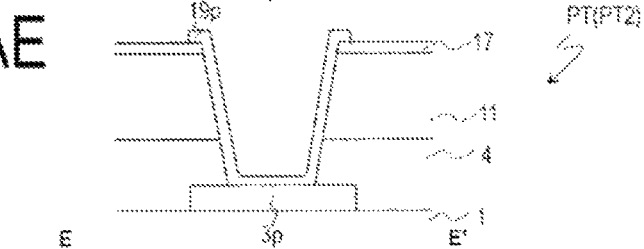
Figure 51B:
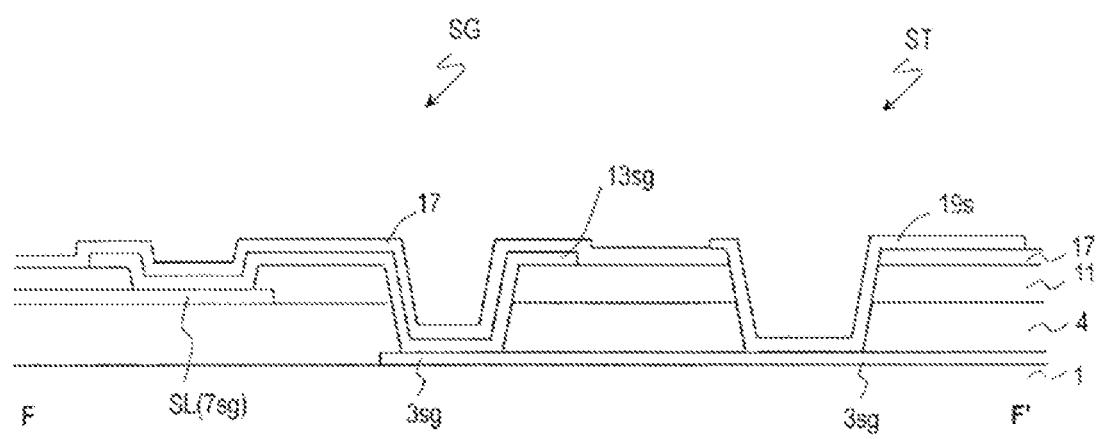
FIG. 51BF is a schematic cross-sectional view of the TFT substrate 107*a*.

FIGS. 49A, 49B, and 50 are each a schematic plan view illustrating a TFT substrate 107a of modification 1 of the present embodiment. FIG. 49A illustrates the antenna unit region U of the transmission and/or reception region R1, FIG. 49B illustrates the source-gate connection section SG and the source terminal section ST provided to the non-transmission and/or reception region R2, and FIG. 50 illustrates the transfer terminal section PT, the gate terminal section GT, and the CS terminal section CT provided to the non-transmission and/or reception region R2. FIGS. 51AA to 51BF are each a schematic cross-sectional view of the TFT substrate 107a. FIG. 51AA illustrates a cross section of the antenna unit region U along the line A-A' in FIG. 49A, FIG. 51AB illustrates a cross section of the transfer terminal section PT along the line B-B' in FIG. 50, FIG. 51AC illustrates a cross section of the source-gate connection section SG along the line C-C' in FIG. 49B, FIG. 51AD illustrates a cross section of the source terminal section ST along the line D-D' in FIG. 49B, FIG. 51AE illustrates a cross section of the transfer terminal section PT along the line E-E' in FIG. 50, and FIG. 51BF illustrates a cross section of the source-gate connection section SG and the source terminal section ST along the line F-F' in FIG. 50.

The gate insulating layer 4 and the first insulating layer 11 of the TFT substrate 107a differs from the TFT substrate 107 in that the gate insulating layer 4 and the first insulating layer 11 of the TFT substrate 107a include the opening 12a (1) exposing only a part of the patch electrode 3PE in the antenna unit region U. Furthermore, the TFT substrate 107a has a structure that differs from that of the TFT substrate 107 in the first transfer terminal section PT1. Hereinafter, the differences from the TFT substrate 107 are mainly described.

As described with reference to FIGS. 45A and 47AA, the patch electrode 3PE is on the inner side of the opening 12a in the antenna unit region U of the TFT substrate 107, when viewed from the normal direction of the dielectric substrate 1. That is, the opening 12a is formed so as to expose the patch electrode 3PE in its entirety.

In contrast, in the TFT substrate 107a, as illustrated in FIGS. 29A and 51A, the gate insulating layer 4 and the first insulating layer 11 include the opening 12a (1) extending over the patch electrode 3PE and exposing a part of the patch electrode 3PE. The conductive connection section 13a is disposed inside the opening 14a and inside the opening 12a (1), in contact with the section 7Ca extending from the drain electrode 7D inside the opening 14a, and in contact with the patch electrode 3PE inside the opening 12a (1).

The TFT substrate 107a can be manufactured using the manufacturing method described with reference to FIGS. 52AA to 52CO and thus, during the etching of the connection section conductive film, has the advantage of not requiring adjustment of etching conditions to ensure that the etching rate for the patch electrode is less than the etching rate for the connection section conductive film.

The first transfer terminal section PT1 of the TFT substrate 107a, as illustrated in FIGS. 50 and 51AB, includes the gate connection section 3p; the gate insulating layer 4, the first insulating layer 11, and the second insulating layer 17 covering the gate connection section 3p; and the transfer upper connection section 19p formed on the second insulating layer 17. The gate insulating layer 4, the first insulating layer 11, and the second insulating layer 17 include the opening (contact hole) 18p exposing a part of the gate connection section 3p. The transfer upper connection section 19p is disposed on the second insulating layer 17 and inside the opening 18p, and is in contact with the gate connection section 3p inside the opening 18p.

Similar to the TFT substrate 105, in the first transfer terminal section PT1 of the TFT substrate 107a, the entire region on the outer side of the gate connection section 3p has a layered structure including the gate insulating layer 4, the first insulating layer 11, and the second insulating layer 17 on the substrate 1. Thus, the TFT substrate 107a has excellent reliability.

A method for manufacturing the TFT substrate 107a will now be described with reference to FIGS. 52AA to 52CO.

FIGS. 52AA to 52CO are each a process cross-sectional view illustrating an example of the manufacturing method of the TFT substrate 107a. These diagrams illustrate cross sections respectively corresponding to FIGS. 51AA to 51AE. The following mainly describes the differences from the manufacturing method of the TFT substrate 107 described with reference to FIGS. 48AA to 48CN.

As illustrated in FIGS. 52AA to 52BG, the gate metal layer, the gate insulating layer 4, the semiconductor layer, the source metal layer, and the first insulating layer 11 are formed. These steps are similar to the steps illustrated in FIGS. 48AA to 48BG. Here, a layered film (Cu/Ti) is formed as the gate conductive film 3' by layering a Ti film (having a thickness of 20 nm, for example) and a Cu film (having a thickness of 500 nm, for example), in this order, and a layered film (Cu/Ti) is formed as the source conductive film 7' by layering a Ti film (having a thickness of 20 nm, for example), and a Cu layer (having a thickness of 200 nm, for example), in this order. Further, here, the oxide semiconductor layer 5 may be formed as the semiconductor layer 5. As the oxide semiconductor film 5', an In—Sn—Zn—O based semiconductor film having a thickness of 70 nm, for example, is formed, and this is then patterned to obtain the island-shaped oxide semiconductor layer 5. As the gate insulating layer 4, a layered film (SiOx/SixNy) is formed by layering a silicon nitride (SixNy) film (having a thickness of 300 nm, for example) and a silicon oxide (SiOx) film (having a thickness of 50 nm, for example), in this order. As the first insulating layer 11, here a layered film (SixNy/SiOX) is formed by layering a silicon oxide (SiOx) film (having a thickness of 250 nm, for example) and a silicon nitride (SixNy) film (having a thickness of 250 nm, for example), in this order.

Then, as illustrated in FIG. 52BH, the opening 12a (1) that reaches the patch electrode 3PE in the antenna unit formation region is formed in the first insulating layer 11 and the gate insulating layer 4 by a known photolithography process. At the same time, the opening 14a that reaches the section 7Ca extending from the drain electrode 7D in the antenna unit formation region, and the opening 14sg (1) that reaches the source connection section 7sg in the source-gate connection section formation region are formed in the first insulating layer 11. Here, the opening 12a (1) differs from the opening 12a formed in the step illustrated in FIG. 48BH in that the opening is formed so as to expose only a part of the patch electrode 3PE. Further, the opening 12a (1) differs from the opening 12a formed in the step illustrated in FIG. 48BH in that the opening is not formed in the transfer terminal section formation region.

Then, as illustrated in FIG. 52BI, the connection section conductive film 13' is formed on the first insulating layer 11, inside the opening 14a, inside the opening 12a (1), and inside the opening 14sg (1). Here, as the connection section conductive film 13', a layered film (Cu/Ti) is formed by layering a Ti film (having a thickness of 20 nm, for example) and Cu (having a thickness of 200 nm, for example), in this order.

Then, the connection section conductive film 13' is patterned using a known photolithography process. Thus, as illustrated in FIG. 52BJ, the conductive connection section 13a is formed inside the antenna unit formation region, and the conductive connection section 13sg is formed inside the source-gate connection section formation region. The conductive connection section 13a is in contact with the patch electrode 3PE inside the opening 12a (1), and in contact with the section 7Ca extending from the drain electrode 7D inside the opening 14a. Here, the connection section conductive film 13' is patterned by dry etching using fluorine gas, for example.

The patterning step of the connection section conductive film 13' differs from the patterning step illustrated in FIG. 48BJ in that the patch electrode 3PE is not exposed. Thus, etching conditions do not need to be adjusted so that the etching rate for the patch electrode 3PE is less than the etching rate for the connection section conductive film 13'. As in this example, the gate conductive film 3' and the connection section conductive film 13' may be formed from the same metal film.

Subsequently, as illustrated in FIG. 52BK, the opening 12a (2) exposing the remaining part of the patch electrode 3PE is formed by etching the gate insulating layer 4 and the first insulating layer 11 once again.

Figure 52C:
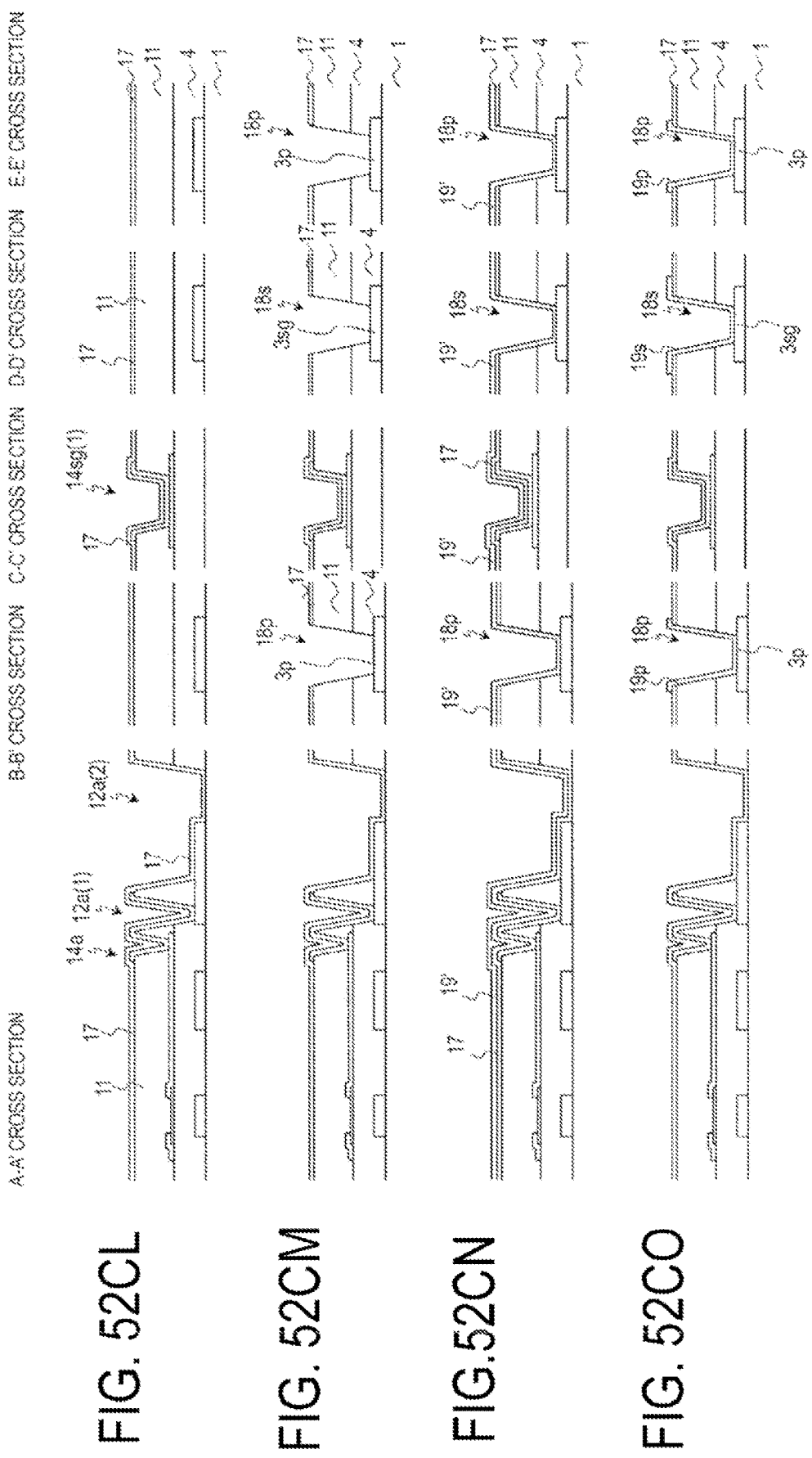
FIG. 52CL to FIG. 52CO are each a process cross-sectional view illustrating an example of a manufacturing method of the TFT substrate 107*a*.

Then, as illustrated in FIG. 52CL, the second insulating layer 17 is formed on the first insulating layer 11, on the conductive connection sections 13a, 13sg, and inside the opening 12a (2). Here, as the second insulating layer 17, for example, a silicon nitride (SixNy) film having a thickness of 50 nm is formed.

Subsequently, the gate insulating layer 4, the first insulating layer 11, and the second insulating layer 17 are etched by a known photolithography process. Thus, as illustrated in FIG. 52CM, the opening 18p that reaches the gate connection section 3p in the first and second transfer terminal section formation region, and the opening 18s that reaches the gate connection wiring line 3sg in the source terminal section formation region are formed in the gate insulating layer 4, the first insulating layer 11, and the second insulating layer 17. The step related to the configuration of the opening formed in the first transfer terminal section formation region differs from the step illustrated in FIG. 48CL.

Then, as illustrated in FIG. 52CN, the transparent conductive film 19' is formed on the second insulating layer 17, inside the opening 18s, and inside the opening 18p by a sputtering method, for example.

Then, the transparent conductive film 19' is patterned. Thus, as illustrated in FIG. 52CO, the transfer upper connection section 19p in contact with the gate connection section 3p inside the opening 18p in the first and second transfer terminal section formation regions, and the source terminal upper connection section 19s in contact with the gate connection wiring line 3sg inside the opening 18s in the source terminal section formation region are formed.

In this manner, the TFT substrate 107a is manufactured.

Note that the opening 12a (2) may be omitted. In this case, the number of photomasks used can be reduced by one.

The first transfer terminal section PT1 of the TFT substrate 107a is not limited to having the same structure as the first transfer terminal section PT1 of the TFT substrate 105, and may have a structure similar to that of the first transfer terminal section PT1 of the TFT substrate 107.

Further, while the above illustrates a case where the semiconductor layer 5 made from an oxide semiconductor is formed as the semiconductor layer 5 of the TFT substrate 107a, the TFT substrate of modification 1 is not limited thereto. As in the semiconductor layer 5 of the TFT substrate 107, the semiconductor layer 5 may be formed from an intrinsic amorphous silicon film.

The scanning antenna according to an embodiment of the disclosure is housed in, for example, a plastic housing, as necessary. A material having a small dielectric constant $\varepsilon_M$ that does not affect microwave transmission and/or reception is preferably used as a material for the housing. In addition, a through-hole may be provided in a portion corresponding to the transmission and/or reception region R1 of the housing. Further, a light blocking structure may be provided to prevent the liquid crystal material from being exposed to light. The light blocking structure is provided, for example, to block light passing from a side surface of the dielectric substrate 1 of the TFT substrate 101 and/or a side surface of the dielectric substrate 51 of the slot substrate 201 into the dielectric substrate 1 and/or the dielectric substrate 51 and entering the liquid crystal layer. A liquid crystal material having large dielectric anisotropy $\Delta\varepsilon_M$ may be prone to photodegradation, and it is preferable to block not only an ultraviolet ray but also short-wavelength blue light among visible light. The light blocking structure can be formed easily in a necessary location by using, for example, a light-blocking tape such as a black adhesive tape.

INDUSTRIAL APPLICABILITY

The embodiments according to the disclosure are used in a scanning antenna for satellite communication or satellite broadcasting mounted on a mobile body (a ship, an aircraft, and an automobile, for example) and inspection of the same.

REFERENCE SIGNS LIST

1 Dielectric substrate
2 Base insulating film
3 Gate electrode
3PE Patch electrode
4 Gate insulating layer
5 Semiconductor layer
6D Drain contact layer
6S Source contact layer
7D Drain electrode
7S Source electrode
7p Source connection wiring line
11 First insulating layer
15 Patch electrode
15p Patch connection section
17 Second insulating layer
18g, 18s, 18p Opening
19g Gate terminal upper connection section
19p Transfer terminal upper connection section
19s Source terminal upper connection section
21 Alignment mark
23 Protective conductive layer
51 Dielectric substrate
52 Third insulating layer
54 Dielectric layer (air Layer)
55 Slot electrode
55L Lower layer
55M Main layer
55U Upper layer
55c Contact surface
57 Slot
58 Fourth insulating layer
60 Upper connection section
65 Reflective conductive plate
67 Adhesive layer
68 Heater resistive film
70 Power feed device
71 Conductive beads
72 Power feed pin
73 Sealing portion
101, 102, 103, 104 TFT substrate
105, 105a, 105b TFT substrate
106, 106a, 106b TFT substrate 107, 107a TFT substrate
201, 203 Slot substrate
1000 Scanning antenna
CH1, CH2, CH3, CH4, CH5, CH6 Contact hole
GD Gate driver
GL Gate bus line
GT Gate terminal section
SD Source driver
SL Source bus line
ST Source terminal section
PT Transfer terminal section
IT Terminal section
LC Liquid crystal layer
R1 Transmission and/or reception region
R2 Non-transmission and/or reception region
Rs Seal region
U, U1, U2 Antenna unit, Antenna unit region

The invention claimed is:

1. A TFT substrate, comprising:
a dielectric substrate;
a plurality of antenna unit regions arranged on the dielectric substrate;
a transmission and/or reception region provided with the plurality of antenna unit regions; and
a non-transmission and/or reception region positioned in a region other than the transmission and/or reception region,
wherein the plurality of antenna unit regions are each provided with a TFT that is supported by the dielectric substrate and that includes a gate electrode, a semiconductor layer, a gate insulating layer formed between the gate electrode and the semiconductor layer, and a source electrode and a drain electrode electrically connected to the semiconductor layer, and a patch electrode electrically connected to the drain electrode of the TFT, and
the patch electrode is formed from the same conductive film as the gate electrode.

2. The TFT substrate according to claim 1,
wherein the gate electrode and the patch electrode each have a thickness from 0.3 to 3 μm, inclusive.

3. The TFT substrate according to claim 1,
wherein the source electrode and the drain electrode are disposed on the gate insulating layer.

4. The TFT substrate according to claim 1,
wherein the plurality of antenna unit regions each include a patch electrode connection section extending from the drain electrode over the patch electrode,
the gate insulating layer includes a first opening exposing the patch electrode,
the patch electrode is on an inner side of the first opening when viewed from a normal direction of the dielectric substrate, and
the patch electrode connection section is in contact with the patch electrode inside the first opening.

5. The TFT substrate according to claim 1,
wherein the plurality of antenna unit regions each include a patch electrode connection section extending from the drain electrode over the patch electrode,
the gate insulating layer includes a first opening that extends over the patch electrode and exposes a part of the patch electrode,
and the patch electrode connection section is disposed inside the first opening.

6. The TFT substrate according to claim 1, further comprising a transfer terminal section disposed in the non-transmission and/or reception region,
wherein the transfer terminal section includes a gate connection section formed from the same conductive film as the gate electrode, the gate insulating layer that extends over the gate connection section and includes a third opening exposing a part of the gate connection section, and a first conductive connection section disposed on the gate insulating layer and inside the third opening.

7. The TFT substrate according to claim 1, further comprising:
a first insulating layer that covers the TFT; and
a transfer terminal section disposed in the non-transmission and/or reception region,
wherein the transfer terminal section includes a gate connection section formed from the same conductive film as the gate electrode, a third opening of the gate insulating layer exposing the gate connection section, the first insulating layer that extends over the gate connection section, is in contact with the gate connection section inside the third opening, and includes a fourth opening exposing a part of the gate connection section, and a first conductive connection section disposed on the first insulating layer and inside the fourth opening.

8. The TFT substrate according to claim 1, further comprising:
a first insulating layer that covers the TFT; and
a first conductive connection section formed on the first insulating layer,
wherein the gate insulating layer and the first insulating layer include a first contact hole exposing the patch electrode,
the patch electrode is on an inner side of the first contact hole when viewed from the normal direction of the dielectric substrate,
the first insulating layer includes a first opening exposing a part of the drain electrode or a part of a section extending from the drain electrode, and
the first conductive connection section is disposed inside the first opening and is in contact with the patch electrode inside the first contact hole.

9. The TFT substrate according to claim 1, further comprising:
a first insulating layer that covers the TFT; and
a first conductive connection section formed on the first insulating layer,
wherein the gate insulating layer and the first insulating layer include a first contact hole extending over the patch electrode and exposing a part of the patch electrode,
the first insulating layer includes a first opening extending over the drain electrode or over a section extending from the drain electrode, and exposing the drain electrode or a part of a section extending from the drain electrode, and
the first conductive connection section is disposed inside the first opening and inside the first contact hole.

10. The TFT substrate according to claim 8, further comprising a transfer terminal section disposed in the non-transmission and/or reception region,
wherein the transfer terminal section includes a gate connection section formed from the same conductive film as the gate electrode, the gate insulating layer and the first insulating layer that include a third contact hole extending over the gate connection section and exposing a part of the gate connection section, and a second conductive connection section disposed on the first insulating layer and inside the third contact hole.

11. The TFT substrate according to claim 8, further comprising:
a second insulating layer formed on the first insulating layer; and
a transfer terminal section disposed in the non-transmission and/or reception region,
wherein the transfer terminal section includes a gate connection section formed from the same conductive film as the gate electrode, a third contact hole formed in the gate insulating layer and the first insulating layer and exposing the gate connection section, the second insulating layer that extends on the gate connection section, is in contact with the gate connection section inside the third contact hole, and includes a second opening exposing a part of the gate connection section, and a second conductive connection section disposed on the second insulating layer and inside the second opening.

12. A scanning antenna, comprising:
the TFT substrate described in claim 1;
a slot substrate disposed facing the TFT substrate;
a liquid crystal layer provided between the TFT substrate and the slot substrate; and
a reflecting conductive plate disposed facing a surface of the slot substrate on a side opposite the liquid crystal layer via a dielectric layer,
wherein the slot substrate includes another dielectric substrate, and a slot electrode formed on a surface of the other dielectric substrate on the liquid crystal layer side,
the slot electrode includes a plurality of slots, and
the plurality of slots are disposed correspondingly with the patch electrodes of the plurality of antenna unit regions of the TFT substrate.

13. A method for manufacturing a TFT substrate provided with a transmission and/or reception region including a plurality of antenna unit regions, and a non-transmission and/or reception region positioned in a region other than the transmission and/or reception region, each of the plurality of antenna unit regions being provided with a TFT and a patch electrode, the method comprising the steps of:
(a) forming a gate conductive film on a dielectric substrate, and forming a plurality of gate bus lines, a gate electrode of the TFT, and the patch electrode by patterning the gate conductive film;
(b) forming a gate insulating layer that covers the plurality of gate bus lines, the gate electrode, and the patch electrode;
(c) forming a semiconductor layer of the TFT on the gate insulating layer; and
(d) forming a first opening in the gate insulating layer, exposing at least a part of the patch electrode.

14. The method of manufacturing a TFT substrate according to claim 13, further comprising the step of (e) forming a source conductive film on the semiconductor layer, on the gate insulating layer, and inside the first opening, and forming a plurality of source bus lines, a source electrode and a drain electrode connected to the semiconductor layer, and a first section that extends from the drain electrode and is in contact with the patch electrode inside the first opening, after the steps (c) and (d).

15. The method for manufacturing a TFT substrate according to claim 13,
wherein TFT substrate further includes a transfer terminal section in the non-transmission and/or reception region,
the step (a) includes forming a gate connection section in the non-transmission and/or reception region by patterning the gate conductive film,
the step (b) includes forming the gate insulating layer that covers the plurality of gate bus lines, the gate electrode, the patch electrode, and the gate connection section, and
the manufacturing method further includes forming a second opening in the gate insulating layer, exposing a part of the gate connection section.

16. The method for manufacturing a TFT substrate according to claim 13,
wherein the TFT substrate further includes a transfer terminal section in the non-transmission and/or reception region,
the step (a) includes forming a gate connection section in the non-transmission and/or reception region by patterning the gate conductive film,
the step (b) includes forming the gate insulating layer that covers the plurality of gate bus lines, the gate electrode, the patch electrode, and the gate connection section,
the step (d) includes forming a second opening in the gate insulating layer, exposing the gate connection section, and
the manufacturing method further includes forming a first insulating layer on the gate insulating layer and inside the second opening, and forming a third opening in the first insulating layer, exposing a part of the gate connection section, after the step (d).

17. The method for manufacturing a TFT substrate according to claim 13, the method further comprising, after the step (c) and before the step (d), the steps of:
(e) forming a source conductive film on the semiconductor layer and the gate insulating layer, and forming a plurality of source bus lines, a source electrode and a drain electrode connected to the semiconductor layer, and a second section extending from the drain electrode by patterning the source conductive film; and
(f) forming a first insulating layer that covers the TFT,
wherein the step (d) further includes etching the gate insulating layer and the first insulating layer at once, thereby forming a first contact hole in the gate insulating layer and the first insulating layer, exposing at least a part of the patch electrode, and forming a second opening in the first insulating layer, exposing a part of the drain electrode or a part of the second section.

18. The method for manufacturing a TFT substrate according to claim 17, the method further comprising, after the step (d), forming a connection section conductive film on the first insulating layer, inside the first contact hole, and inside the second opening, and forming a conductive connection section that is in contact with the patch electrode inside the first contact hole and in contact with a part of the drain electrode or a part of the second section inside the second opening, by patterning the connection section conductive film, after the step (d).

19. The method for manufacturing a TFT substrate according to claim 17,
wherein the TFT substrate further includes a transfer terminal section in the non-transmission and/or reception region,
the step (a) includes forming a gate connection section in the non-transmission and/or reception region by patterning the gate conductive film,
the step (b) includes forming the gate insulating layer that covers the plurality of gate bus lines, the gate electrode, the patch electrode, and the gate connection section, the step (f) includes forming the first insulating layer that covers the TFT and the gate connection section, and the manufacturing method further includes forming a second contact hole in the gate insulating layer and the first insulating layer, exposing a part of the gate connection section.

20. The method for manufacturing a TFT substrate according to claim 17, wherein the TFT substrate further includes a transfer terminal section in the non-transmission and/or reception region, the step (a) includes forming a gate connection section in the non-transmission and/or reception region by patterning the gate conductive film, the step (b) includes forming the gate insulating layer that covers the plurality of gate bus lines, the gate electrode, the patch electrode, and the gate connection section, the step (f) includes forming a first insulating layer that covers the TFT and the gate connection section, the step (d) includes forming a second contact hole in the gate insulating layer and the first insulating layer, exposing the gate connection section, and the manufacturing method further includes forming a second insulating layer on the first insulating layer and inside the second contact hole, and forming a third opening in the second insulating layer, exposing a part of the gate connection section, after the step (d).

\* \* \* \* \*